US009349964B2

(12) United States Patent
Chun et al.

(10) Patent No.: US 9,349,964 B2
(45) Date of Patent: May 24, 2016

(54) ORGANIC LIGHT EMITTING DIODE AND MANUFACTURING METHOD THEREOF

(75) Inventors: Min-Seung Chun, Daejeon (KR); Sung-Kil Hong, Daejeon (KR); Yun-Hwan Kim, Daejeon (KR); Tae-Yoon Park, Daejeon (KR)

(73) Assignee: LG CHEM, LTD., Seoul (KR)

(*) Notice: Subject to any disclaimer, the term of this patent is extended or adjusted under 35 U.S.C. 154(b) by 638 days.

(21) Appl. No.: 13/335,165

(22) Filed: Dec. 22, 2011

(65) Prior Publication Data

US 2012/0193612 A1 Aug. 2, 2012

(30) Foreign Application Priority Data

Dec. 24, 2010 (KR) ........................ 10-2010-0134759

(51) Int. Cl.

| | |
|---|---|
| ***H01L 51/54*** | (2006.01) |
| ***H01L 51/00*** | (2006.01) |
| ***C09K 11/06*** | (2006.01) |
| ***H05B 33/14*** | (2006.01) |
| *H01L 51/50* | (2006.01) |

(52) U.S. Cl.

CPC ............ *H01L 51/0072* (2013.01); *C09K 11/06* (2013.01); *H01L 51/0061* (2013.01); *H01L 51/0071* (2013.01); *H05B 33/14* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *H01L 51/504* (2013.01); *H01L 51/5012* (2013.01)

(58) Field of Classification Search

CPC ........... C09K 11/06; C09K 2211/1007; C09K 2211/1011; C09K 2211/1014; C09K 2211/1029; C09K 2211/1044; H01L 51/0061; H01L 51/0071; H01L 51/0072; H01L 51/5012; H01L 51/504; H05B 33/14

See application file for complete search history.

(56) References Cited

U.S. PATENT DOCUMENTS

| | | | | |
|---|---|---|---|---|
| 2003/0165715 | A1 | 9/2003 | Yoon et al. | |
| 2004/0131882 | A1 | 7/2004 | Matsuura et al. | |
| 2007/0122939 | A1 | 5/2007 | Jeong et al. | |
| 2007/0131929 | A1 | 6/2007 | Bae et al. | |
| 2010/0044689 | A1 | 2/2010 | Nishimura et al. | |
| 2010/0181560 | A1 | 7/2010 | Kambe et al. | |
| 2010/0301312 | A1* | 12/2010 | Jinde et al. ...................... | 257/40 |
| 2011/0073897 | A1 | 3/2011 | Kang et al. | |
| 2011/0127513 | A1* | 6/2011 | Lee et al. ........................ | 257/40 |
| 2011/0201778 | A1 | 8/2011 | Stoessel et al. | |
| 2011/0288292 | A1 | 11/2011 | Parham et al. | |
| 2012/0068170 | A1 | 3/2012 | Pflumm et al. | |
| 2012/0091438 | A1 | 4/2012 | Yabunouchi et al. | |

FOREIGN PATENT DOCUMENTS

| | | | |
|---|---|---|---|
| CN | 1531581 | A | 9/2004 |
| CN | 101291935 | A | 10/2008 |
| CN | 101904028 | A | 12/2010 |

(Continued)

*Primary Examiner* — Dawn Garrett

(74) *Attorney, Agent, or Firm* — Dentons US LLP

(57) ABSTRACT

The present invention relates to a heat emitting body comprising a transparent board, a bus bar, a power supply connected to the bus bar, a heat emitting pattern line provided on the transparent board and electrically connected to the bus bar, and a non-heat emitting pattern line provided on the transparent board and not electrically connected to the bus bar, and a method for manufacturing the same.

7 Claims, 6 Drawing Sheets

(56) References Cited

FOREIGN PATENT DOCUMENTS

| | | | | |
|---|---|---|---|---|
| JP | 11-144873 | A | | 5/1999 |
| JP | 2007-158337 | A | | 6/2007 |
| JP | 2009-076817 | | * | 4/2009 |
| JP | 2009-266927 | | * | 11/2009 |
| JP | 2010-215759 | | * | 9/2010 |
| KR | 20030067773 | A | | 8/2003 |
| KR | 10-2010-0084977 | A | | 7/2010 |
| KR | 1020100084977 | | | 7/2010 |
| KR | 10-2010-0130197 | A | | 12/2010 |
| TW | 200507696 | | | 2/2005 |
| TW | 200732452 | | | 9/2007 |
| WO | 99/13691 | A1 | | 3/1999 |
| WO | 2007/069847 | A1 | | 6/2007 |
| WO | 2008/013399 | A1 | | 1/2008 |
| WO | 2008/123178 | A1 | | 10/2008 |
| WO | 2009/081857 | A1 | | 7/2009 |
| WO | 2009/142462 | A2 | | 11/2009 |
| WO | 2010/054730 | A1 | | 5/2010 |
| WO | 2010062065 | A2 | | 6/2010 |
| WO | WO 2010/062065 | A2 | * | 6/2010 |
| WO | 2010/083869 | A2 | | 7/2010 |
| WO | 2010/114021 | A1 | | 10/2010 |
| WO | 2010-136109 | A1 | | 12/2010 |

* cited by examiner

ORGANIC LIGHT EMITTING DIODE AND MANUFACTURING METHOD THEREOF

TECHNICAL FIELD

The application claims priority under 35 USC 119(a) to Korean Patent Application No. 10-2010-0134759, filed in the Republic of Korea on Dec. 24, 2010, the entire content of which is incorporated herein by reference.

BACKGROUND ART

An organic light emission phenomenon is an example of converting current into visible rays through an internal process of a specific organic molecule. The principle of the organic light emission phenomenon is based on the following mechanism. When an organic material layer is disposed between an anode and a cathode, if voltage is applied between the two electrodes, electrons and holes are injected from the cathode and the anode, respectively, into the organic material layer. The electrons and the holes which are injected into the organic material layer are recombined to form an exciton, and the exciton is reduced to a bottom state to emit light. An organic light emitting diode using this principle may typically comprise a cathode, an anode, and an organic material layer, for example, an organic material layer comprising a hole injection layer, a hole transporting layer, a light emitting layer, and an electron transporting layer, disposed therebetween.

The materials used in the organic light emitting diode are mostly pure organic materials or complexes of organic materials with metals, and may be classified as a hole injection material, a hole transporting material, a light emitting material, an electron transporting material, or an electron injection material, according to their use. In connection with this, an organic material having a p-type property, which is easily oxidized and is electrochemically stable when it is oxidized, is usually used as the hole injection material or the hole transporting material. Meanwhile, an organic material having an n-type property, which is easily reduced and is electrochemically stable when it is reduced, is usually used as the electron injection material or the electron transporting material. As the light emitting layer material, an organic material having both p-type and n-type properties is preferable, which is stable when it is oxidized and reduced. When an exciton is formed, a material having high light emitting efficiency for converting the exciton into light is preferable.

In addition, it is preferred that the material used in the organic light emitting diode further has the following properties.

First, it is preferred that the material used in the organic light emitting diode has excellent thermal stability. This is due to joule heat generated by movement of electric charges in the organic light emitting diode. NPB, which has currently been used as the hole transporting layer material, has a glass transition temperature of 100° C. or less, and thus it is difficult to apply NPB to an organic light emitting diode requiring a high current. Also, in order to improve the service life of the organic light emitting diode, the stability of the material itself is important, and since the OLED diode is a diode which provides electricity to generate light, the stability for electric charges is important. This means that when a phenomenon in which electrons are introduced into or emitted from a material is repeated, the material itself is not modified or broken.

Second, in order to obtain an organic light emitting diode that is capable of being driven at low voltage and has high efficiency, holes or electrons which are injected into the organic light emitting diode need to be smoothly transported to a light emitting layer, and simultaneously the injected holes and electrons need to be prevented from being released out of the light emitting layer. To achieve this, a material used in the organic light emitting diode needs to have a proper band gap and proper HOMO and LUMO energy levels. A LUMO energy level of PEDOT:PSS, which is currently used as a hole transporting material of an organic light emitting diode manufactured by using a solution coating method, is lower than that of an organic material used as a light emitting layer material, and thus it is difficult to manufacture an organic light emitting diode having high efficiency and a long service life.

Moreover, the material used in the organic light emitting diode needs to have excellent chemical stability, electric charge mobility, and interfacial characteristic with an electrode or an adjacent layer. That is, the material used in the organic light emitting diode needs to be minimally deformed by moisture or oxygen. Furthermore, a proper hole or electron mobility needs to be assured so as to balance densities of the holes and of the electrons in the light emitting layer of the organic light emitting diode to maximize the formation of excitons. Additionally, it needs to be able to have a good interface with an electrode comprising metal or metal oxides so as to assure stability of the diode.

DETAILED DESCRIPTION OF THE INVENTION

Technical Problem

In order to implement excellent characteristics of the above-described organic light emitting diode sufficiently, materials constituting the organic material layer in the diode, for example, a hole injection material, a hole transporting material, a light emitting material, an electron transporting material, an electron injection material, and the like need to be supported by stable and efficient materials above anything else, but the development of stable and efficient organic layer materials for organic light emitting diode has not been sufficiently achieved. Accordingly, it is necessary to conduct continuous studies on organic light emitting diodes.

Technical Solution

An exemplary embodiment of the present invention provides an organic light emitting diode, comprising: an anode; a cathode; and an organic material layer of one or more layers disposed between the anode and the cathode, wherein the organic material layer comprises a light emitting layer, and an organic material layer comprising a compound having a fluorescent light emitting efficiency equal to or greater than the fluorescent light emitting efficiency of NPB is positioned between the anode and the light emitting layer.

Advantageous Effects

According to exemplary embodiments of the present invention, it is possible to provide an organic light emitting diode having high light emitting efficiency and excellent service life by suppressing self-light emitting effects of a hole injection material or a hole transporting material generated when a hole injection layer or a hole transporting layer with high fluorescent light emitting efficiency is in contact with the light emitting layer.

BEST MODE

Figure 1:
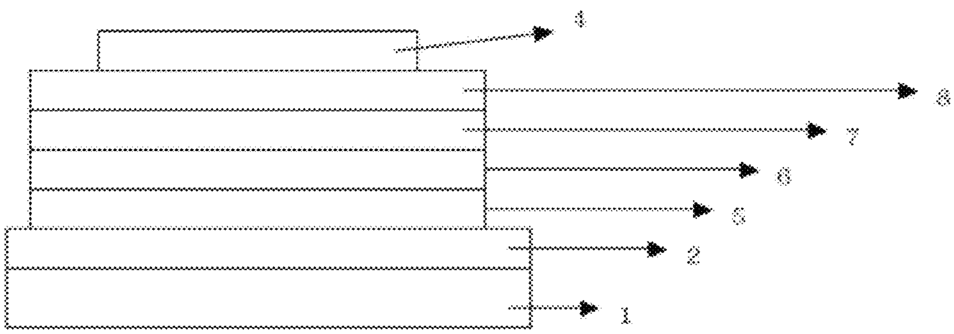
FIG. 1 illustrates an example of an organic light emitting diode comprising a substrate 1, a first electrode 2, a hole injection layer 5, a hole transporting layer 6, a light emitting layer 7, an electron transporting layer 8, and a second electrode 4.

Hereinafter, the present invention will be described in detail.

In order to enhance the thermal and electrical stability of an organic light emitting diode, hole injection and transporting materials have been developed toward increasing the size of an aryl group of a compound. If a region that the aryl group occupies in a molecule is increased, the overlapping region of the p-orbital is widened, and thus an electrically stable material with minimal change in properties due to the in-and-out of electric charges may be produced. Further, the molecular weight of the molecule itself is increased and thus thermal properties which are endured at high deposition temperature or driving temperature also become excellent.

However, the aryl group which is essentially comprised so as to have these properties moves in a direction in which the fluorescence quantum efficiency is increased. The fluorescence quantum efficiency refers to a degree in which light is emitted when excitation is produced by an external light or electric charge, and then the state is stabilized to a bottom state. It is natural that light emitting materials having excellent quantum efficiency have excellent properties because the light emitting materials are materials for emitting light. However, hole injection and transporting materials rather serve to deteriorate properties of a diode.

In the case of NPB, which is mostly used as a hole transporting material, a paper released by Shumei Liu, et al., (Applied Physics Letters, 97, 083304, 2010) disclosed that another material layer was comprised between NPB as a hole transporting layer and a light emitting layer so as to prevent the deterioration of properties of a diode by light emission of NPB which was in contact with the light emitting layer, and in this case, properties had been improved by 1.6 times in terms of luminance, compared to a diode in which NPB was in direct contact with the light emitting layer. In addition, a paper release by Ming-Te Lin et al., (Solid-State Electronics, 56, 196, 2011) reported that in terms of power efficiency (lm/W), properties had been improved by about 14 times when another material layer was inserted between NPB and the light emitting layer, compared to a diode in which NPB as a hole transporting layer was in direct contact with the light emitting layer.

The above-exemplified two cases all show methods for improving properties by inserting another material layer between the light emitting layer and the hole transporting layer in order to solve the following problem that when hole injection and transporting materials which have excellent fluorescence quantum efficiency are in contact with the light emitting layer, electric charges (electrons and holes) injected from the anode and the cathode fail to be converted into light in the light emitting layer, are transferred to a hole injection or transporting material layer, which is in contact with the light emitting layer, and contribute to the light emission of a hole injection or transporting material, which deteriorates characteristics of a diode.

However, the above solution is disadvantageous in that it is not preferable in terms of investment in production facilities or process efficiency because an additional process of manufacturing one more layer needs to be inserted into a diode production process.

Thus, the organic light emitting diode according to the present invention comprises an anode, a cathode, and an organic material layer of one or more layers disposed between the anode and the cathode, wherein the organic material layer comprises a light emitting layer, and an organic material layer comprising a compound having a fluorescent light emitting efficiency equal to or greater than the fluorescent light emitting efficiency of NPB is positioned between the anode and the light emitting layer.

In the present invention, the compound having a fluorescent light emitting efficiency equal to or greater than the fluorescent light emitting efficiency of NPB means a compound in which an intensity of the PL (photoluminescence) spectrum at the Max. peak position is equal to or greater than that of the PL spectrum of NPB at the Max. peak position, produced from 350 nm to 500 nm after the same UV wavelength is irradiated in terms of NPB.

In general, a ratio at which photons or electrons in a material are converted into photons or electrons having different energy levels, and particularly converted into photons is referred to as a light emitting efficiency. As used herein, "fluorescent light emitting efficiency" has few cases where an organic material applied to a hole transporting layer has a phosphorous light emission, and means that photons irradiated by UV are converted into other photons by materials to release PL.

In the present invention, it is preferable for UV to be irradiated as a light source because the energy band of UV is so great that electrons at a bottom state are sufficiently excited even though the energy gap is different for each organic material, and the excited electrons may be returned to the bottom state to emit photons. Although electrons are excited, whether photons are produced, the amount of photons produced, and the like are inherent properties of a material. Thus, in consideration of a PL efficiency measured by irradiating the same light source, it may be determined which side has a relatively higher or lower fluorescent light emitting efficiency rather than not using an absolute value.

The fluorescent light emitting efficiency may be measured by using methods known in the art. For example, the fluorescent light emitting efficiency may be measured under conditions of a temperature range of 15 to 30° C. and a humidity of 70% or less by depositing an organic material layer onto a substrate such as glass, and the like, and then using a measuring apparatus which will be described below, but the method is not limited thereto. Here, when the fluorescent light emitting efficiency is measured, the excitation wavelength, the fluorescent light emitting efficiency measurement range, the increment, and the integration time may be 350 nm, 350 to 600 nm, 0.5 nm, and 0.5 s, respectively, but are limited thereto.

In addition, the measuring apparatus may comprise Fluorolog-3 spectrofluorometer System, Single-grating excitation spectrometer, TBX-04-A-Single Photon detection module, and the like from HORIBA Jobin Yvon, Inc., but are not limited thereto. Measuring conditions of the fluorescent light emitting efficiency may be appropriately controlled by those skilled in the art depending on a measuring device.

The organic material layer comprising the compound having a fluorescent light emitting efficiency equal to or greater than that of NPB is preferably in contact with the light emitting layer. The present invention may provide an organic light emitting diode which suppresses the self-light emission effects of a hole injection material or a hole transporting material to have a high light emitting efficiency and excellent service life by comprising an organic material layer which comprises the compound having the fluorescent light emitting efficiency equal to or greater than that of NPB as a hole injection layer or a hole transporting layer, and comprising the organic material layer which comprises the compound having the fluorescent light emitting efficiency equal to or greater than that of NPB to be in contact with the light emitting layer.

The organic light emitting diode according to the present invention may comprise an organic material layer comprising one or more selected from the group consisting of compounds represented by the following Formulas 1 to 4 between the cathode and the light emitting layer.

[Formula 1]

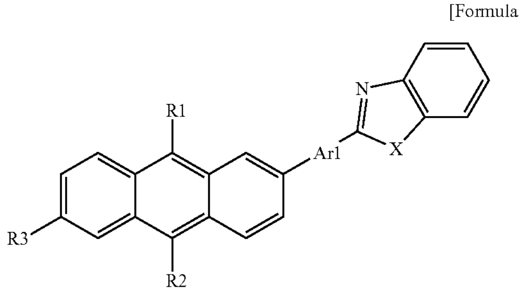

-continued

[Formula 2]

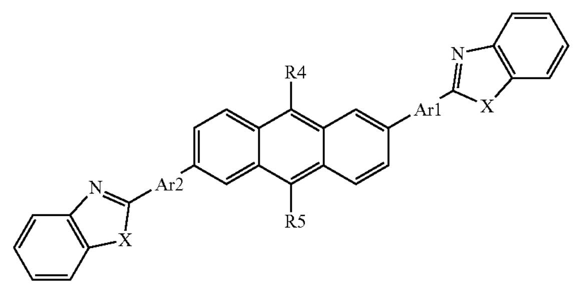

In Formulas 1 and 2, R1, R2, R3, R4, and R5 are the same as or different from each other, and are each independently selected from the group consisting of a hydrogen, an alkyl group having 1 to 10 carbon atoms, an alkenyl group having 2 to 10 carbon atoms, an aryl group having 6 to 20 carbon atoms, and a heteroaryl group having 5 to 20 carbon atoms, except that both of R1 and R2 are a hydrogen and both of R4 and R5 are a hydrogen, Ar1 and Ar2 are each independently selected from the group consisting of a direct bond, an arylene group having 6 to 20 carbon atoms, and a heteroarylene group having 5 to 20 carbon atoms, X is NR6, S, or O, and R6 is selected from the group consisting of a hydrogen, an alkyl group having 1 to 10 carbon atoms, an alkenyl group having 2 to 10 carbon atoms, an aryl group having 6 to 20 carbon atoms, and a heteroaryl group having 5 to 20 carbon atoms.

[Formula 3]

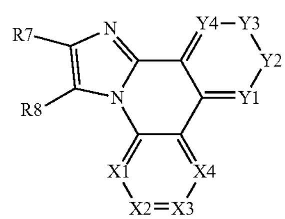

In Formula 3, X1 is N or CR9, X2 is N or CR10, X3 is N or CR11, and X4 is N or CR12, and Y1 is N or CR13, Y2 is N or CR14, Y3 is N or CR15, and Y4 is N or CR16, and both of X1 to X4 and Y1 to Y4 are not simultaneously N, R9 to R16 are each independently-(L)p-(Y)q, wherein p is an integer of 0 to 10, q is an integer of 1 to 10, and adjacent two or more groups of R9 to R16 may form a monocylic or a polycyclic ring, L is an oxygen; a sulfur; a substituted or unsubstituted nitrogen; a substituted or unsubstituted phosphorus; a substituted or unsubstituted arylene group; a substituted or unsubstituted alkenylene group; a substituted or unsubstituted fluorenylene group; a substituted or unsubstituted carbazolylene group; or a substituted or unsubstituted heteroarylene group comprising at least one of N, O, and S atoms, Y is a hydrogen; a deuterium; a halogen group; a nitrile group; a nitro group; a hydroxyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; or a substituted or unsubstituted heteroaryl group comprising at least one of N, O, and S atoms; when each of L and Y is present in the number of two or more, they are each independently the same as or different from each other, R7 and R8 may be connected to each other to form or not to form a substituted or unsubstituted aliphatic, aromatic, or heteroaromatic monocyclic or polycyclic ring, and when R7 and R8 do not form a ring, R7 and R8 are the same as or different from each other, and are each independently selected from the group consisting of a hydrogen, an alkyl group having 1 to 10 carbon atoms, an alkenyl group having 2 to 10 carbon atoms, a cycloalkyl group having 3 to 20 carbon atoms, an aryl group having 6 to 20 carbon atoms, and a heteroaryl group having 5 to 20 carbon atoms, but when both of X1 to X4 and Y1 to Y4 are CR9 to CR16, at least one of R9 to R16 has a substituent group which is not a hydrogen, or R7 and R8 are connected to each other to form a substituted monocyclic or polycyclic ring.

[Formula 4]

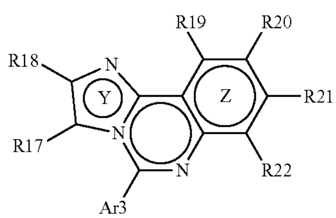

In Formula 4, R17 and R18 are the same as or different from each other, are each independently a $C_1$ to $C_{30}$ alkyl group which is unsubstituted or substituted by one or more groups selected from the group consisting of a hydrogen, a deuterium, a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_3$ to $C_{30}$ cycloalkyl group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ aryl group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; or a $C_2$ to $C_{30}$ heteroaryl group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group, and may form an aliphatic, aromatic, aliphatic hetero, or aromatic hetero condensation ring or a Spiro bond in conjunction with an adjacent group, R19 to R22 are the same as or different from each other, are each independently a $C_1$ to $C_{12}$ alkoxy group which is unsubstituted or substituted by one or more groups selected from the group consisting of a hydrogen, a deuterium, a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_1$ to $C_{12}$ alkylthioxy group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_1$ to $C_{30}$ alkylamine group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ arylamine group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_5$ to $C_{30}$ aryl group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a $C_2$ to $C_{30}$ heteroaryl group which is un substituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_s$ to $C_{30}$ aryl group, and a $C_2$ to $C_{30}$ heteroaryl group; a silicon group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; a boron group which is unsubstituted or substituted by one or more groups selected from the group consisting of a halogen, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; an amino group; a nitrile group; a nitro group; a halogen group; an amide group; or an ester group, and may form an aliphatic, aromatic, aliphatic hetero, or aromatic hetero condensation ring or a spiro bond in conjunction with an adjacent group, Ar3 is a $C_5$ to $C_{30}$ aryl group which is unsubstituted or substituted by one more groups selected from the group consisting of a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group; or a $C_2$ to $C_{30}$ heteroaryl group which is unsubstituted or substituted by one or more groups selected from the group consisting of a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_5$ to $C_{30}$ aryl group, and a $C_2$ to $C_{30}$ heteroaryl group, and Y is a heteroaryl group in which one or more carbons constituting the ring may be additionally substituted by nitrogens, and Z is an aryl group or a heteroaryl group in which one or more carbons constituting the ring are substituted by nitrogens.

The substituent groups used in the present invention are defined as follows.

The alkyl group is preferably one having 1 to 30 carbon atoms, which does not cause a steric hindrance. Specific examples thereof comprise a methyl group, an ethyl group, a propyl group, an isopropyl group, a butyl group, a t-butyl group, a pentyl group, a hexyl group, a heptyl group, and the like, but are not limited thereto.

The cycloalkyl group is preferably one having 3 to 30 carbon atoms, which does not cause a steric hindrance, and specific examples thereof comprise more preferably a cyclopentyl group or a cyclohexyl group.

Examples of the alkoxy group comprise an alkoxy group having 1 to 30 carbon atoms.

Examples of the alkenyl group comprise an alkenyl group which is connected to an aryl group such as a stylbenzyl group, a styrenyl group, and the like.

Examples of the aryl group comprise a phenyl group, a naphthyl group, an anthracenyl group, a biphenyl group, a pyrenyl group, a phenylene group, derivatives thereof, and the like.

Examples of the arylamine group comprise a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthylamine group, a ditolylamine group, a phenyltolylamine group, a carbazole group, a triphenylamine group, and the like.

Examples of the heteroaryl group comprise a pyridyl group, a bipyridyl group, a triazine group, an acridyl group, a thiophene group, an imidazole group, an oxazole group, a thiazole group, a triazole group, a quinolinyl group, and an isoquinoline group, and the like.

Examples of the halogen group comprise fluorine, chlorine, bromine, iodine, and the like.

Further, as used herein, the term "substituted or unsubstituted" means that a group is substituted by one or more substitutent groups selected from the group consisting of a deuterium, a halogen group, an alkyl group, an alkenyl group, an alkoxy group, a silyl group, an arylalkenyl group, an aryl group, a heteroaryl group, a carbazole group, an arylamine group, a fluorenyl group which is unsubstituted or substituted by an aryl group, and a nitrile group, or does not have any substituent group.

In addition, in the present specification, the substituent groups may be further substituted by an additional substituent group, and specific examples thereof may comprise a halogen group, an alkyl group, an alkenyl group, an alkoxy group, a silyl group, an arylalkenyl group, an aryl group, a heteroaryl group, a carbazole group, an arylamine group, a fluorenyl group which is unsubstituted or substituted by an aryl group, a nitrile group, and the like, but are not limited thereto.

Specific examples of the compounds of Formulas 1 and 2 are as follows.

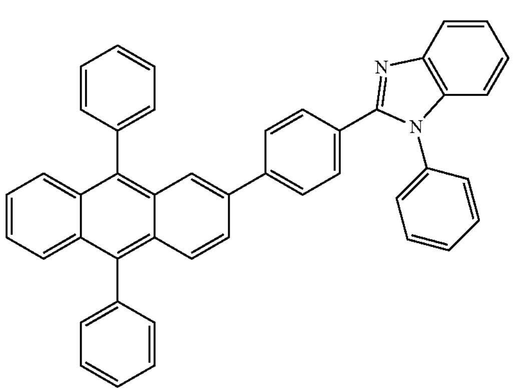

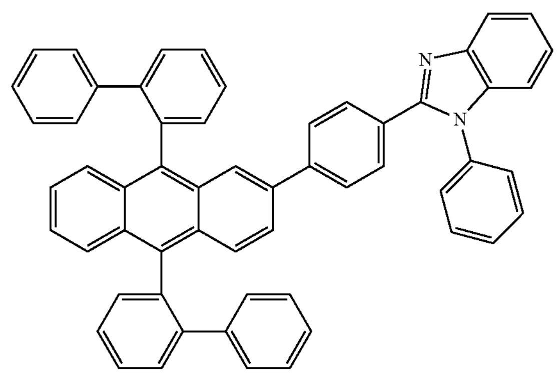

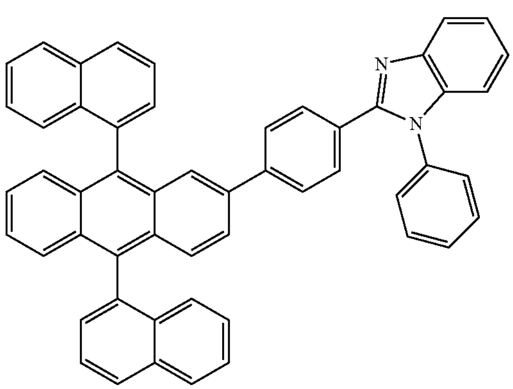

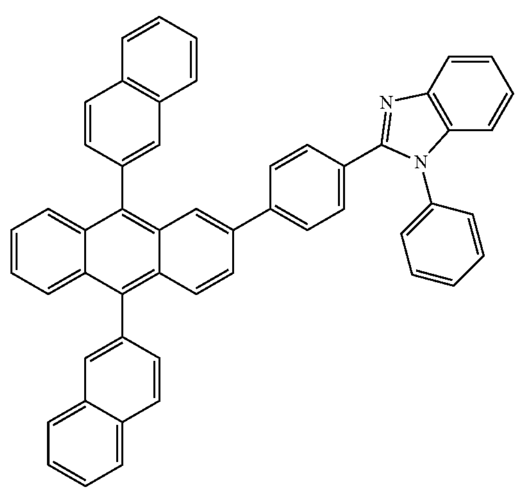

-continued
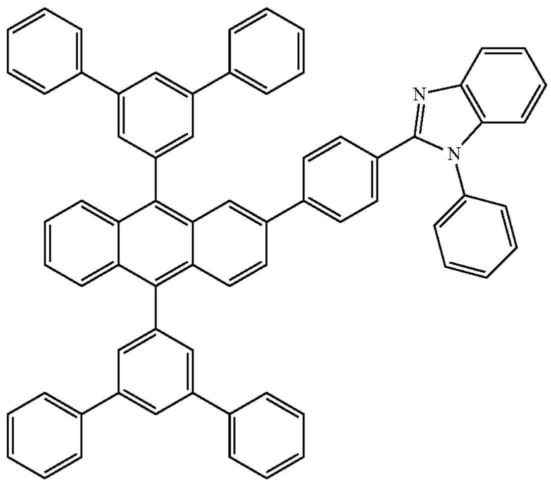
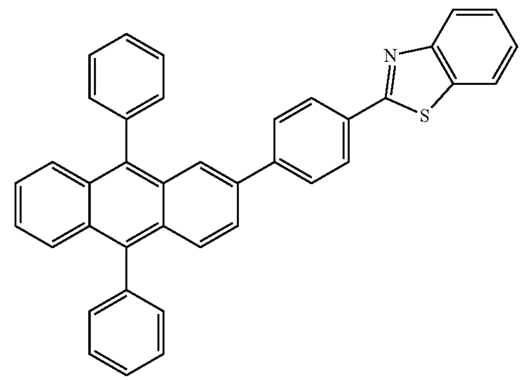
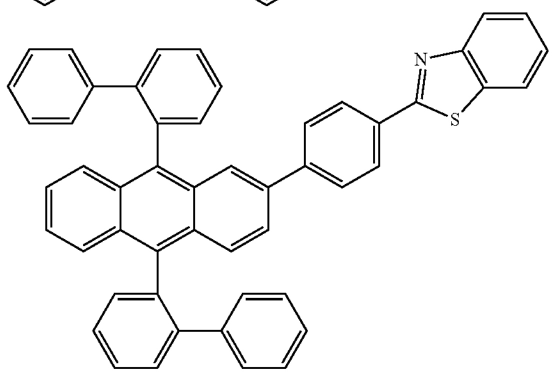
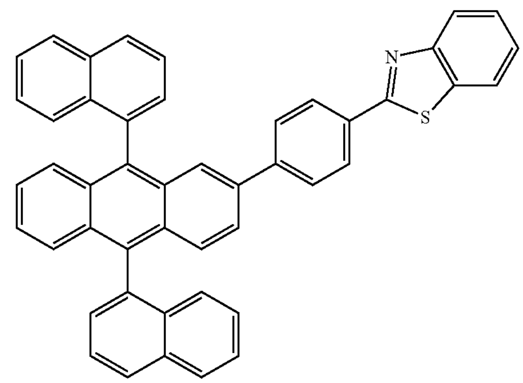
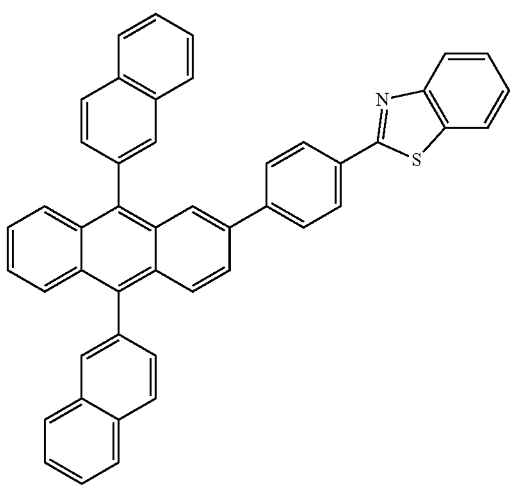
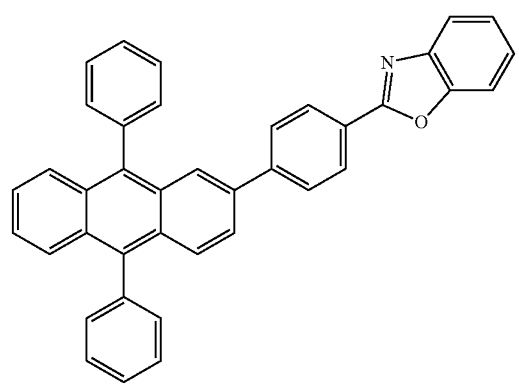
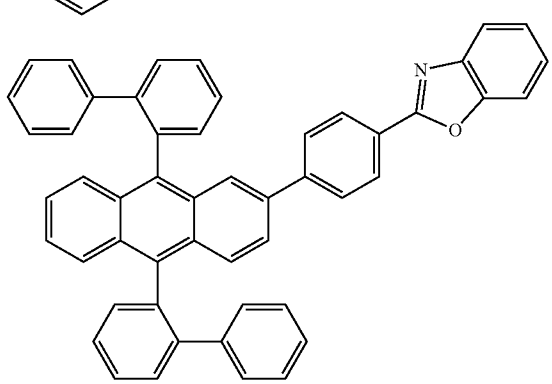
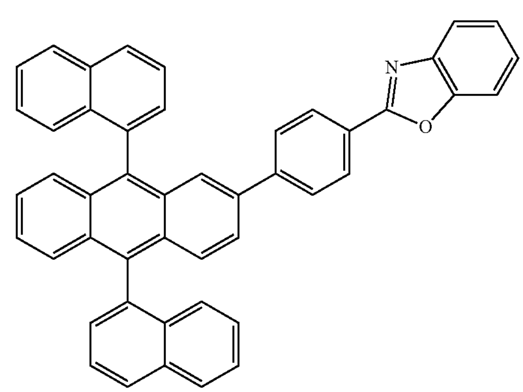

-continued
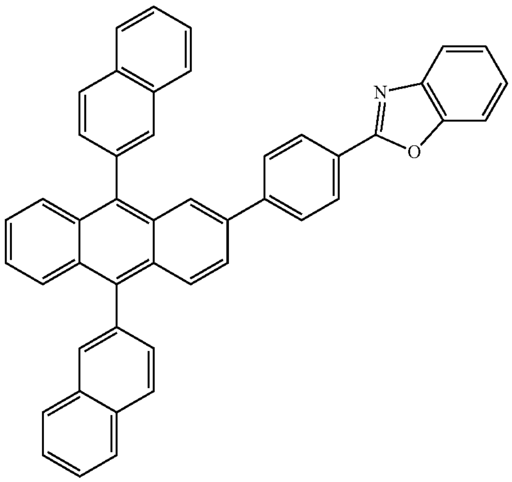
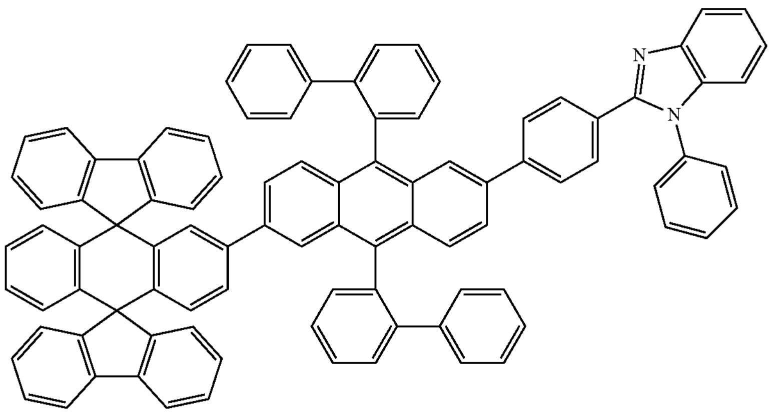
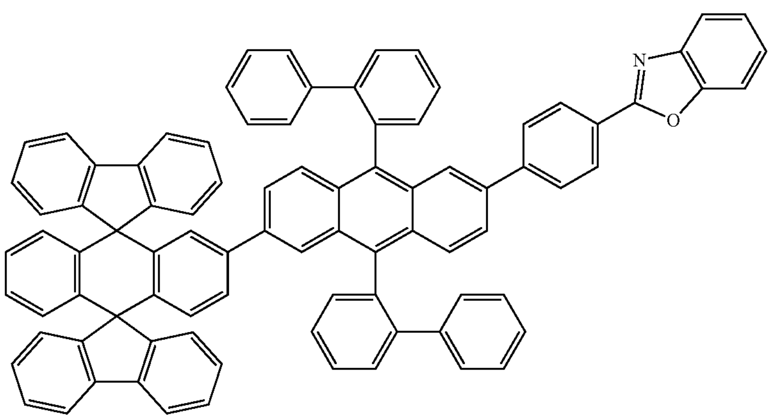
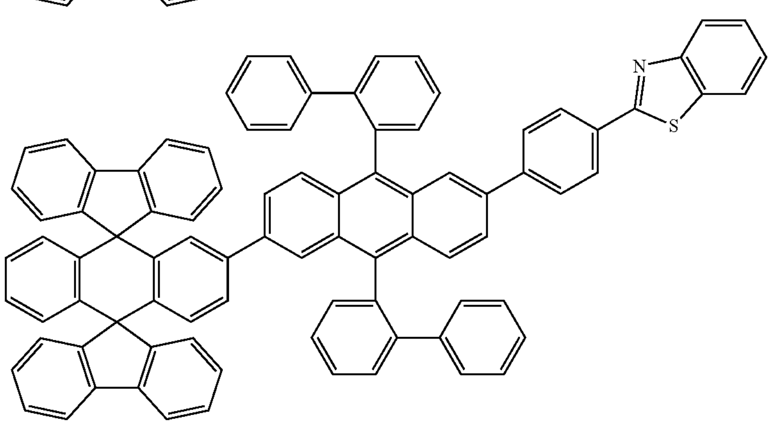

-continued
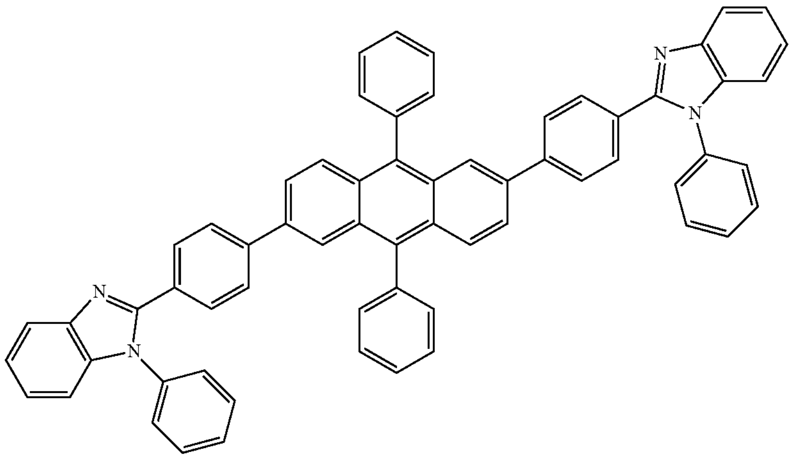
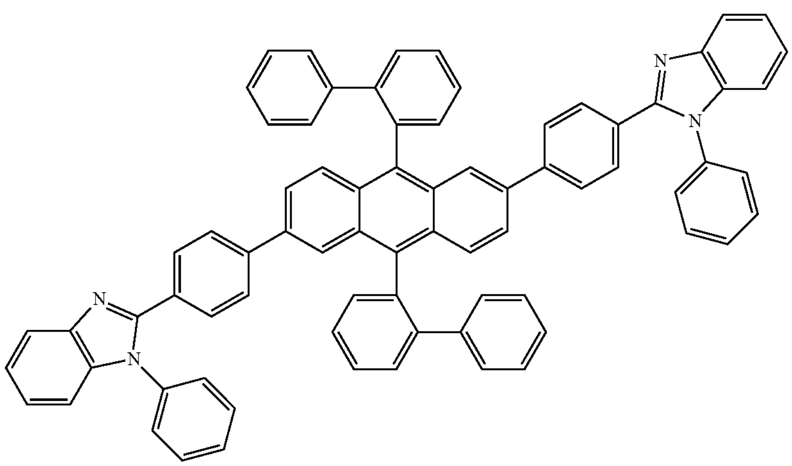
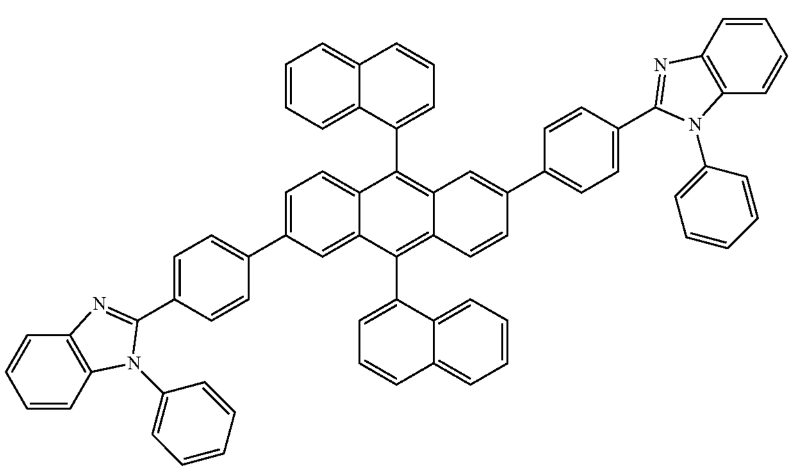

-continued
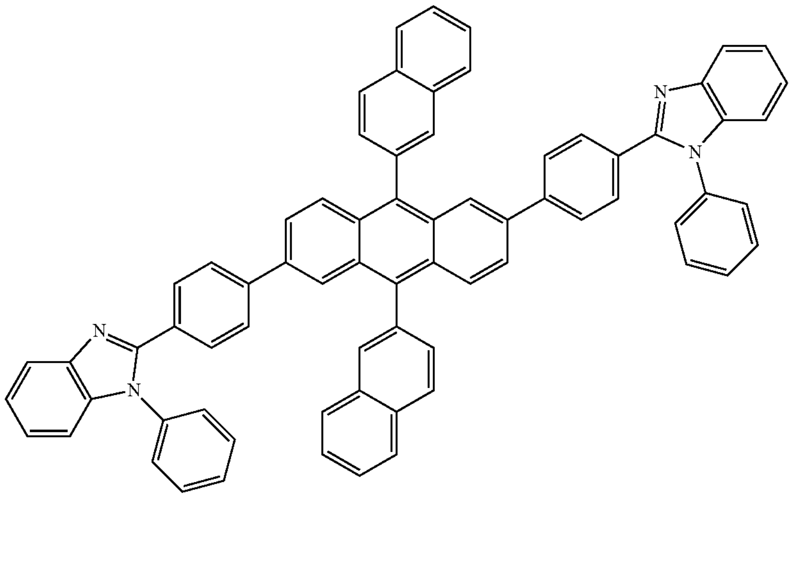
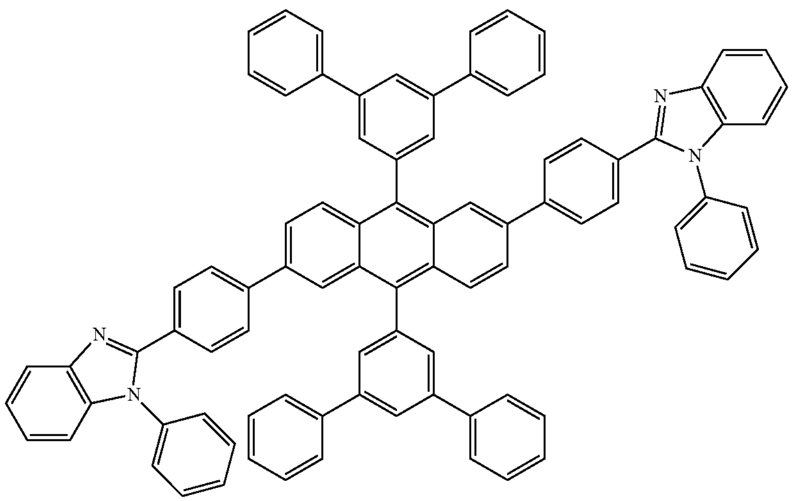
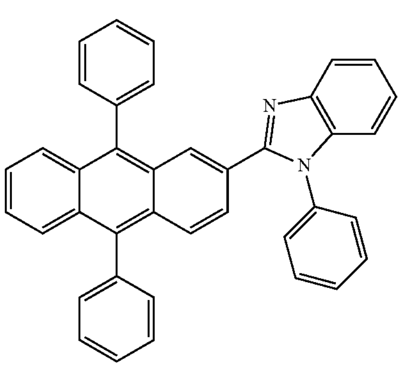
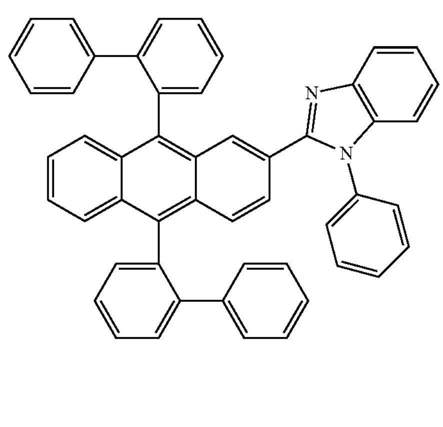

-continued
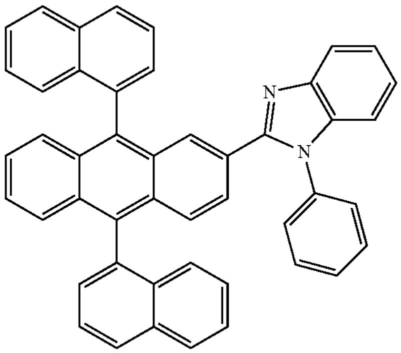
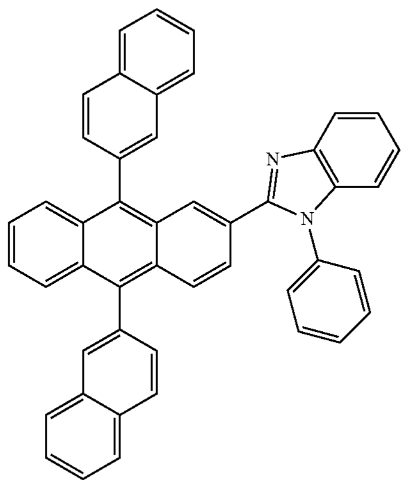
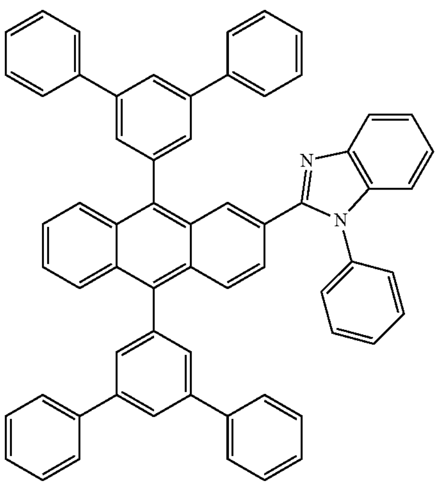
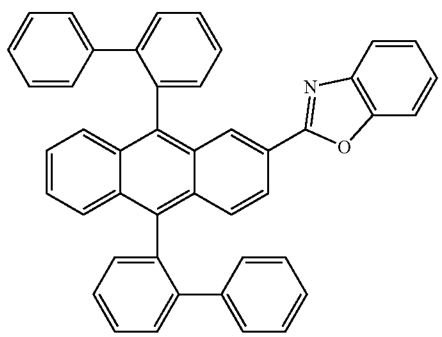
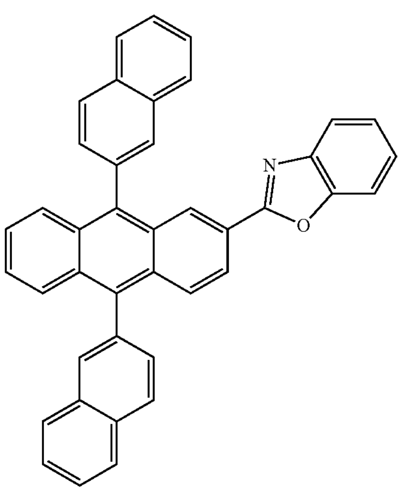
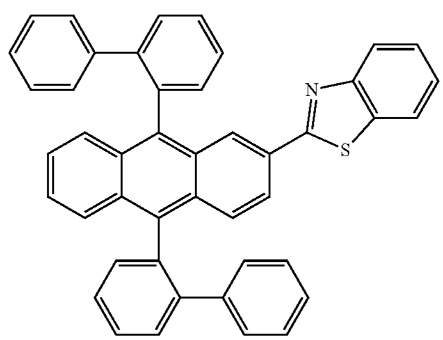

-continued
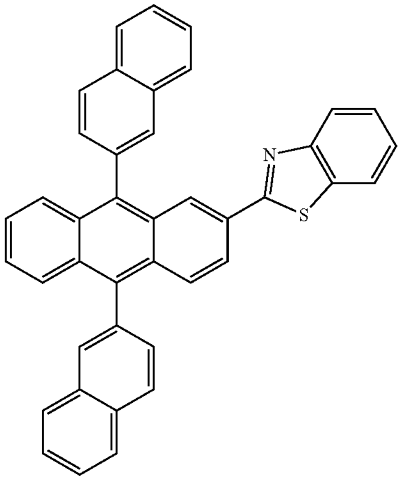
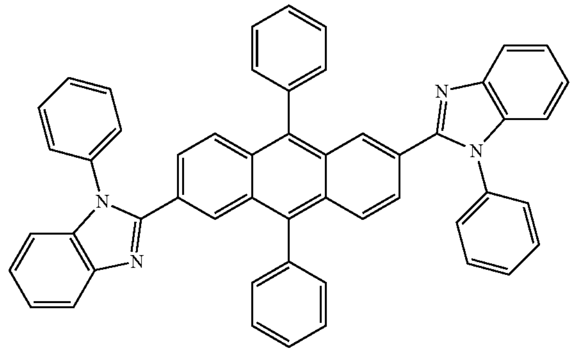
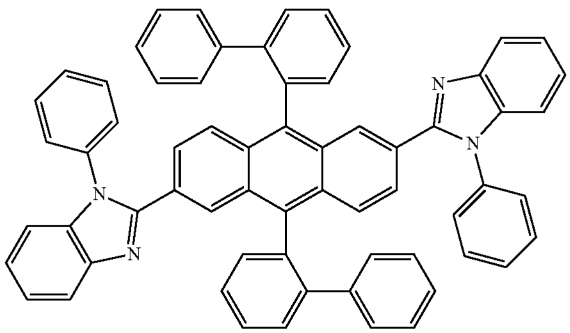
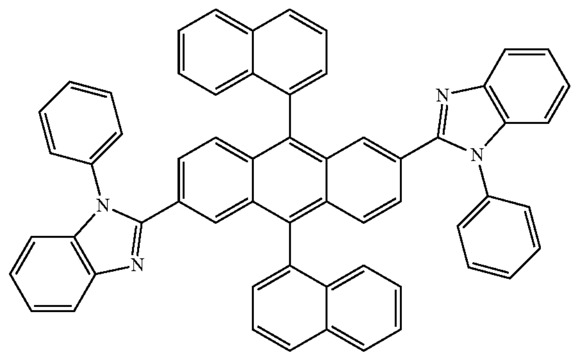
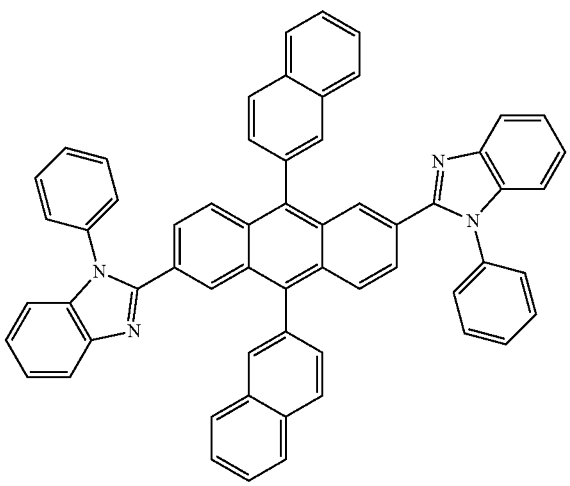
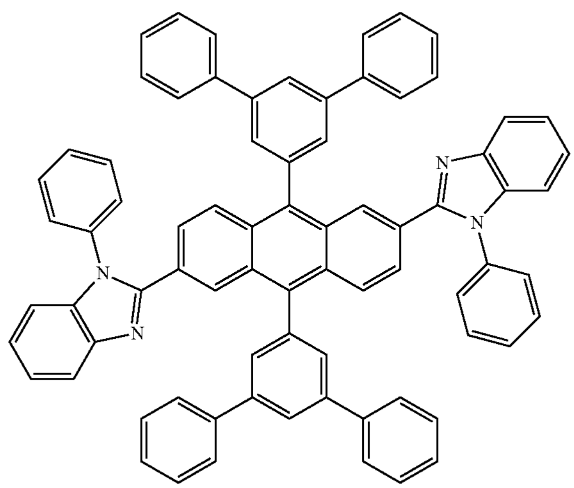
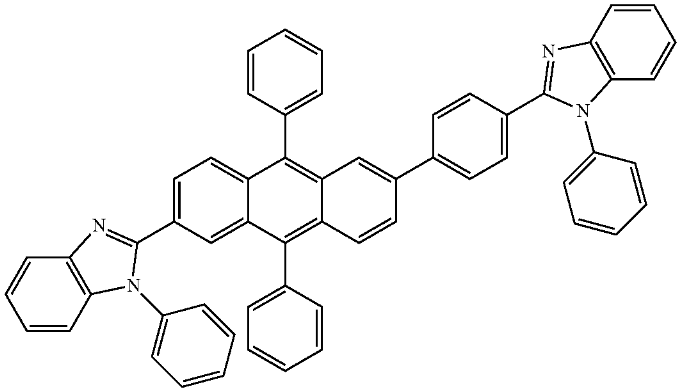

-continued
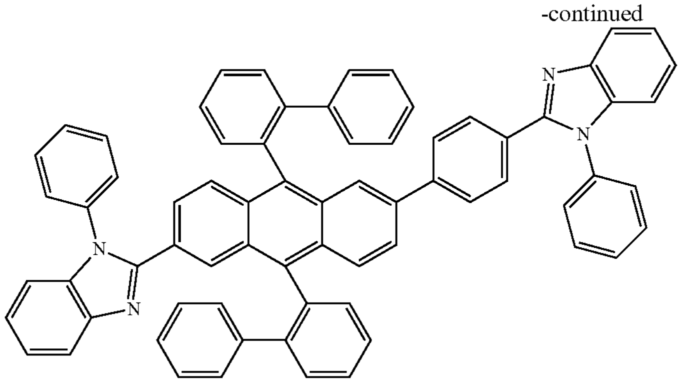
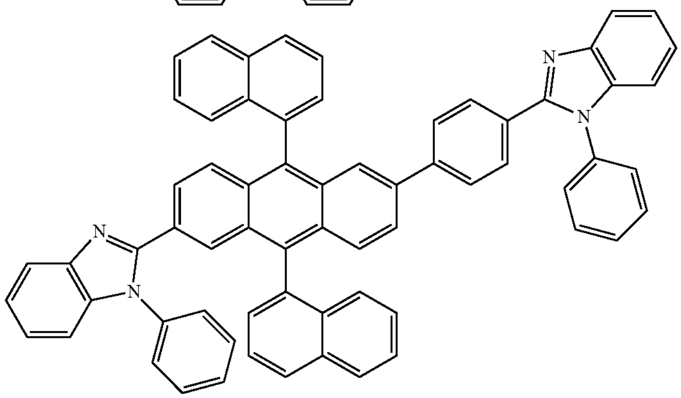
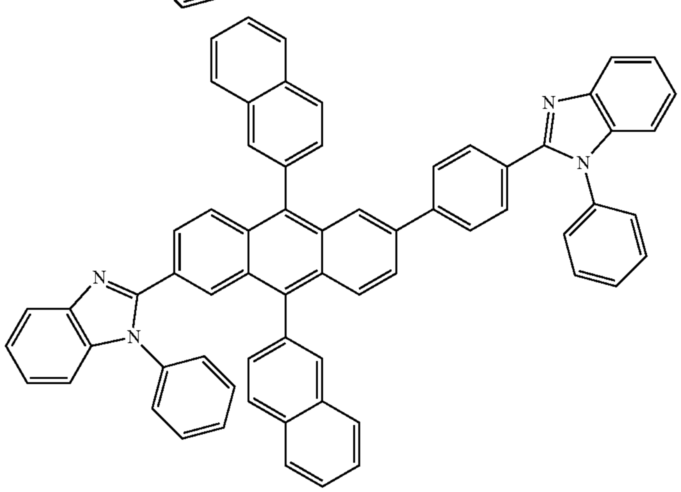
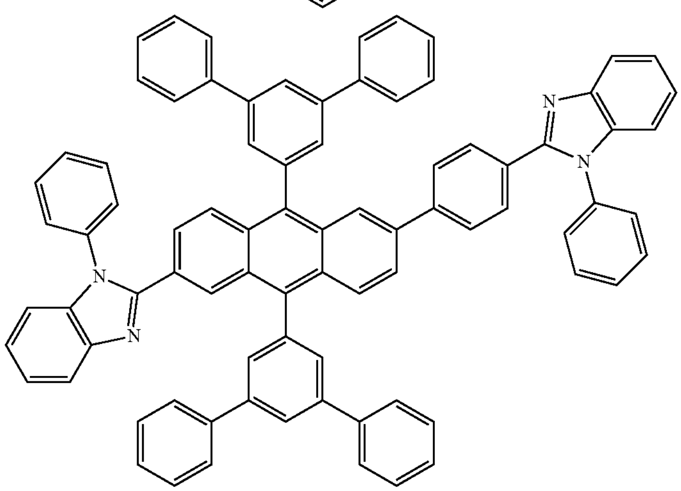

When R7 and R8 are connected to each other to form one ring in Formula 3, the compound may be represented by the following Formula 5.

[Formula 5]

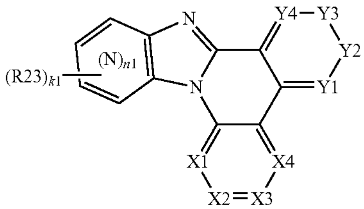

In Formula 5, X1 to X4 and Y1 to Y4 are the same as those defined in Formula 3,

N in $(N)_{n1}$ means a nitrogen atom, and indicates that a nitrogen atom may replace a carbon atom in a benzene ring, n1 in $(N)_{n1}$ is an integer of 0 to 6, and R23 is the same as R9 to R16 defined in Formula 3, k1 is an integer of 0 to 4, and when k1 is an integer of 2 or higher, R11 may be different from each other.

When R7 and R8 are connected to each other to form a polycycling ring having two or more rings in Formula 3, the compound may be represented by the following Formulas 6 and 7.

[Formula 6]

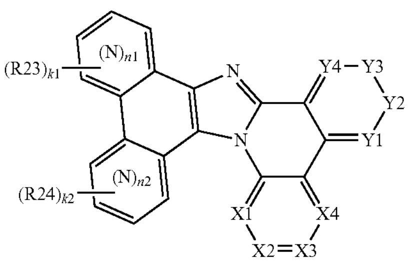

[Formula 7]

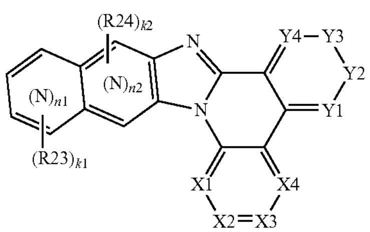

In Formulas 6 and 7, X1 to X4 and Y1 to Y4 are the same as those defined in Formula 3, N in $(N)_{n1}$ and $(N)_{n2}$ means a nitrogen atom, and indicates that a nitrogen atom may replace a carbon atom in a benzene ring, n1 in $(N)_{n1}$ is an integer of 0 to 2, and n2 in $(N)_{n2}$ is an integer of 0 to 2, R23 and R24 are the same as R9 to R16 defined in Formula 3, in Formula 6, k1 is an integer of 0 to 4 and k2 is an integer of 0 to 4, in Formula 7, k1 is an integer of 0 to 4 and k2 is an integer of 0 to 2, and when k1 is an integer of 2 or higher, R23 may be different from each other, and when k2 is an integer of 2 or higher, R24 may be different from each other.

In Formula 3, when R7 and R8 do not form a ring, R7 and R8 may be a phenyl group which is unsubstituted or substituted by R23 and R24, or a hexagonal heteroaromatic ring group that comprises a substituted or unsubstituted nitrogen (N) atom. For example, Formula 3 may be represented by the following Formula 8.

[Formula 8]

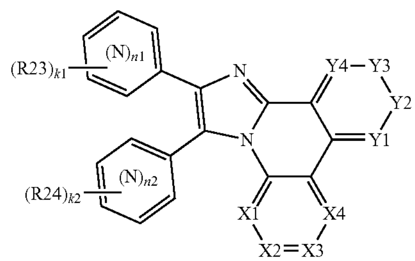

In Formula 8, X1 to X4 and Y1 to Y4 are the same as those defined in Formula 3,

N in $(N)_{n1}$ and $(N)_{n2}$ means a nitrogen atom, and indicates that a nitrogen atom may replace a carbon atom in a benzene ring, n1 in $(N)_{n1}$ is an integer of 0 to 2, and n2 in $(N)_{n2}$ is an integer of 0 to 2, R23 and R24 are the same as R9 to R16 defined in Formula 3, K1 is an integer of 0 to 4 and k2 is an integer of 0 to 4, and when k1 is an integer of 2 or higher, R23 may be different from each other, and when k2 is an integer of 2 or higher, R24 may be different from each other.

Specific examples of the compounds in Formulas 3, 5, 6, 7, and 8 are as follows, but are not limited thereto.

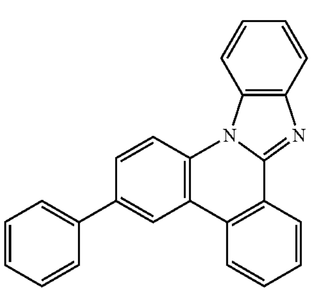

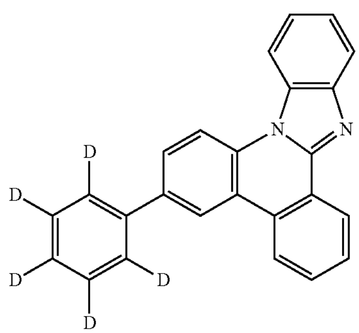

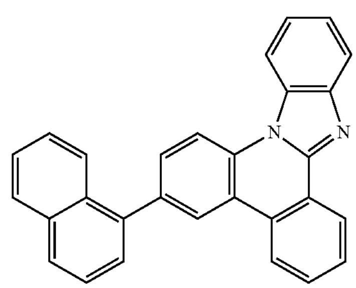

-continued
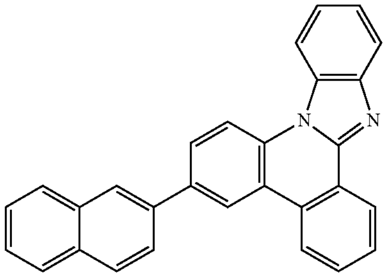
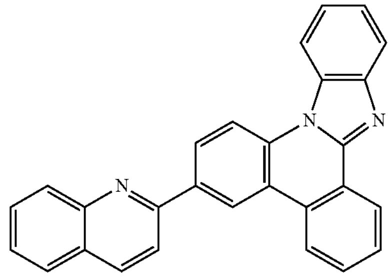
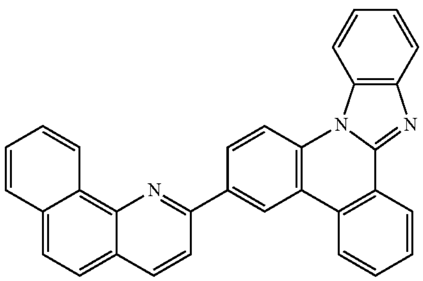
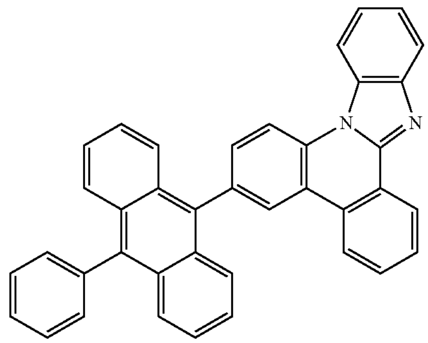
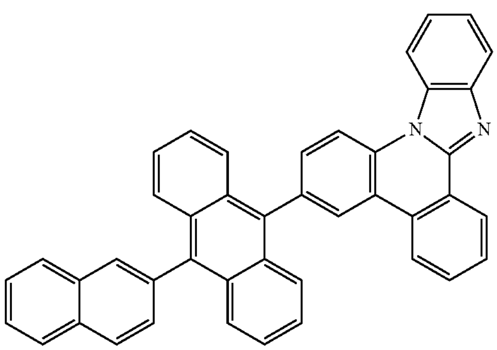
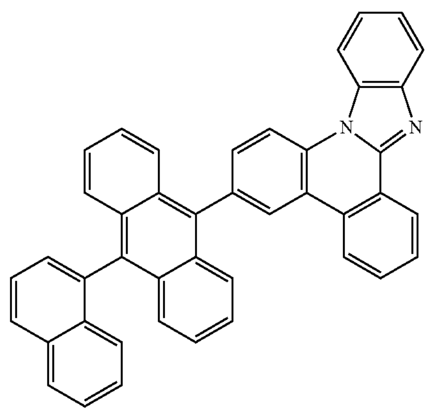
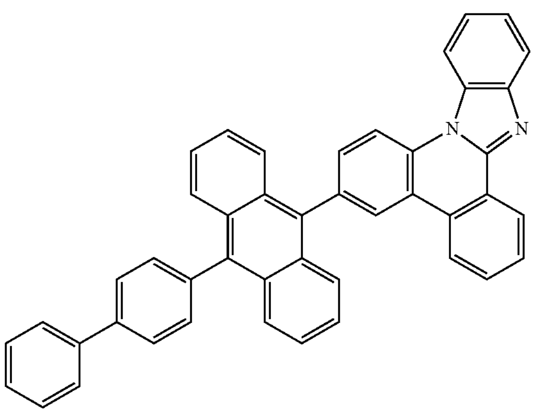
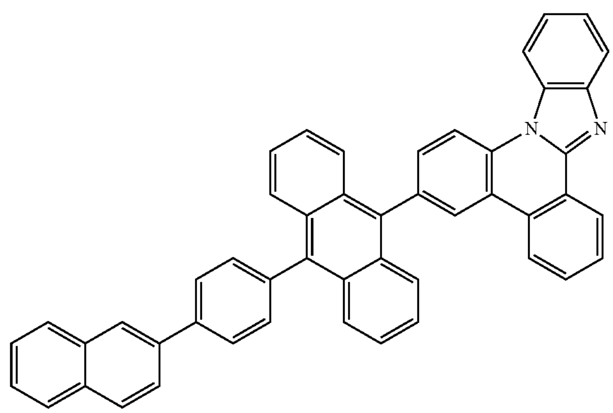

-continued
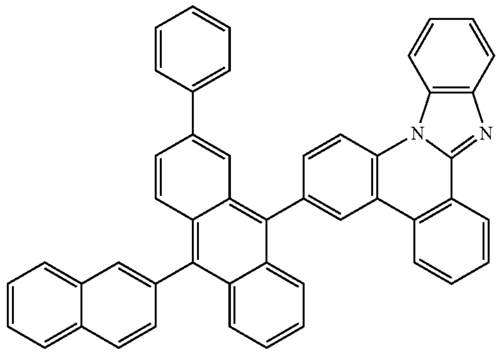
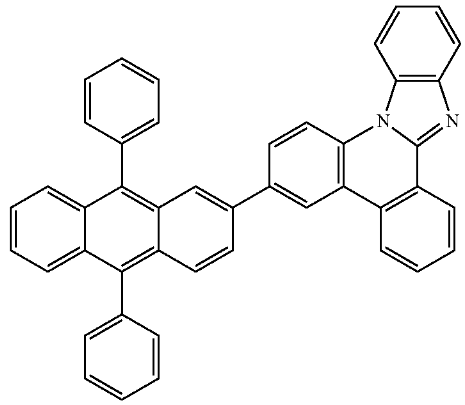
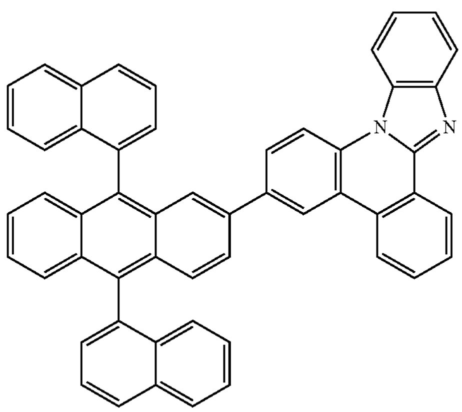
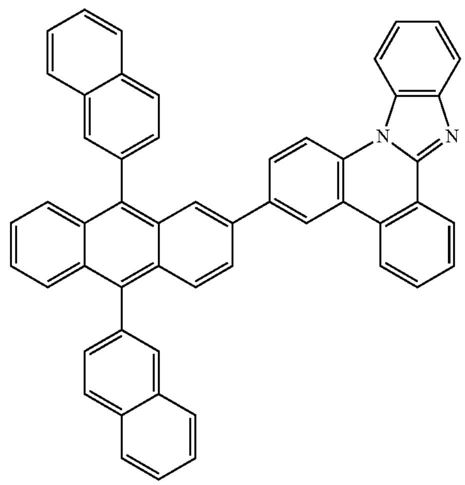
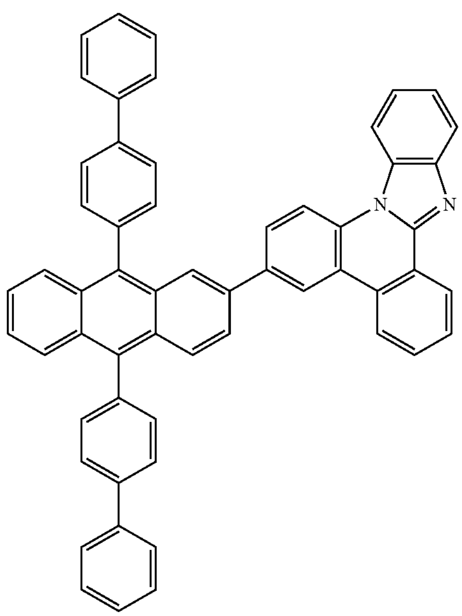
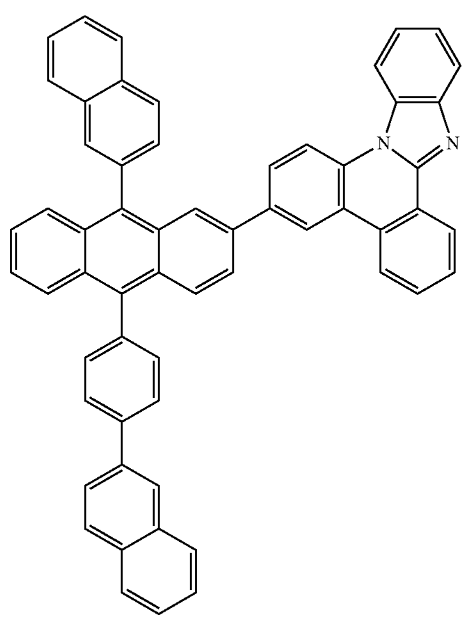

-continued
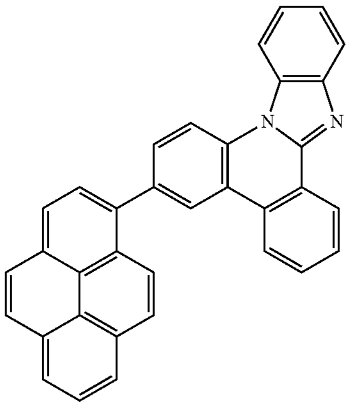
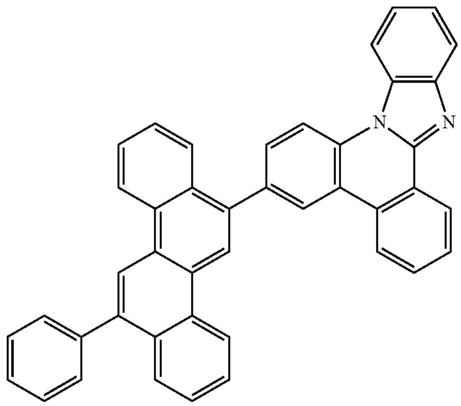
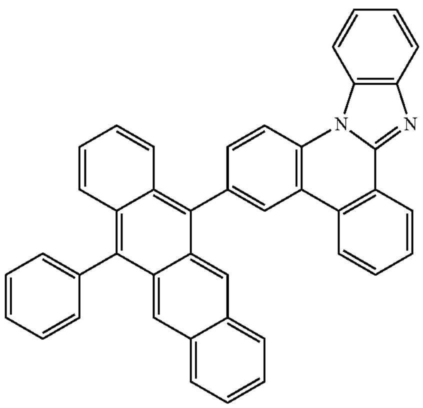
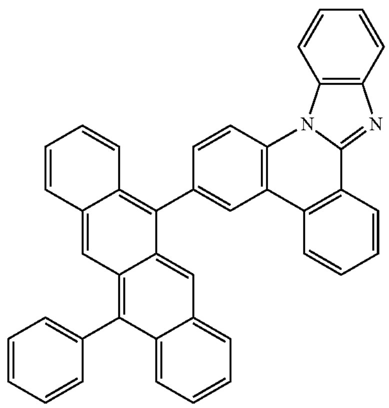
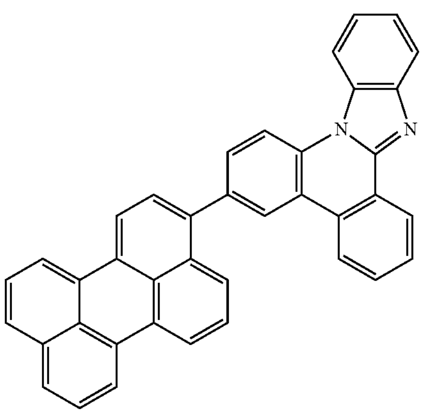
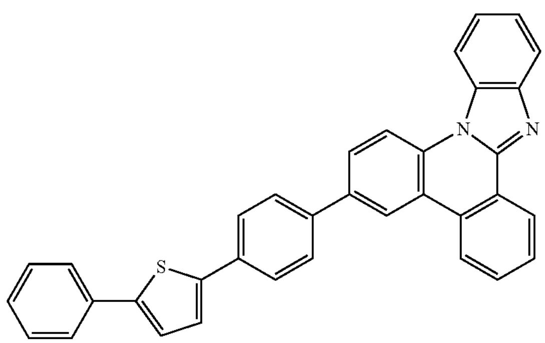
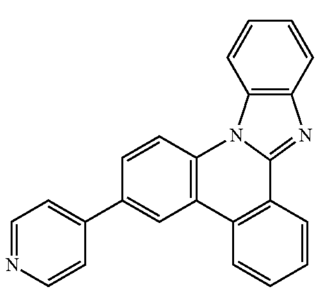
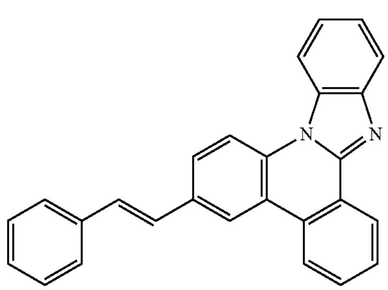

-continued
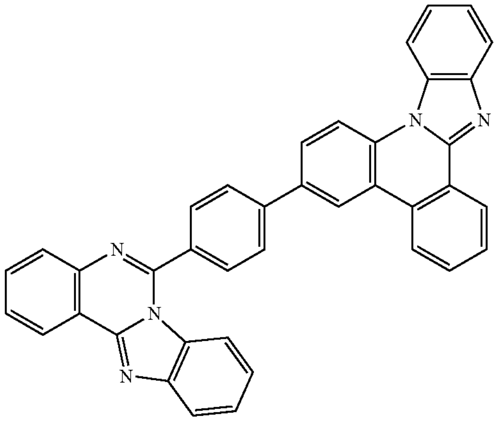
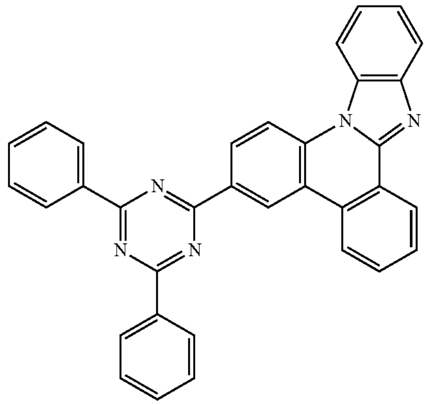
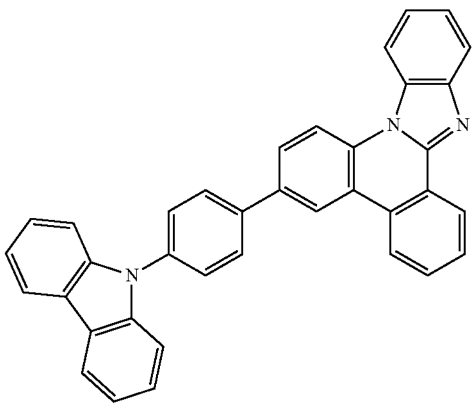
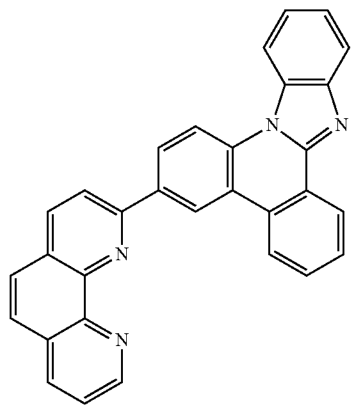
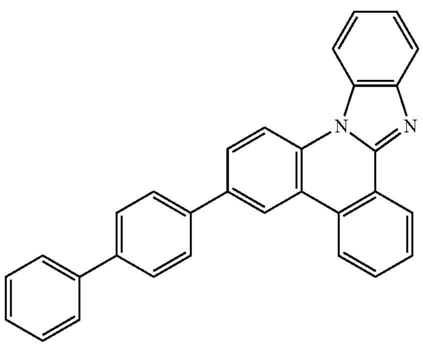
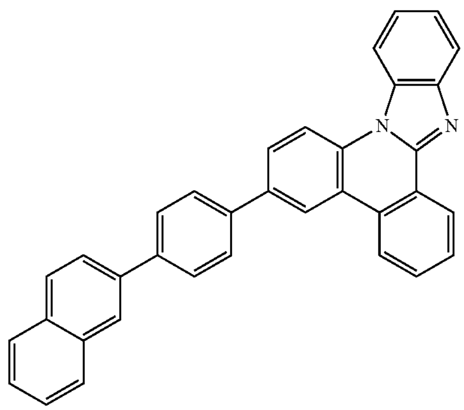
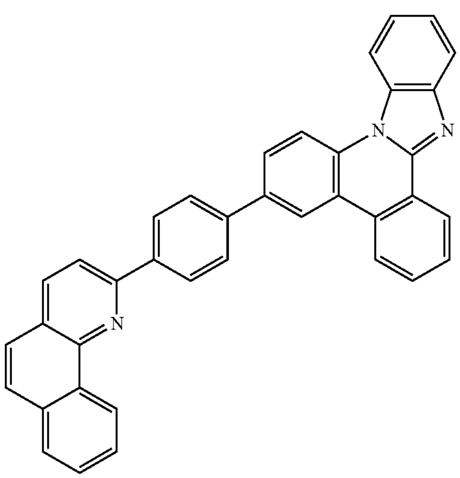
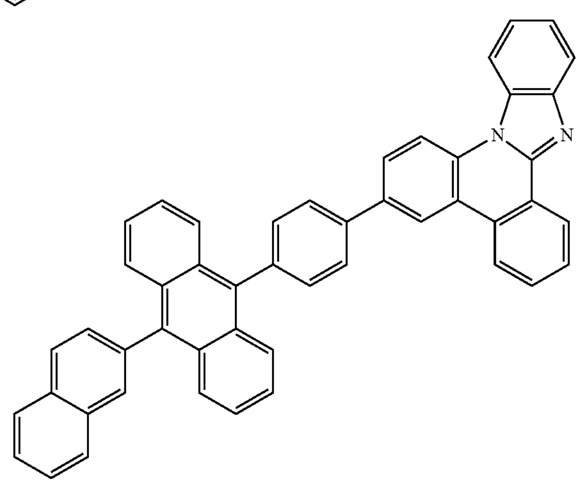

-continued
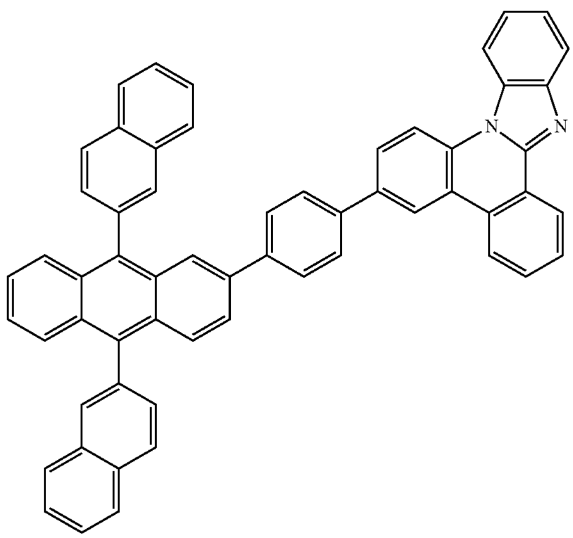
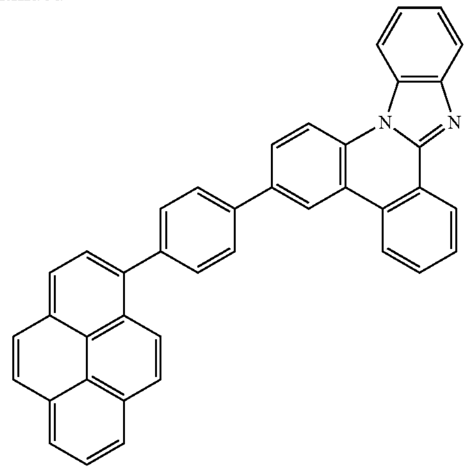
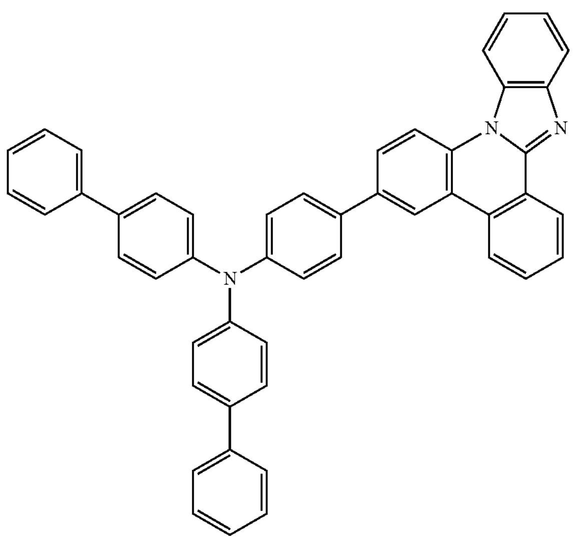
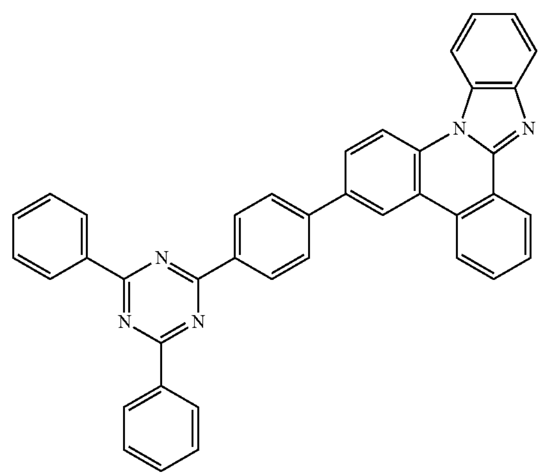
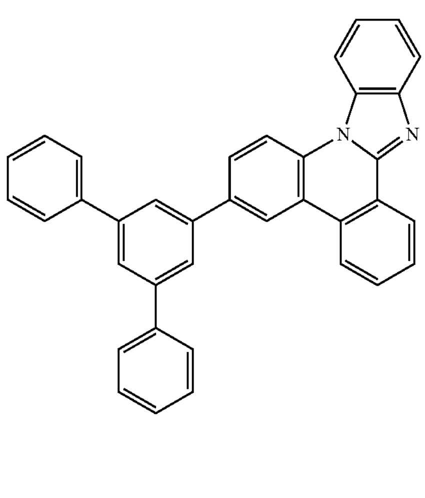
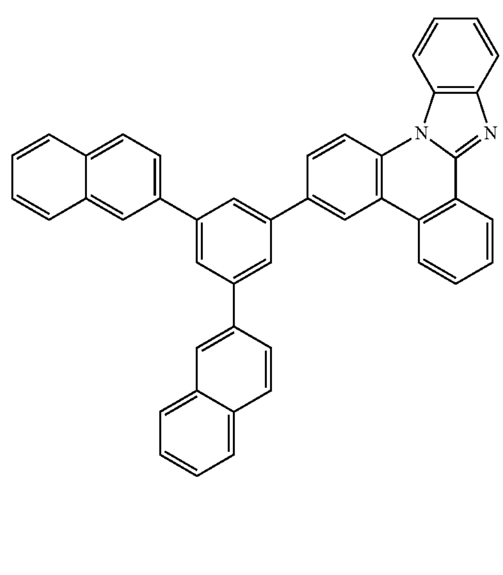

-continued
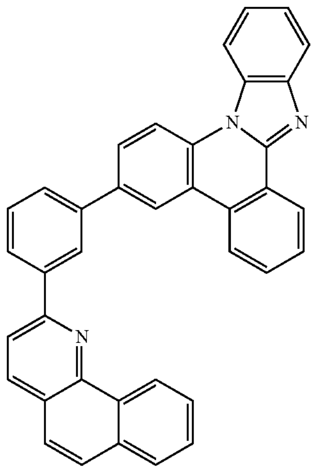
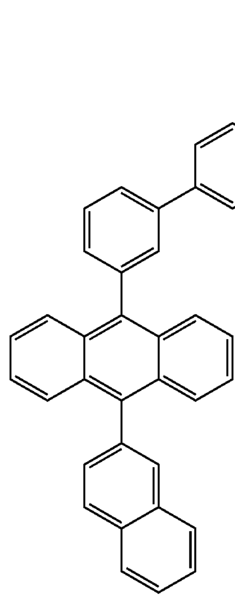
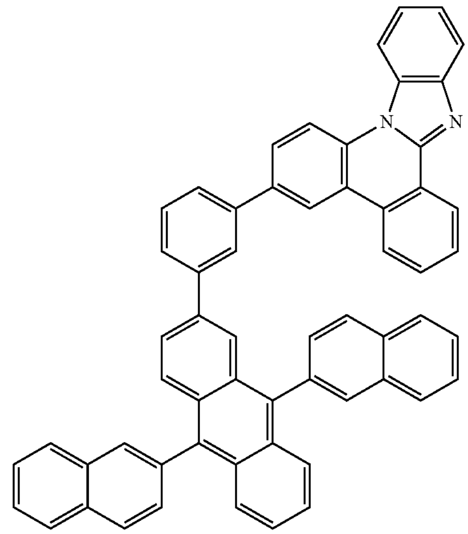
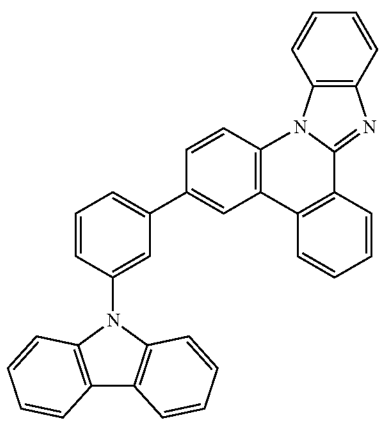
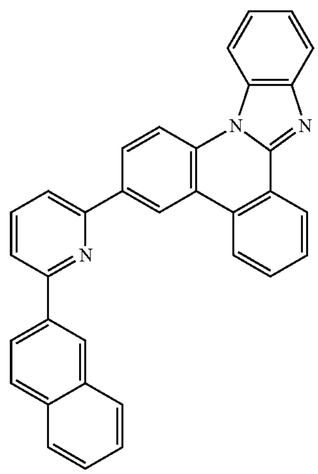
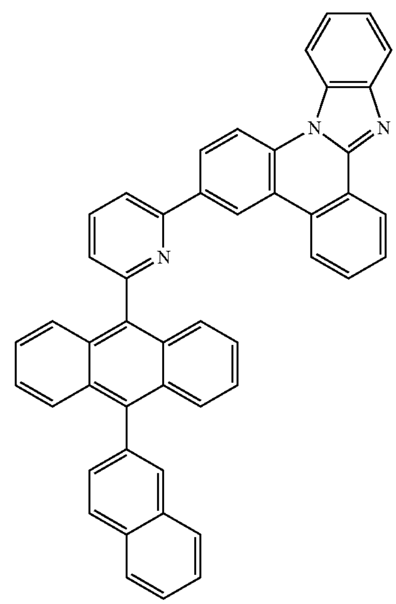
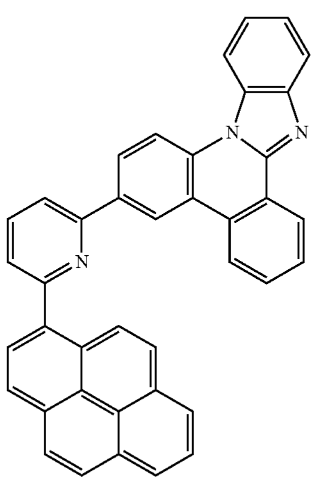
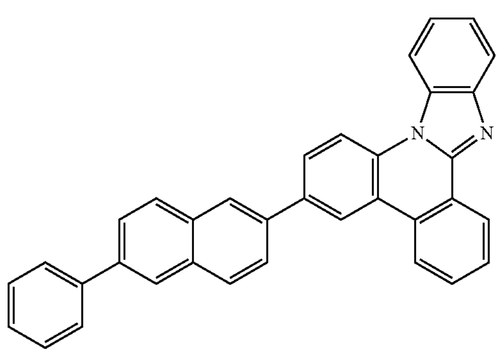

-continued
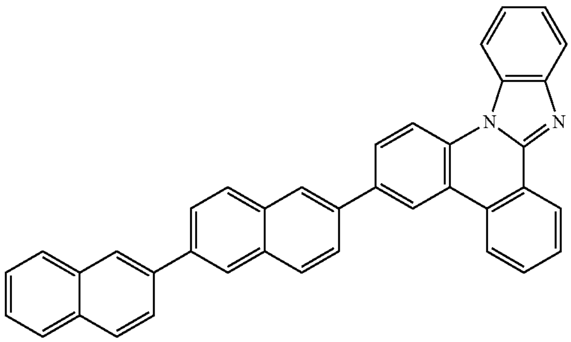
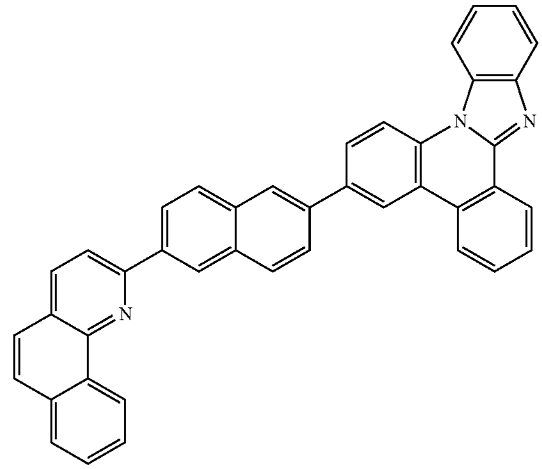
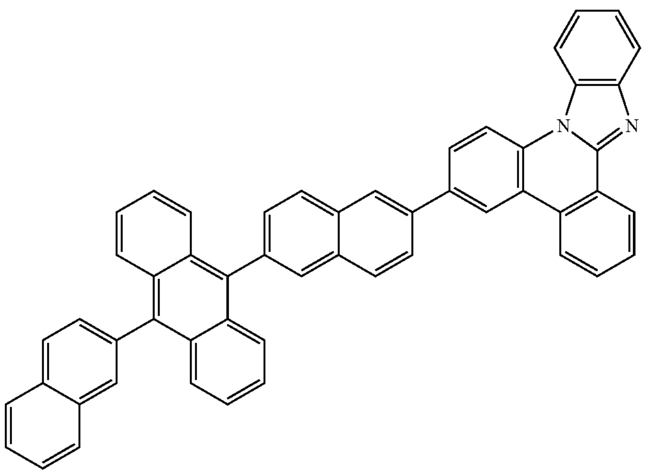
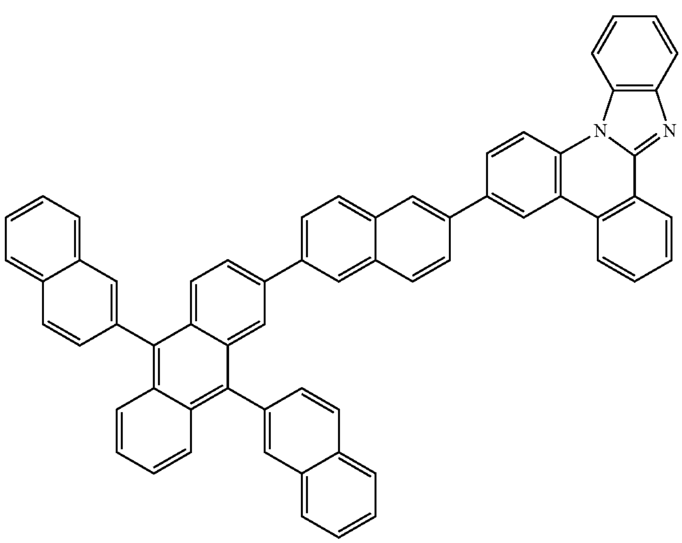

-continued
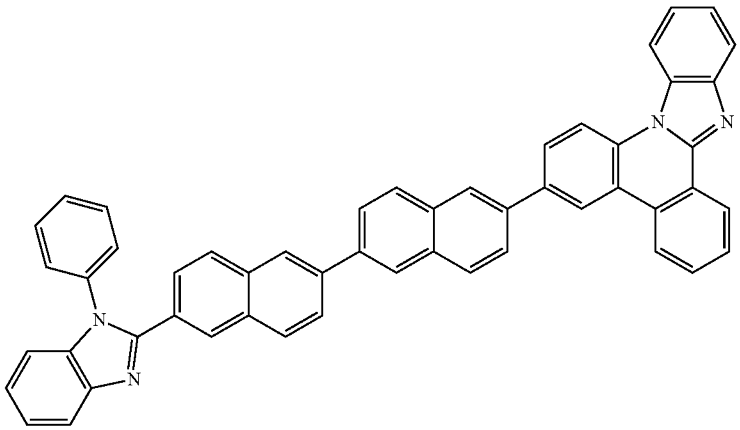
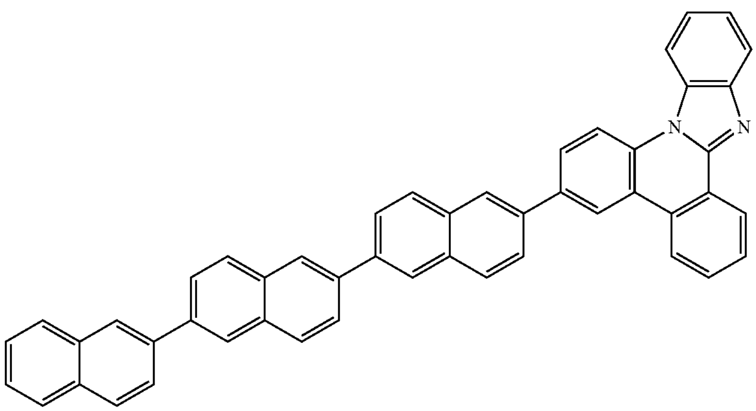
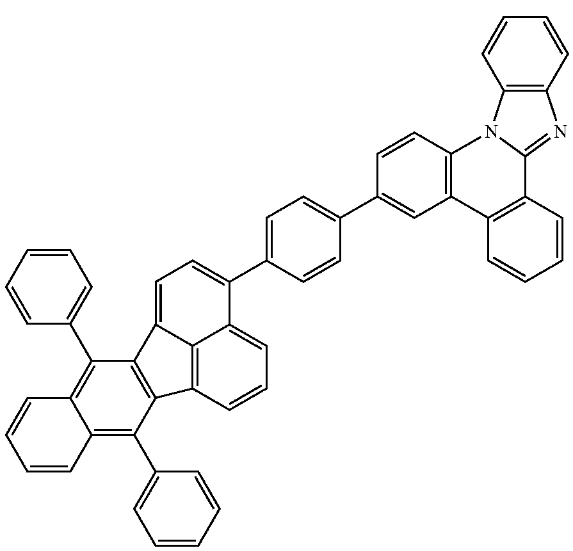
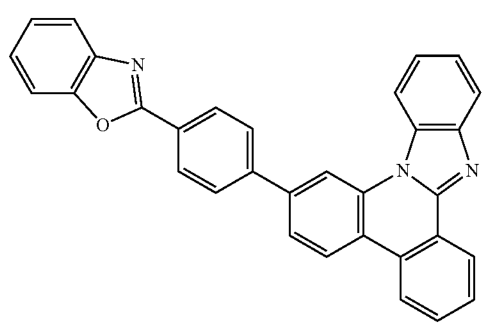

-continued
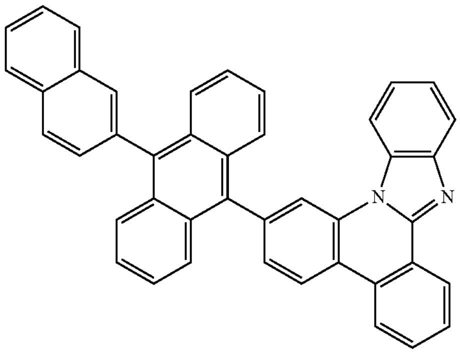
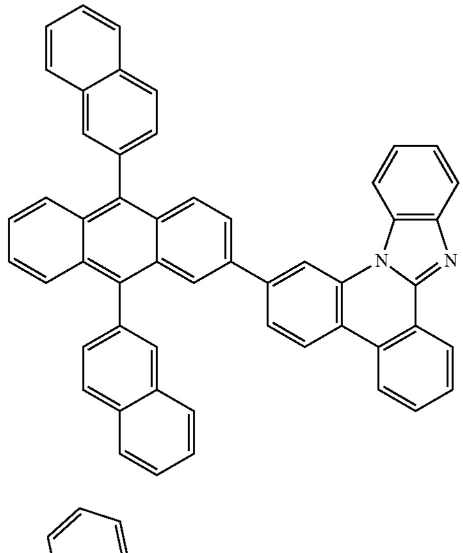
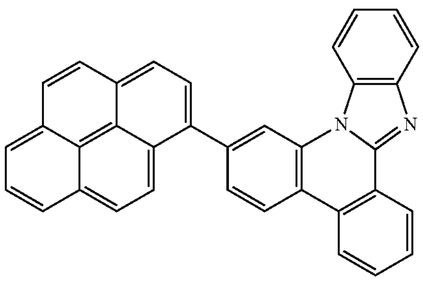
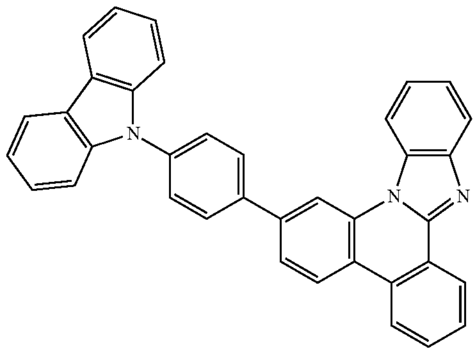
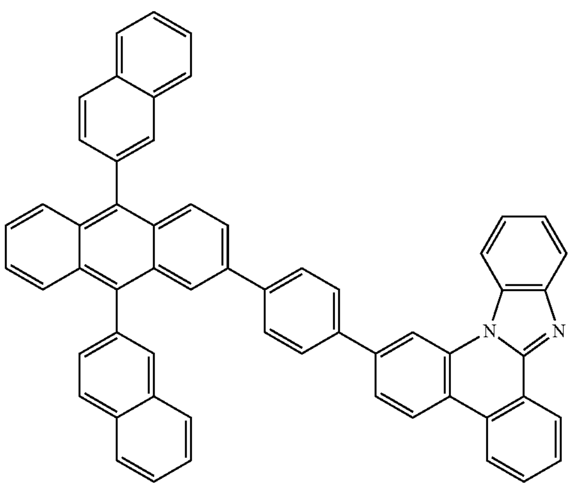
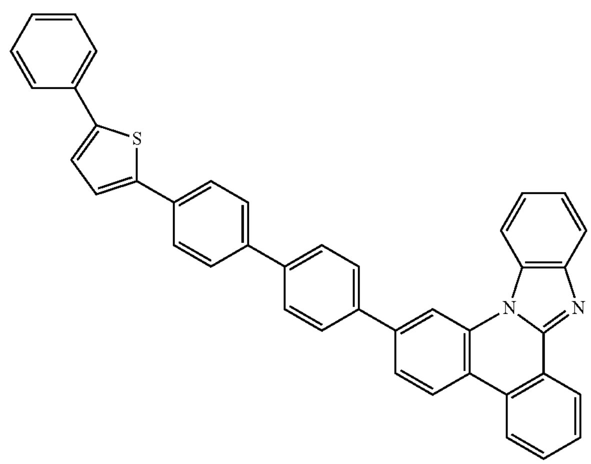
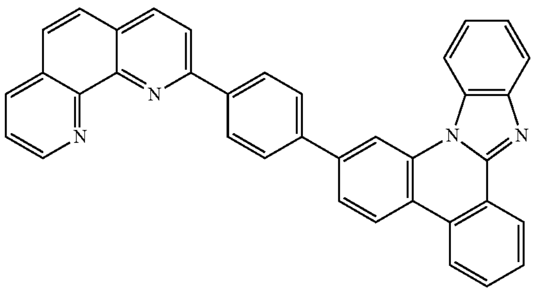
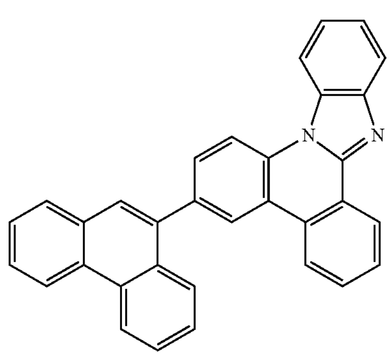

-continued
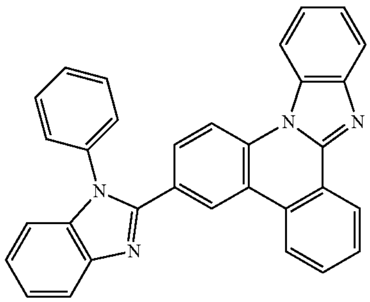
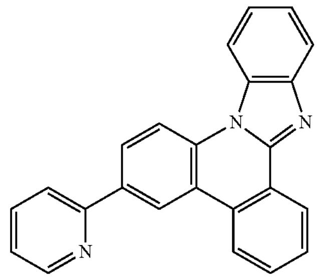
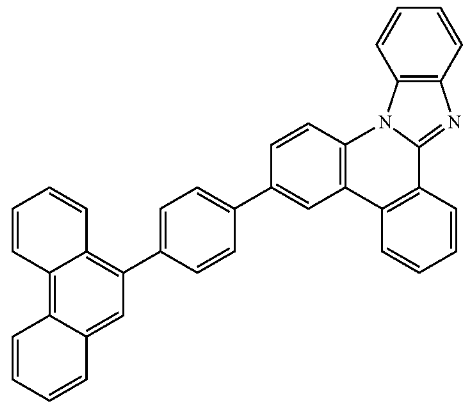
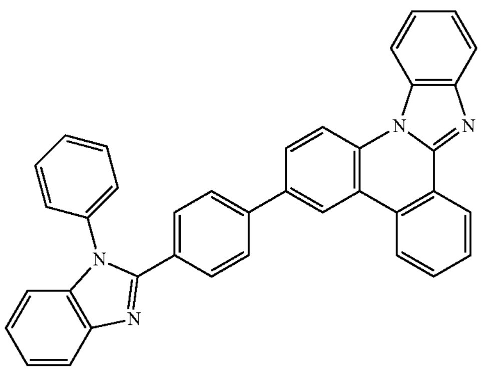
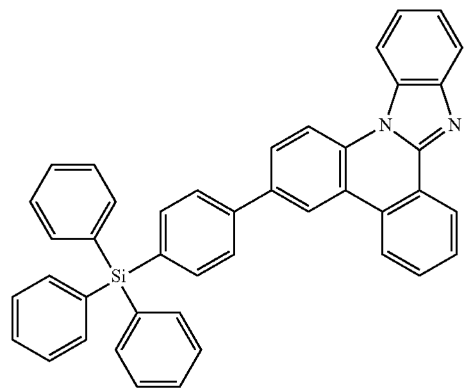
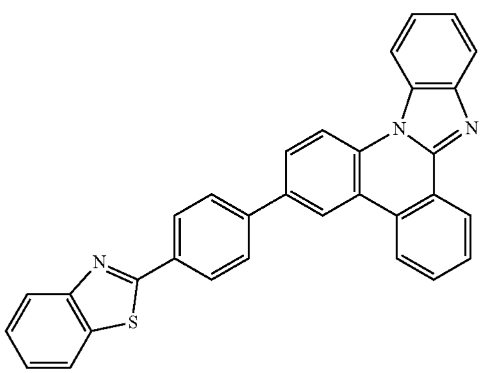
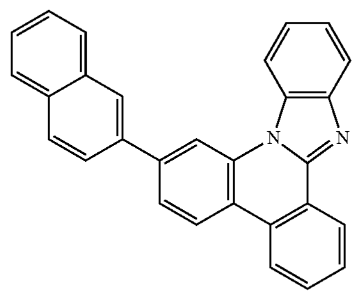
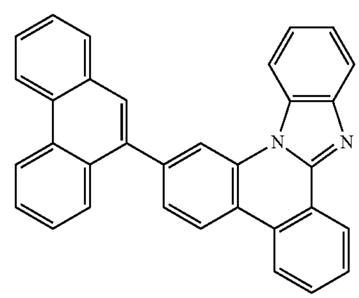
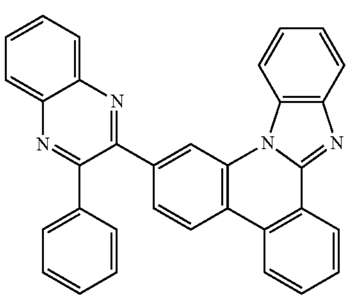
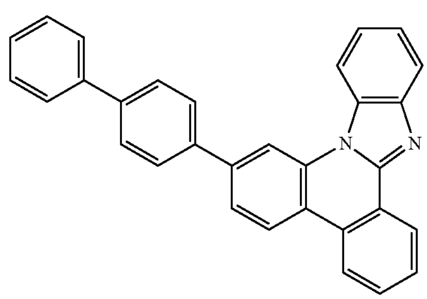

-continued
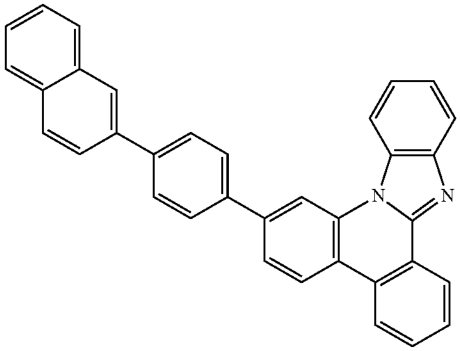
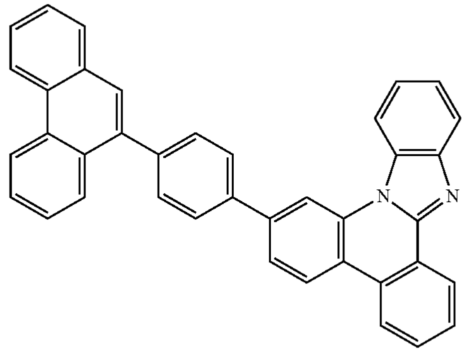
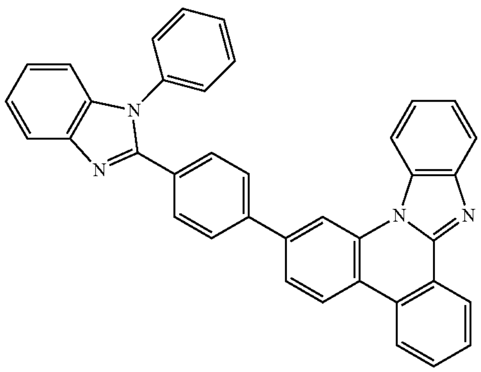
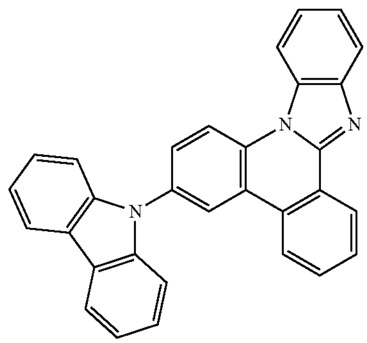
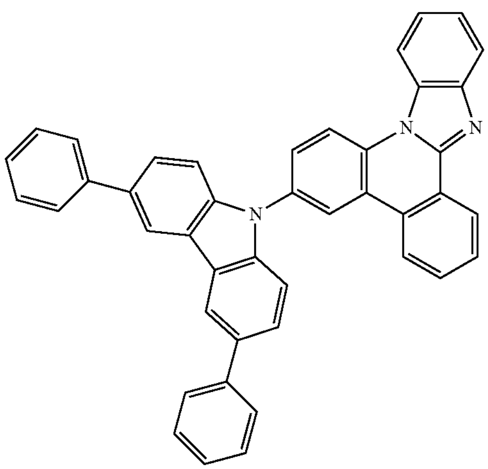
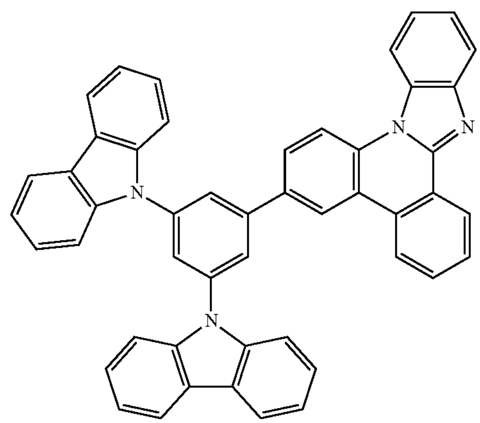
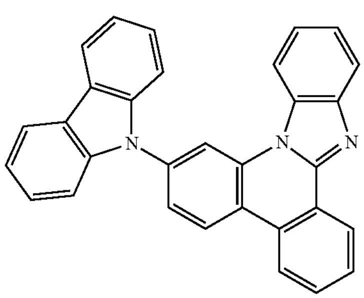
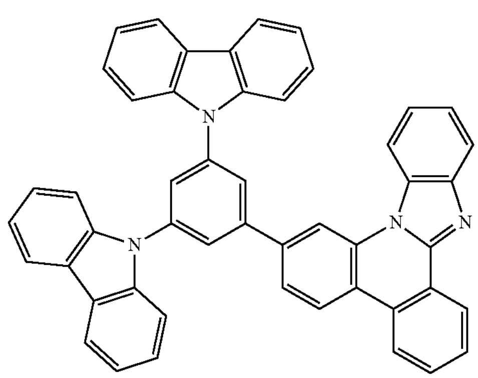

-continued
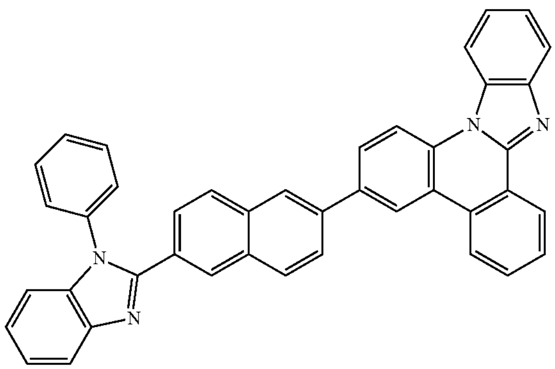
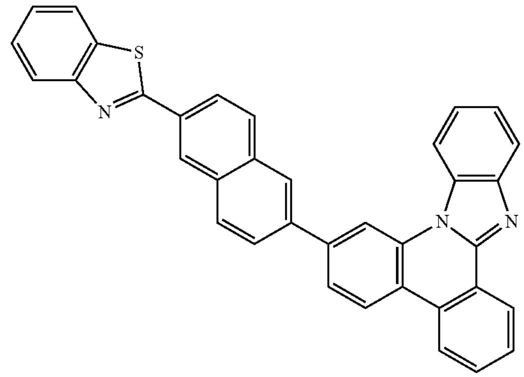
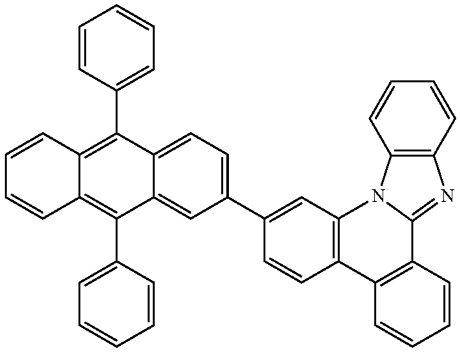
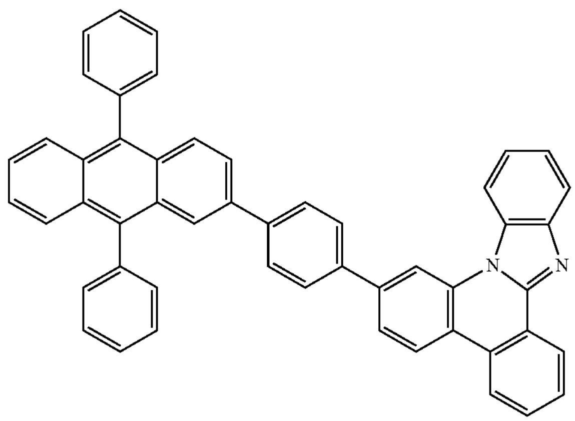
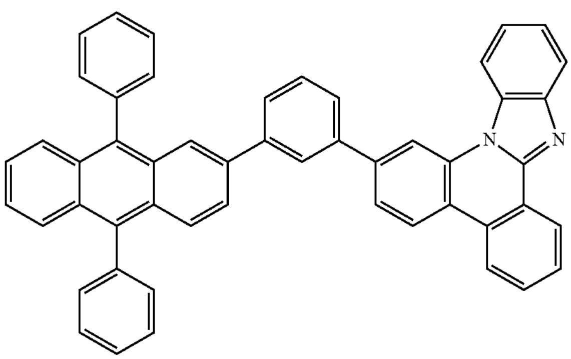
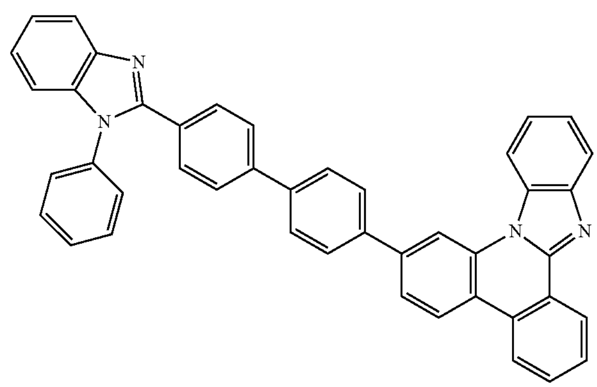
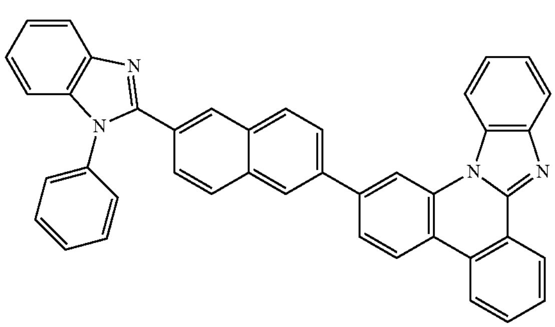
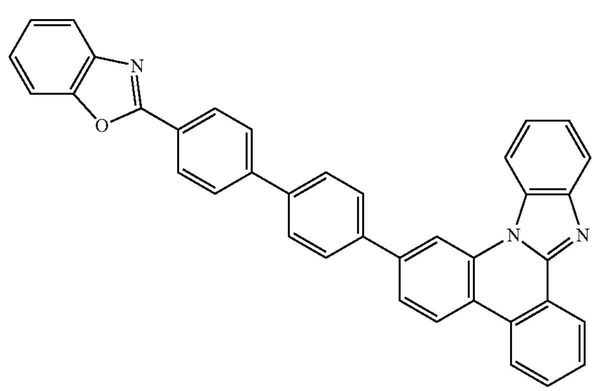

-continued
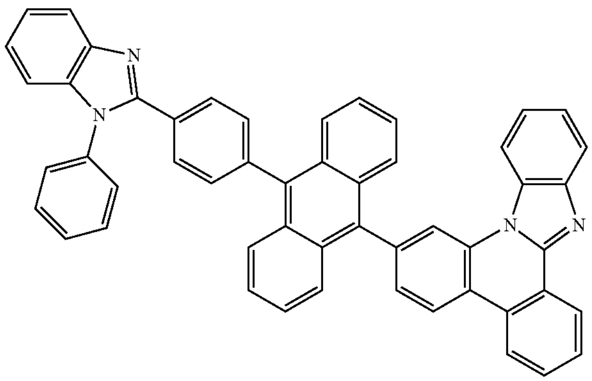
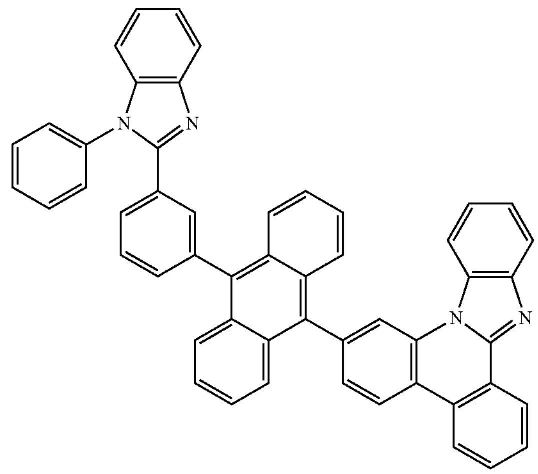
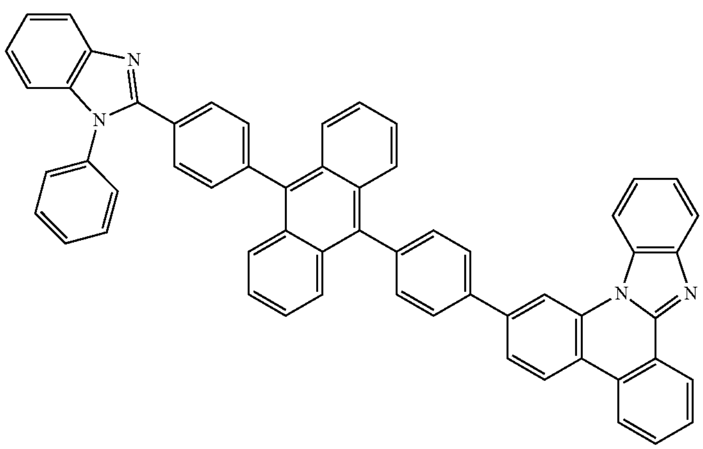
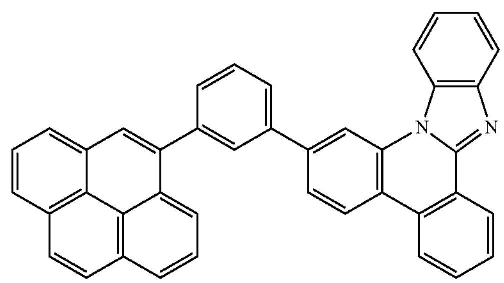
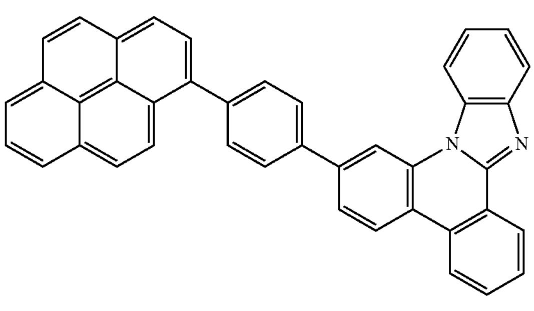
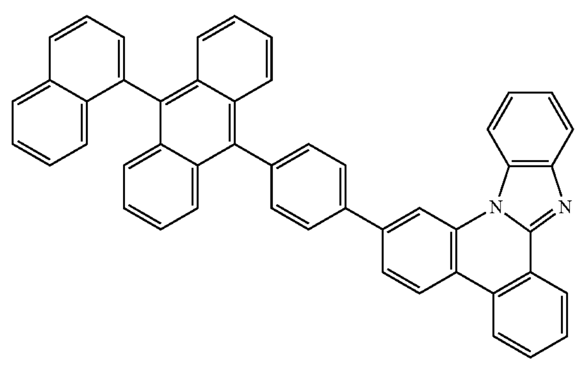
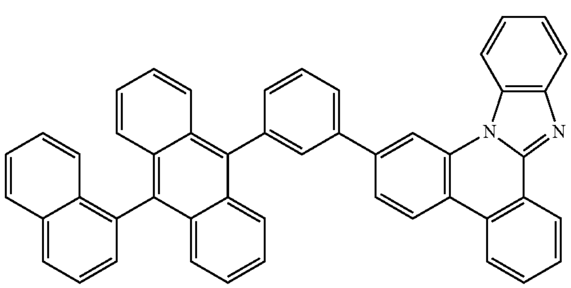
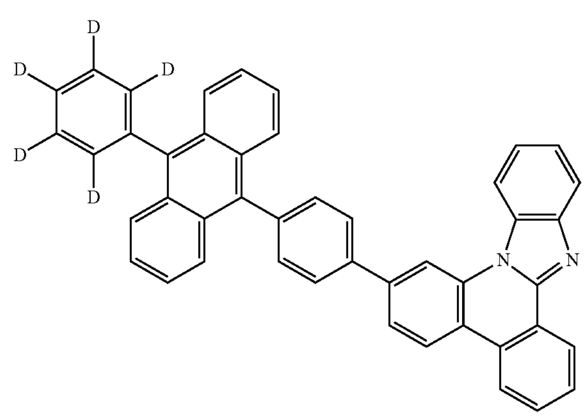

-continued
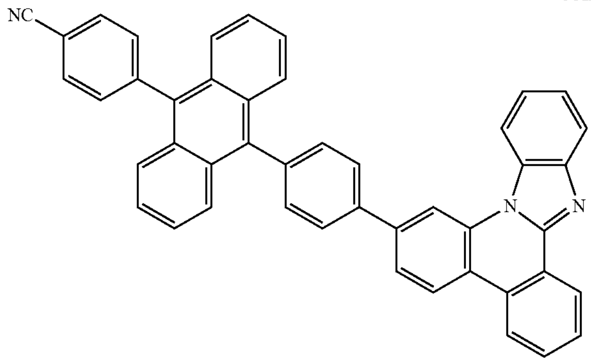
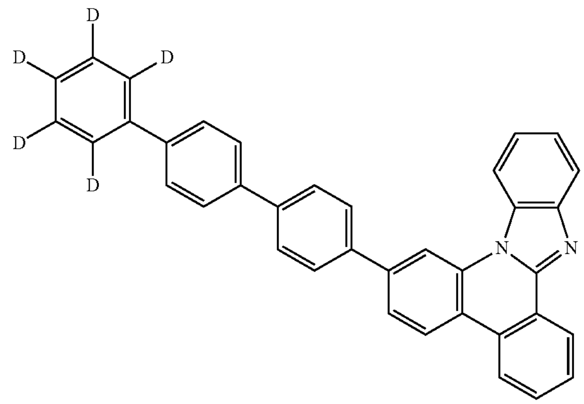
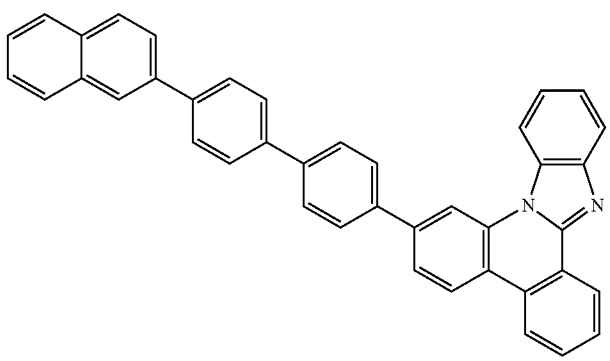
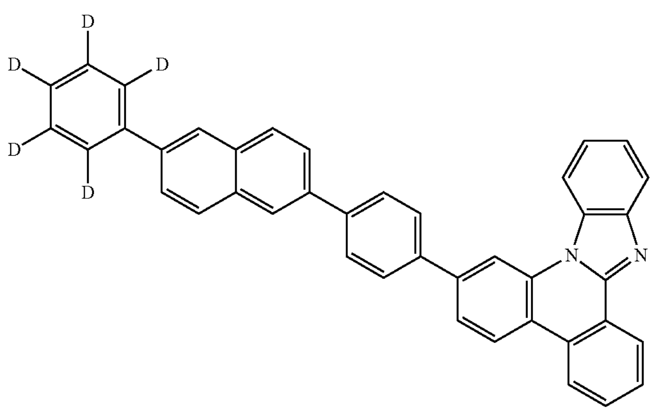
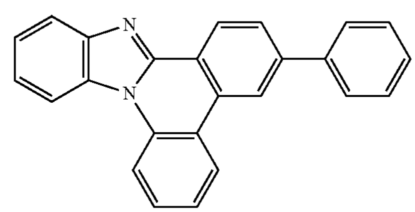
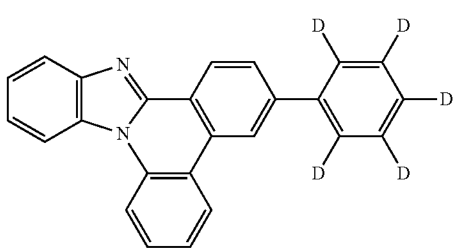
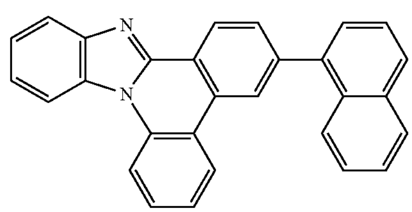
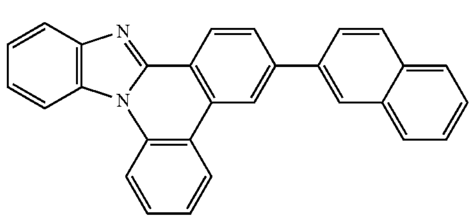
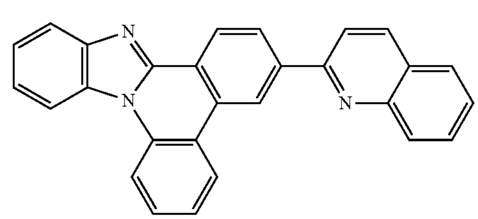

-continued
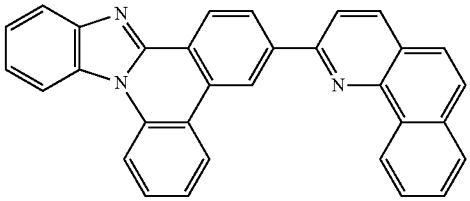
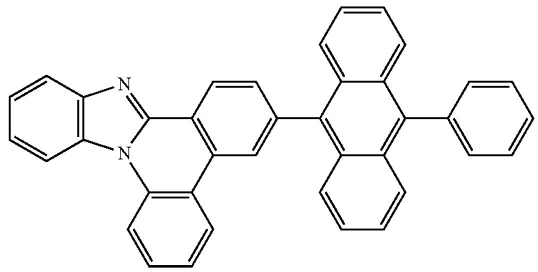
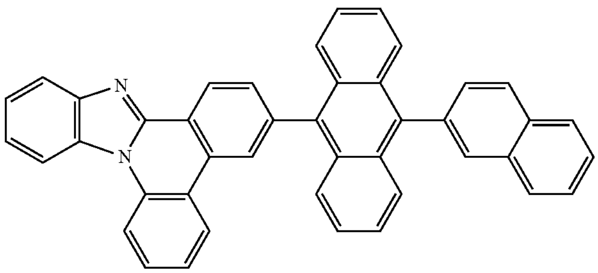
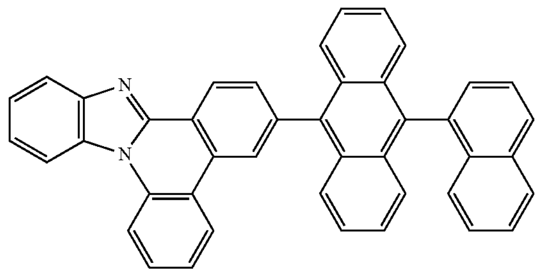
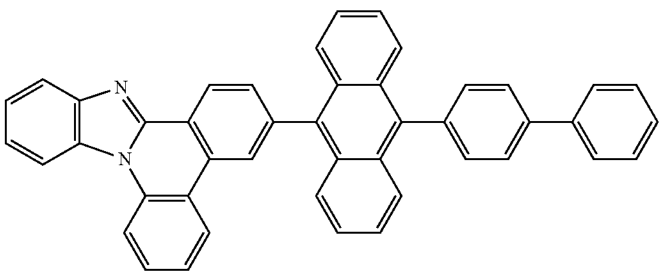
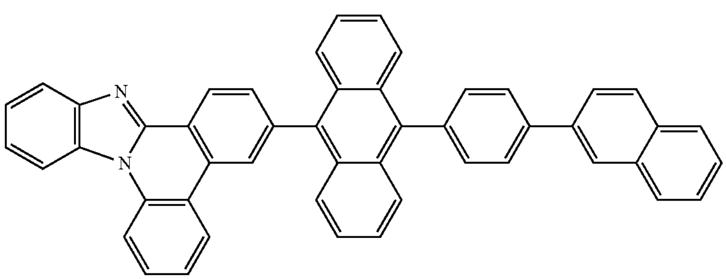
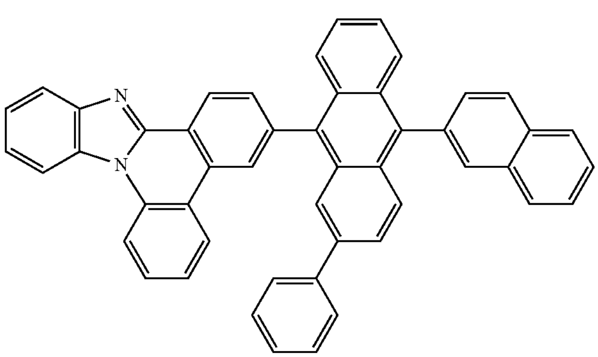
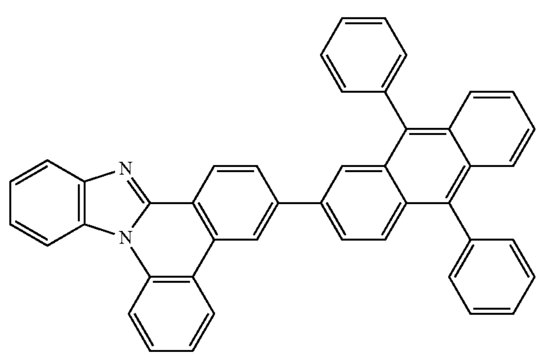

-continued
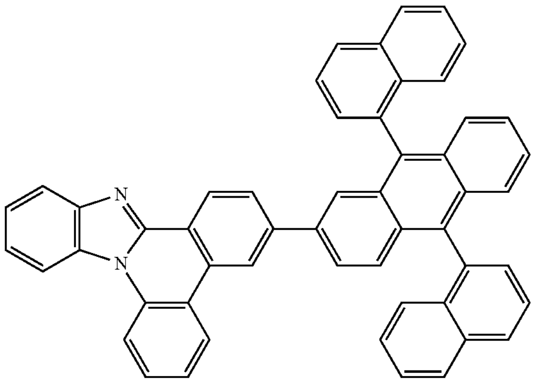
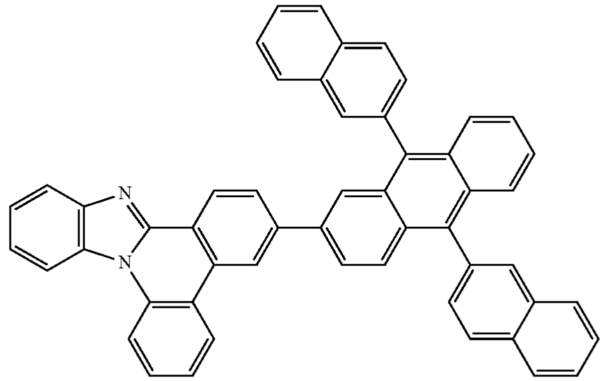
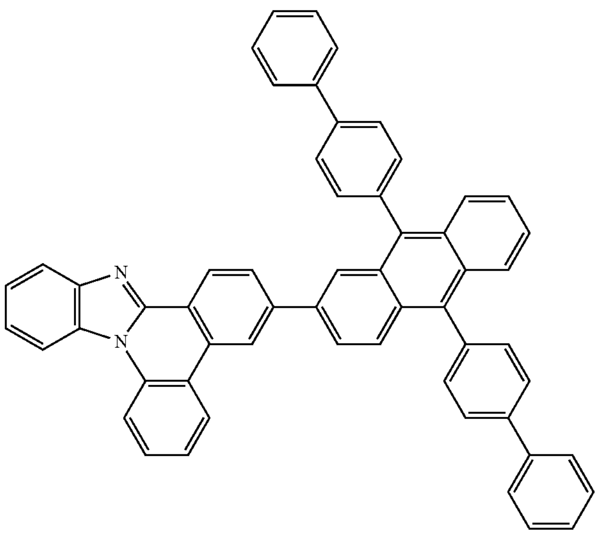
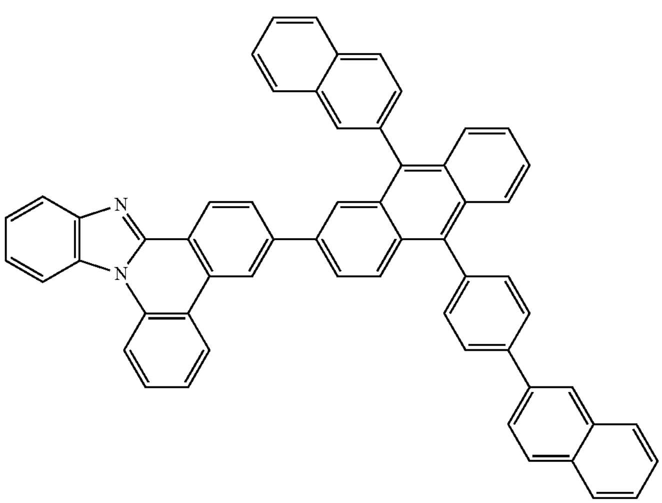
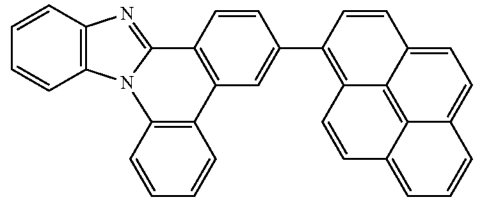

-continued
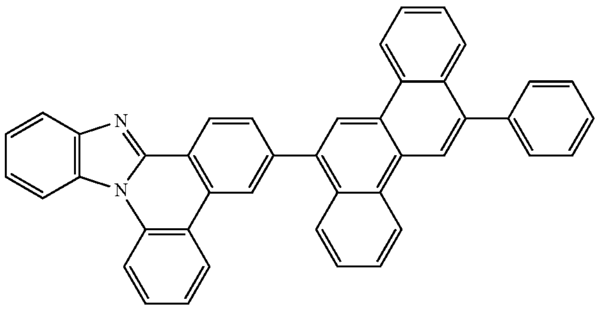
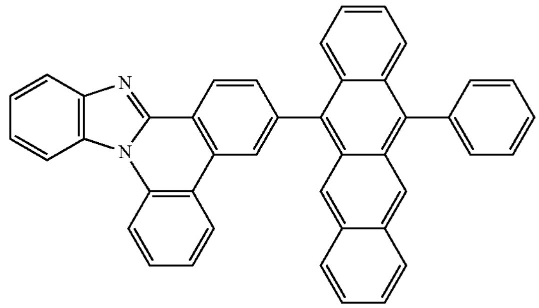
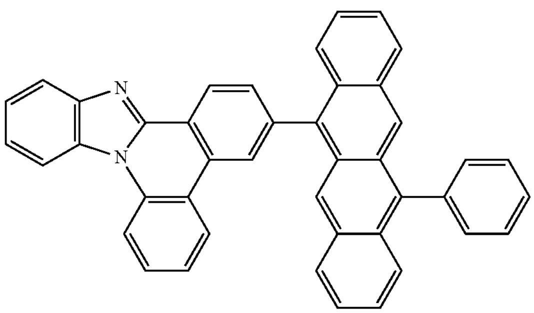
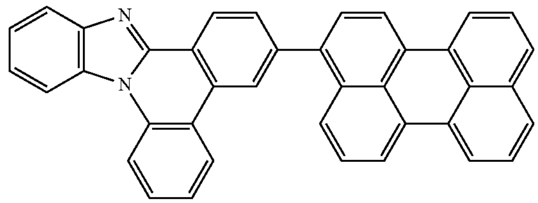
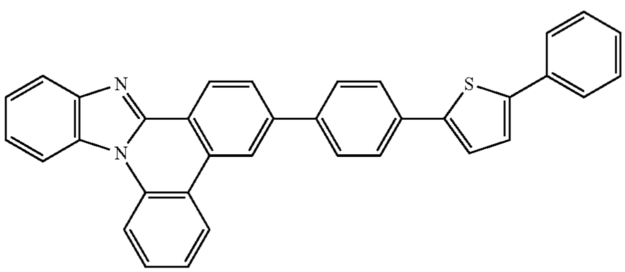
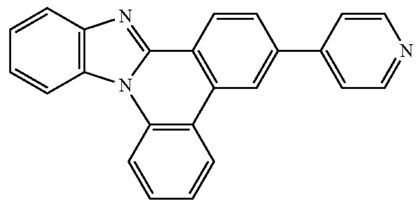
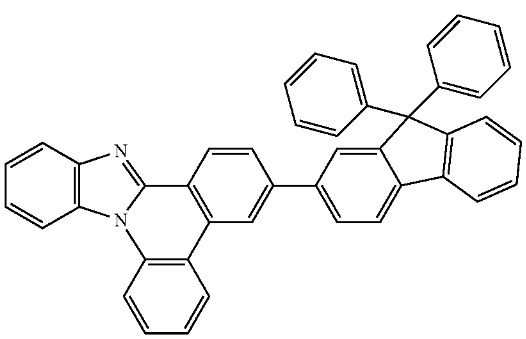
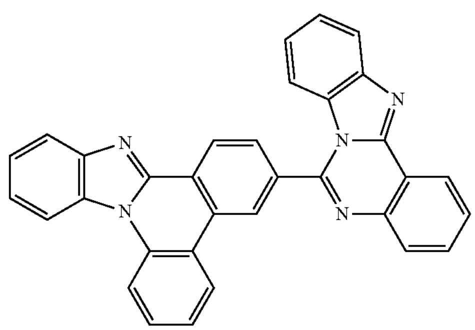
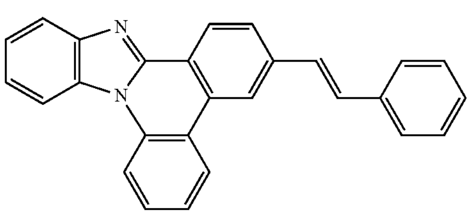
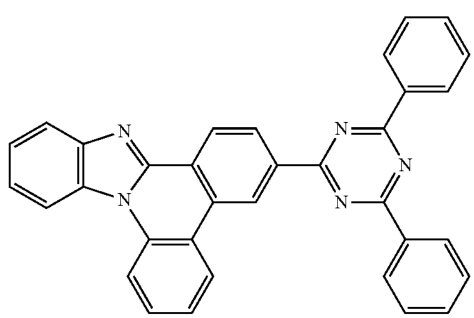

-continued
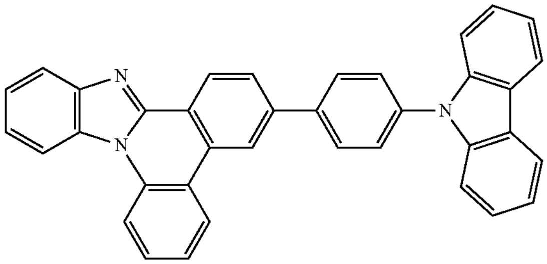
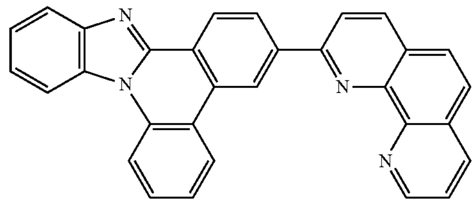
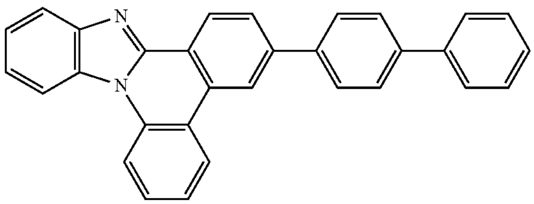
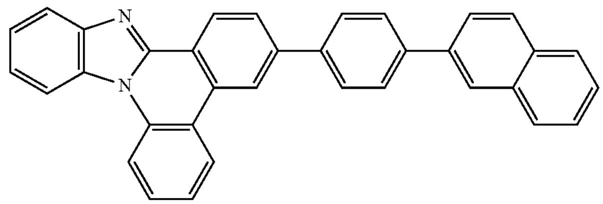
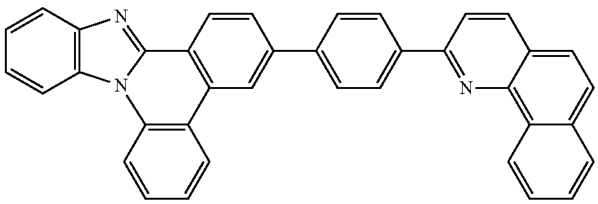
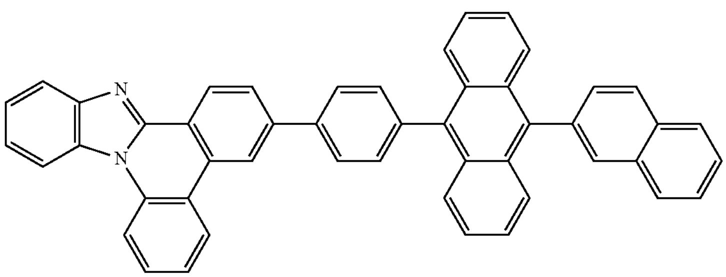
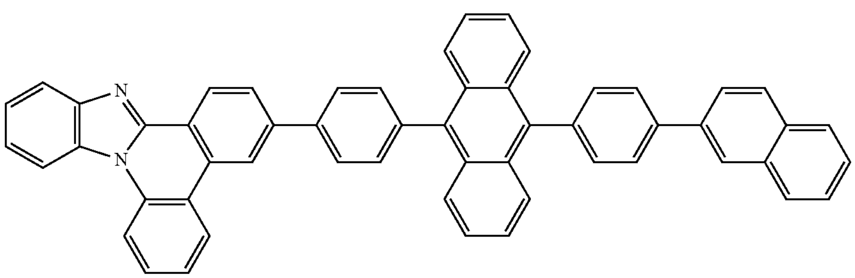
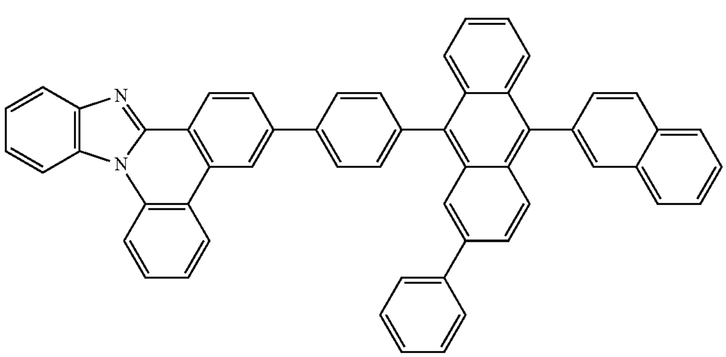

-continued
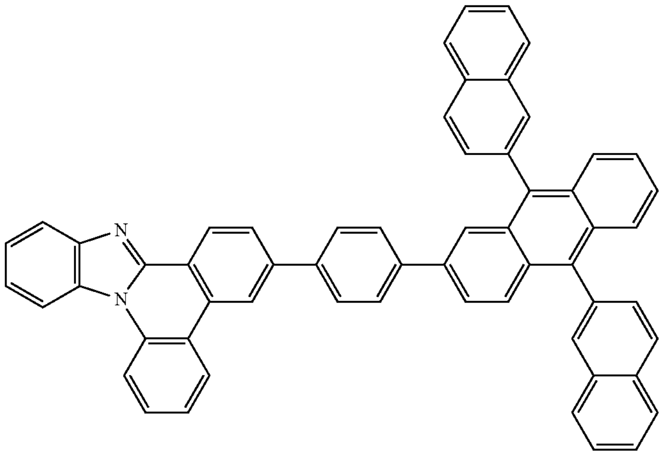
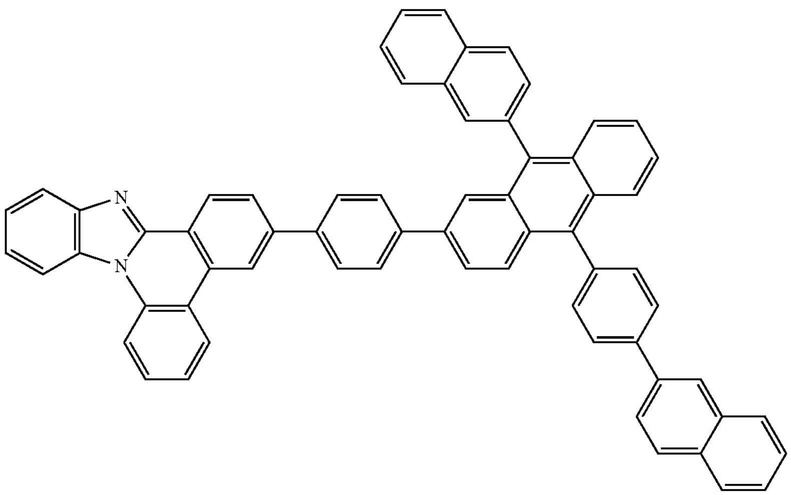
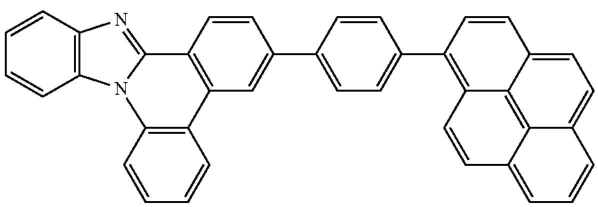
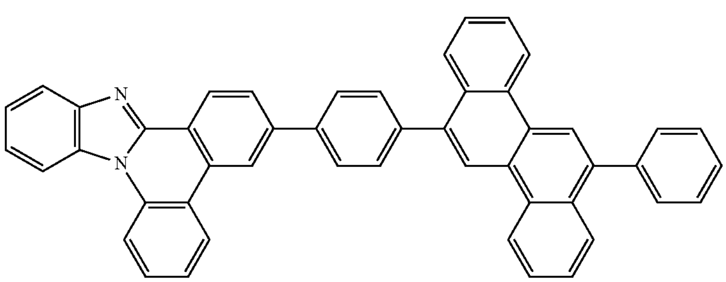

-continued
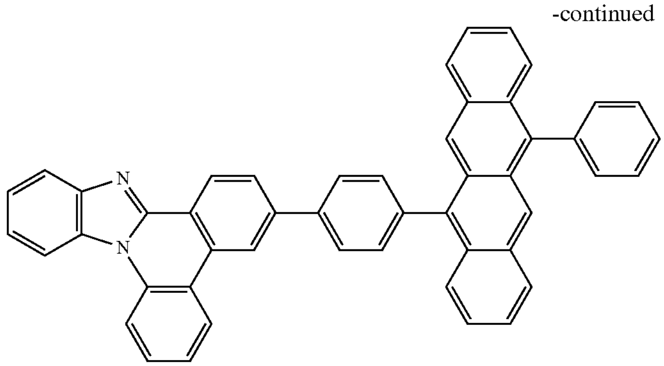
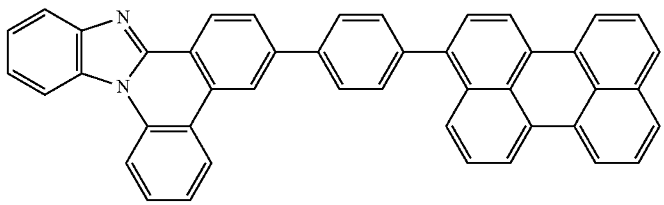
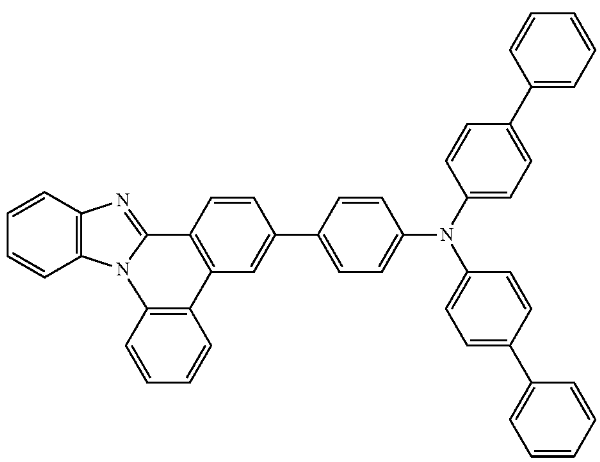
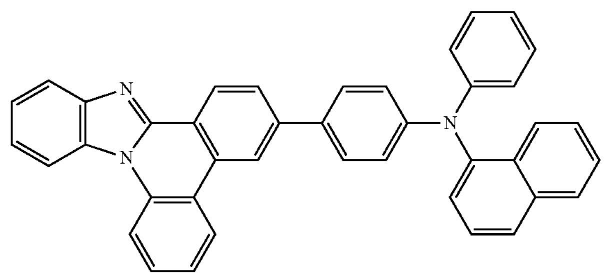
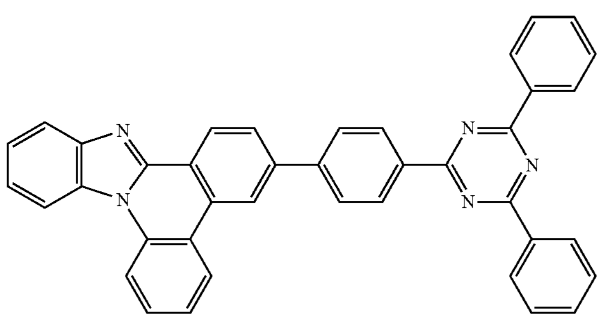
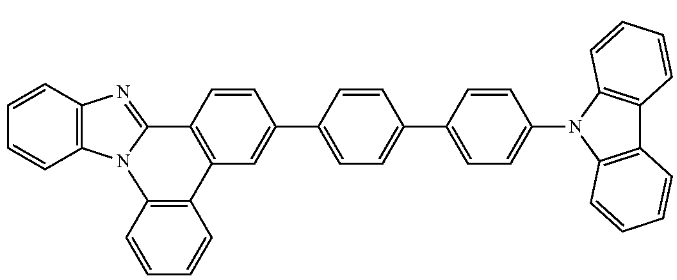
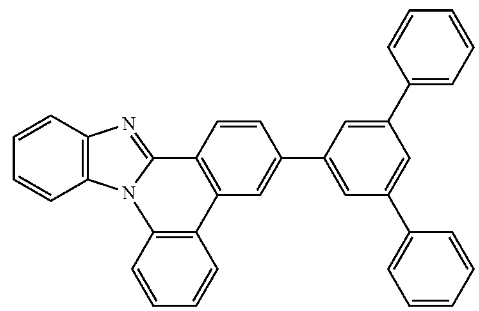

-continued
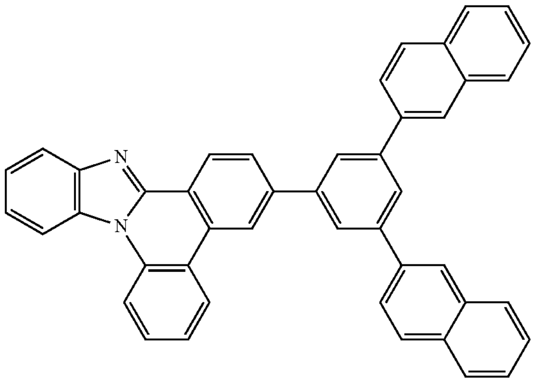
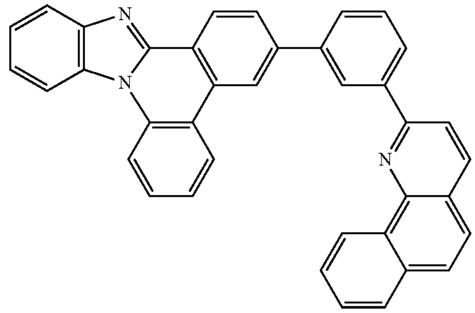
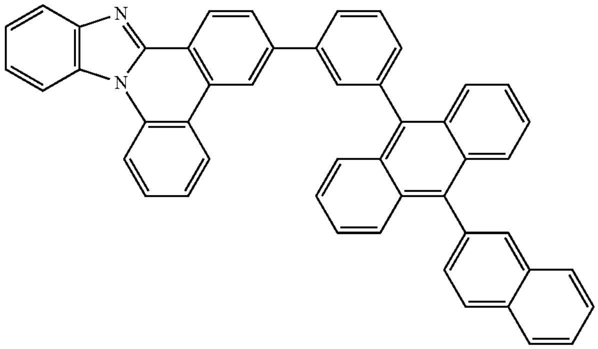
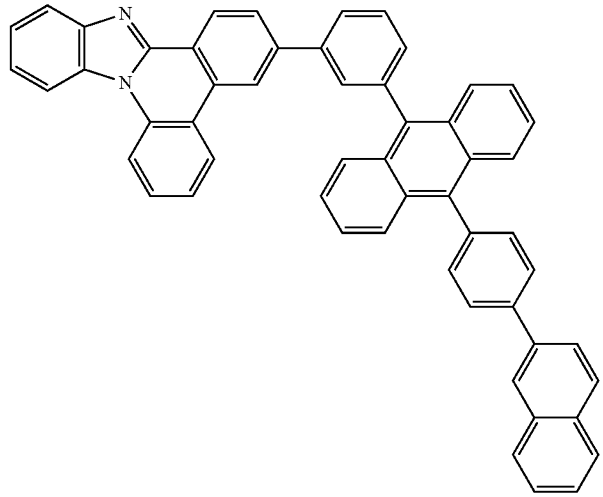
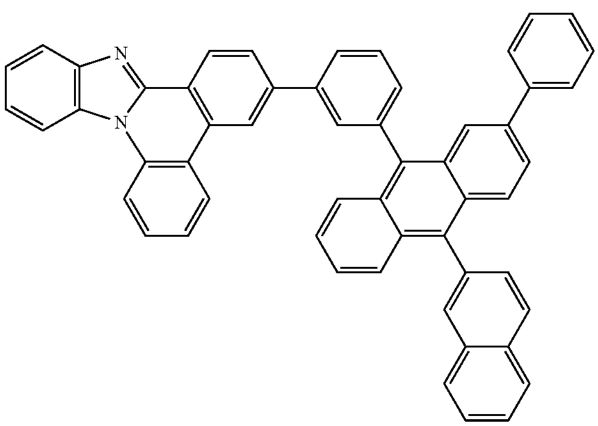
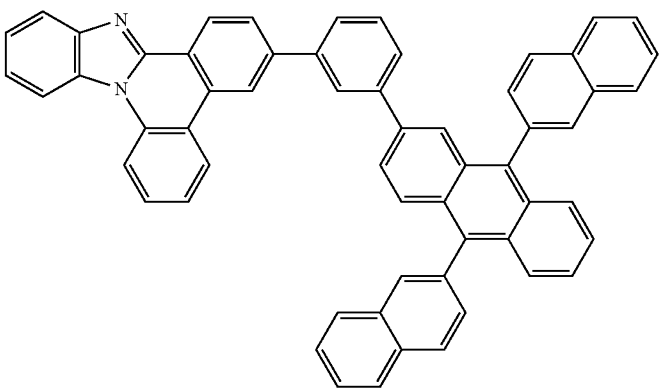

-continued
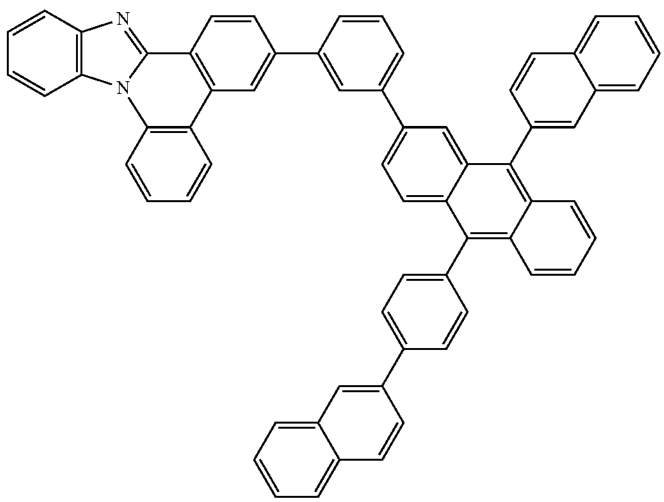
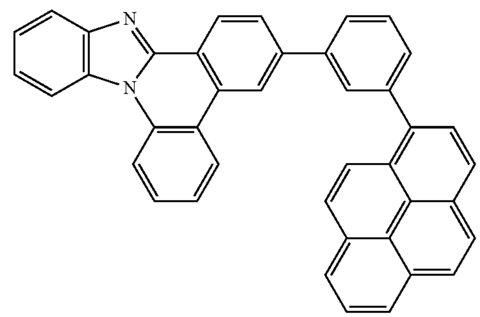
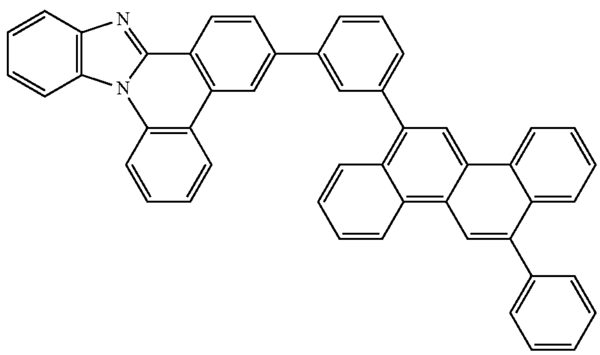
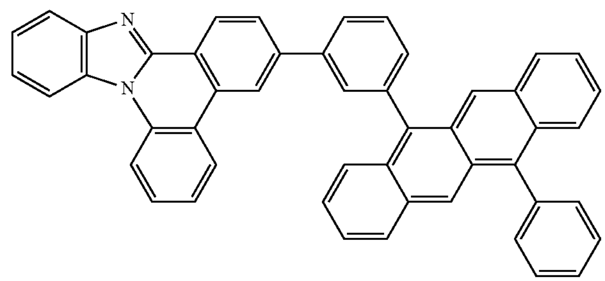
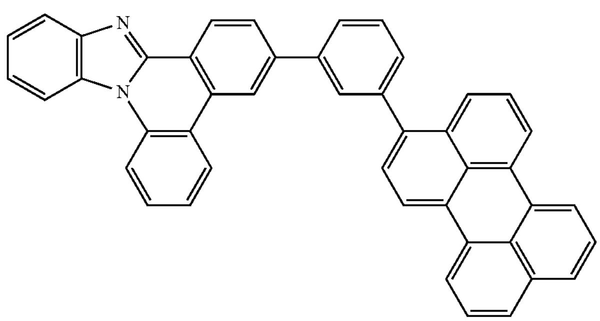
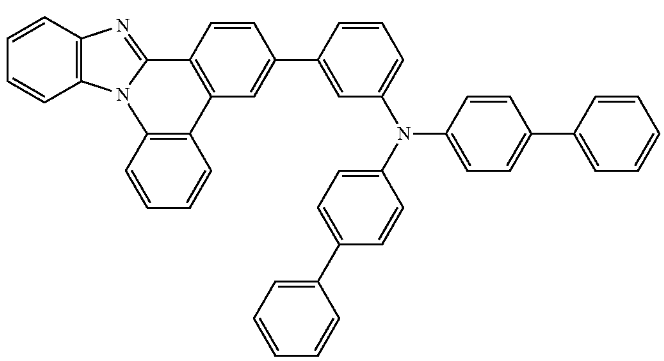
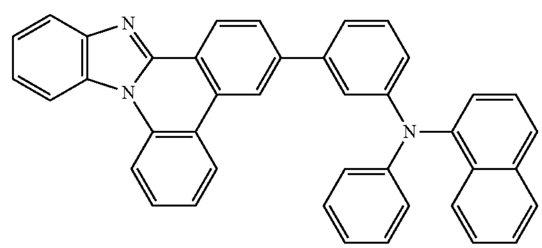

-continued
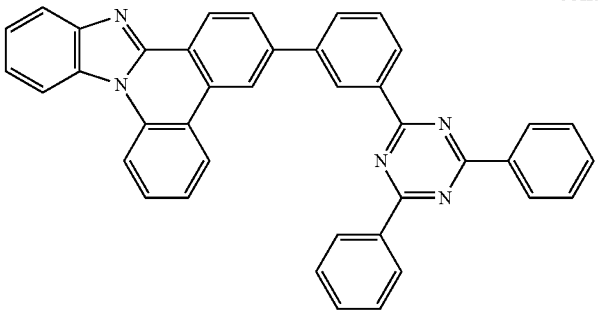
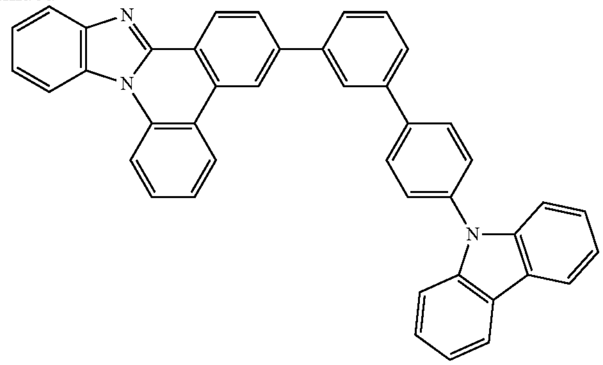
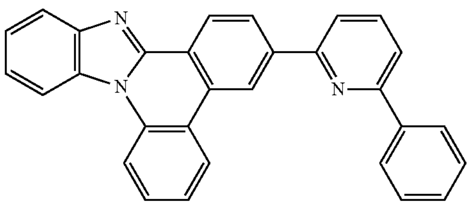
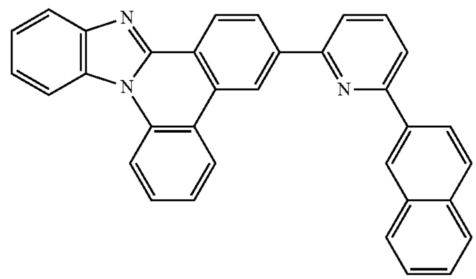
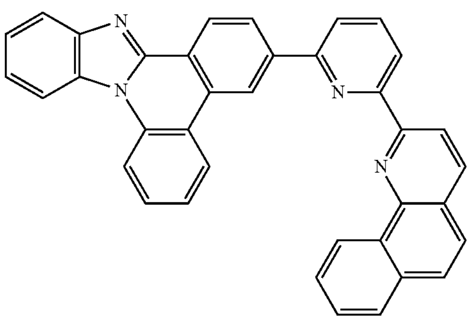
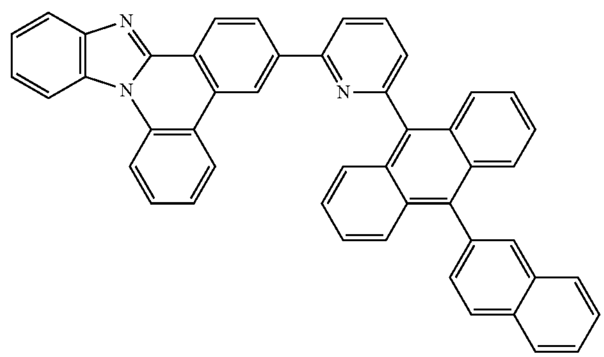
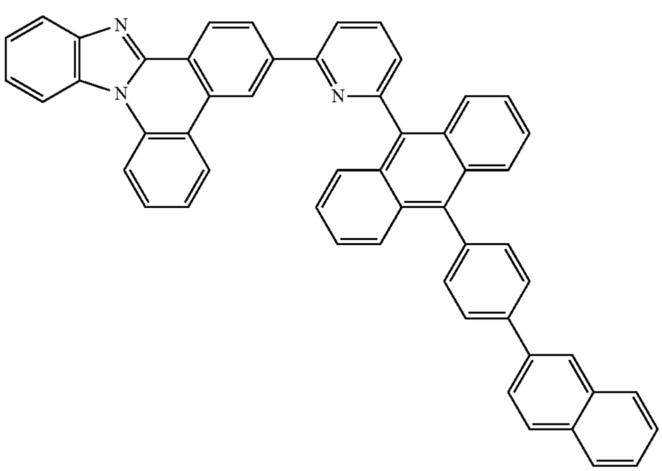

-continued
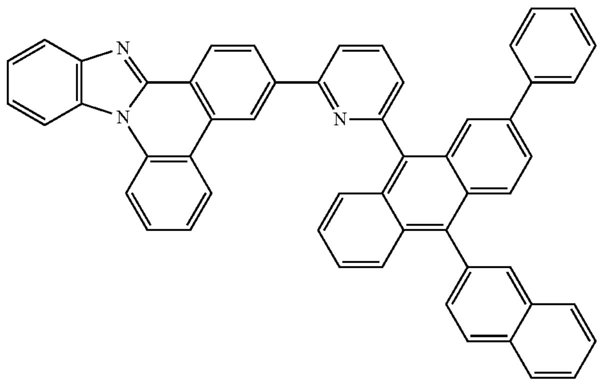
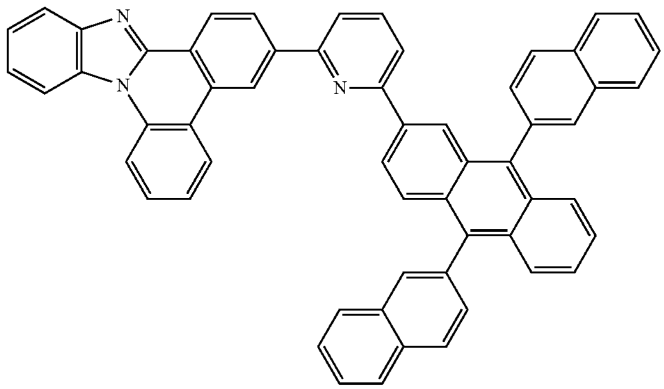
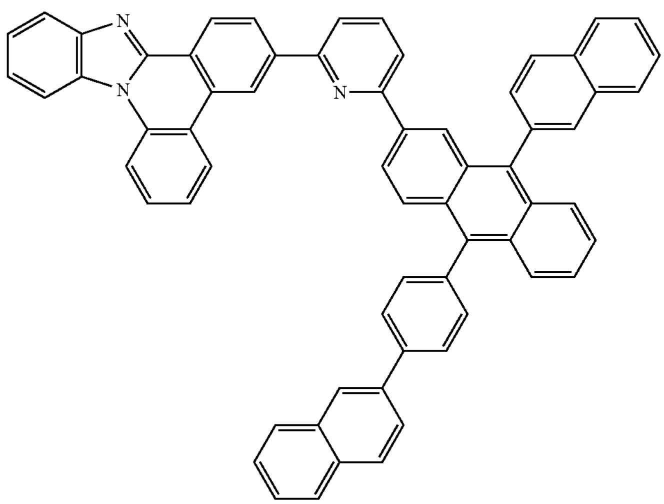
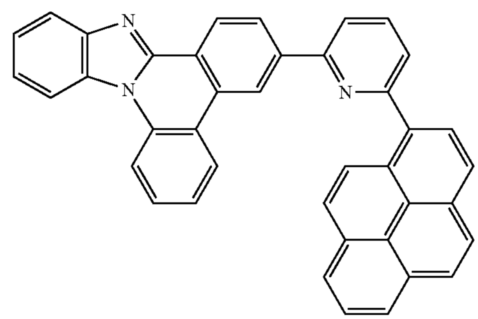
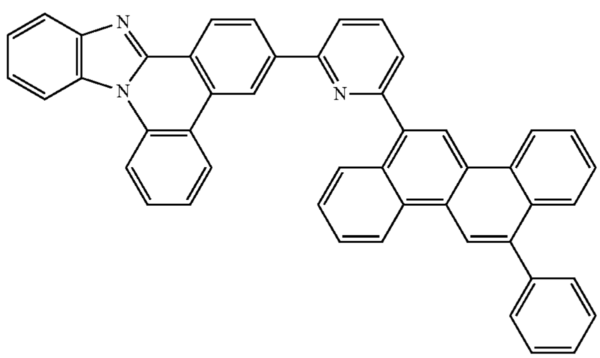
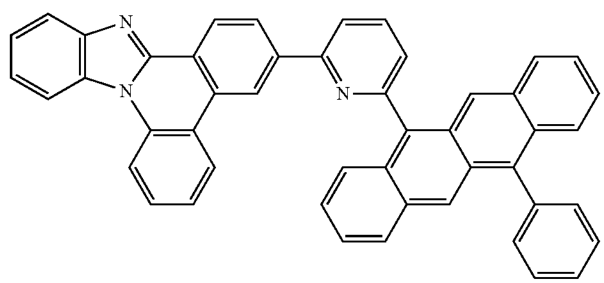

-continued
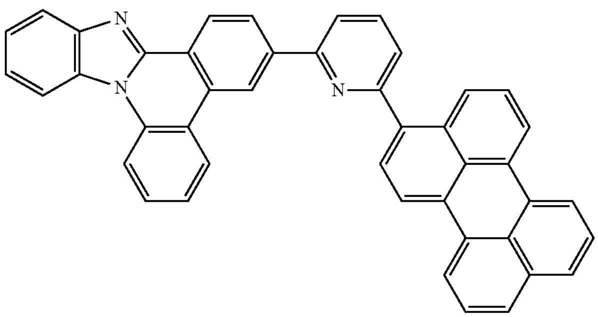
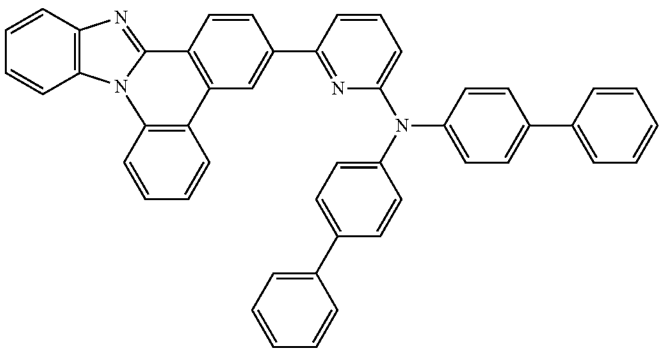
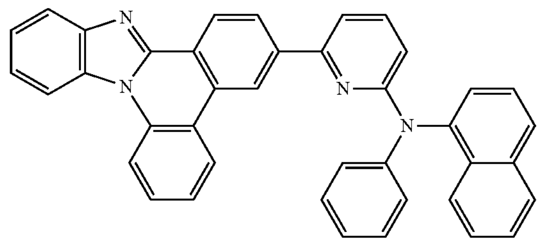
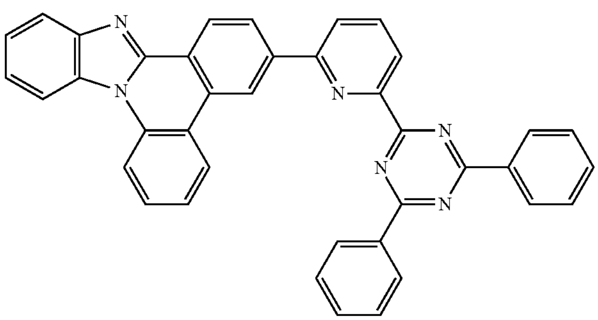
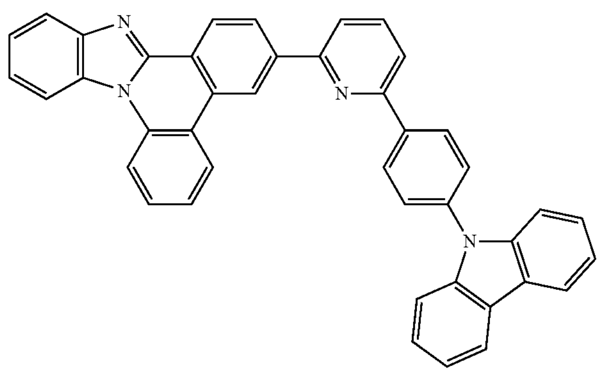
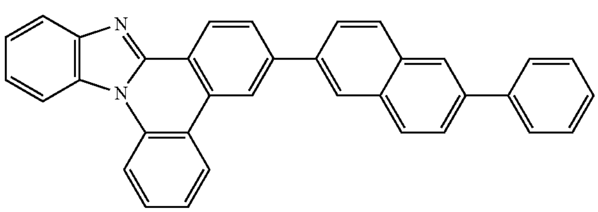
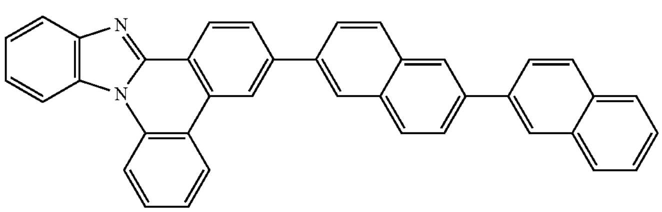
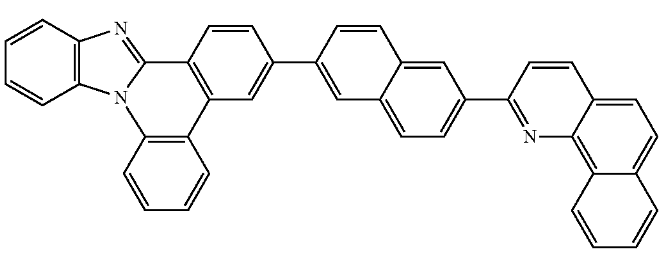

-continued
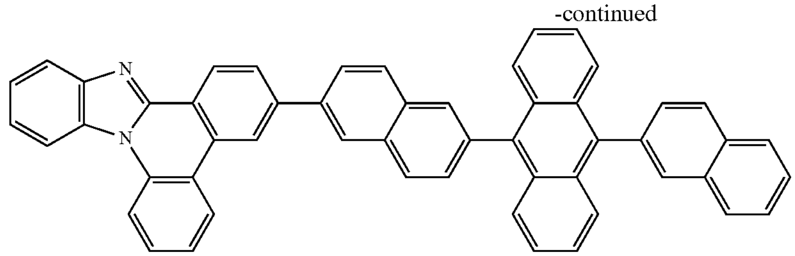
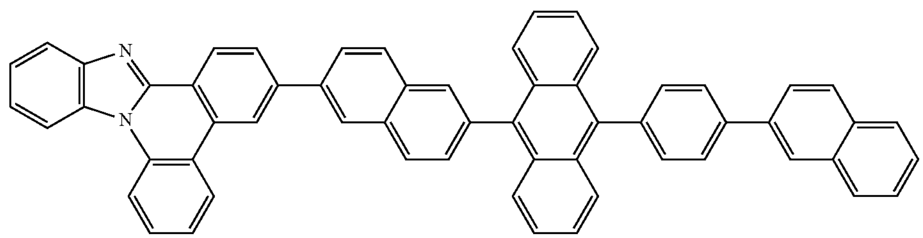
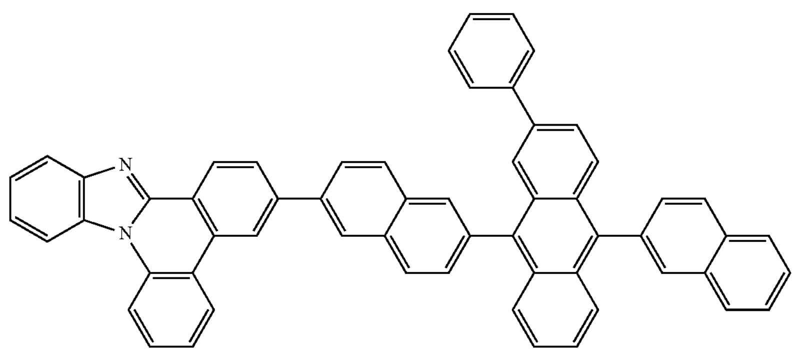
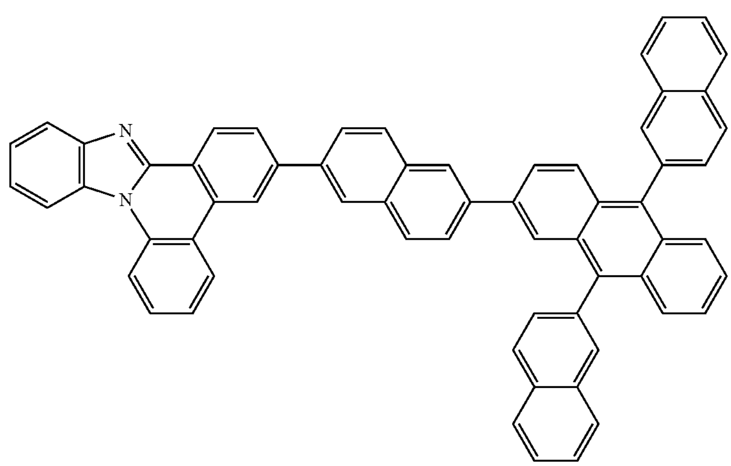

-continued
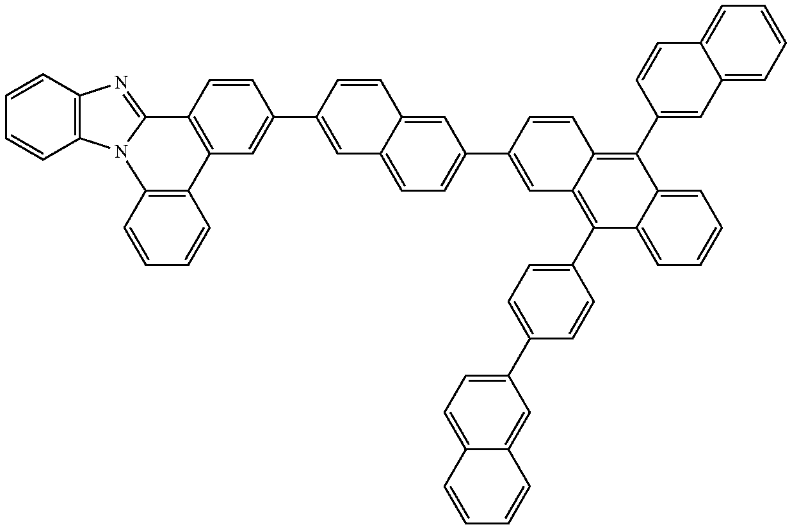
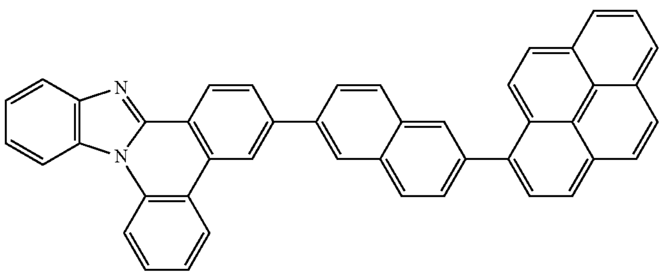
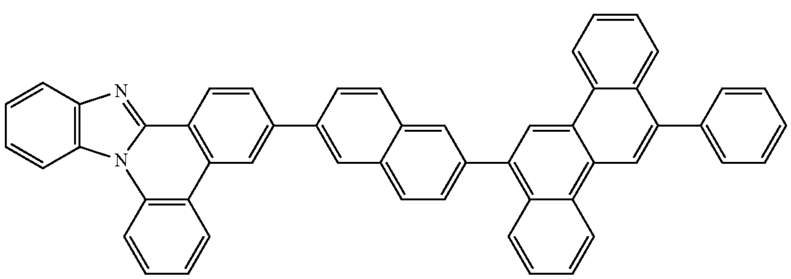
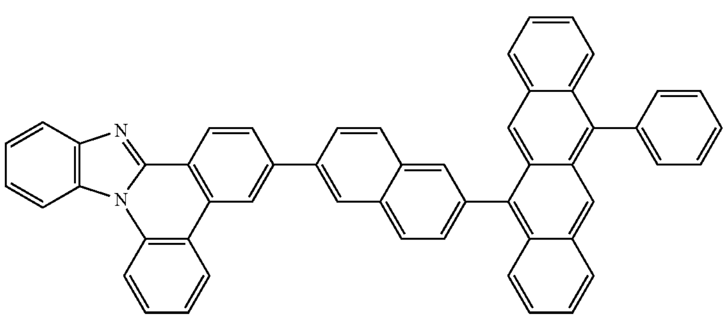
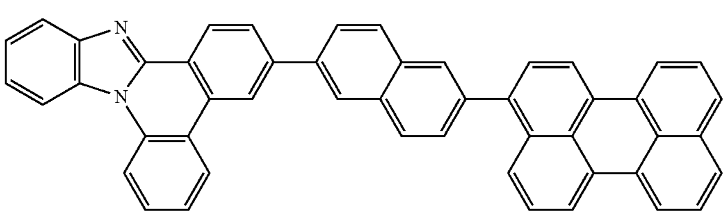

-continued
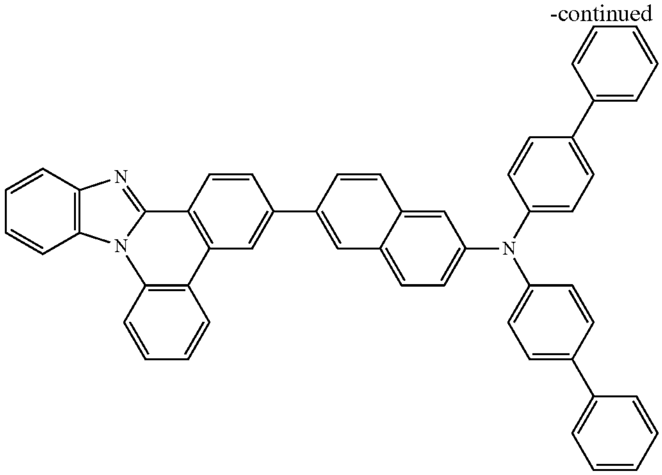
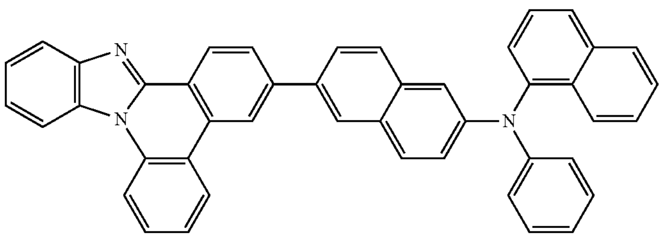
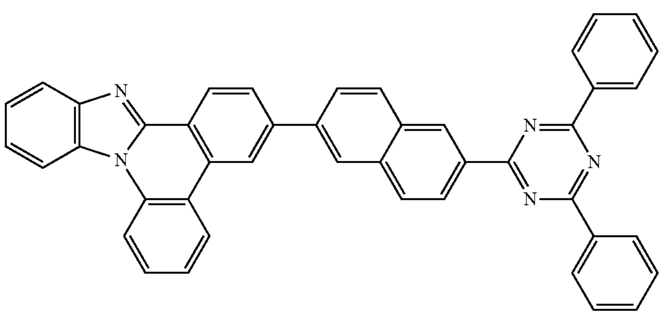
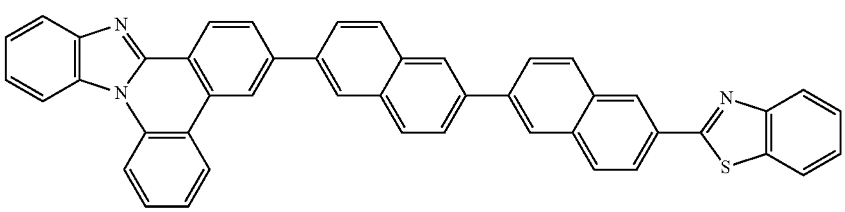
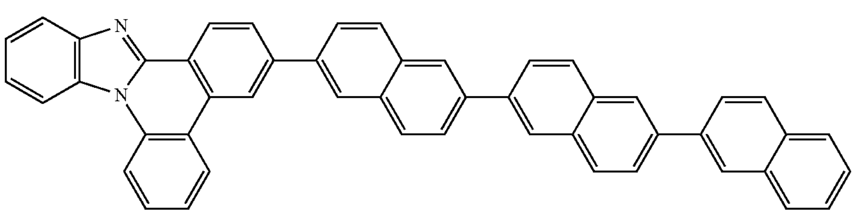

-continued
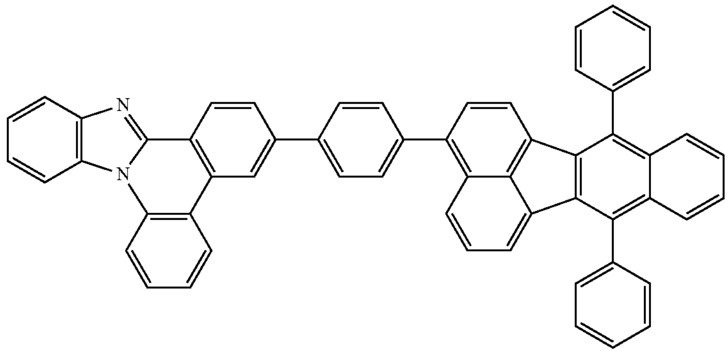
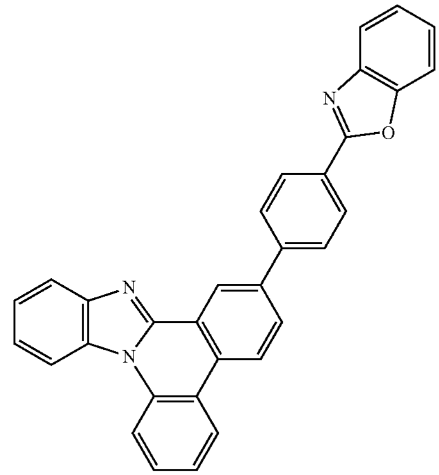
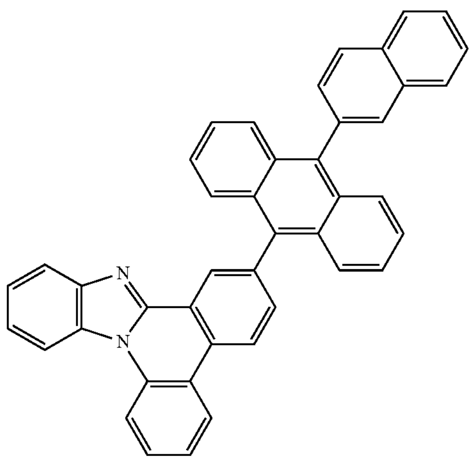
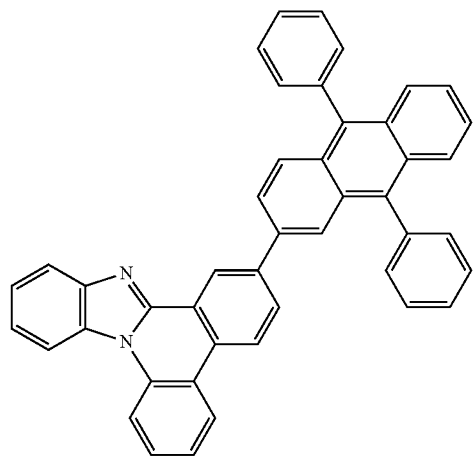
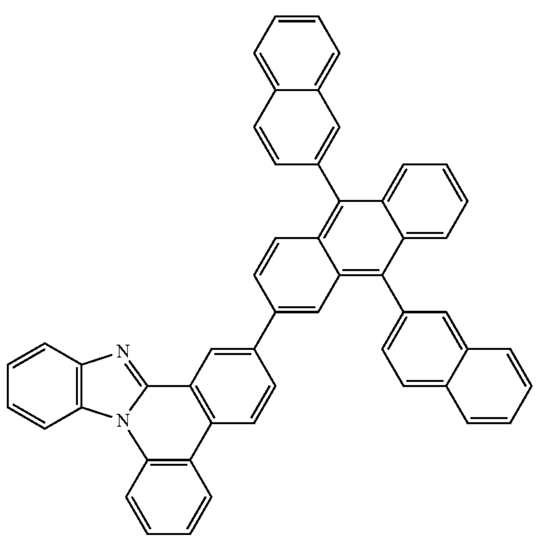
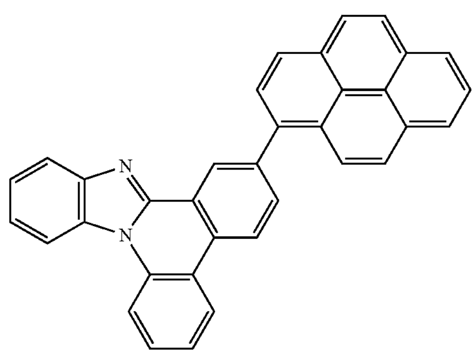

-continued
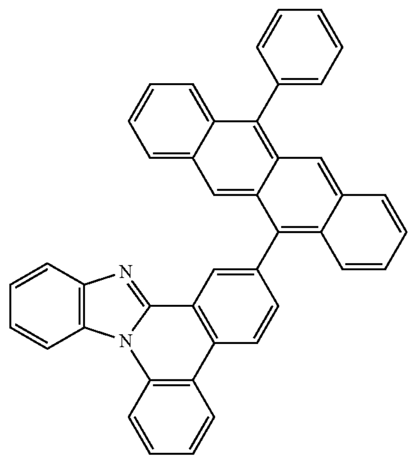
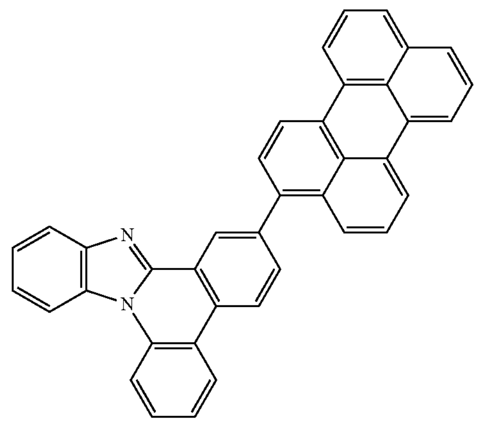
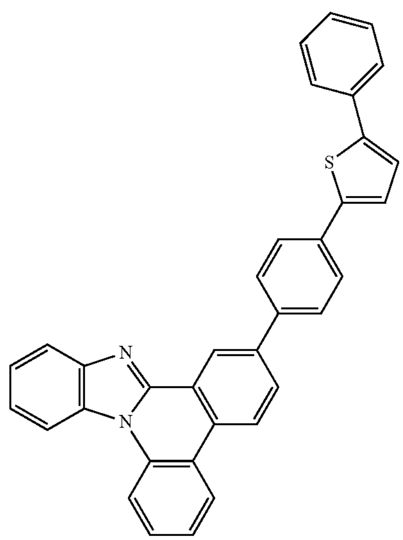
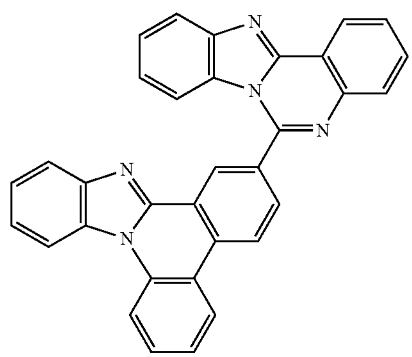
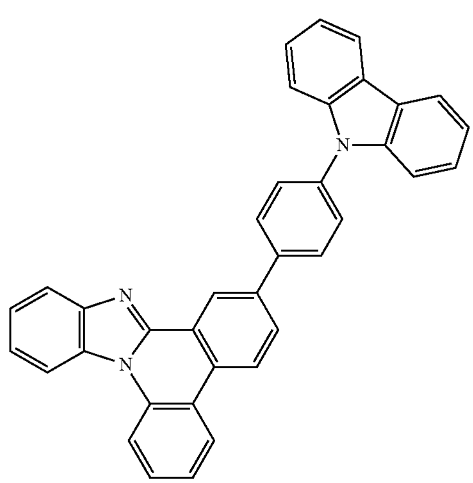
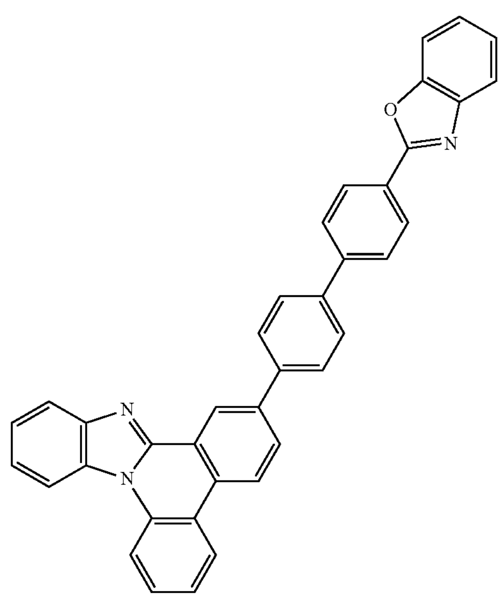

-continued
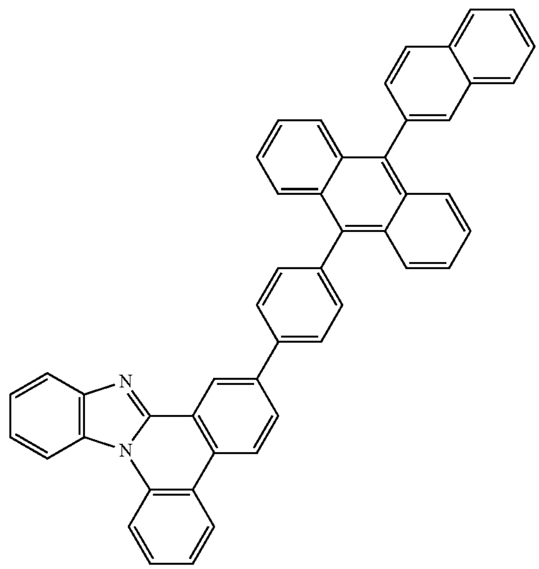
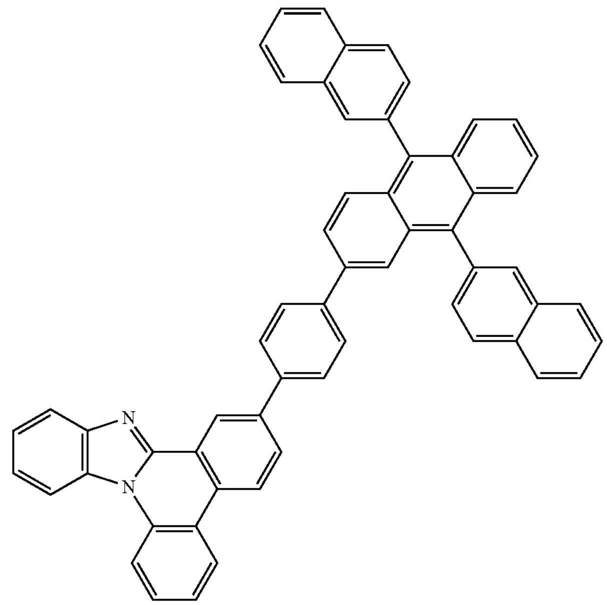
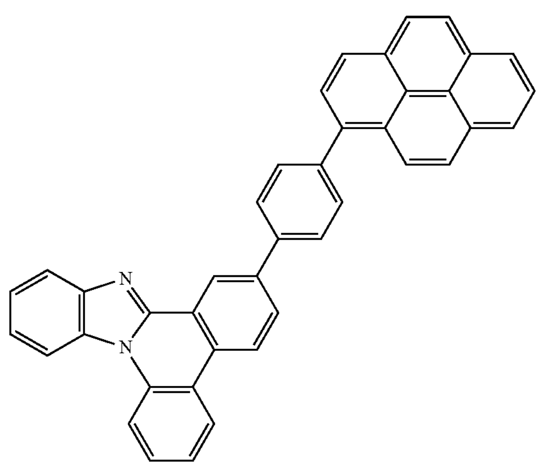
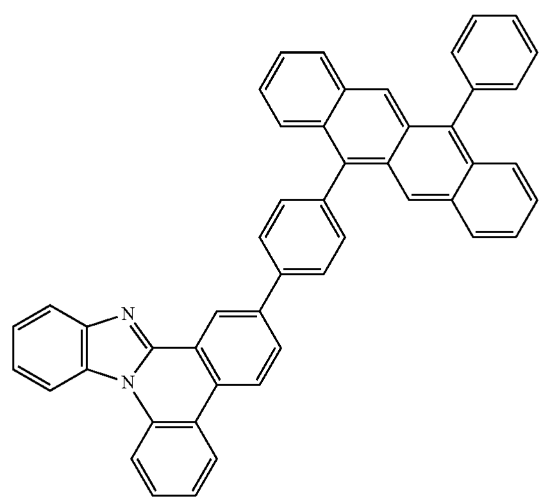

-continued
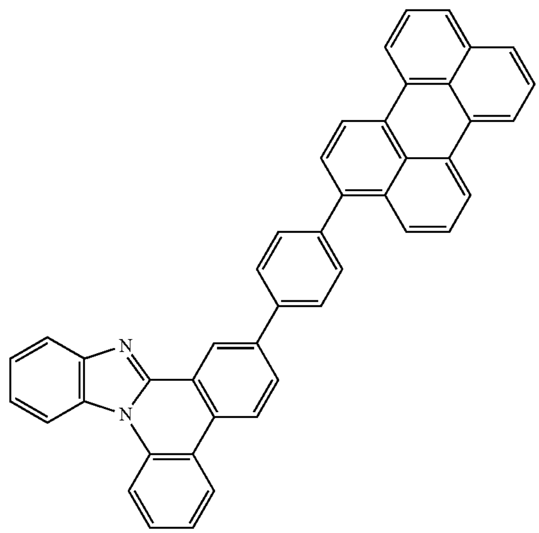
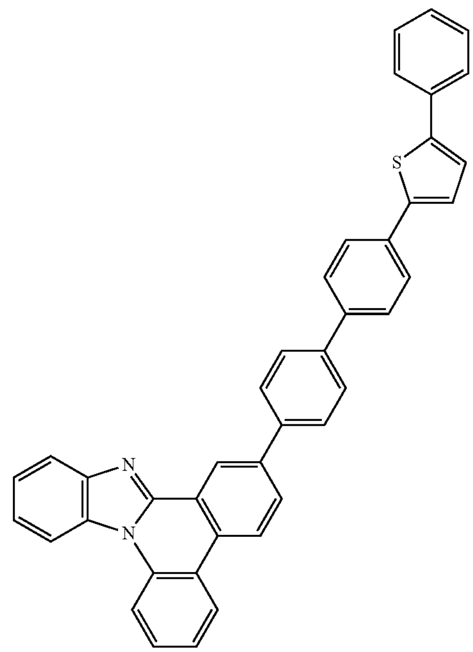
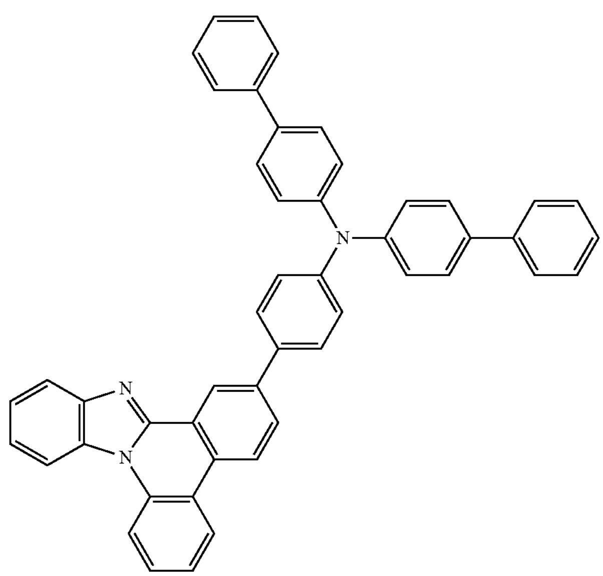
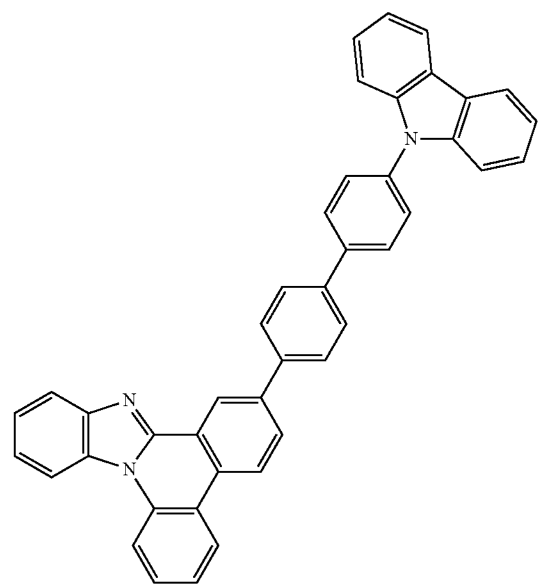
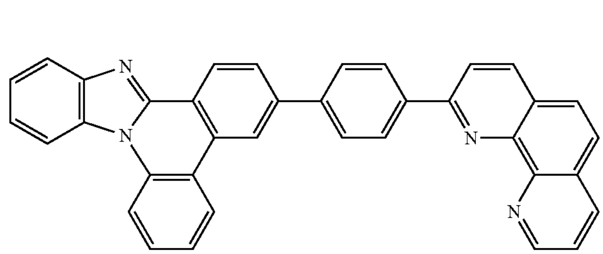
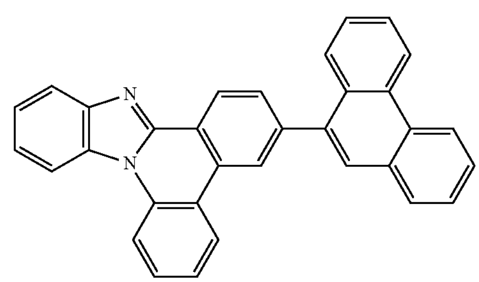

-continued
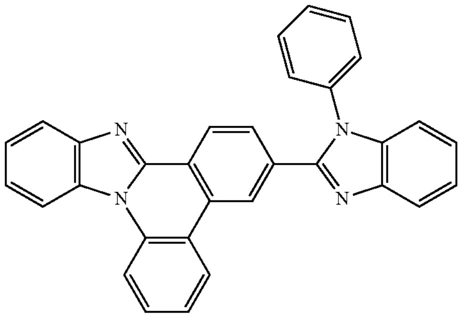
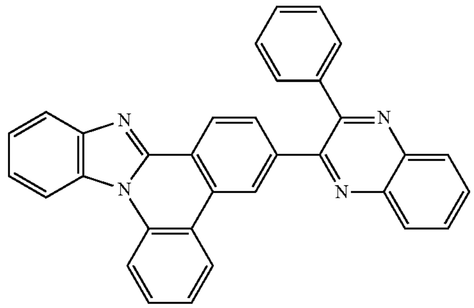
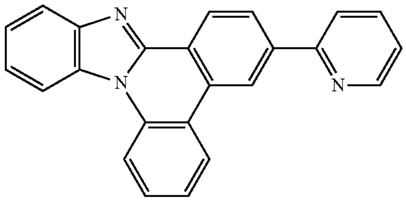
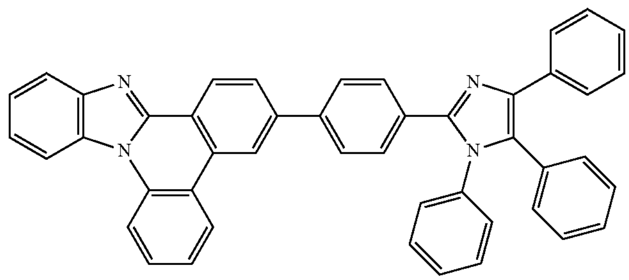
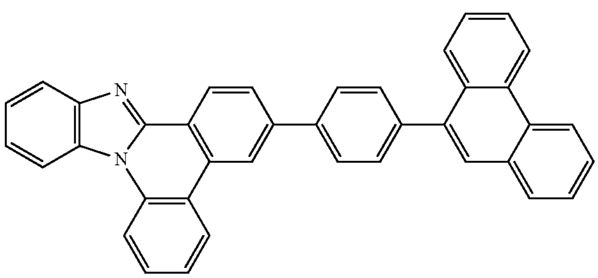
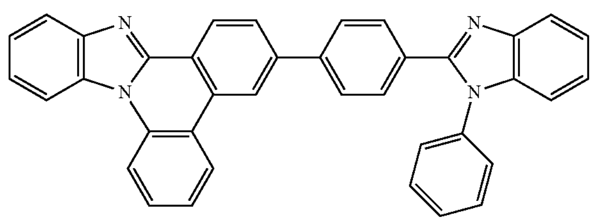
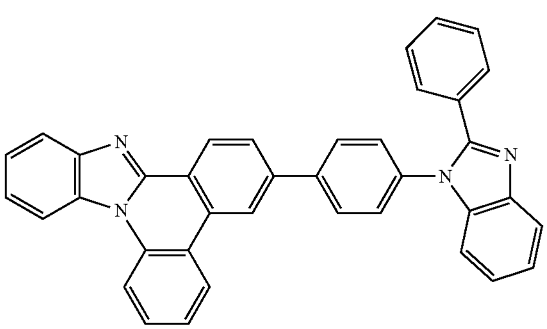
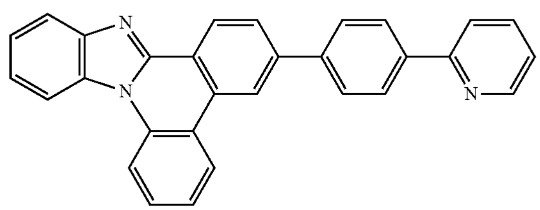
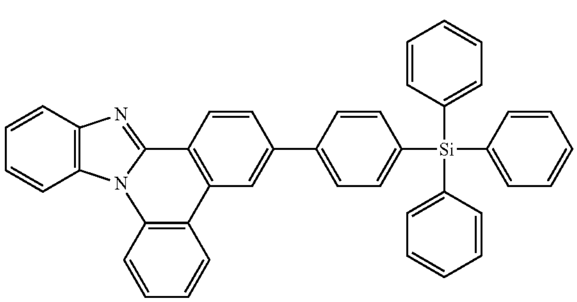
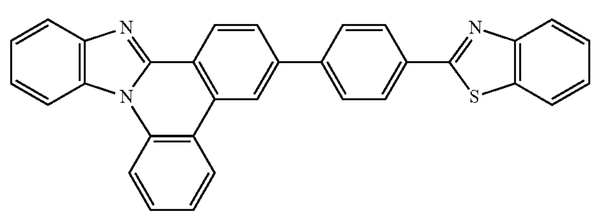

-continued
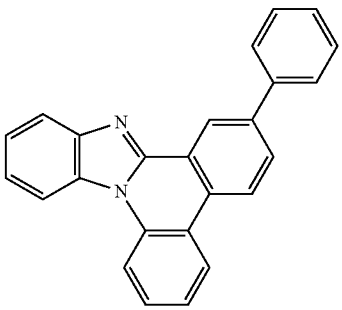
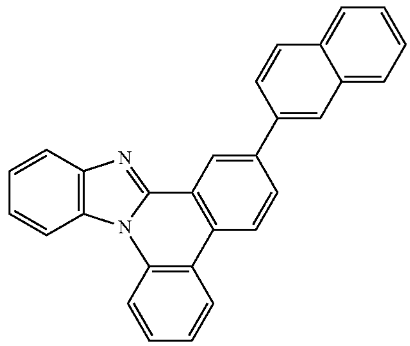
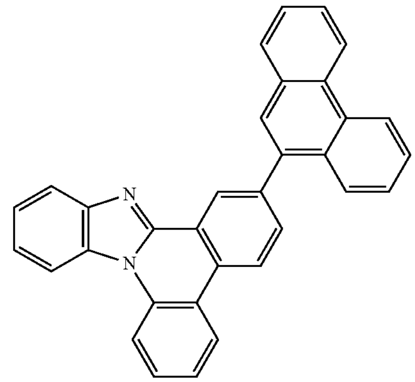
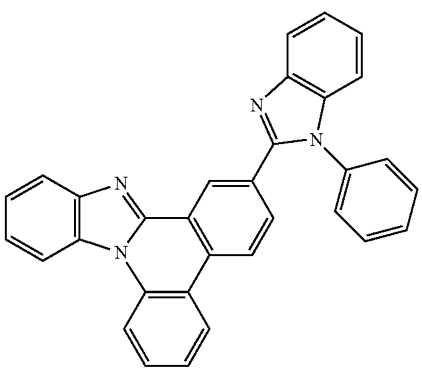
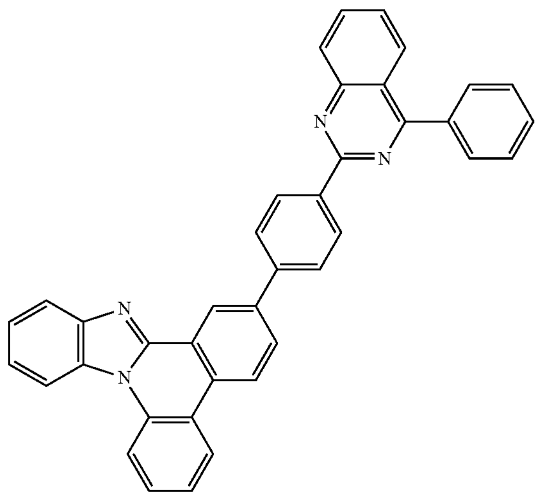
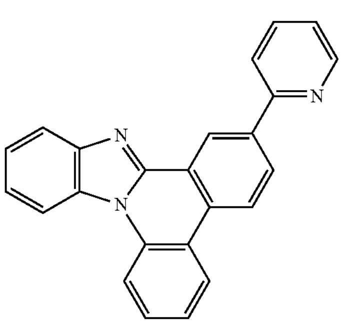
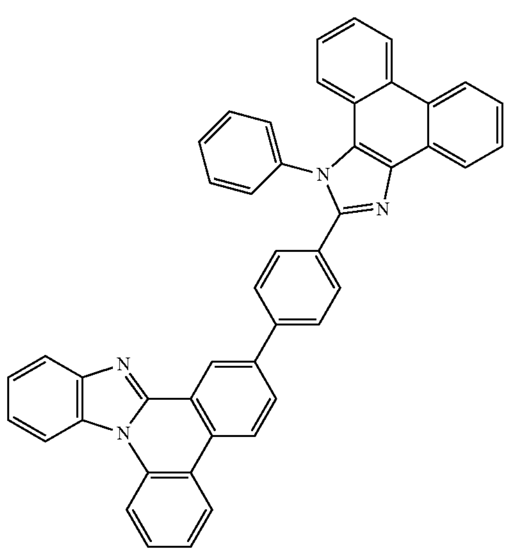

-continued
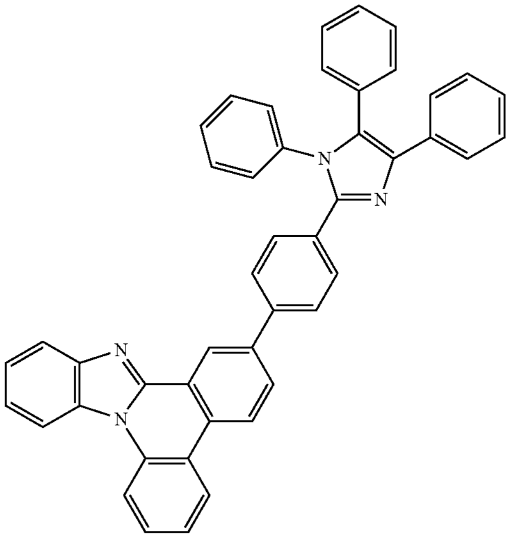
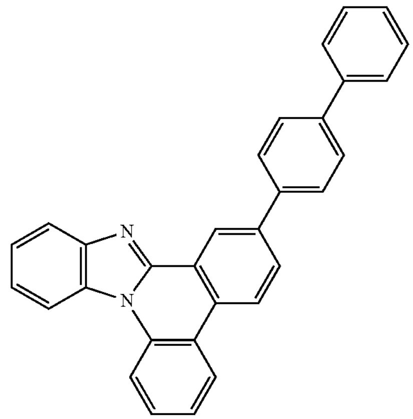
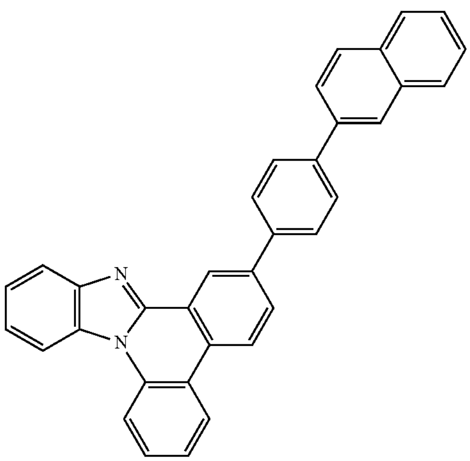
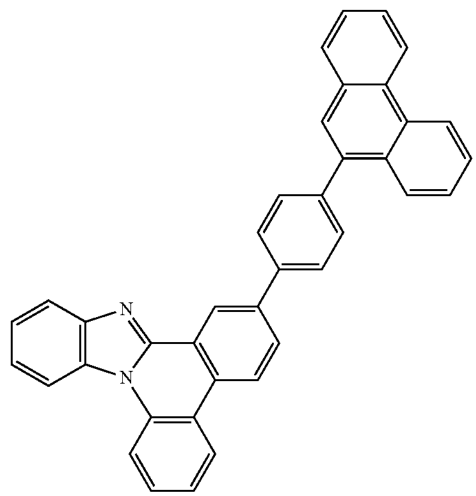
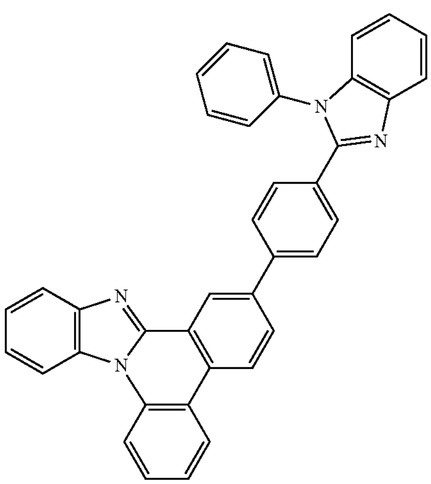
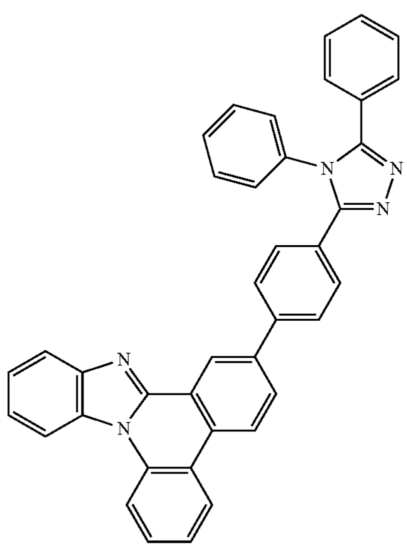

-continued
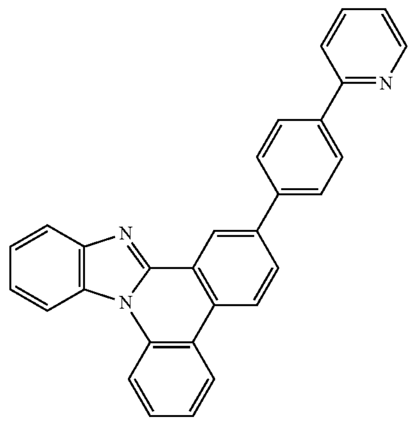
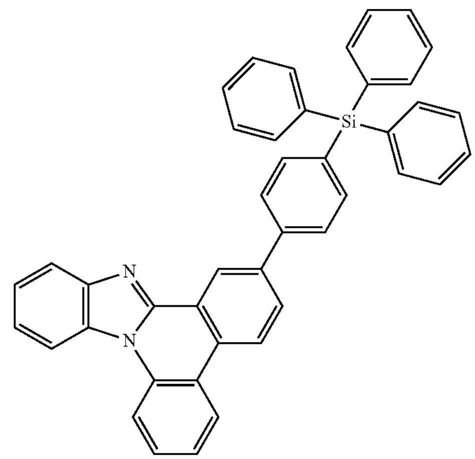
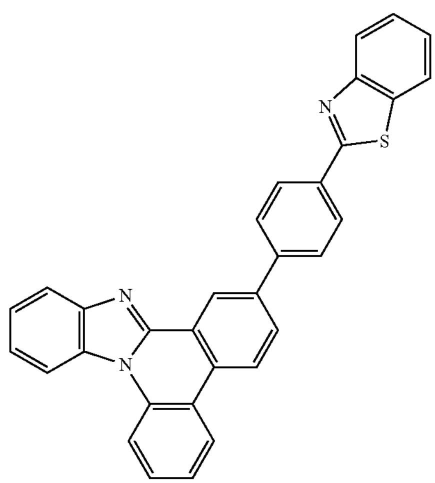
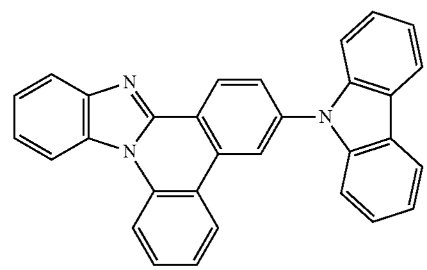
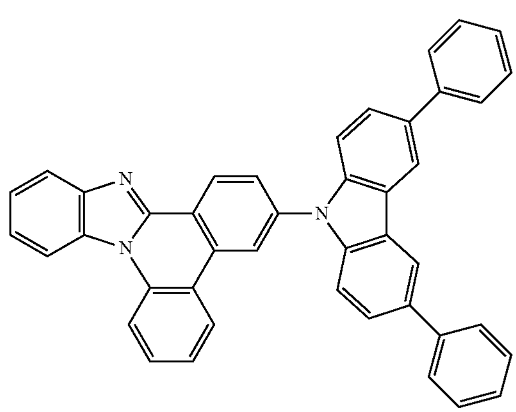
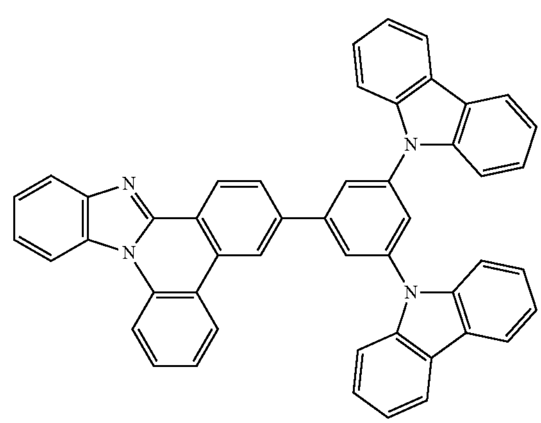

-continued
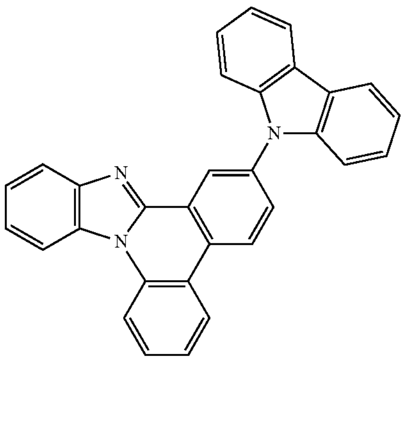
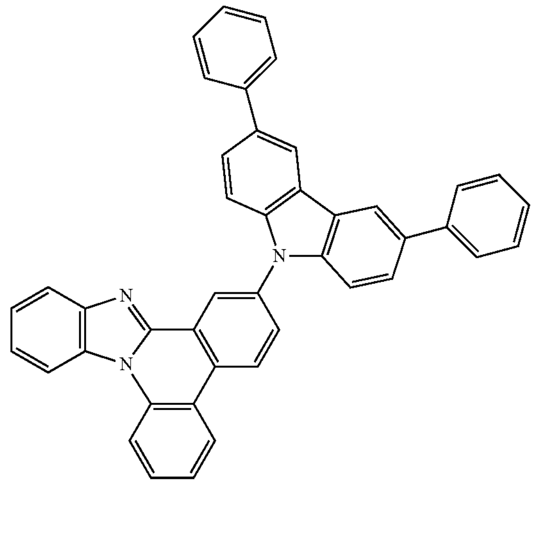
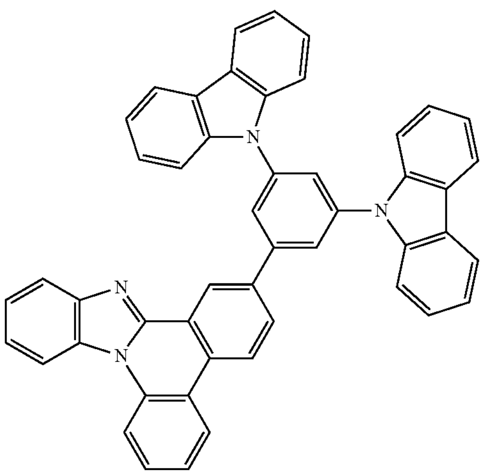
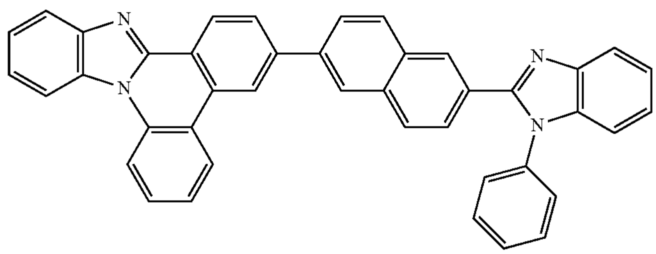
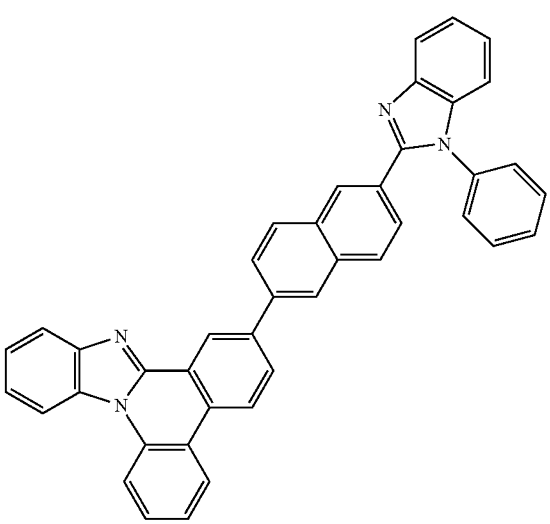
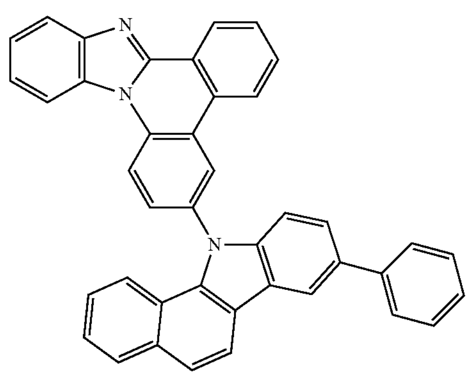

-continued
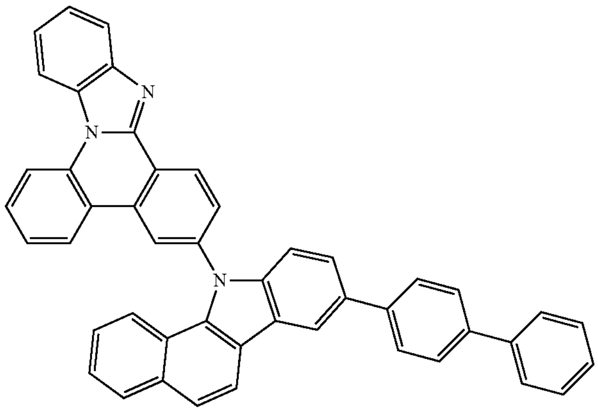
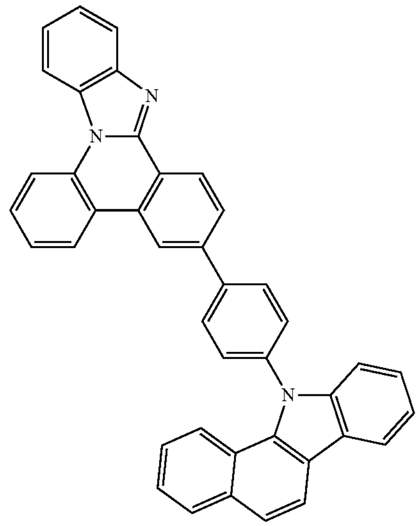
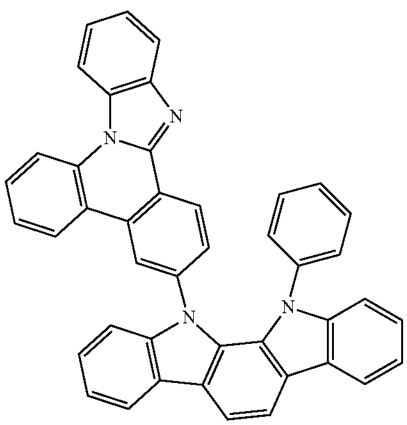
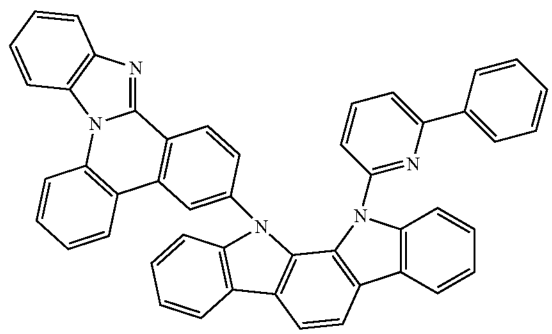
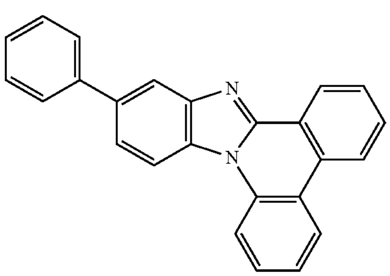
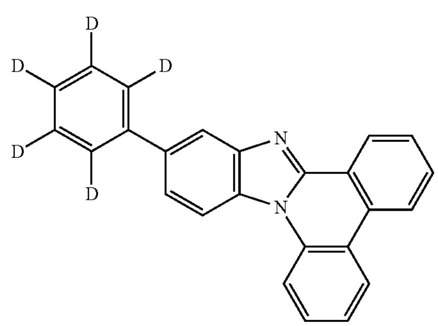
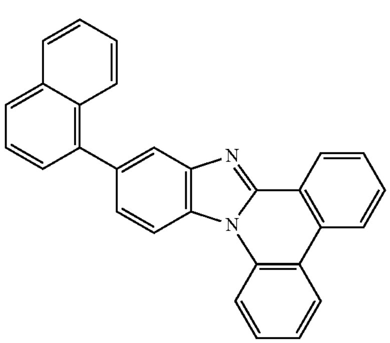
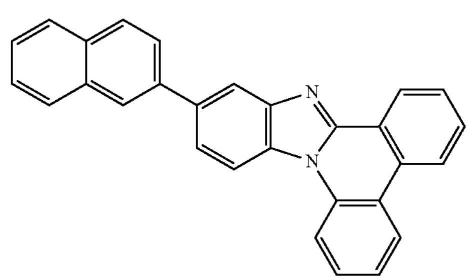

-continued
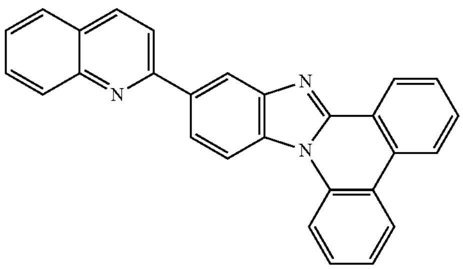
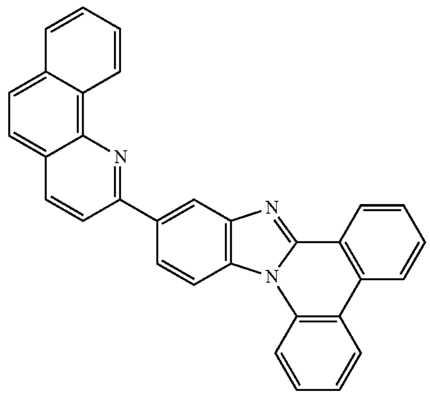
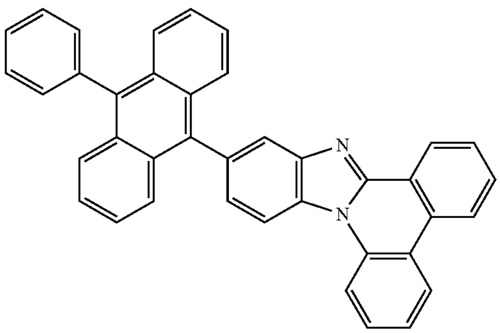
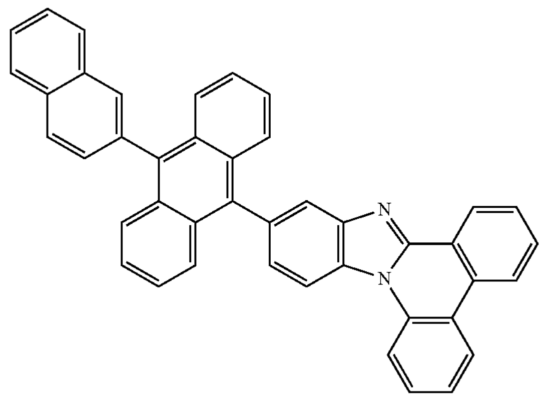
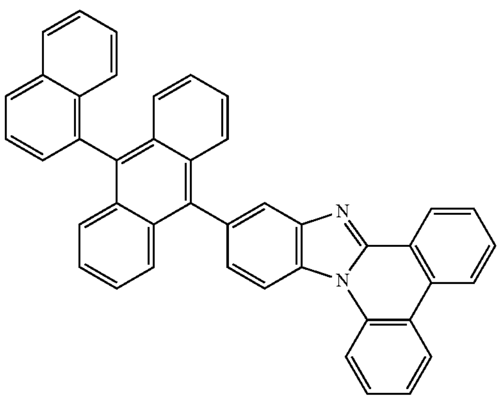
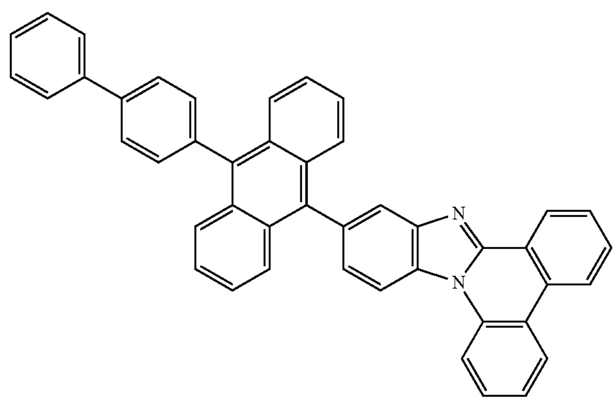
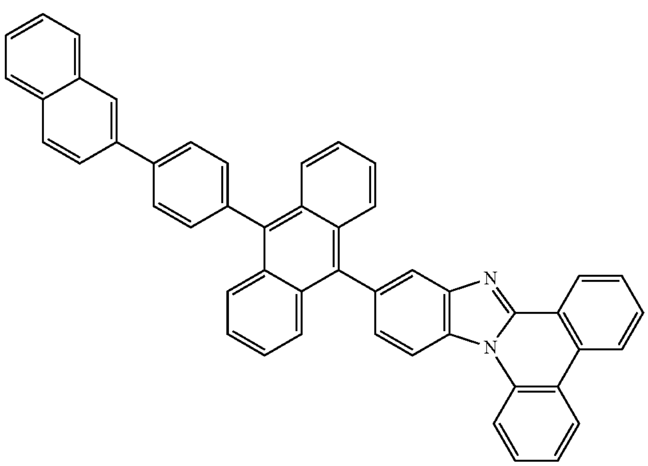
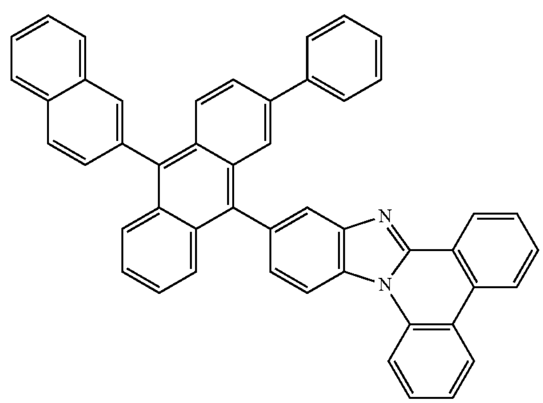

-continued
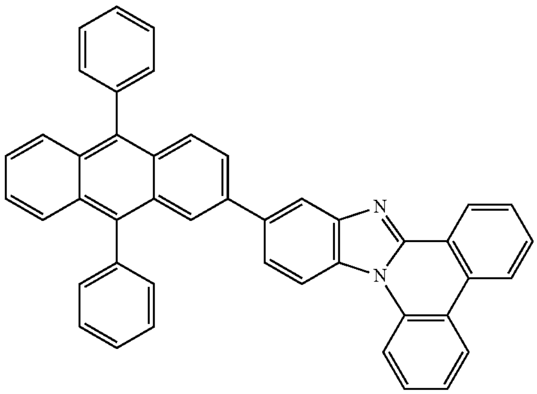
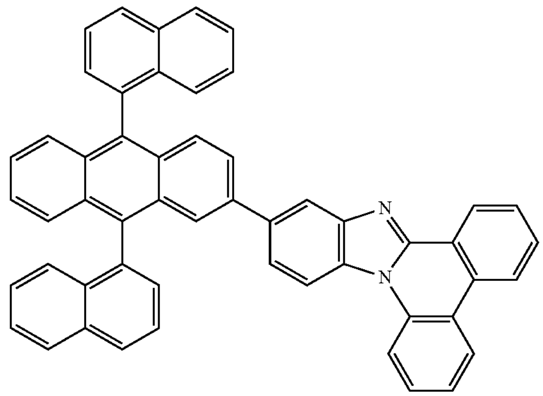
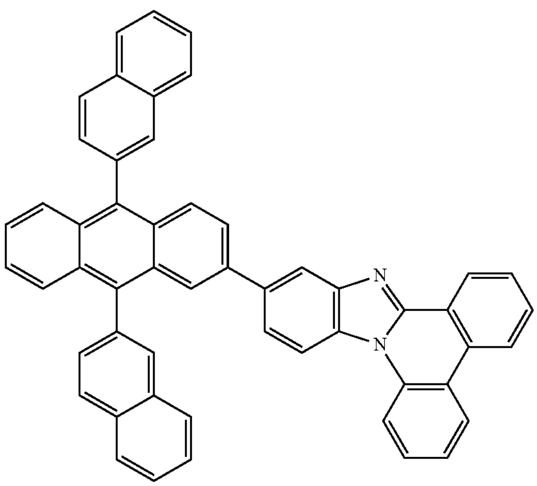
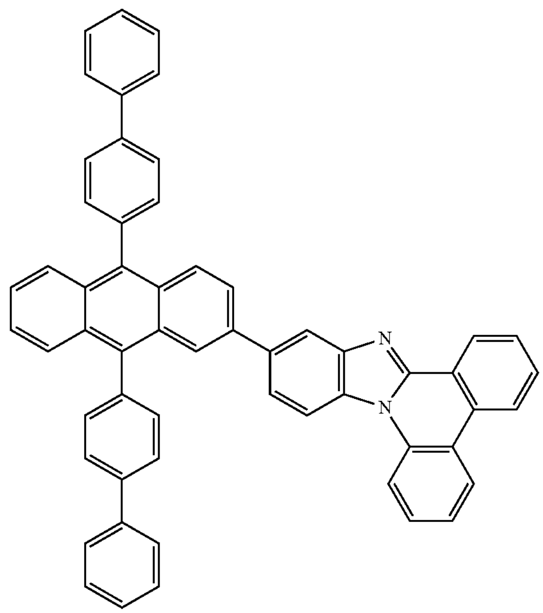
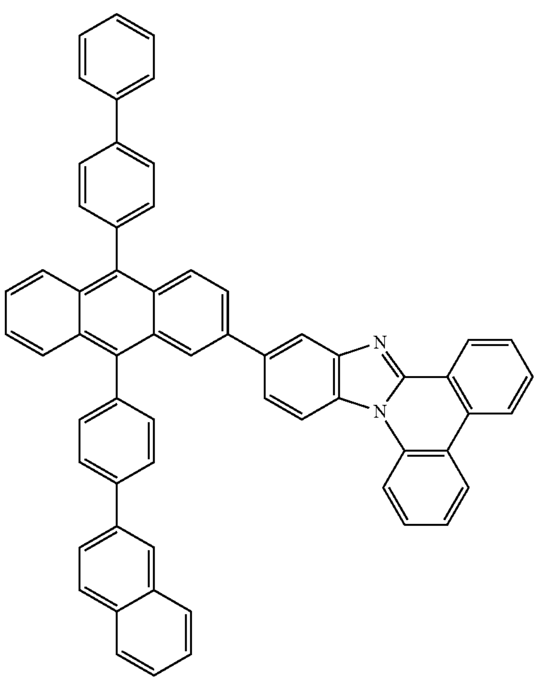
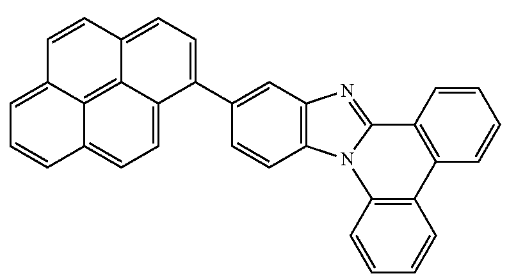

-continued
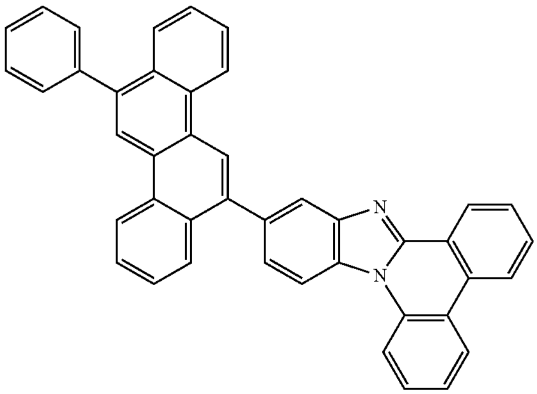
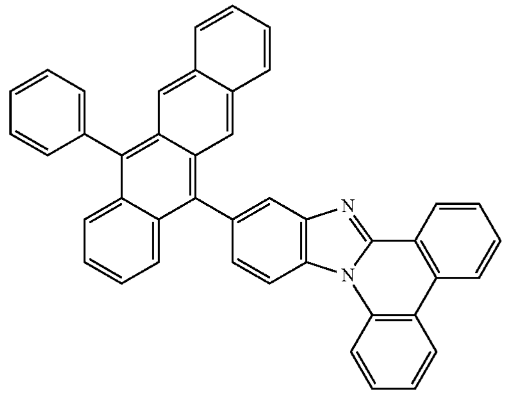
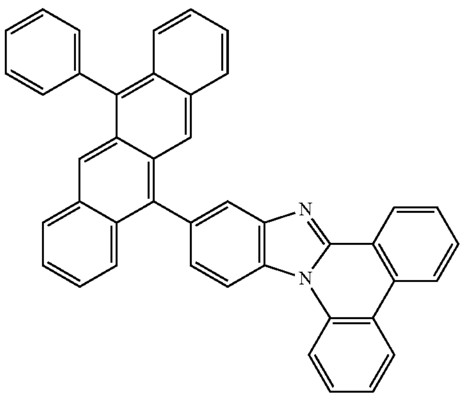
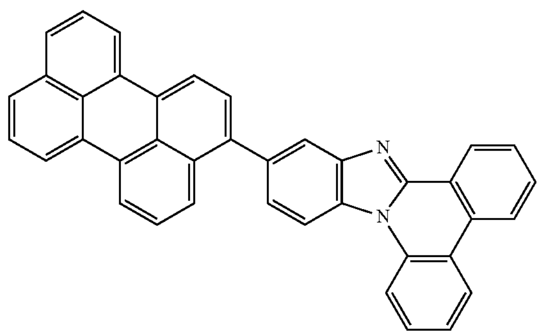
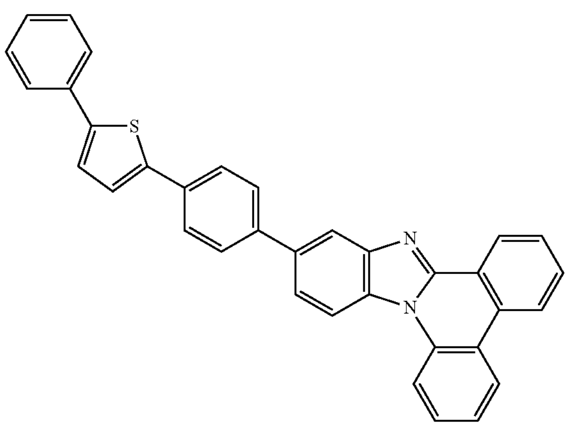
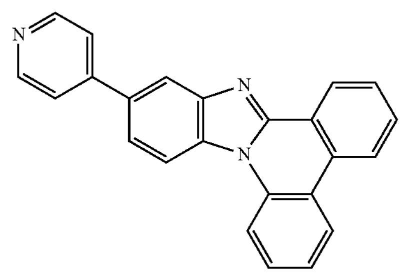
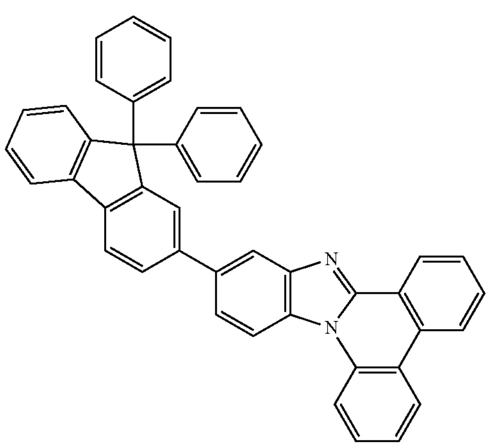
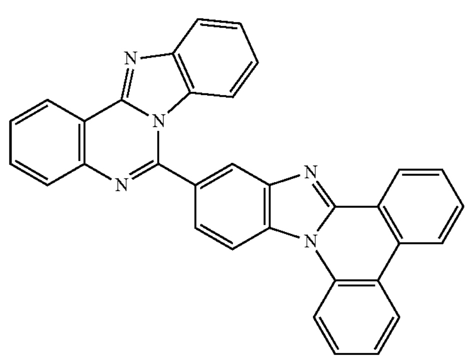

-continued
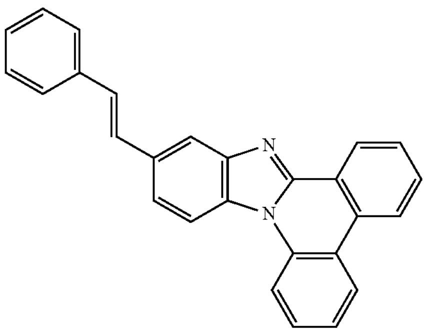
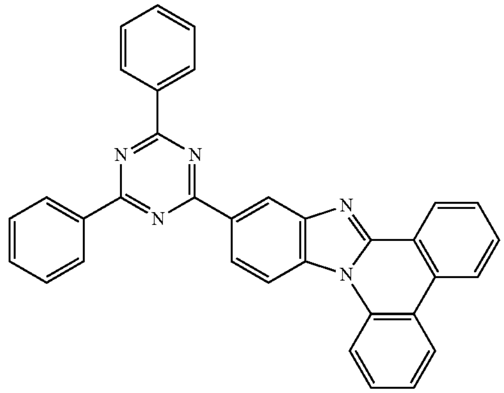
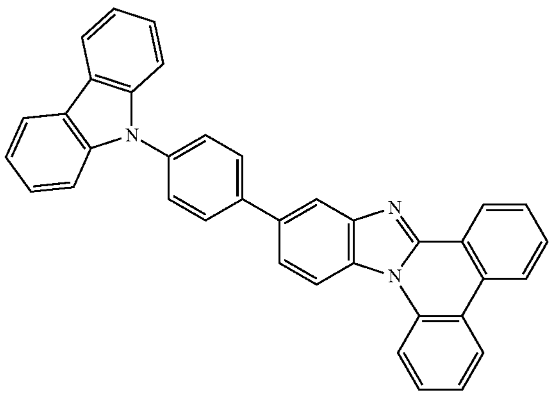
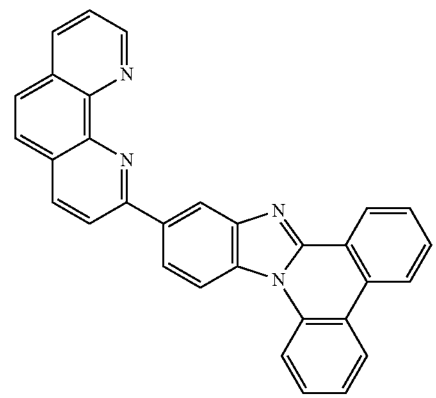
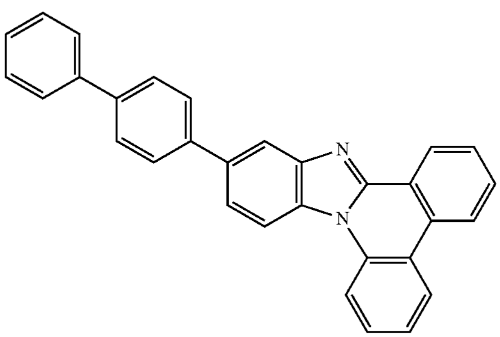
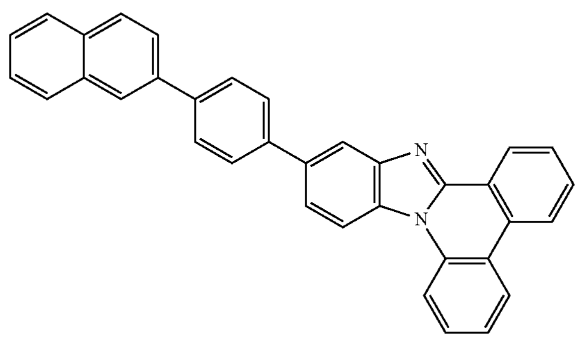
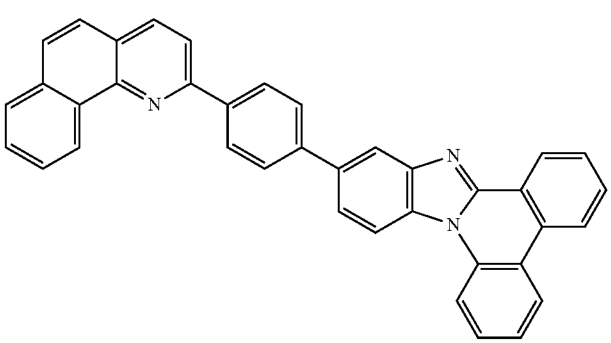

-continued
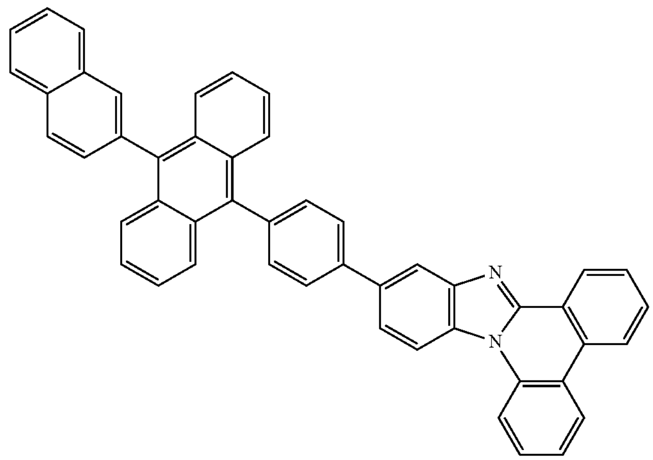
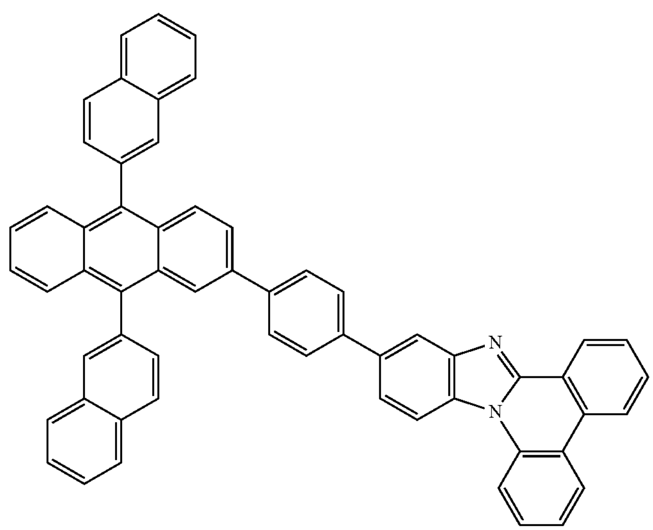
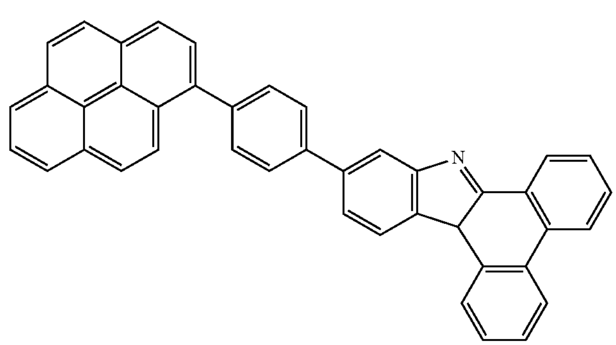

-continued
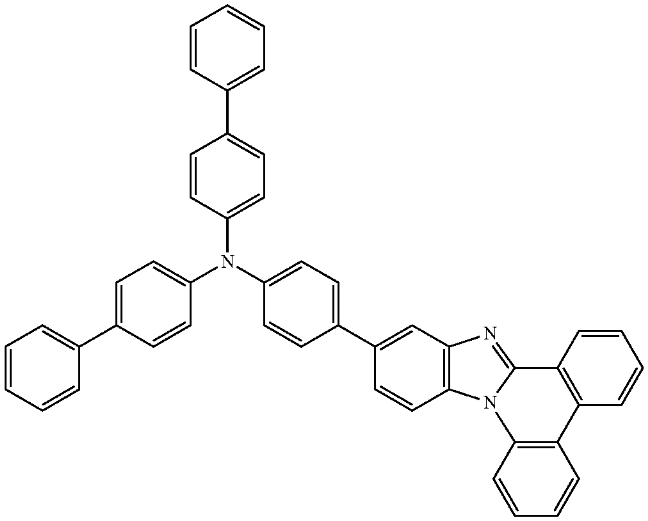
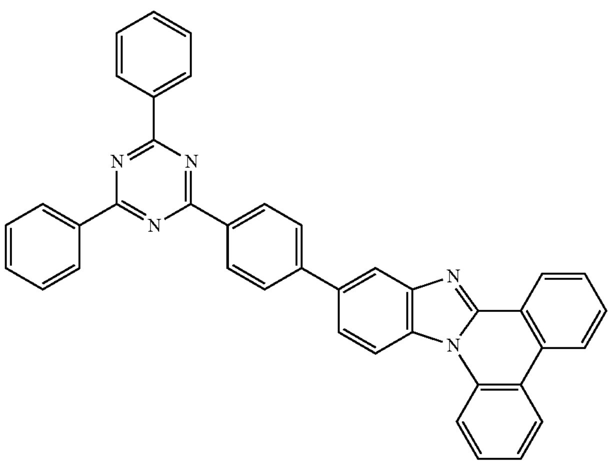
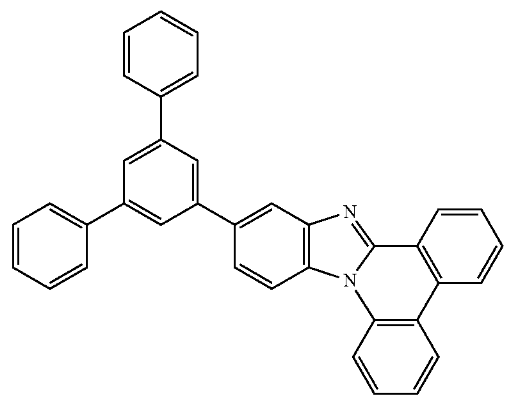
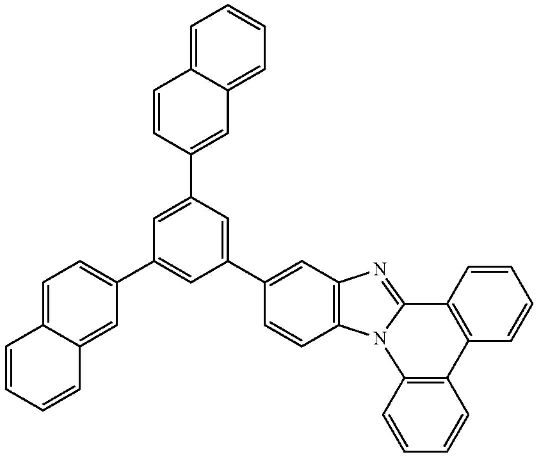
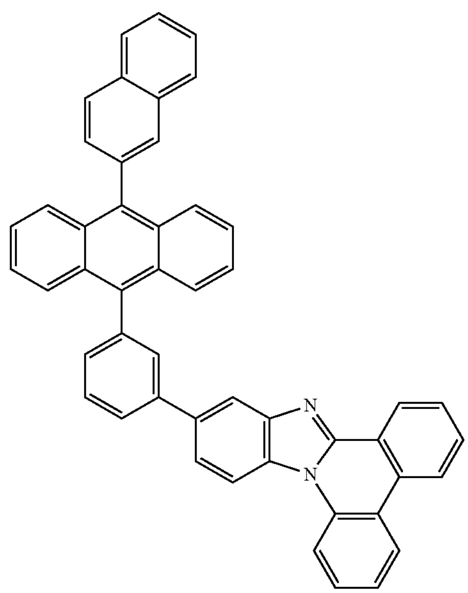

-continued
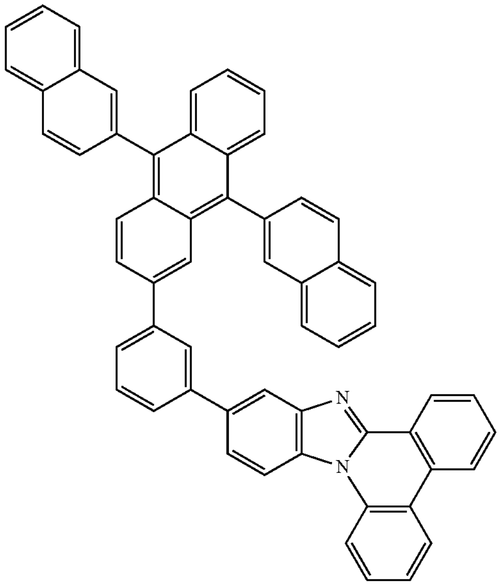
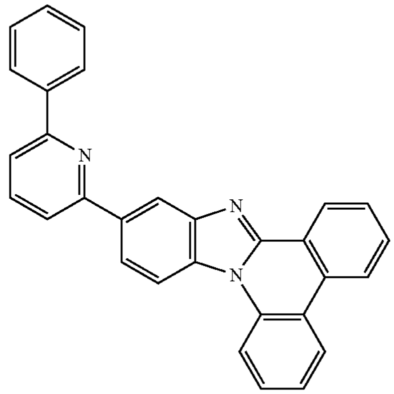
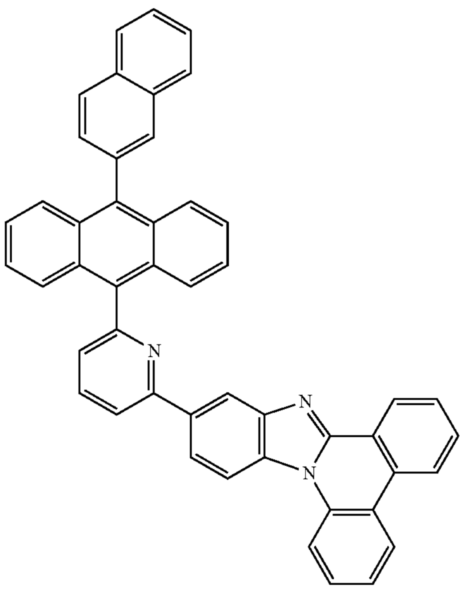
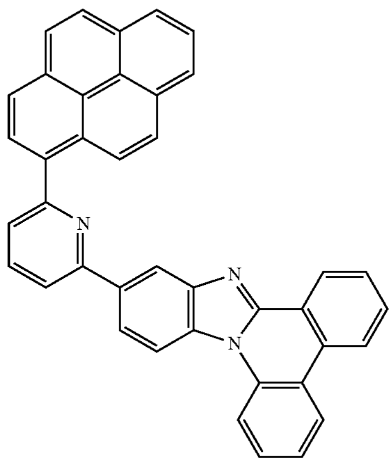
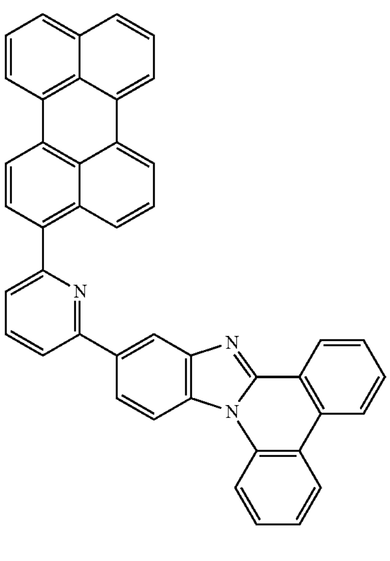
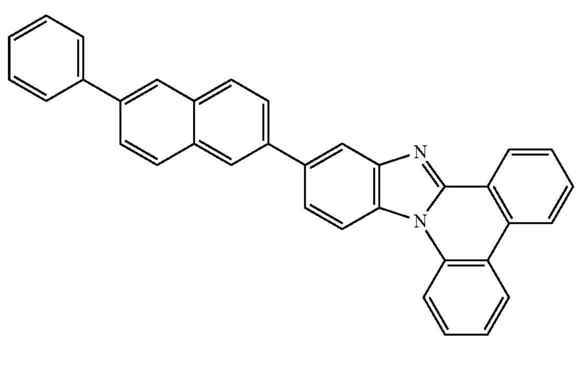

-continued
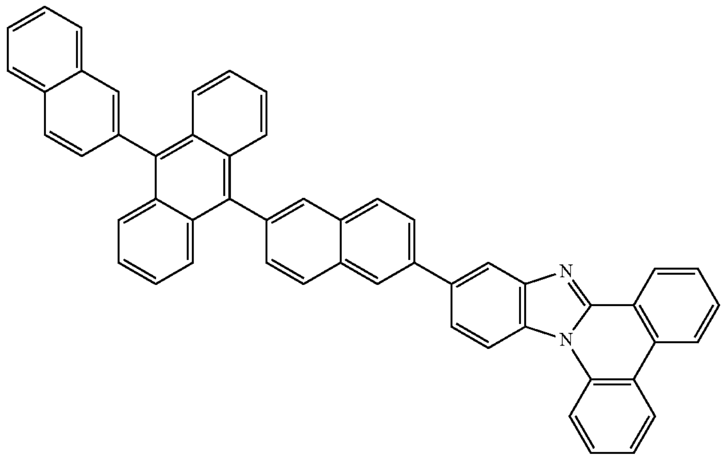
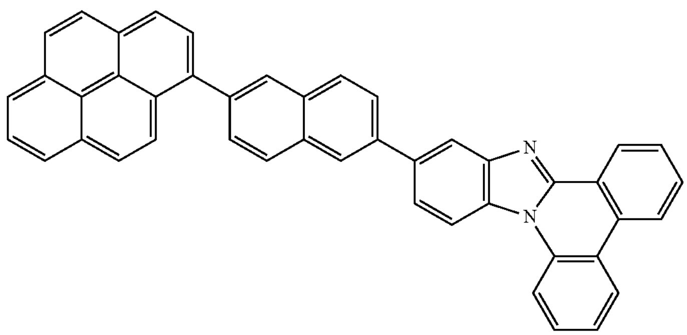
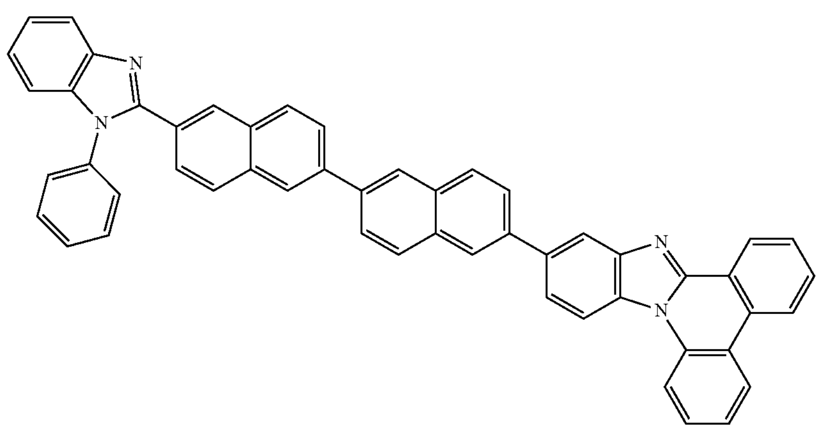
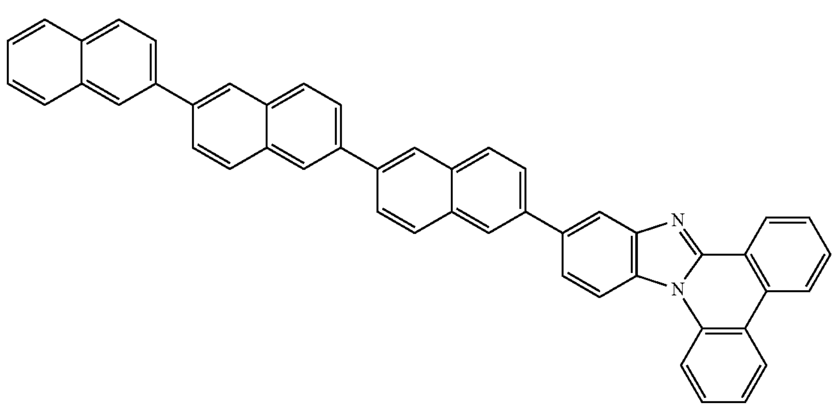

-continued
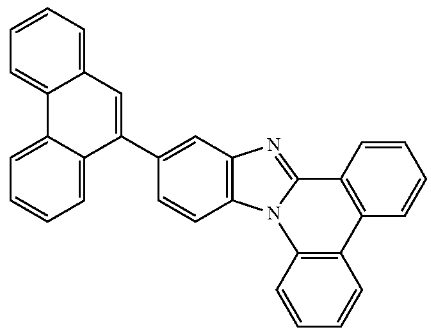
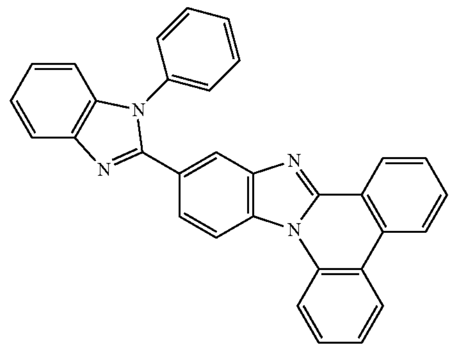
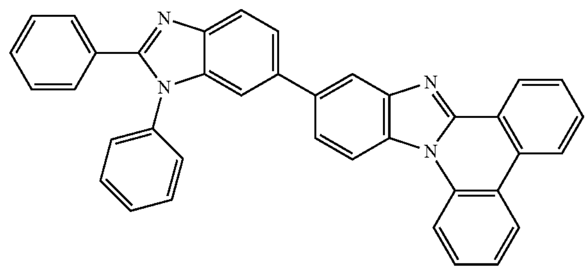
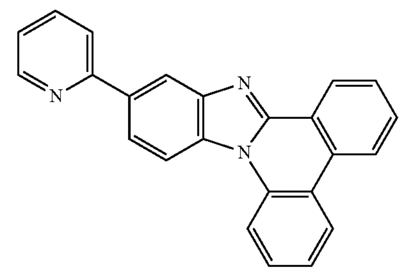
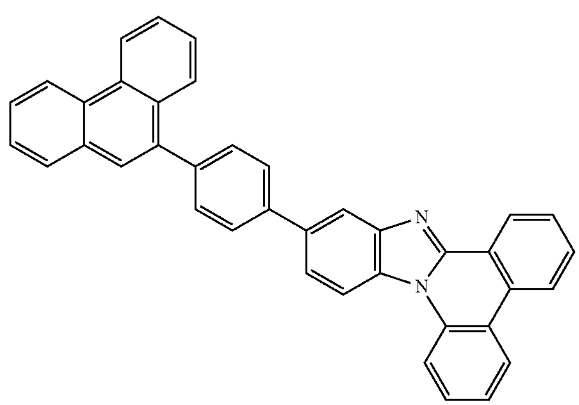
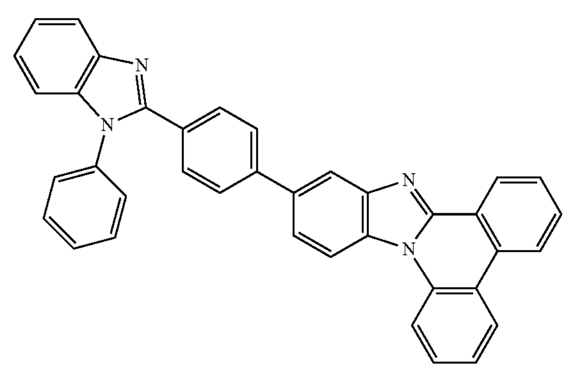
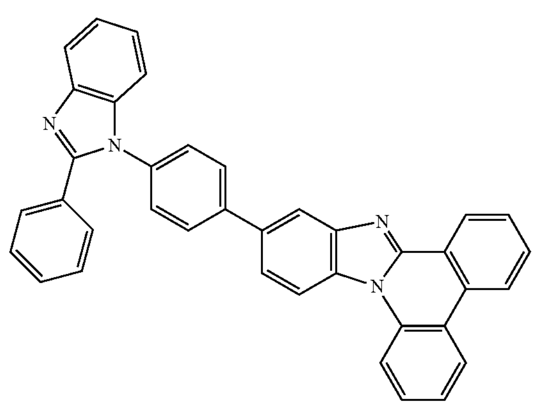
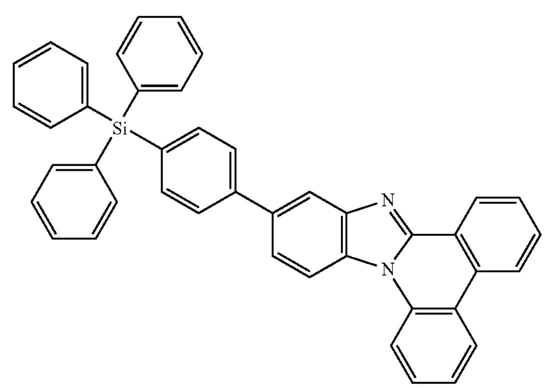

-continued
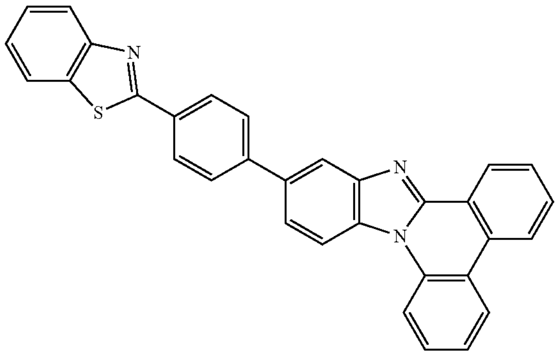
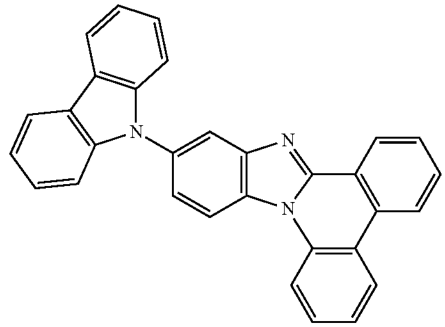
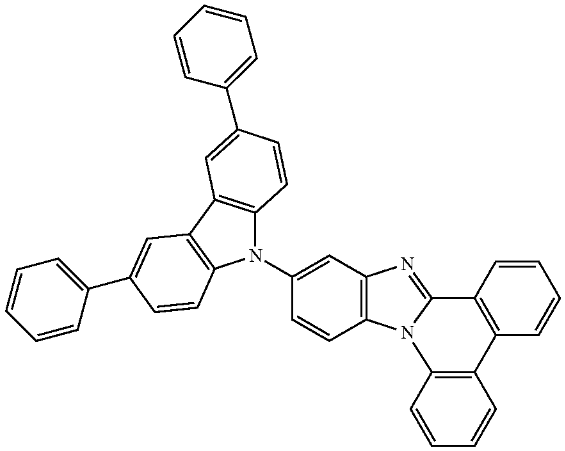
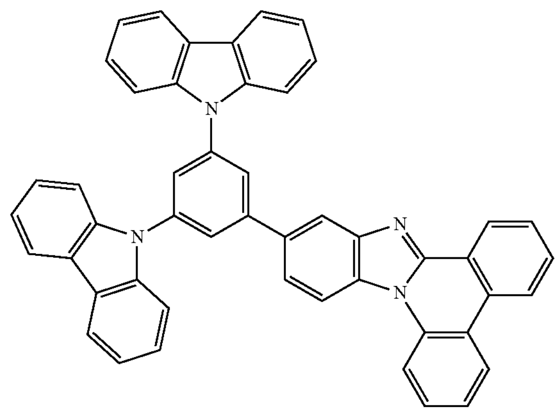
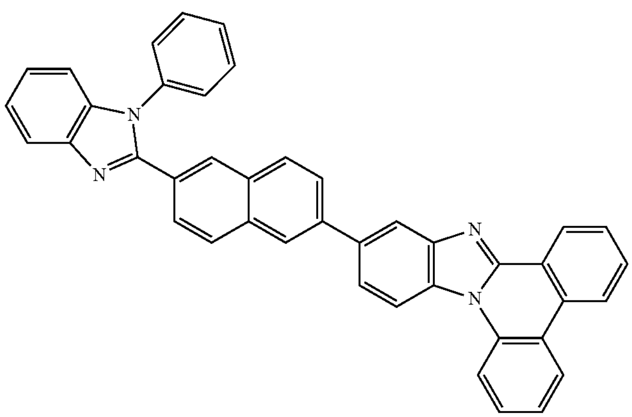
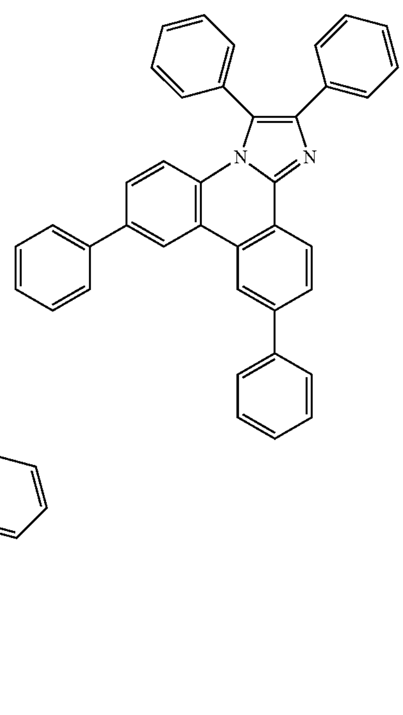
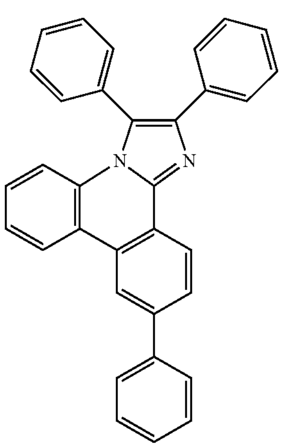
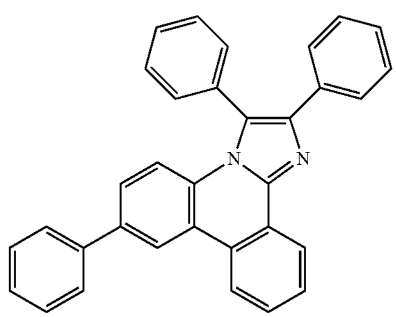

-continued
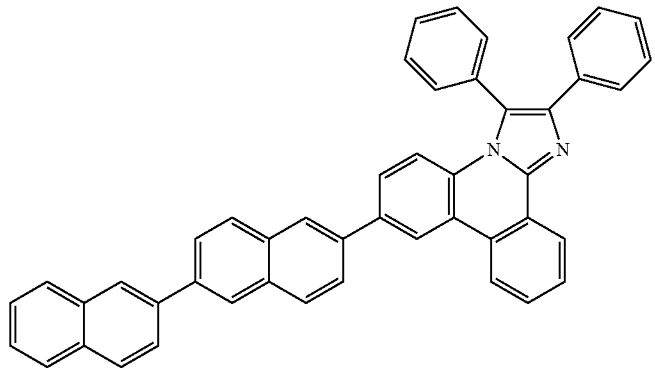
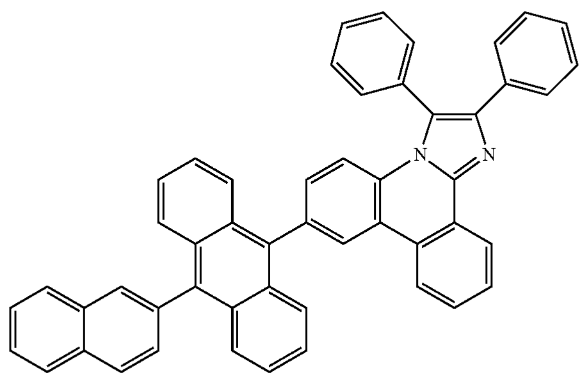
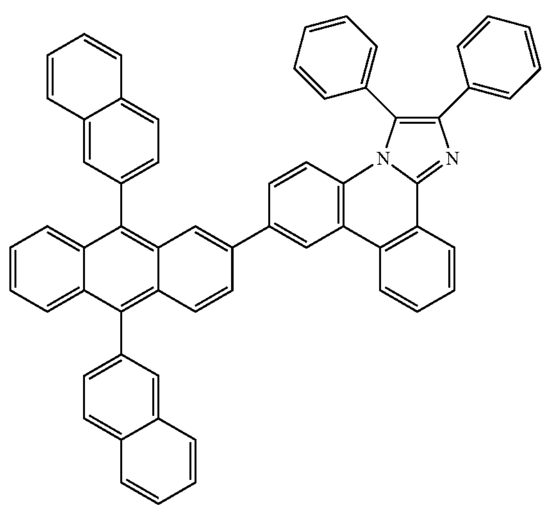
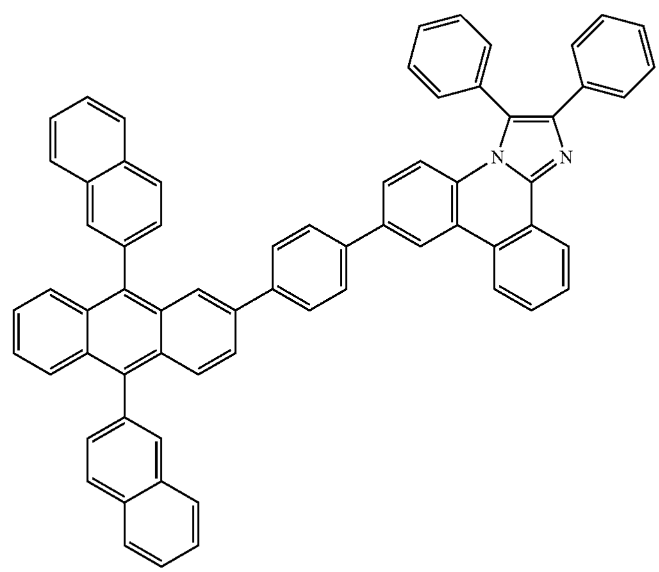

-continued
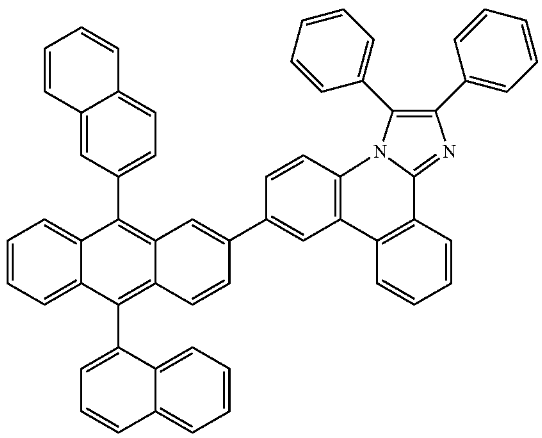
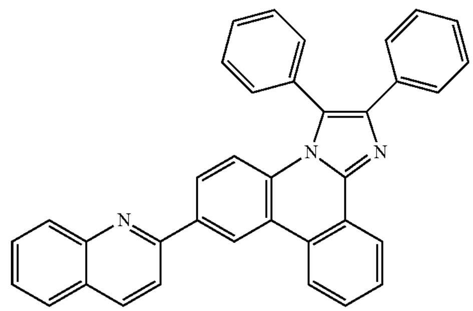
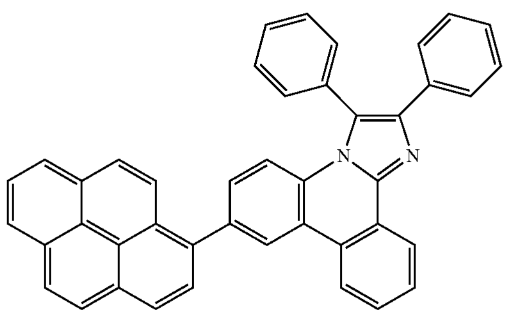
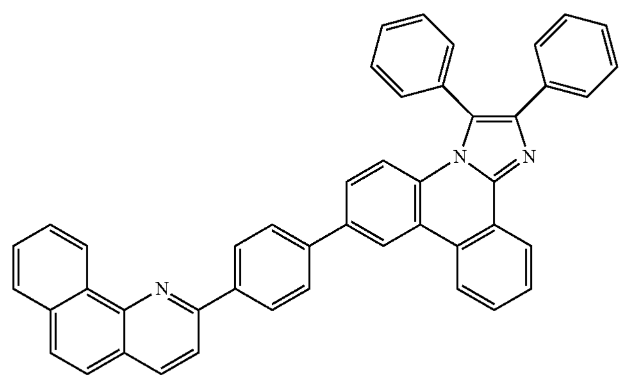
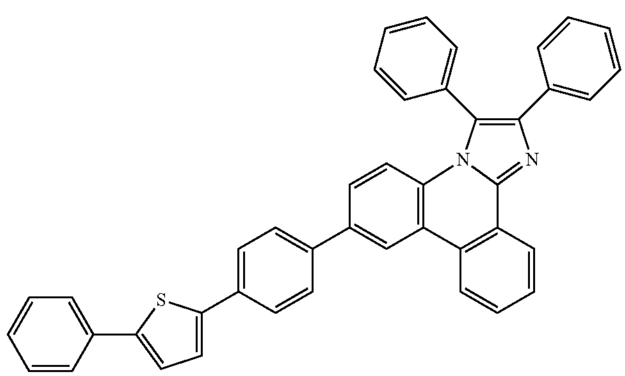
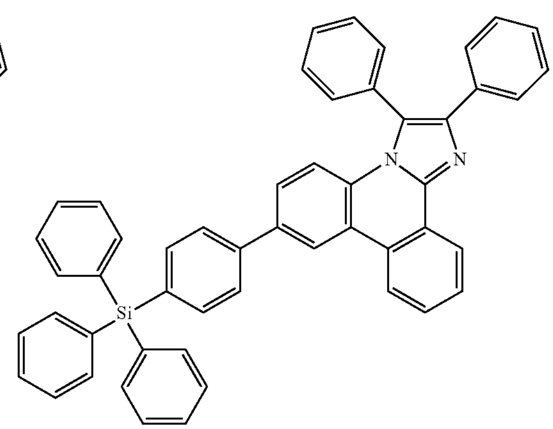
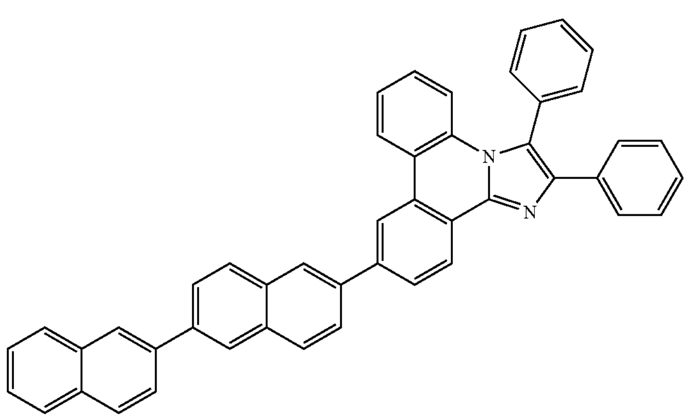

-continued
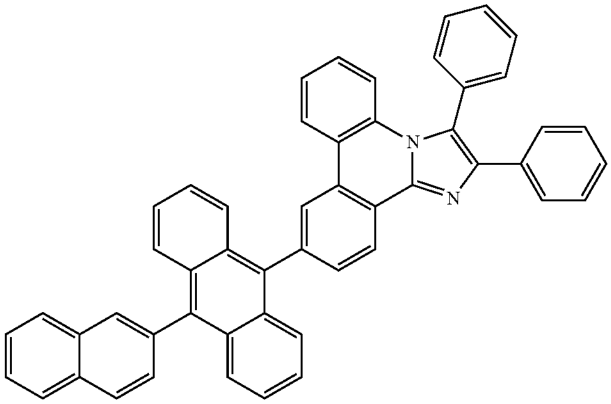
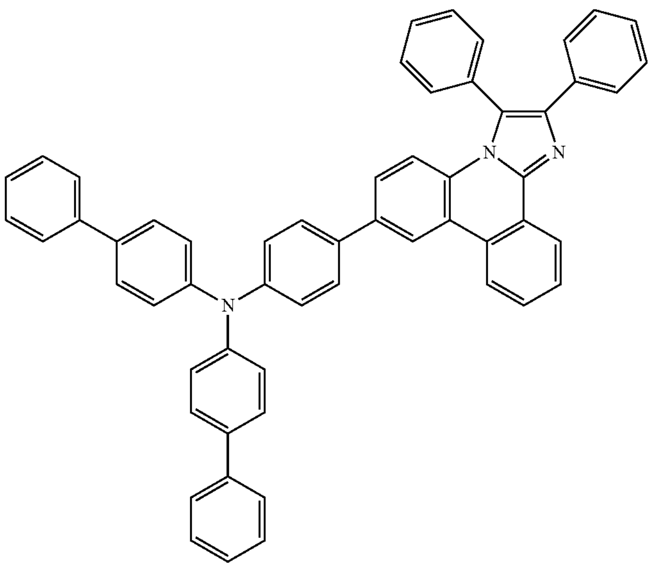
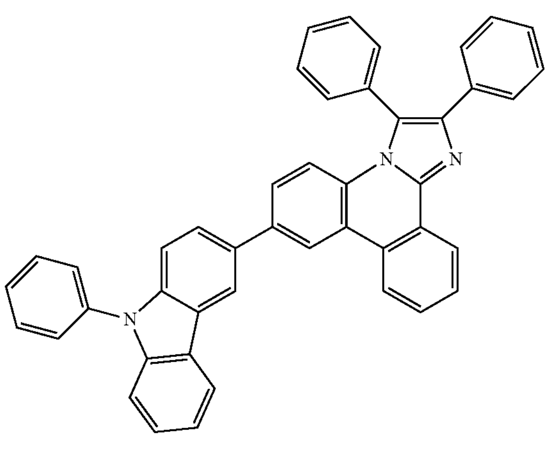
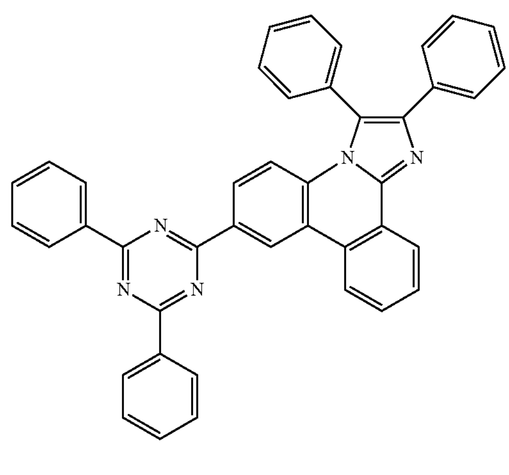

-continued
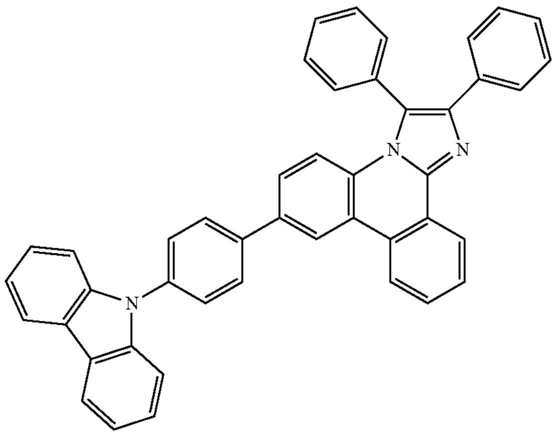
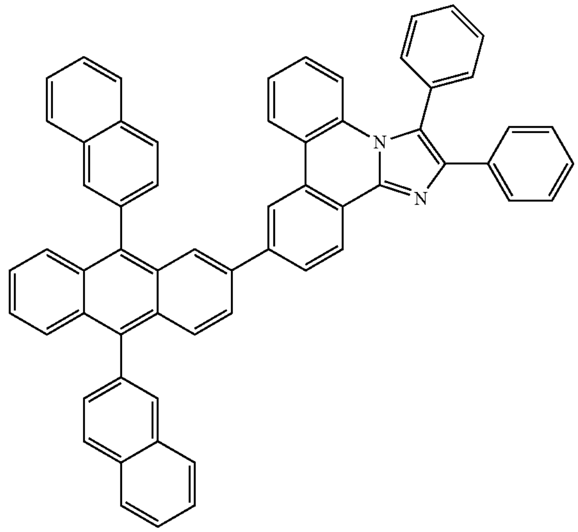
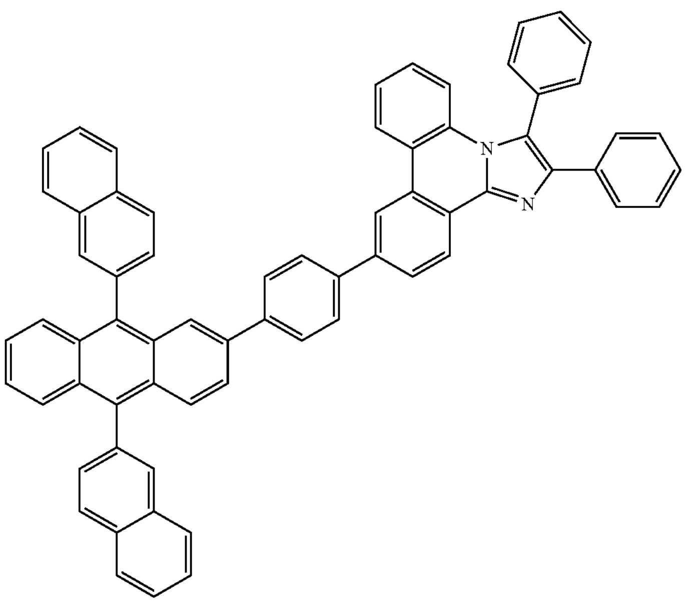
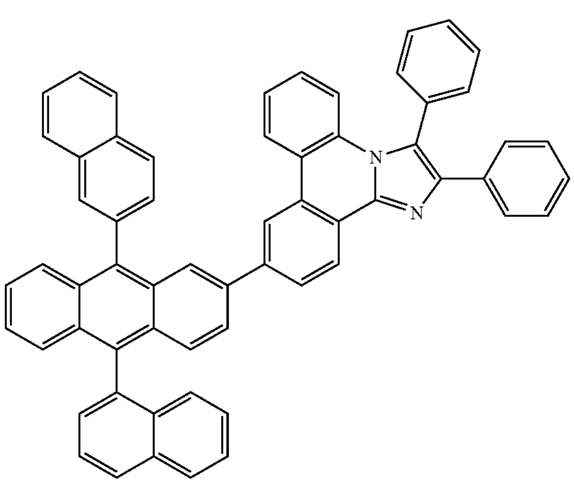
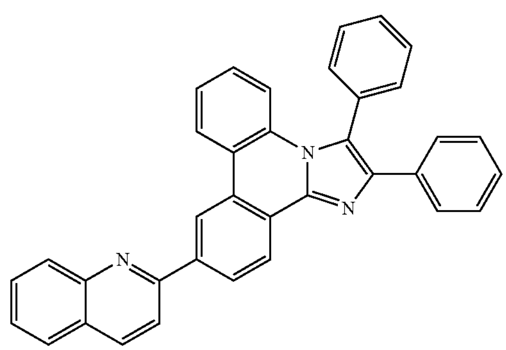

-continued
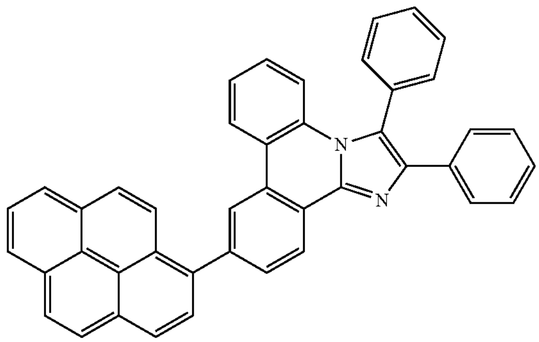
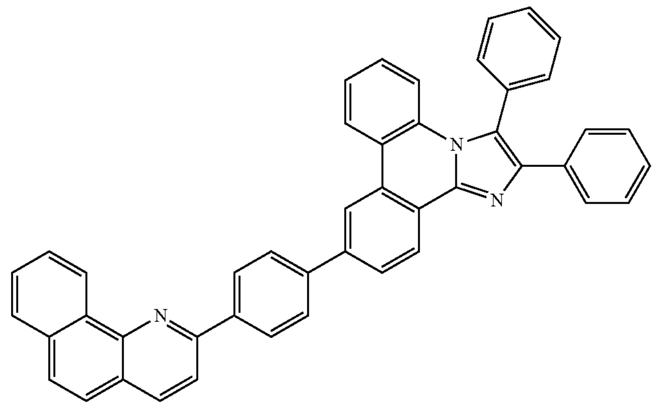
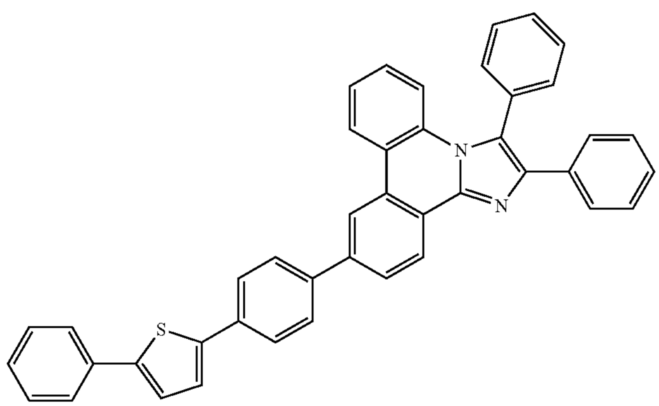
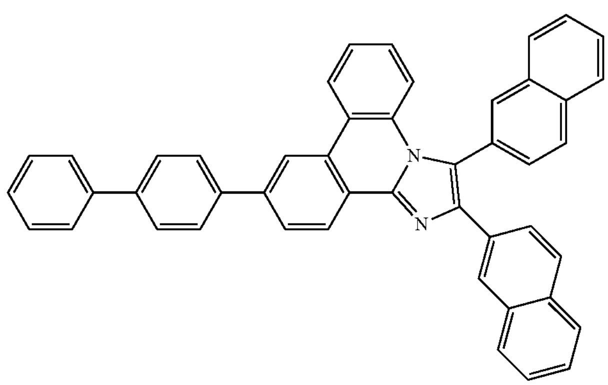
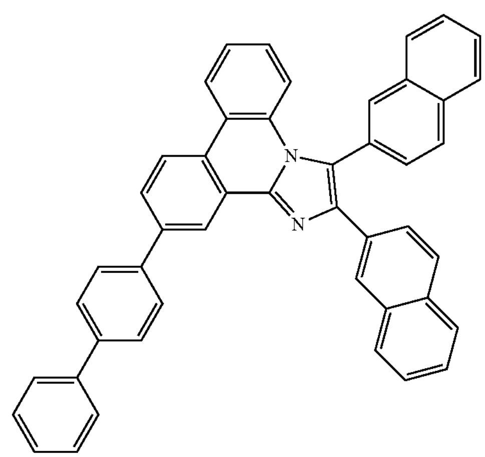

-continued
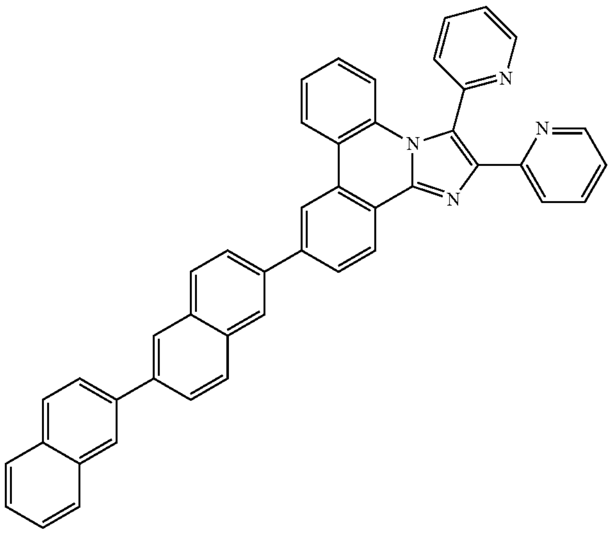
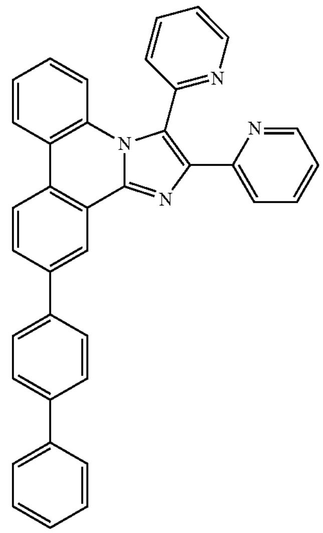
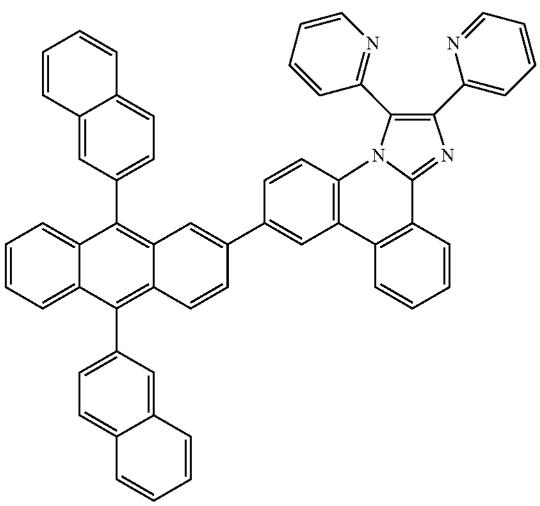
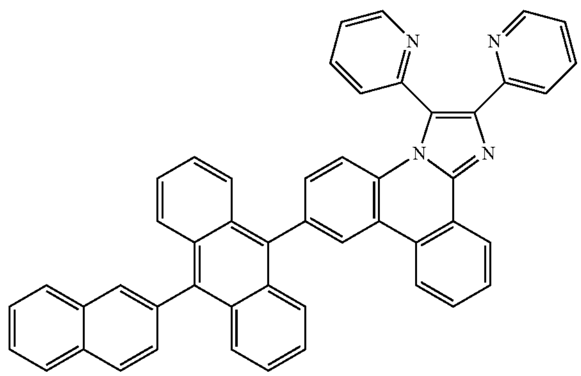
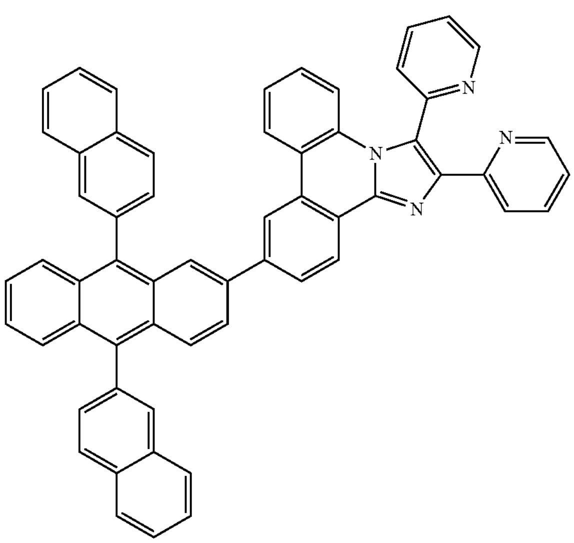
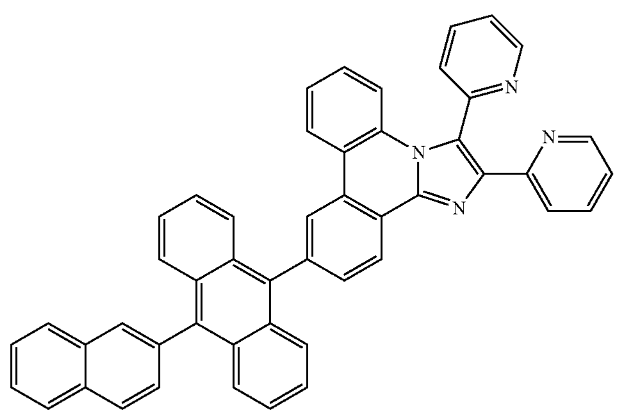

-continued
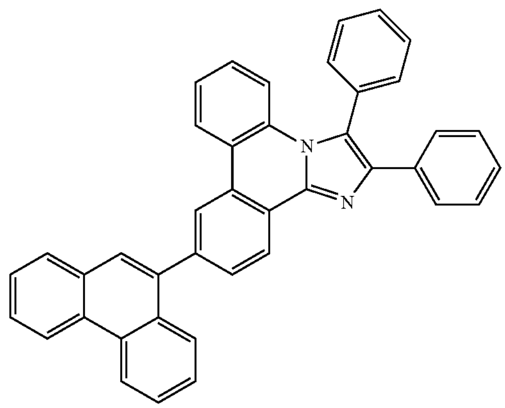
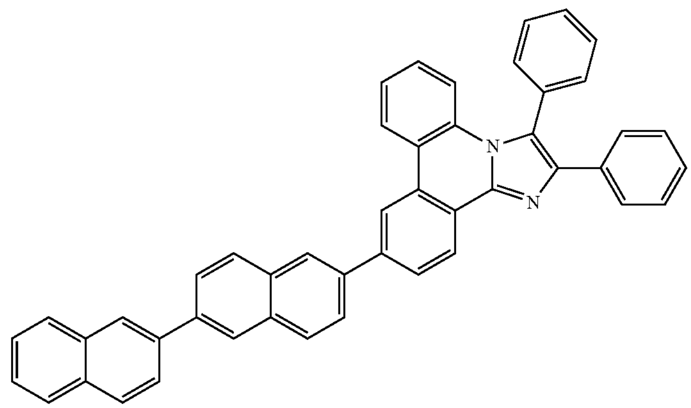
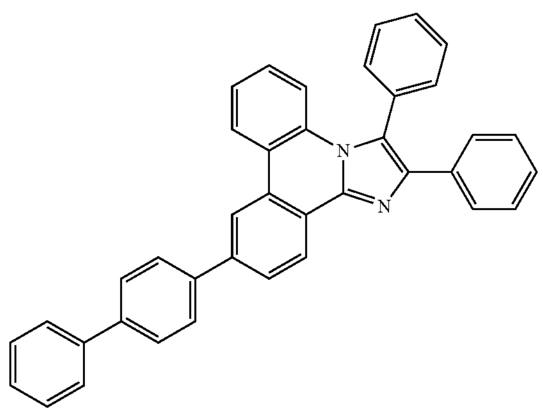
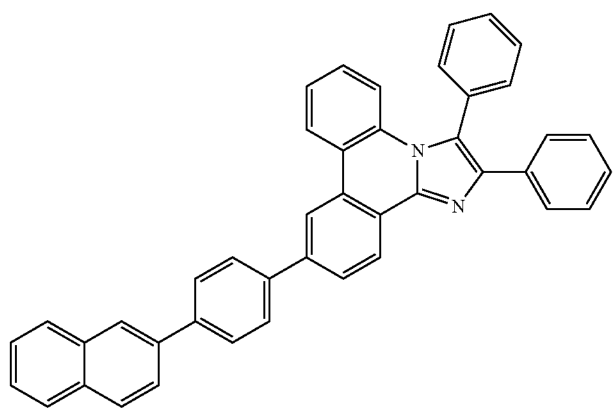
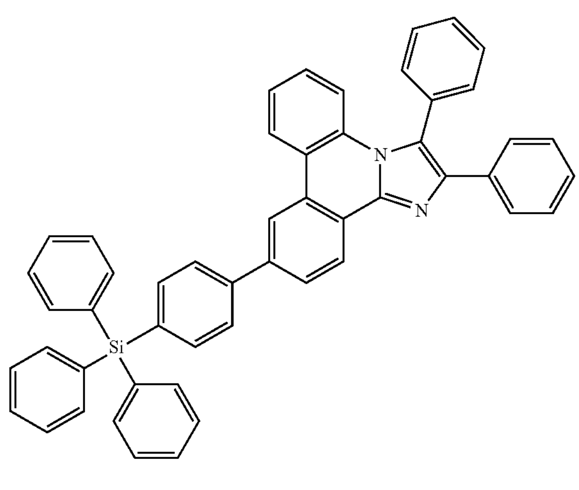
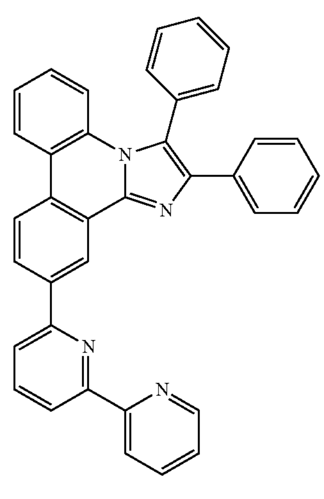

-continued
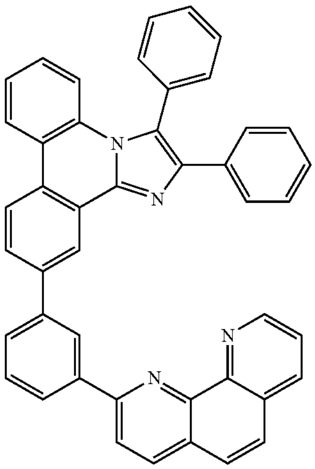
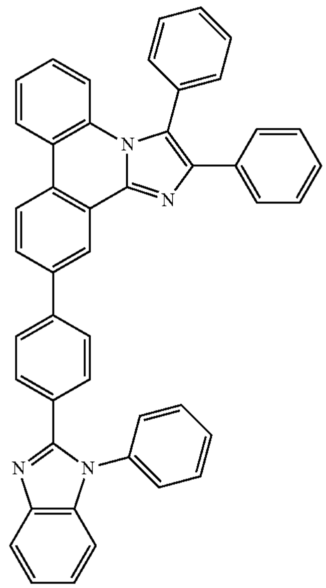
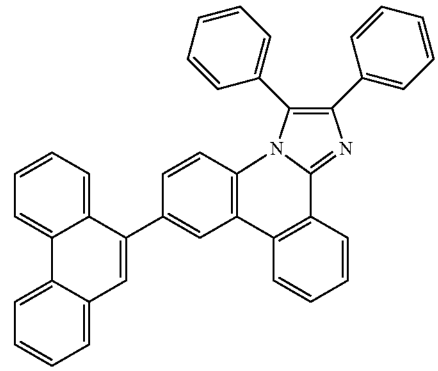
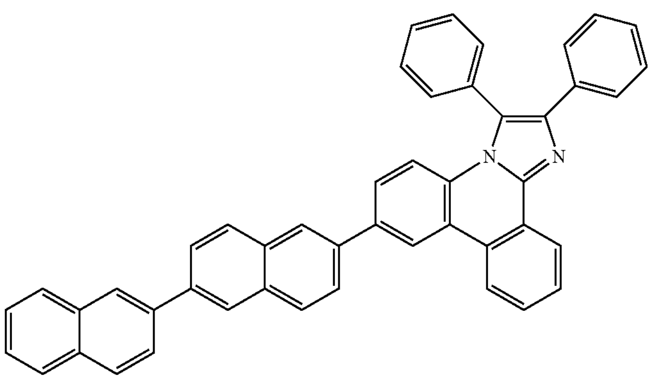
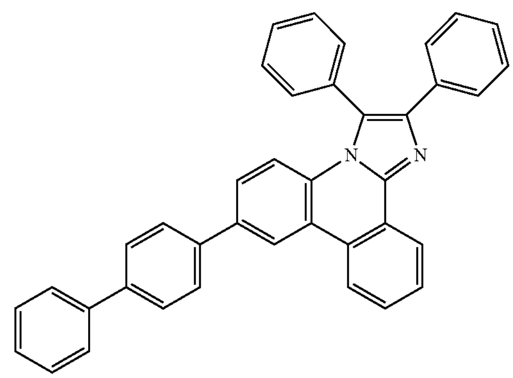
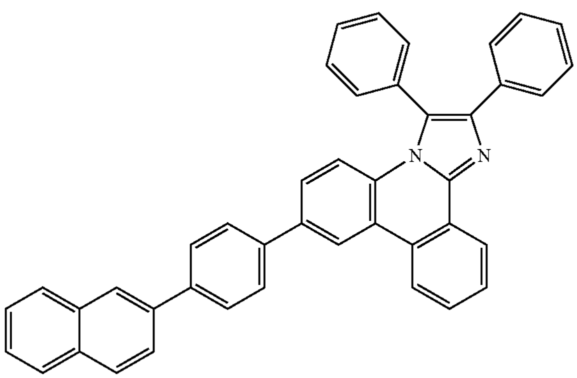
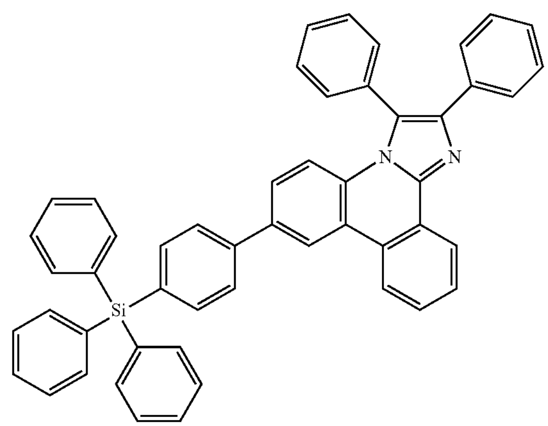
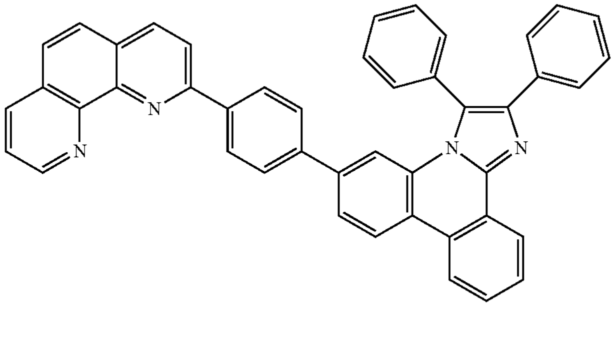
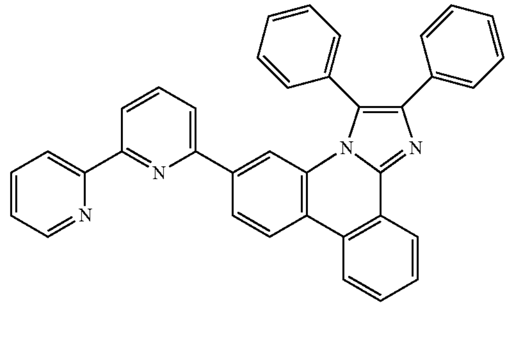

-continued
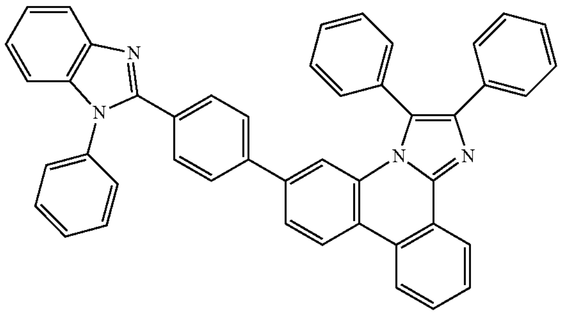
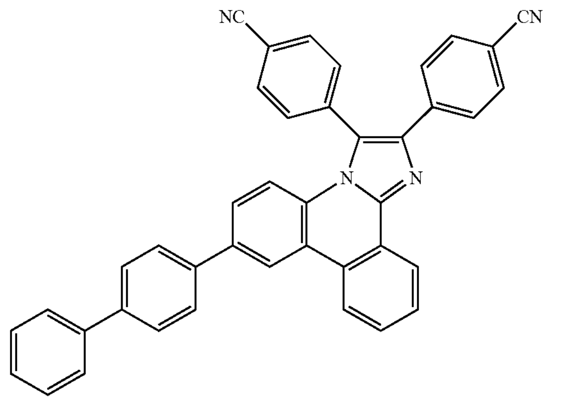
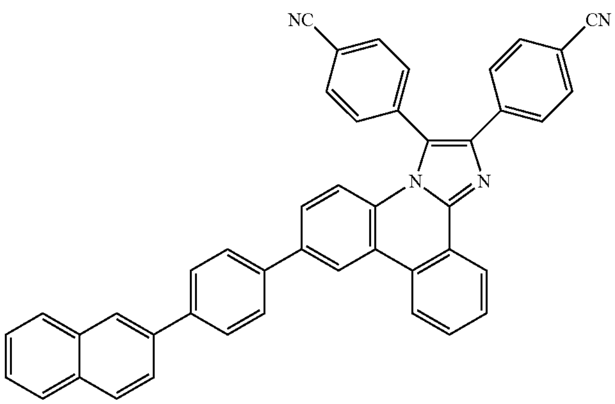
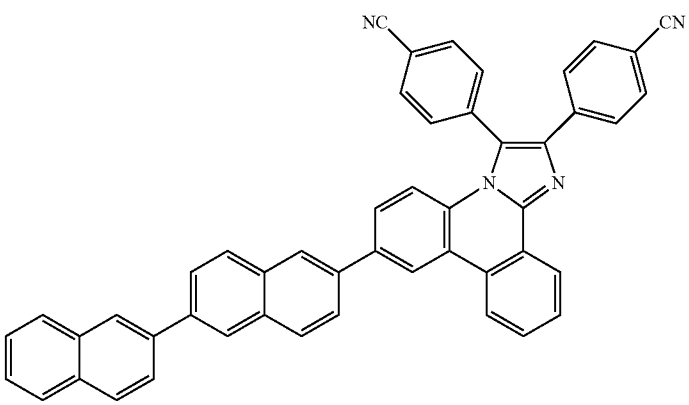
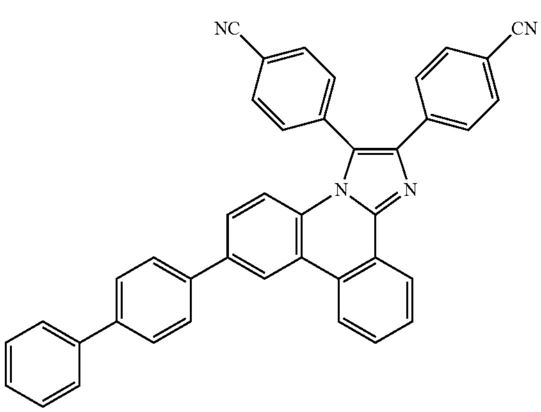
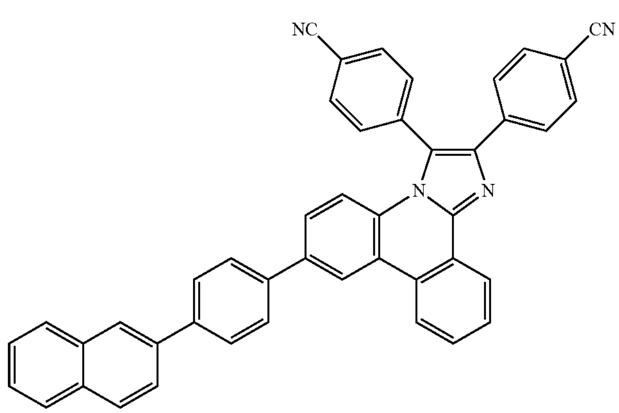

-continued
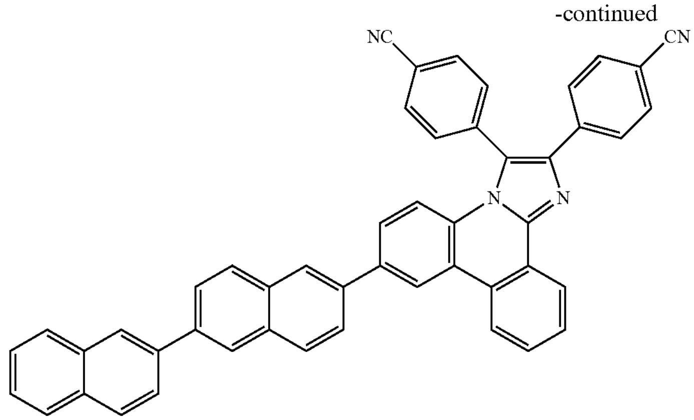
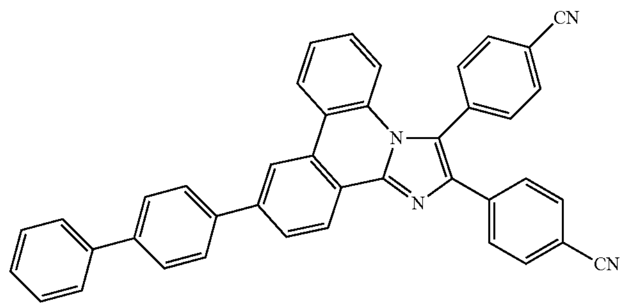
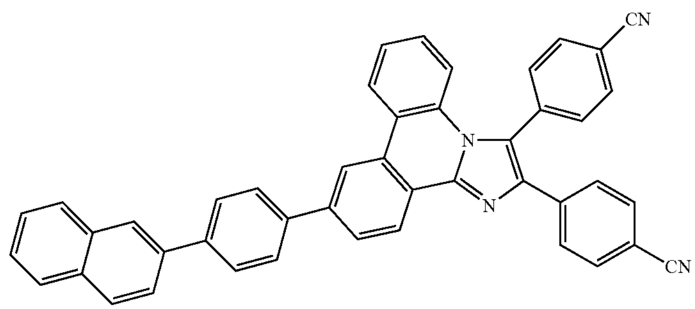
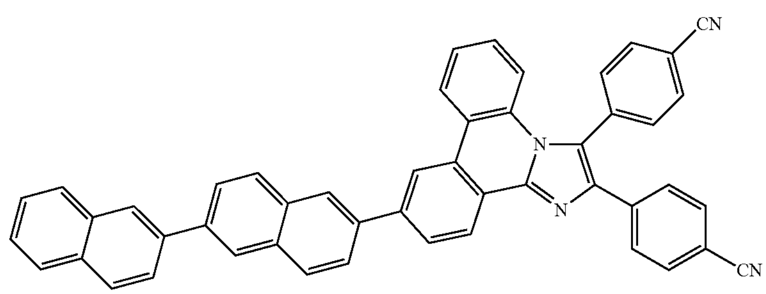
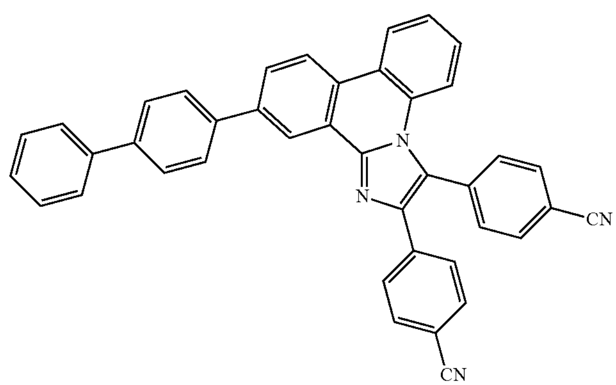

-continued
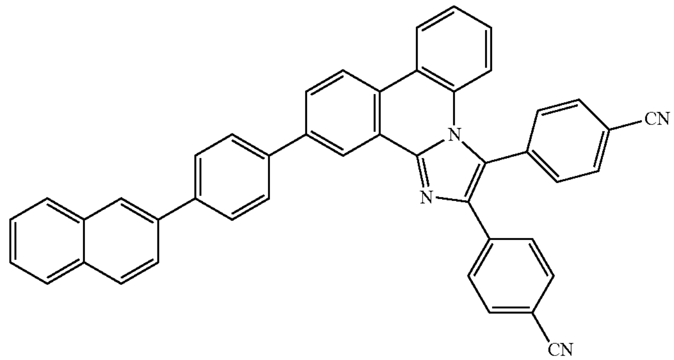
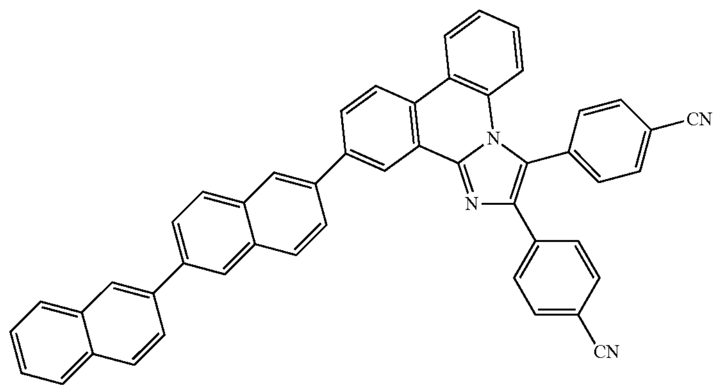
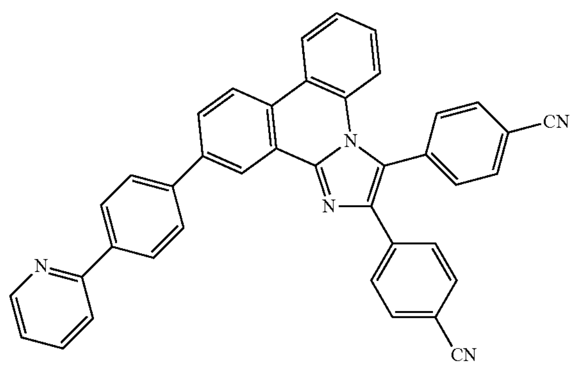
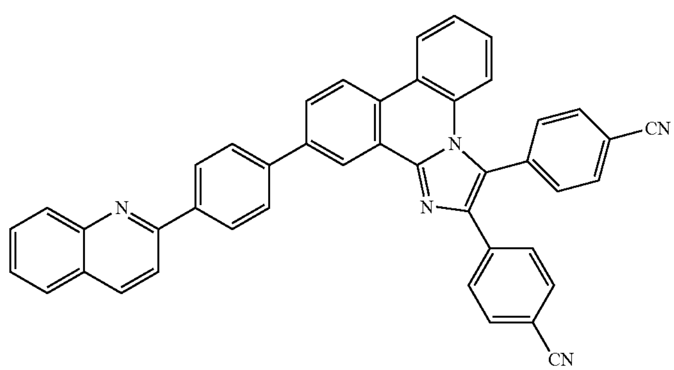

-continued
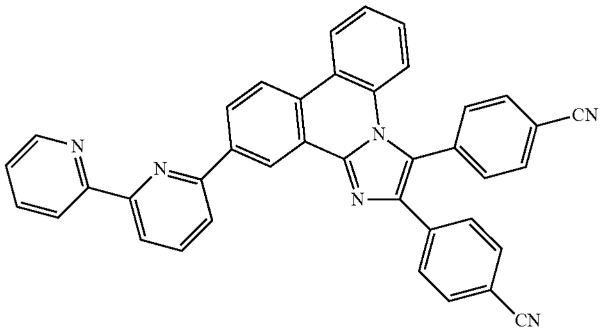
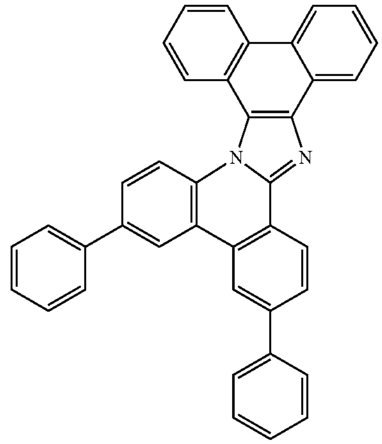
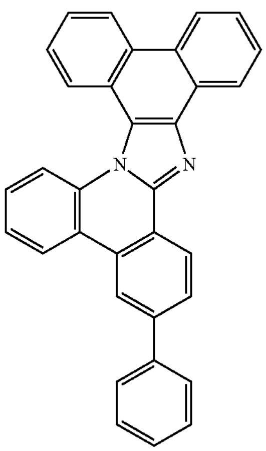
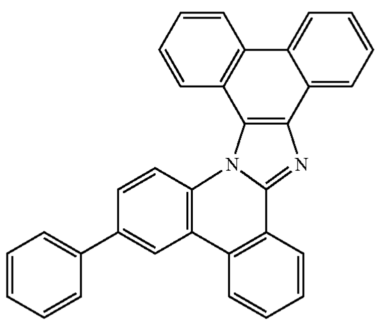
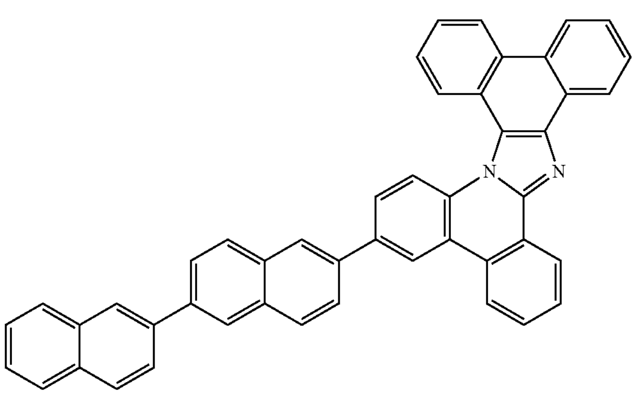
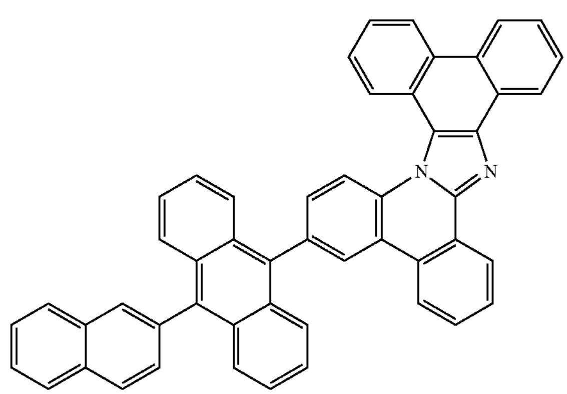

-continued
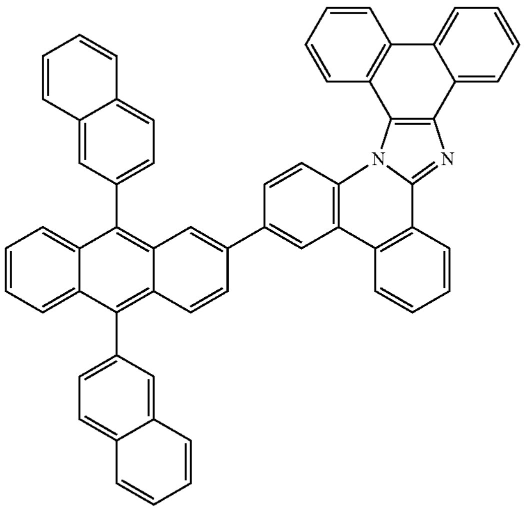
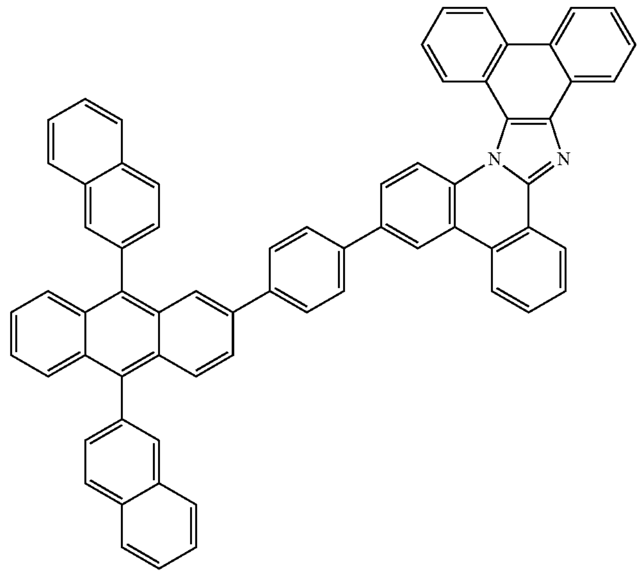
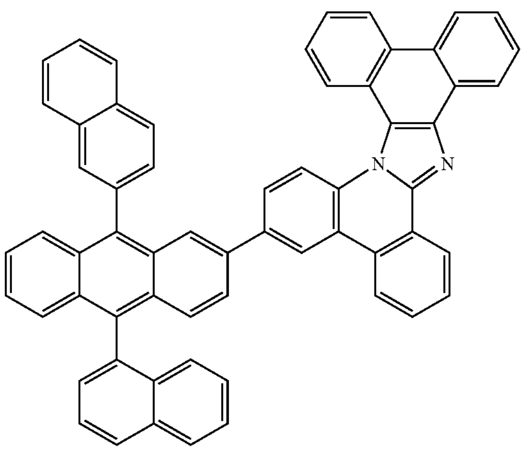
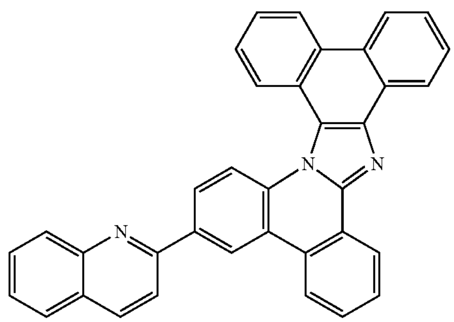
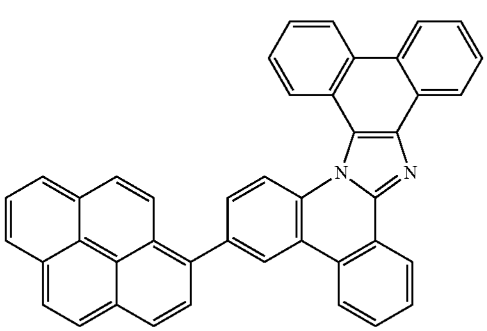
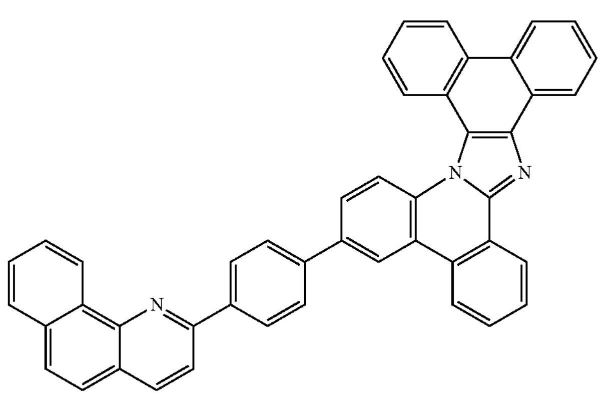

-continued
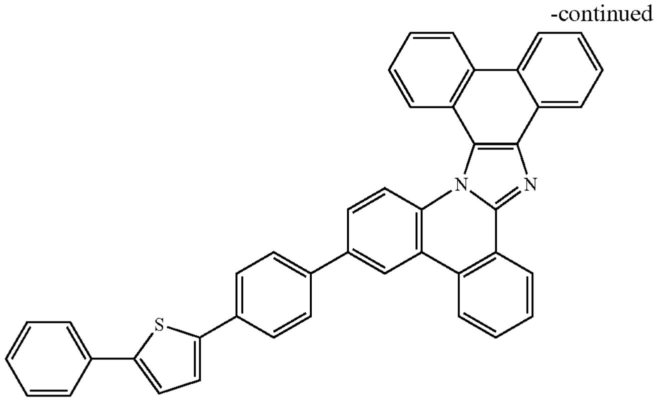
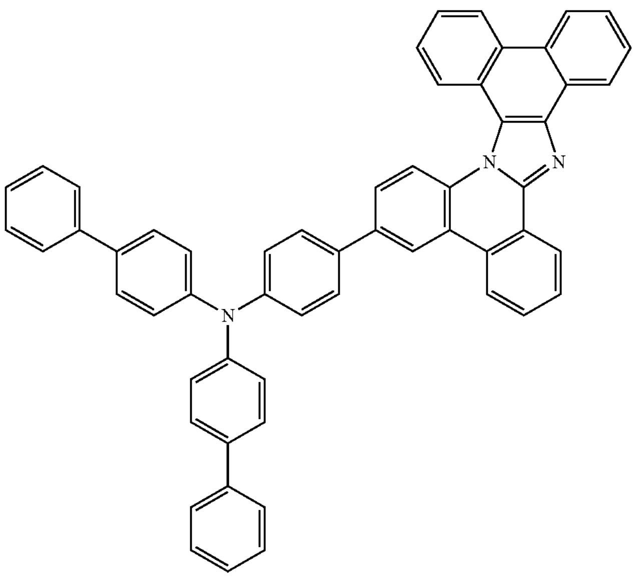
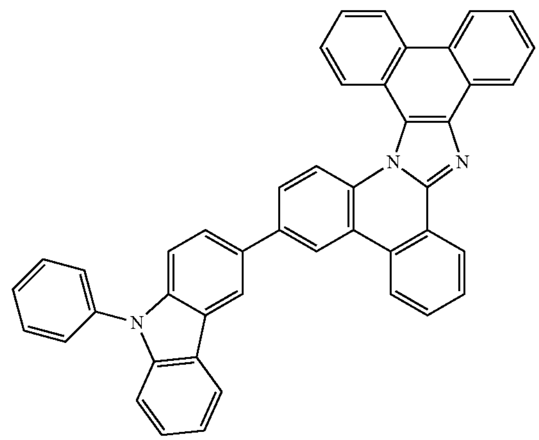
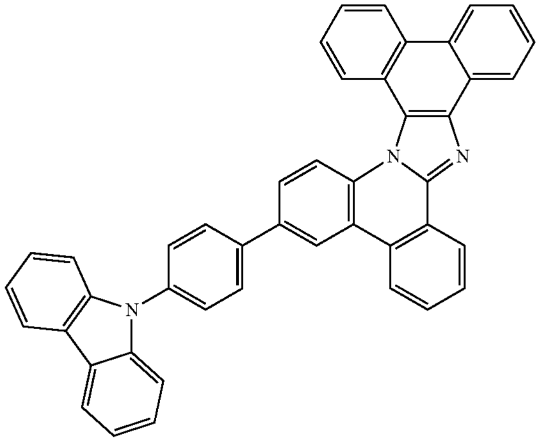
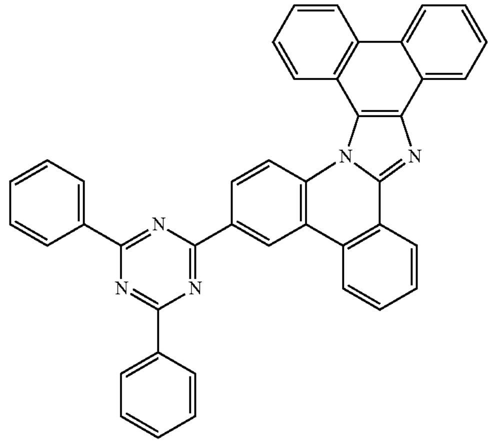

-continued
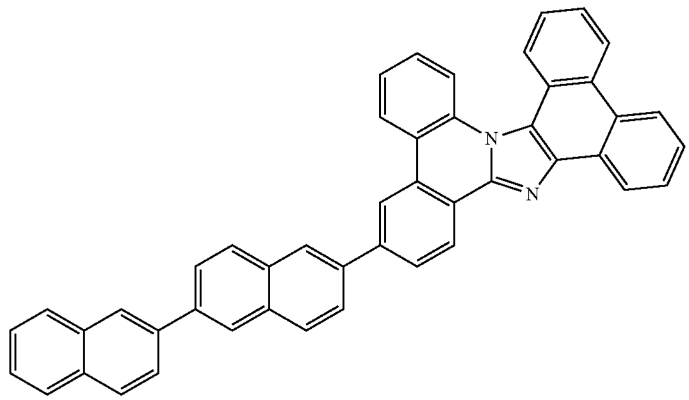
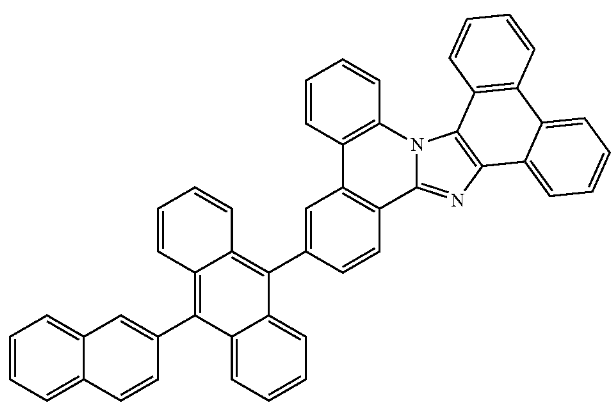
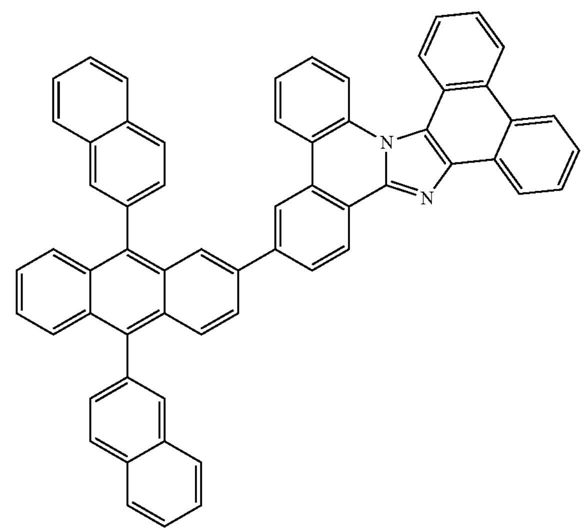
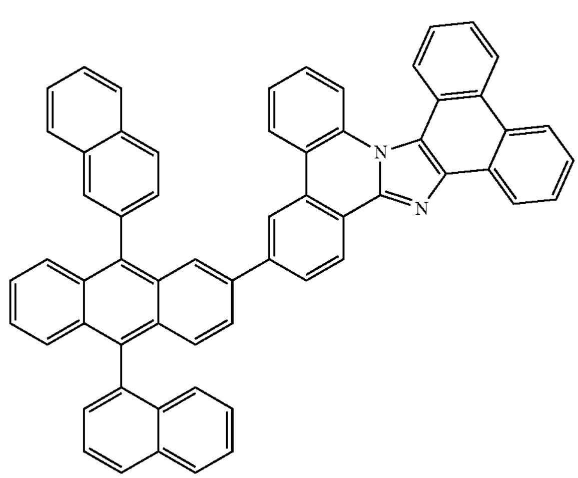
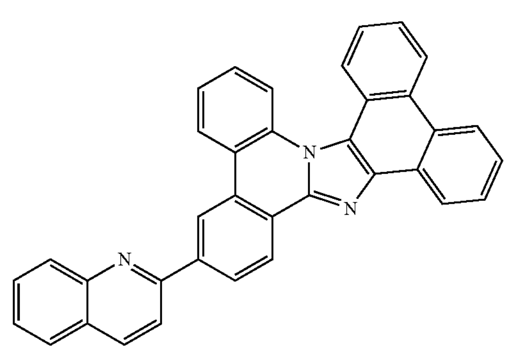

-continued
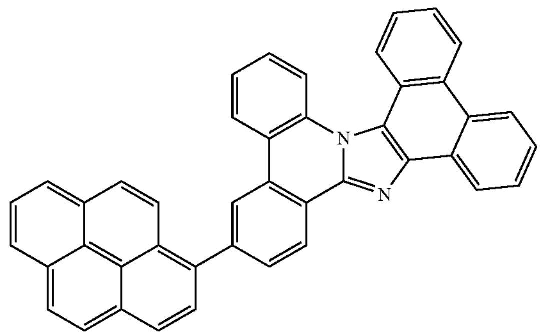
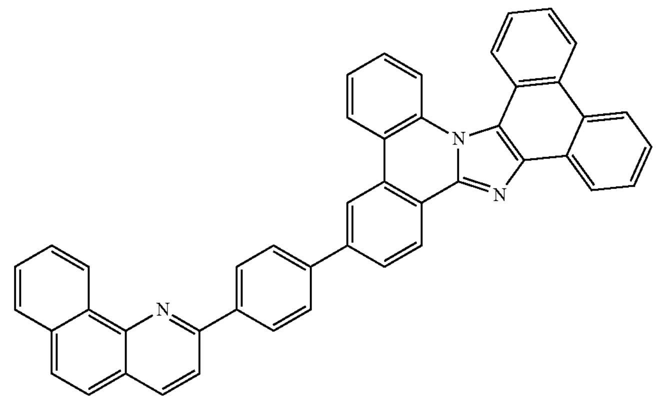
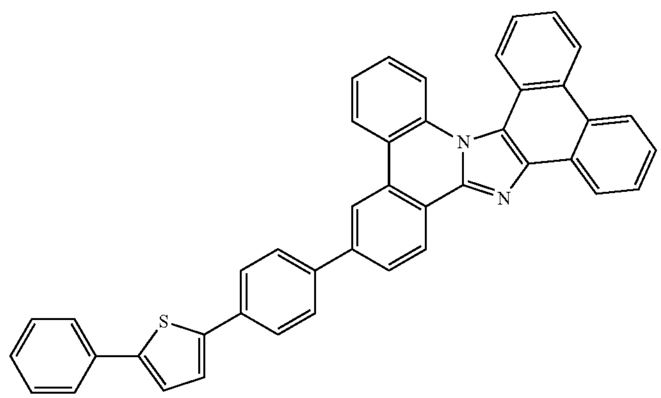
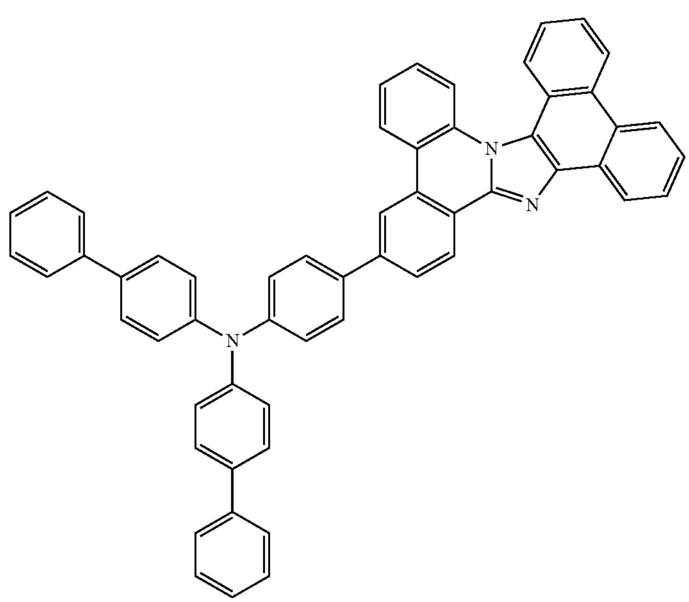

-continued
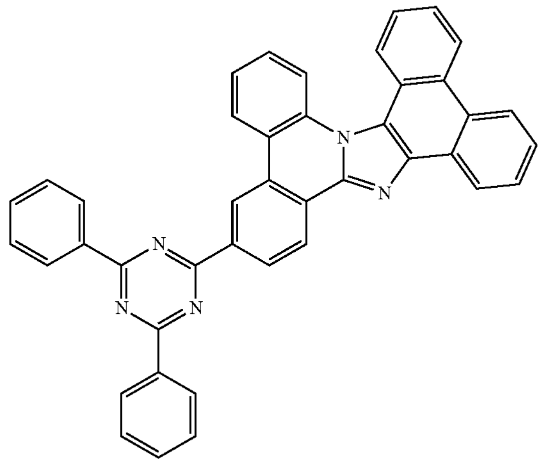
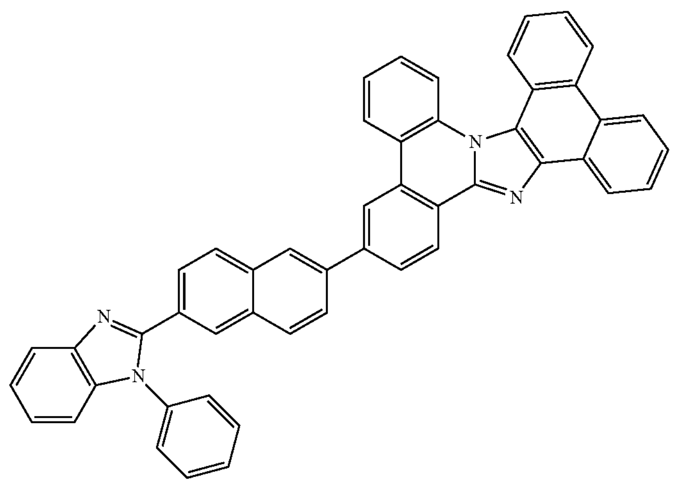
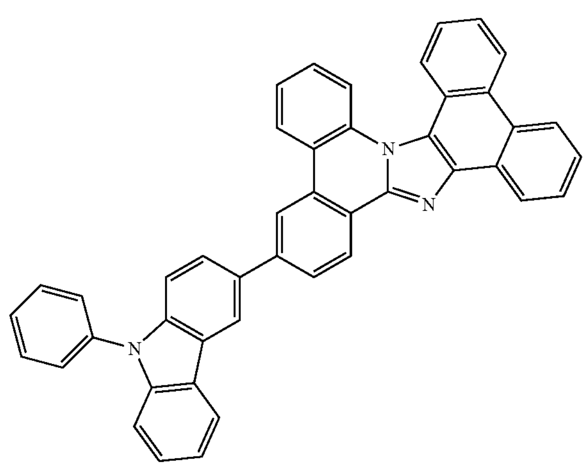
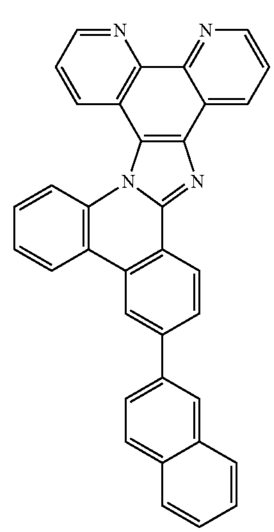

-continued
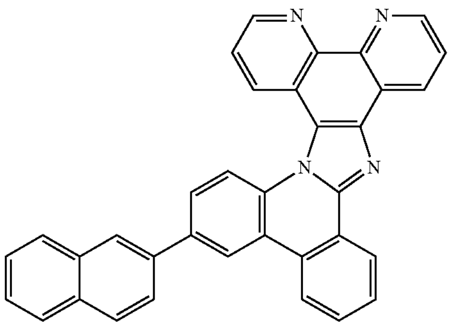
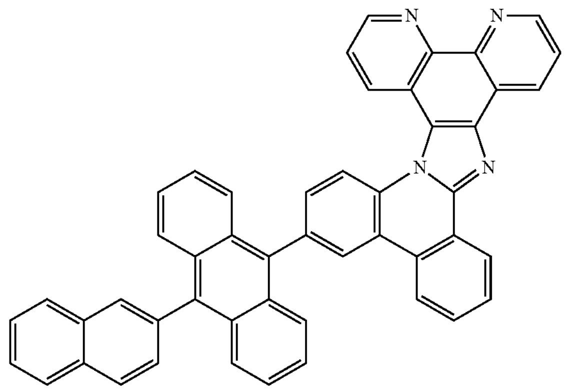
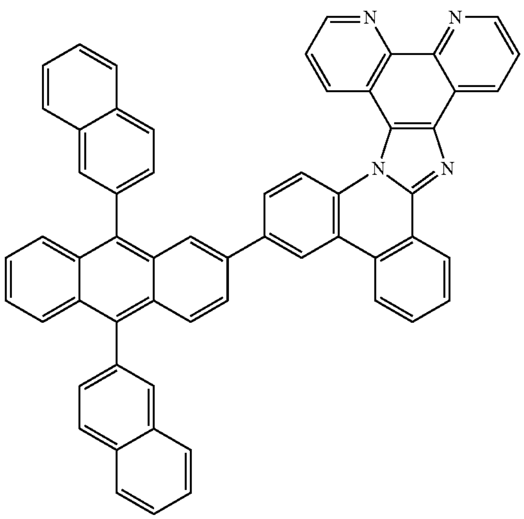
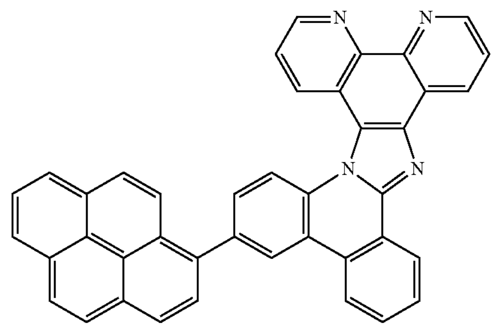
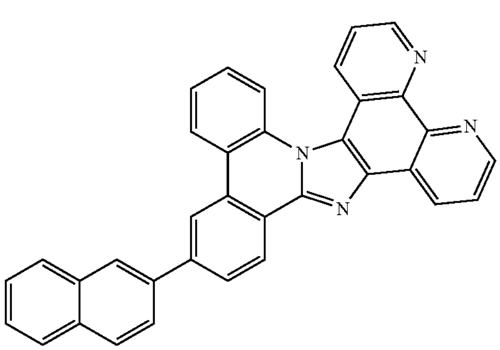
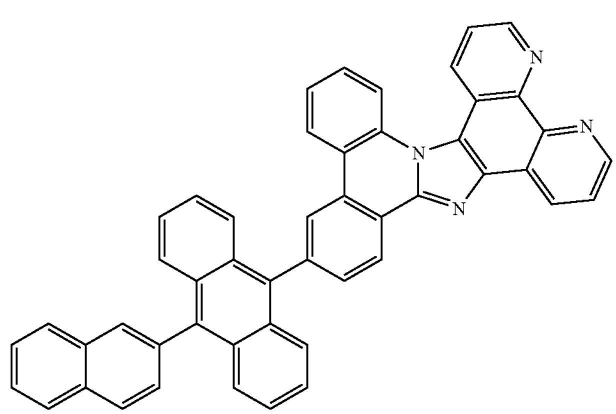

-continued
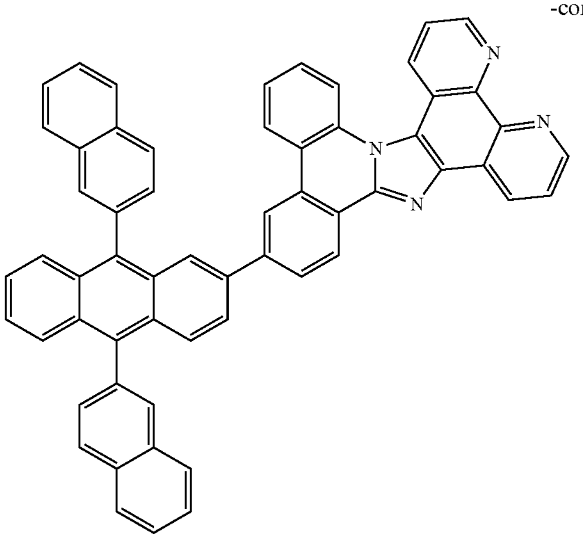
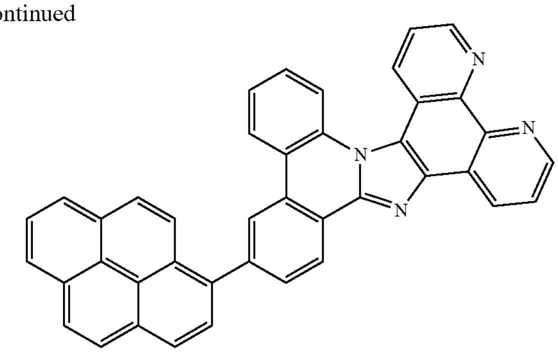
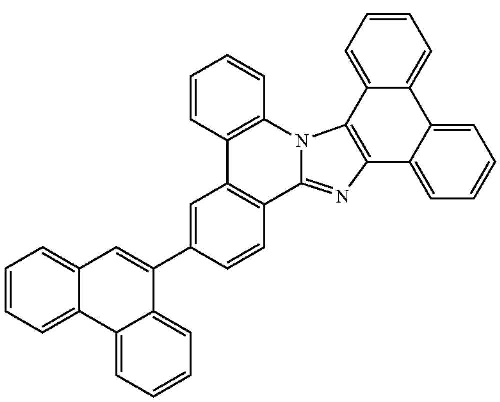
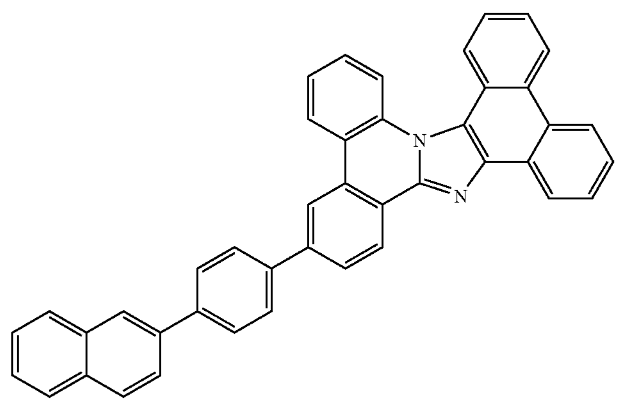
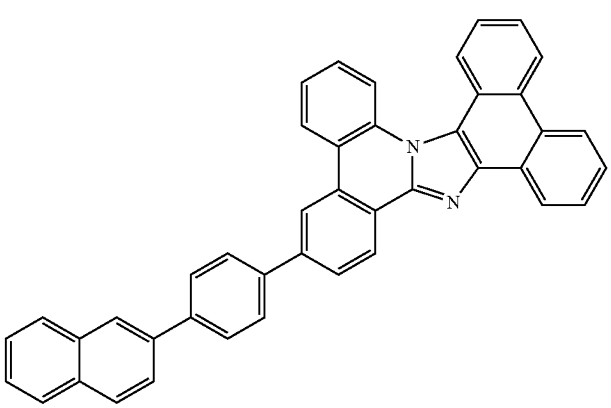
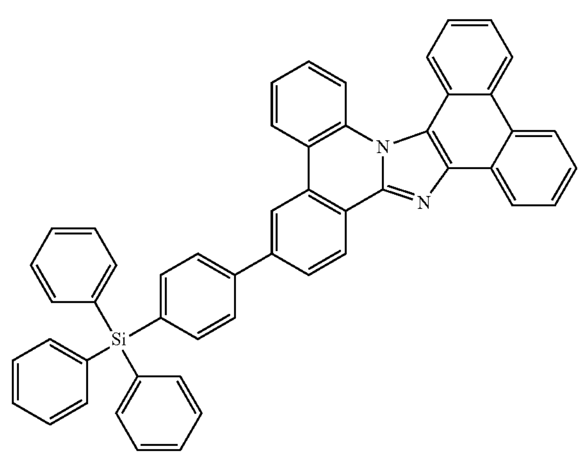

-continued
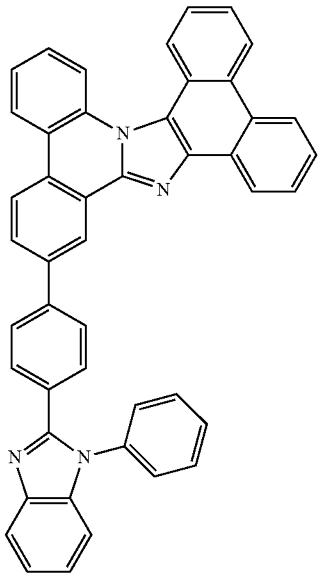
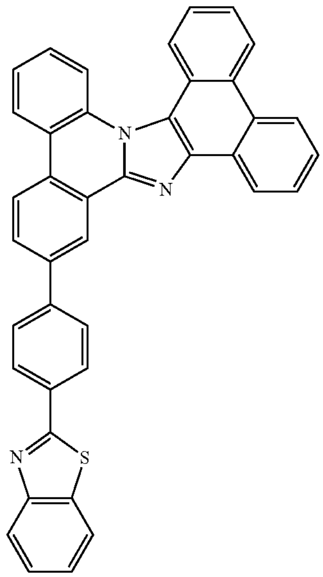
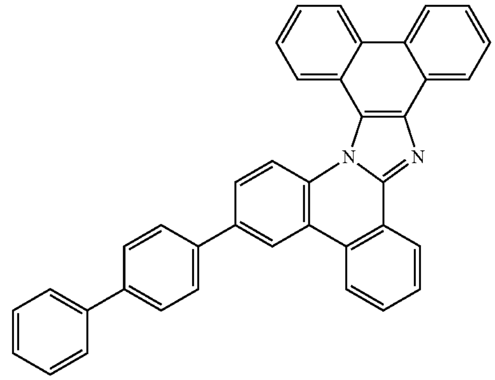
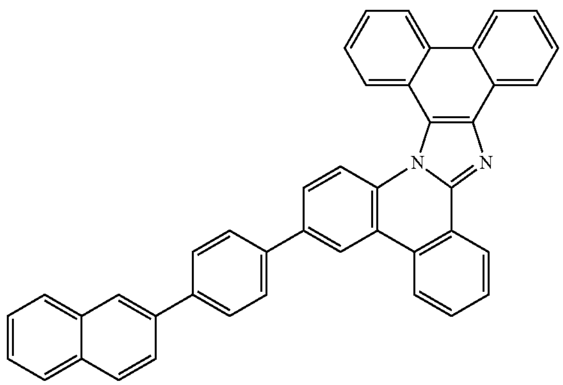
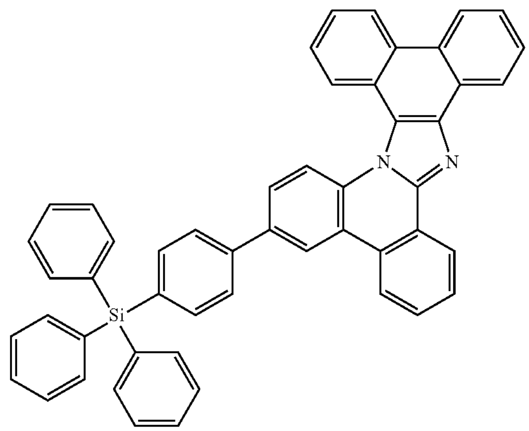
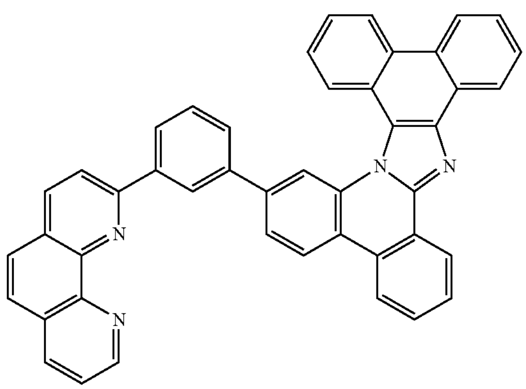
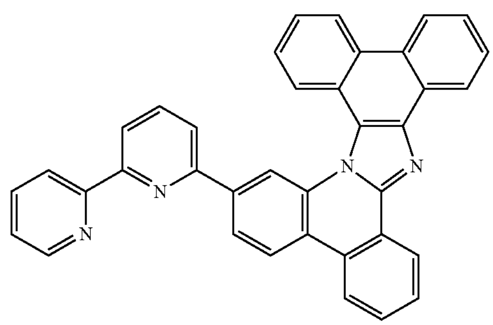
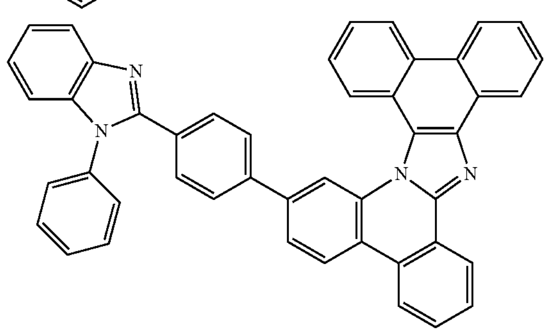
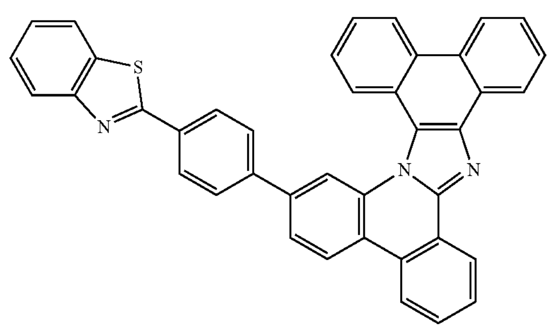

-continued
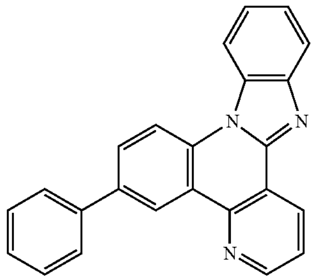
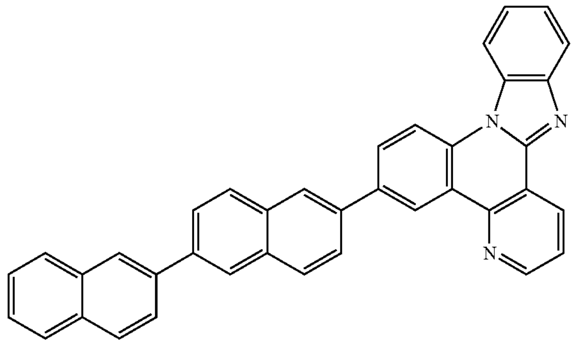
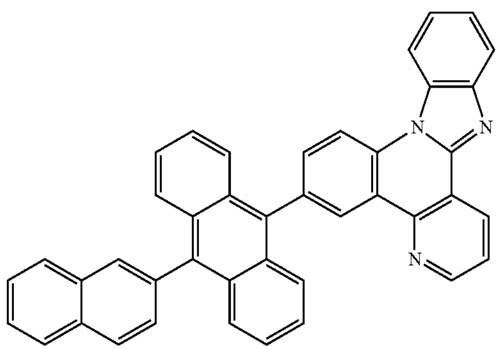
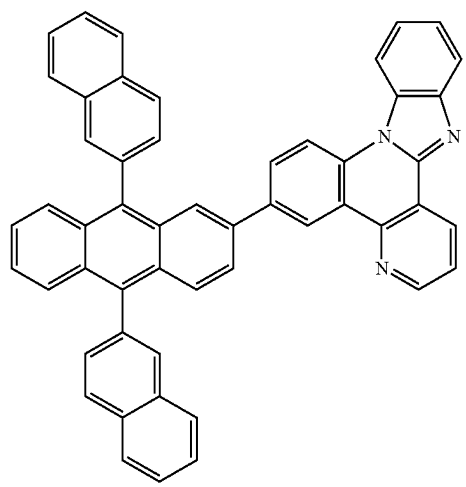
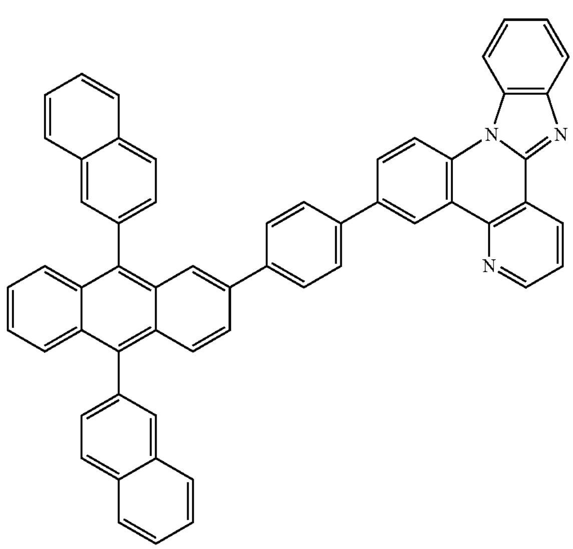
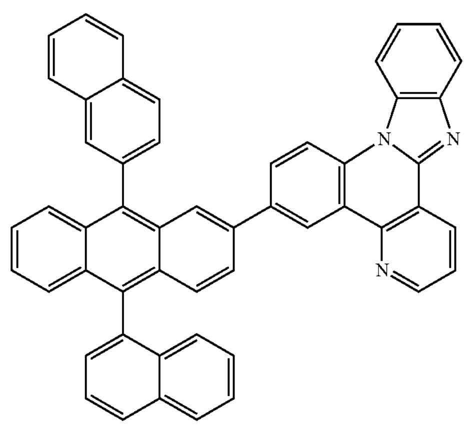

-continued
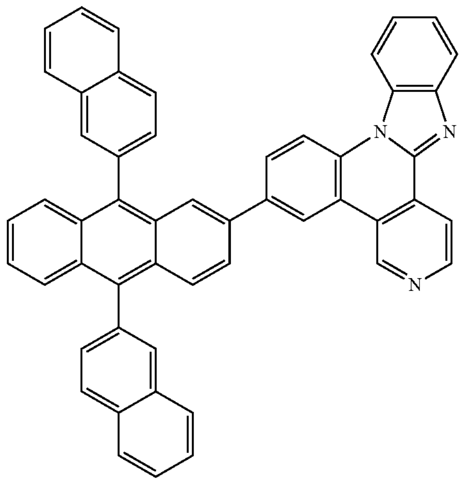
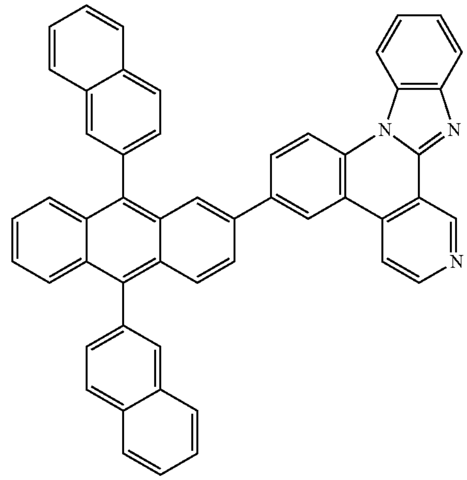
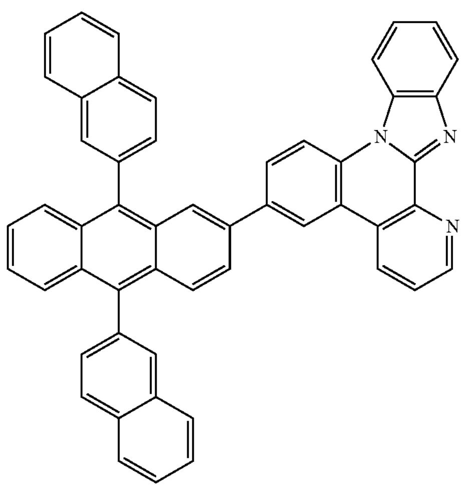
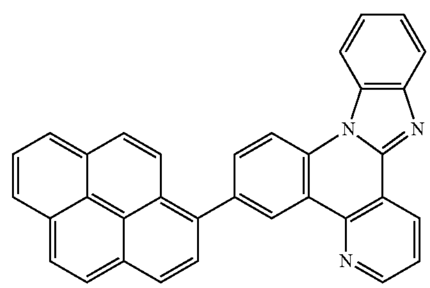
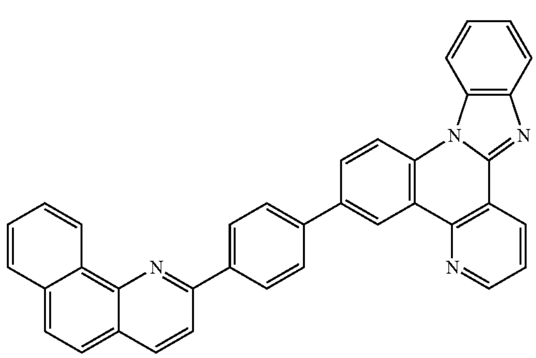
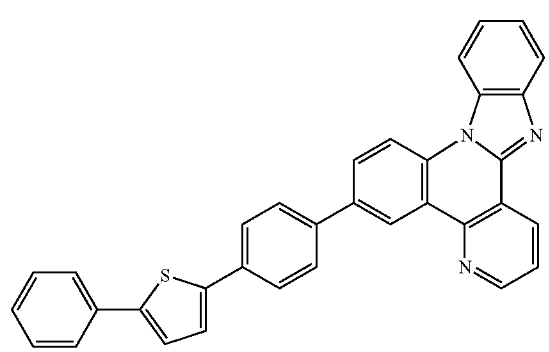

-continued
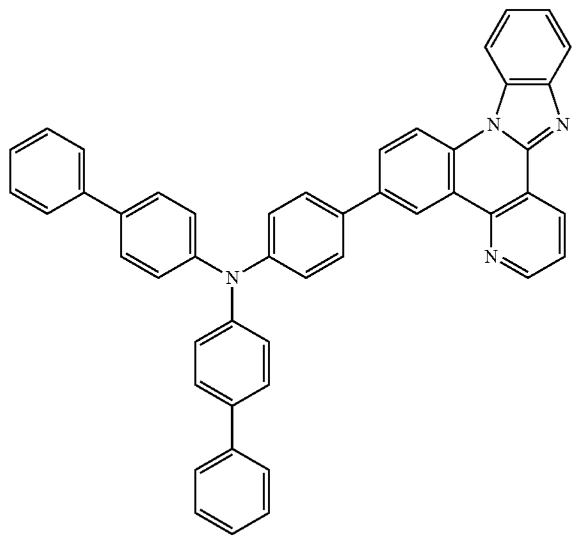
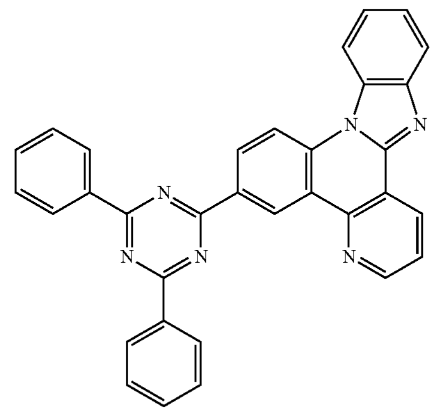
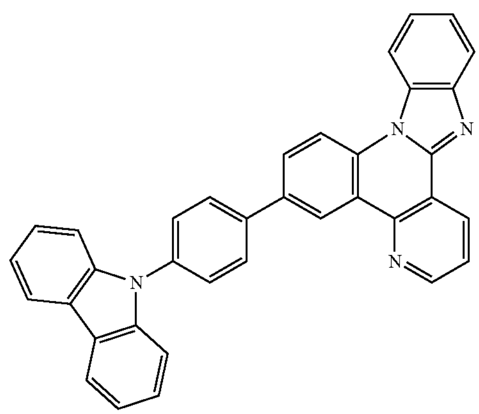
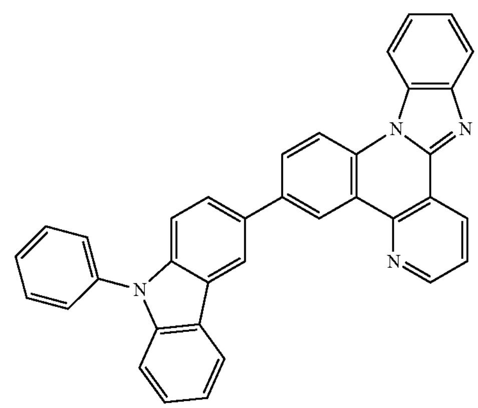
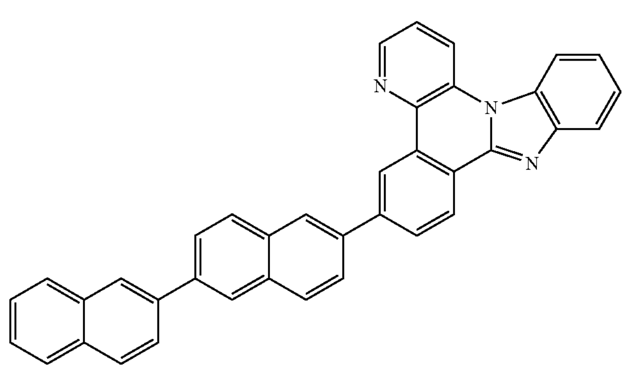
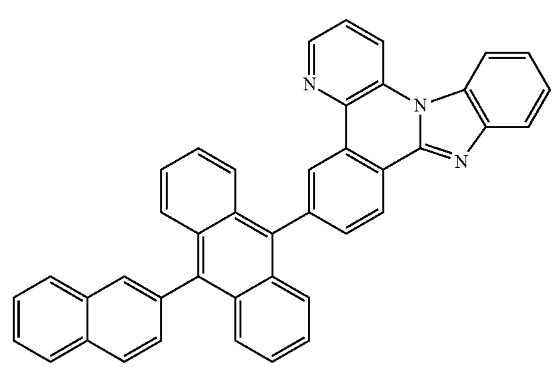

-continued
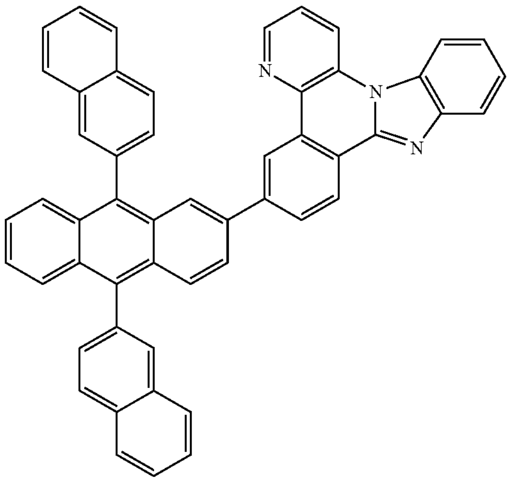
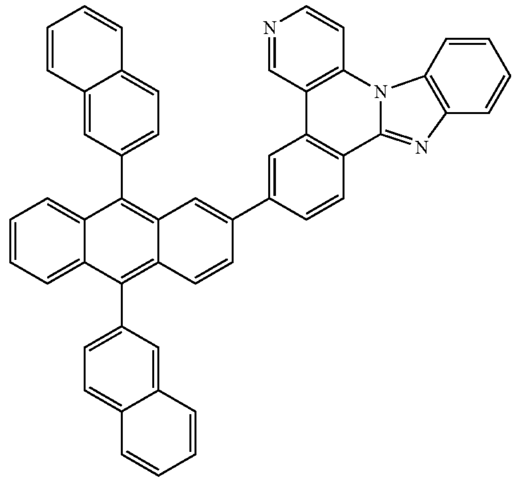
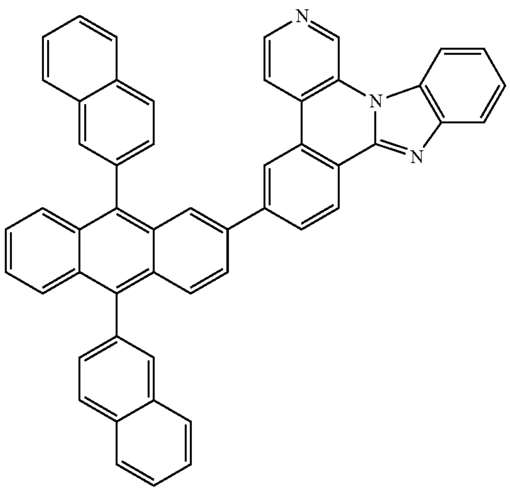
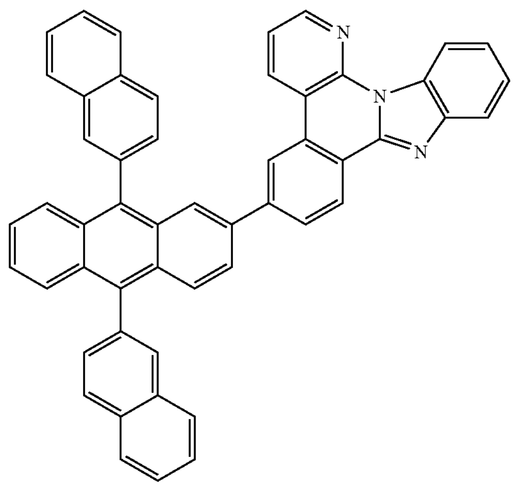
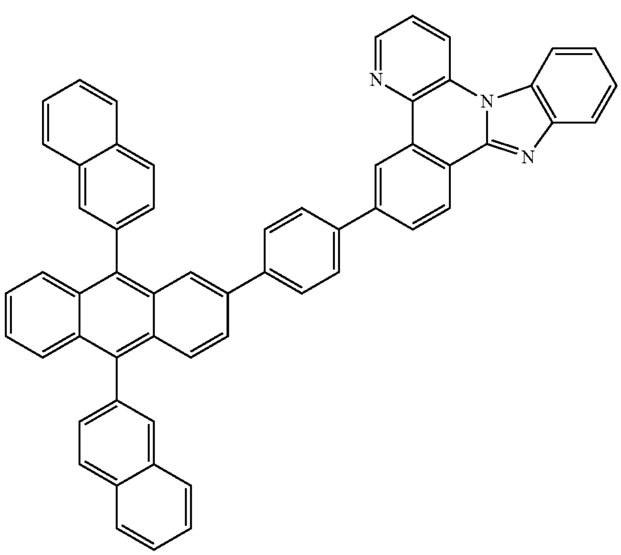
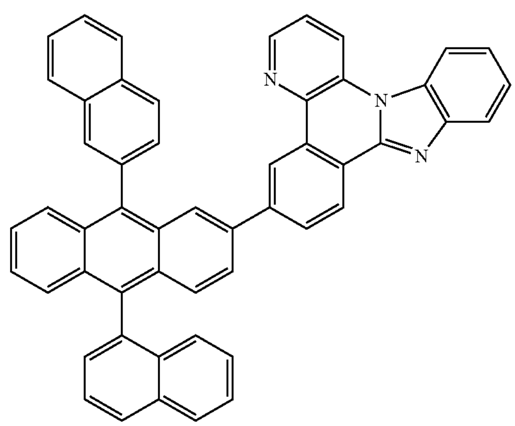

-continued
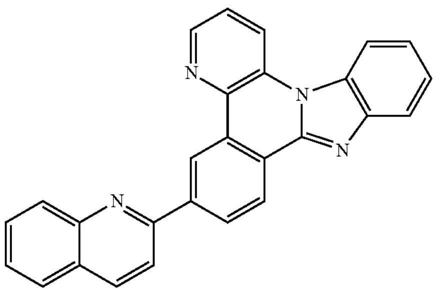
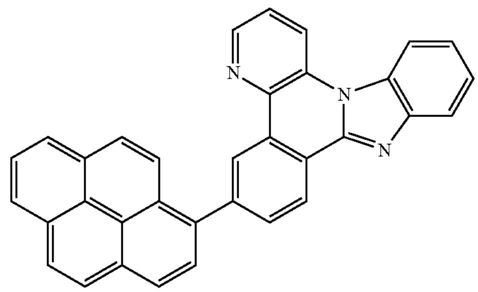
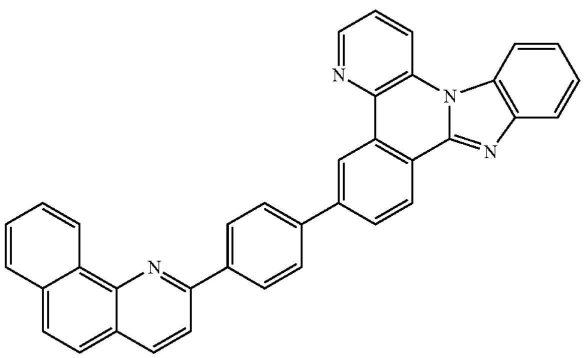
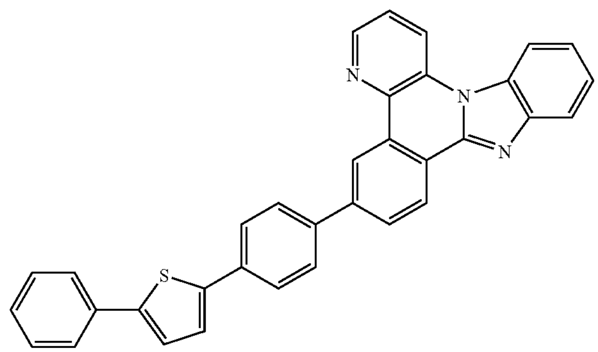
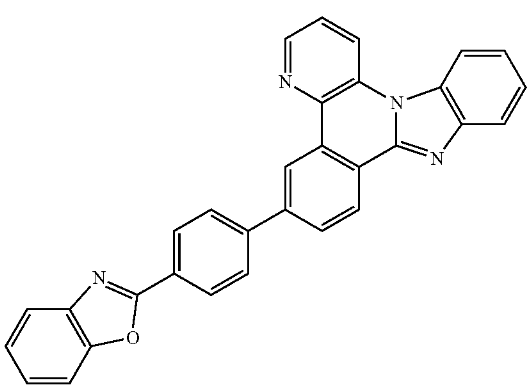
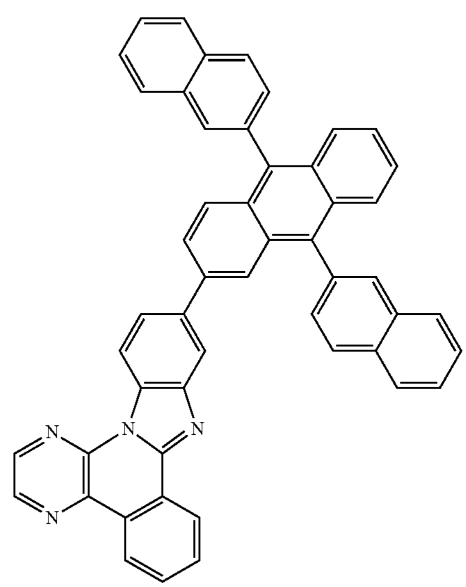

-continued
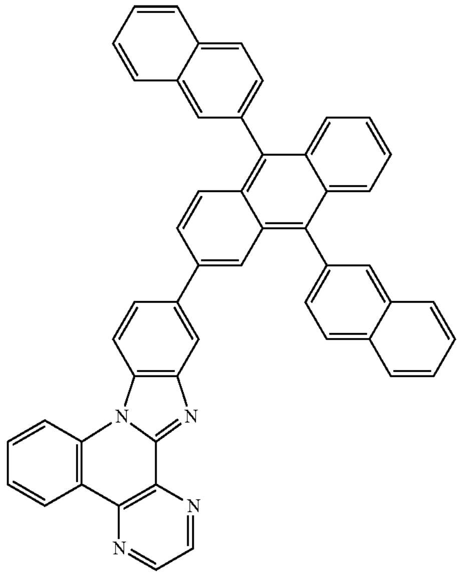
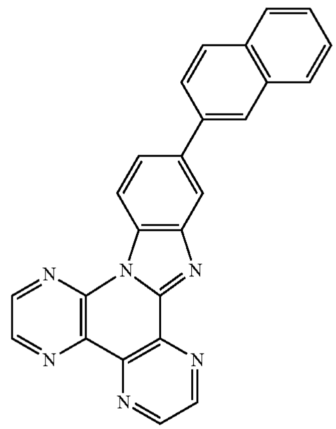
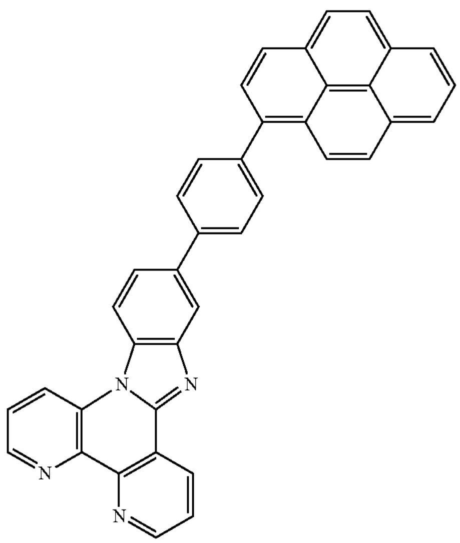
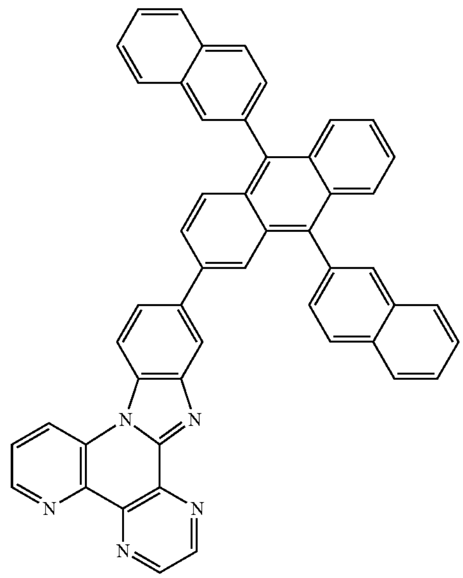
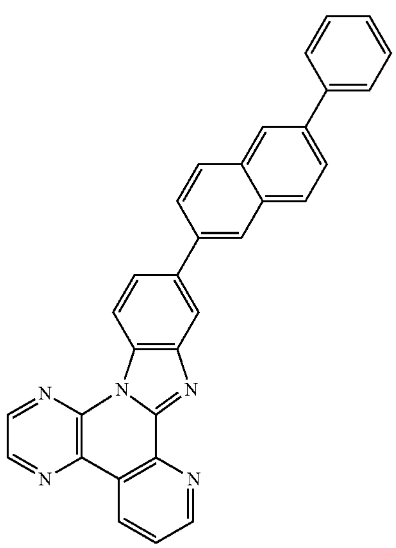
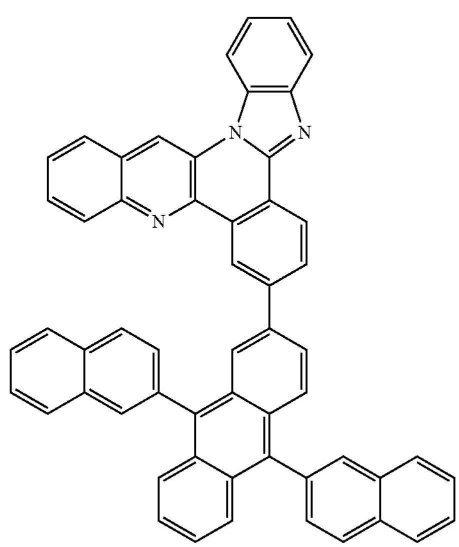

-continued
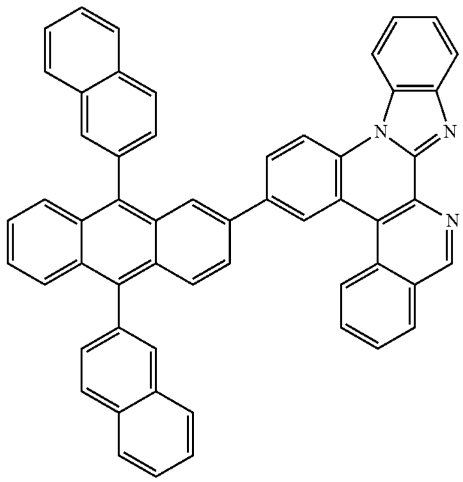
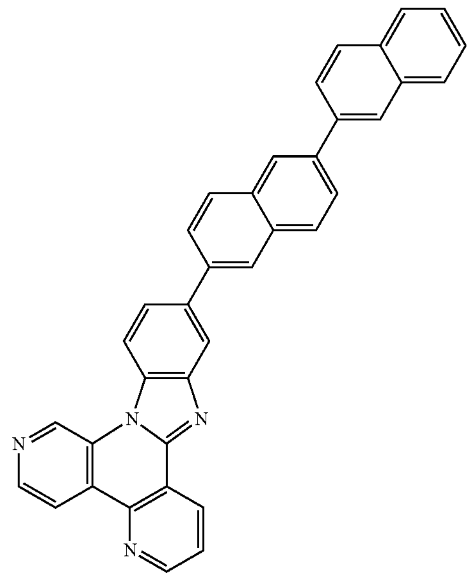
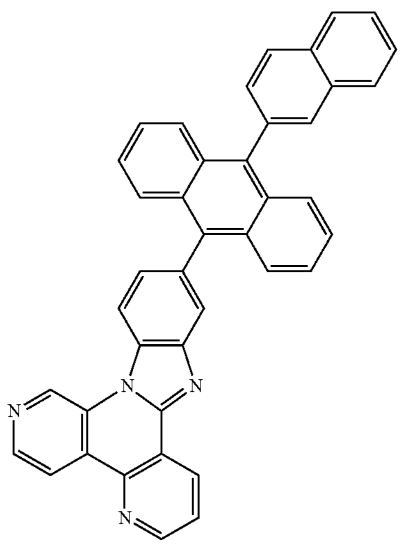
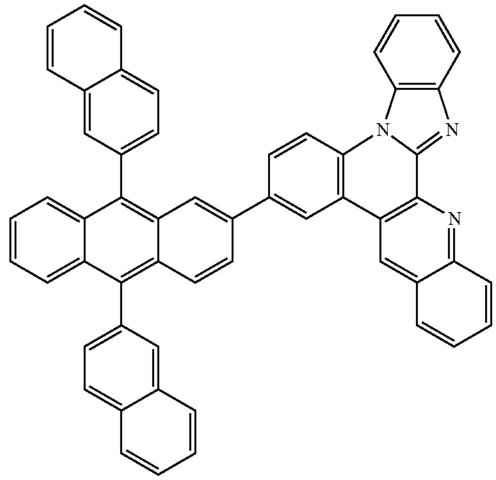
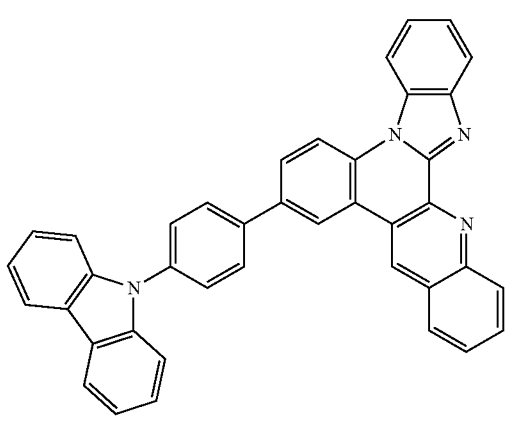
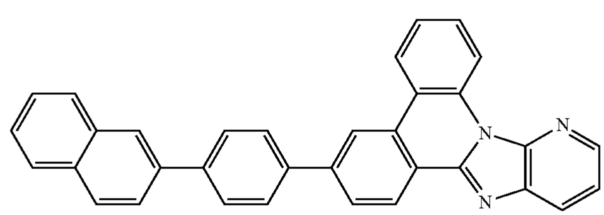

-continued
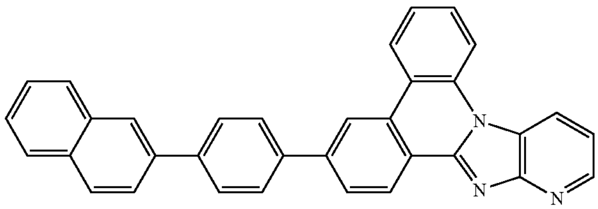
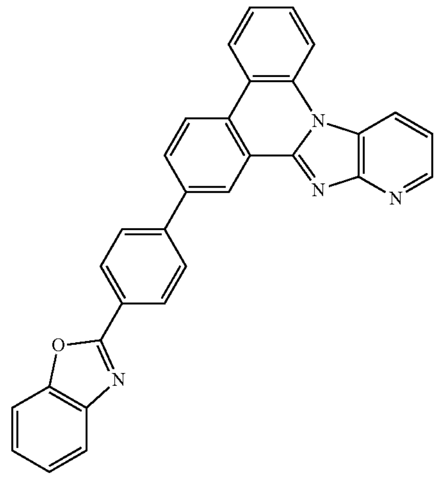
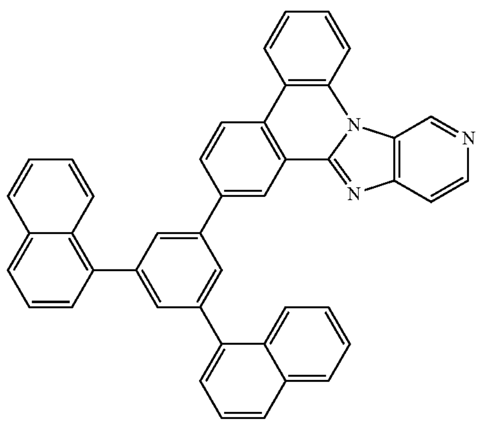
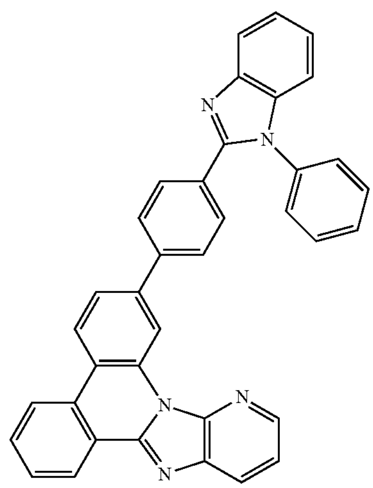
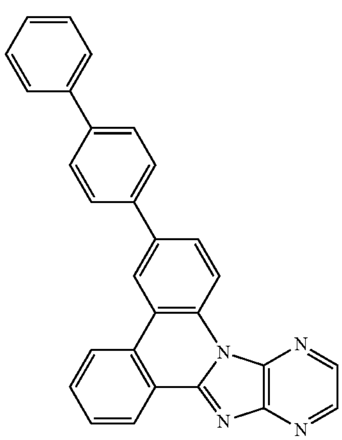
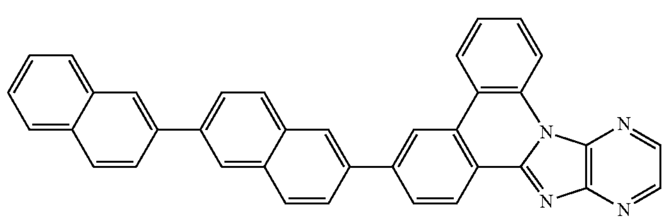
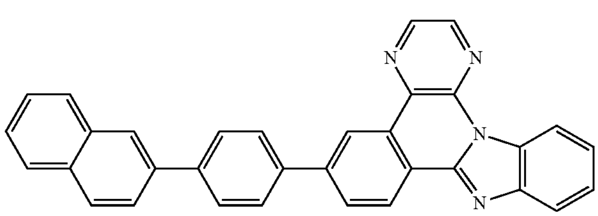
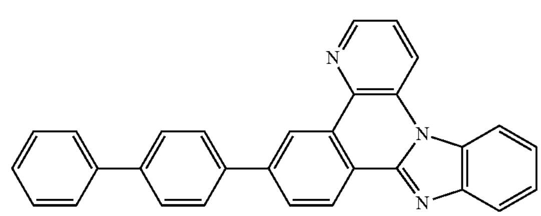

-continued
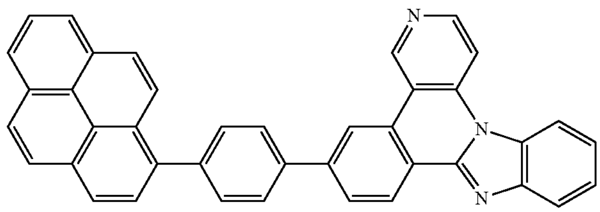
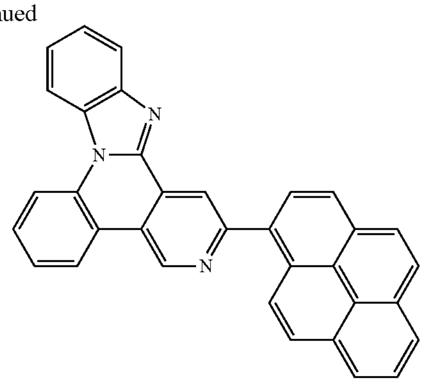
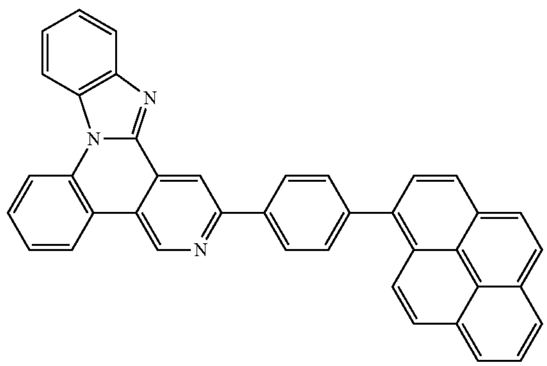
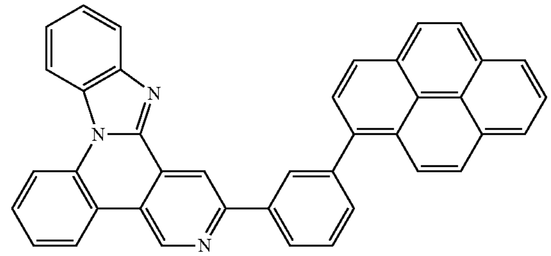
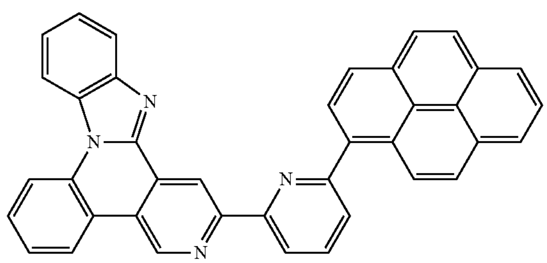
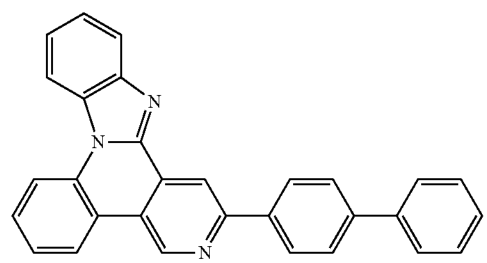
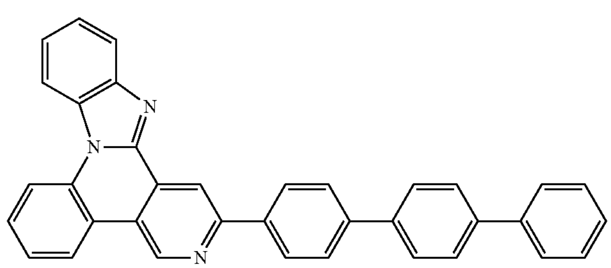
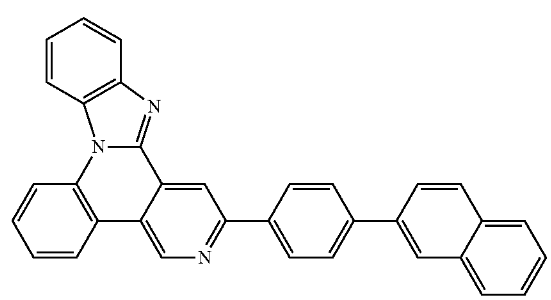
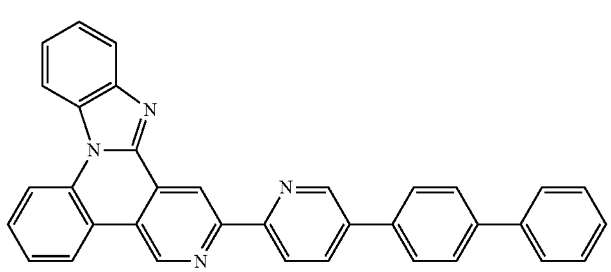

-continued
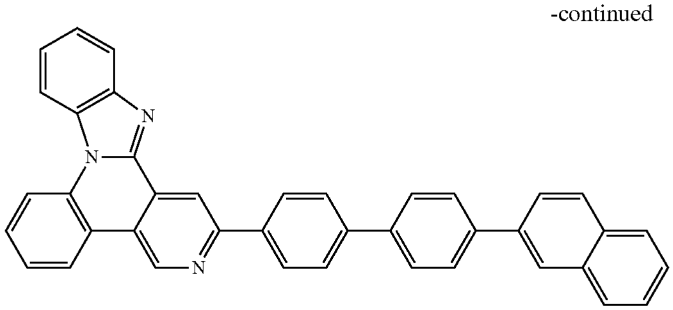
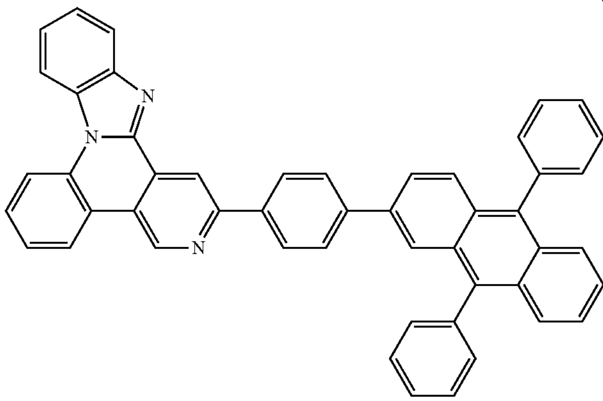
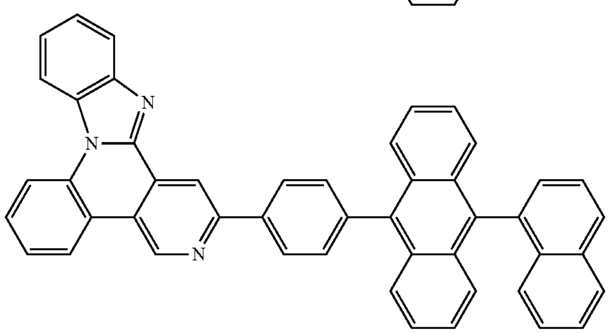
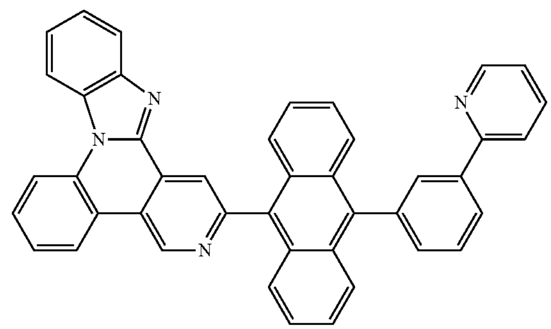
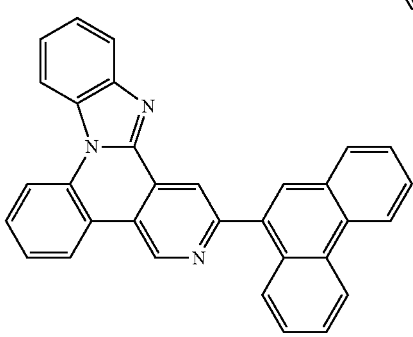
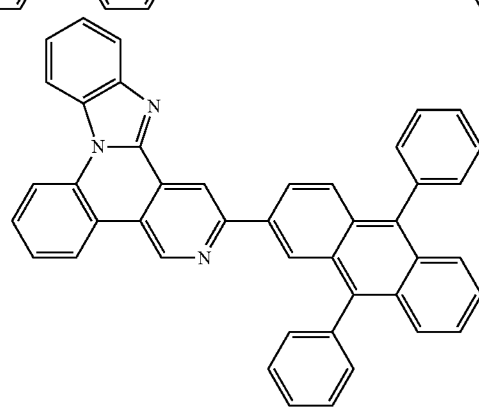
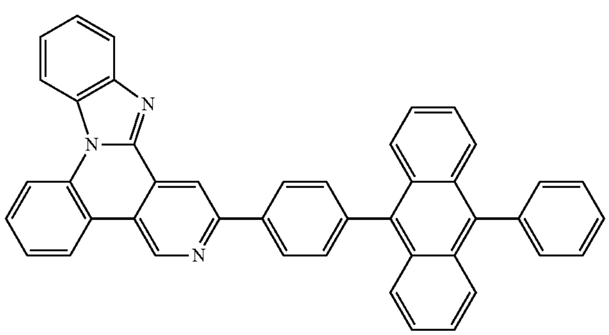

-continued
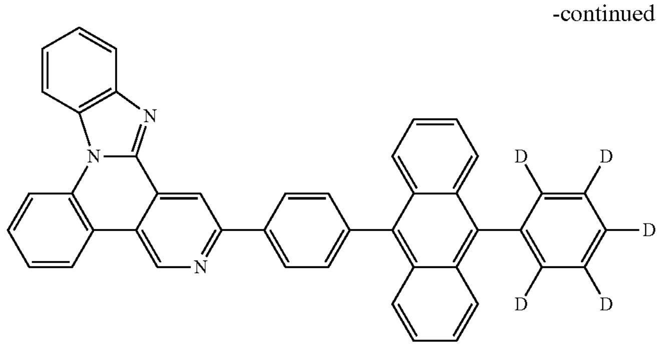
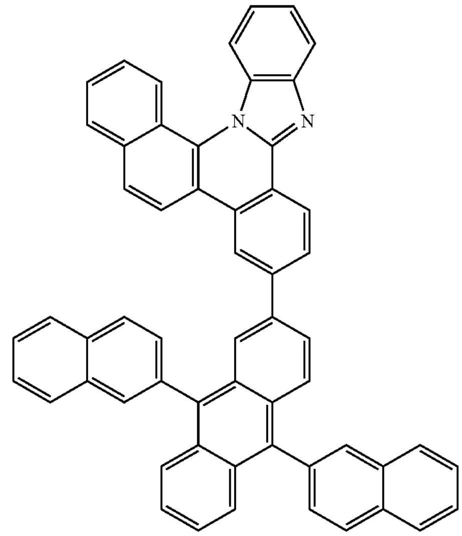
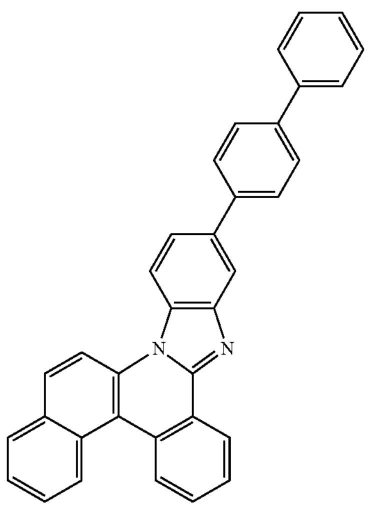
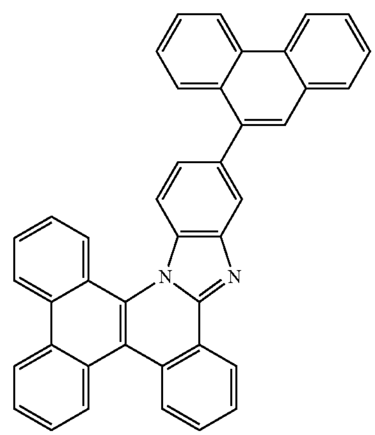
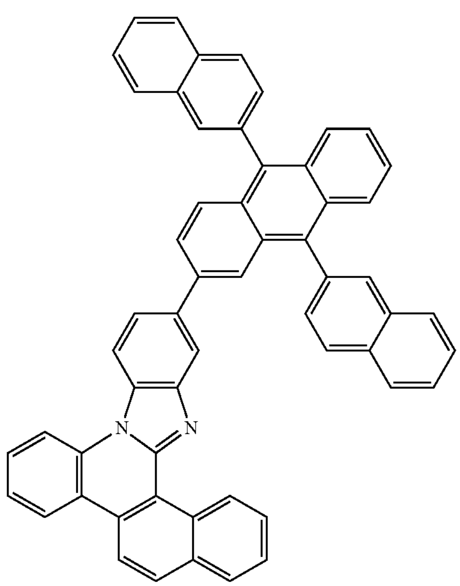
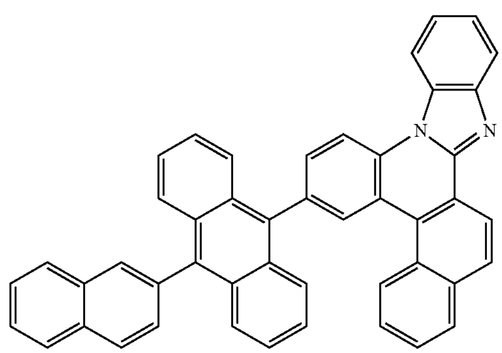

-continued
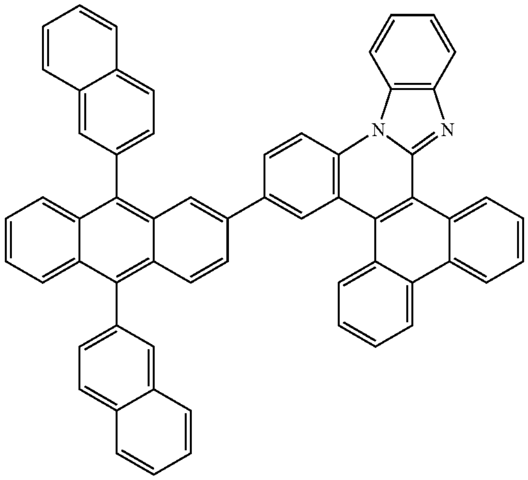
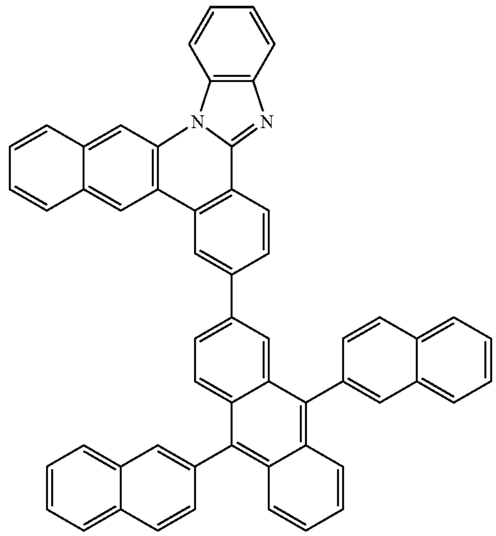
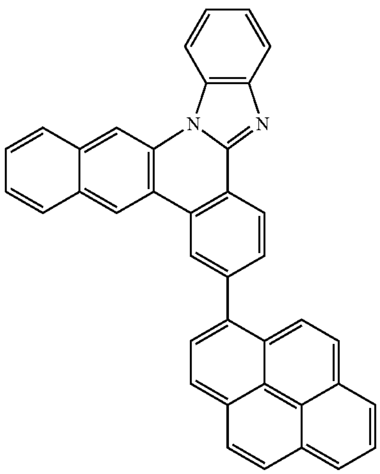
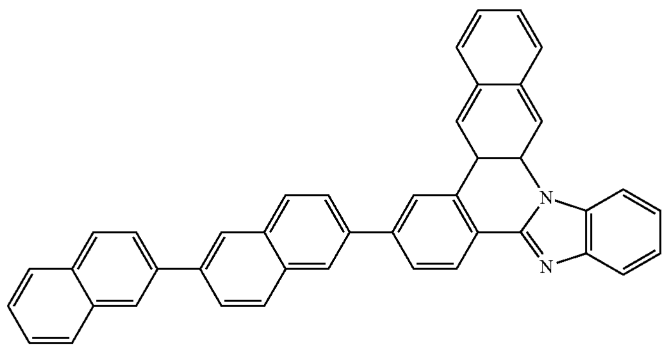
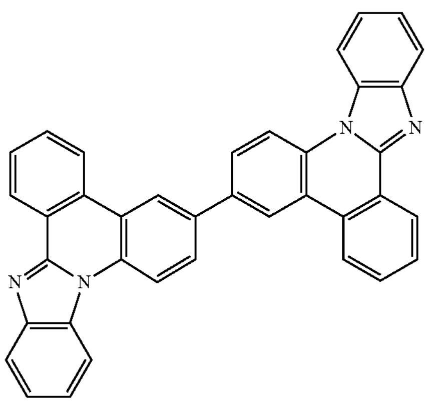
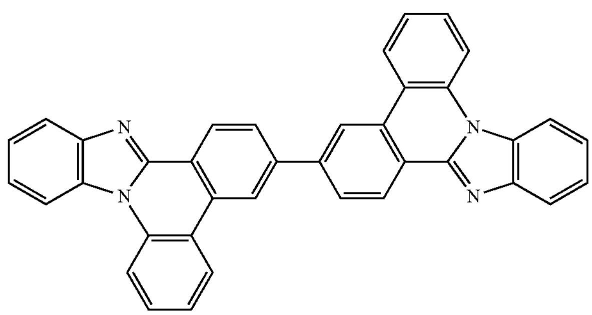
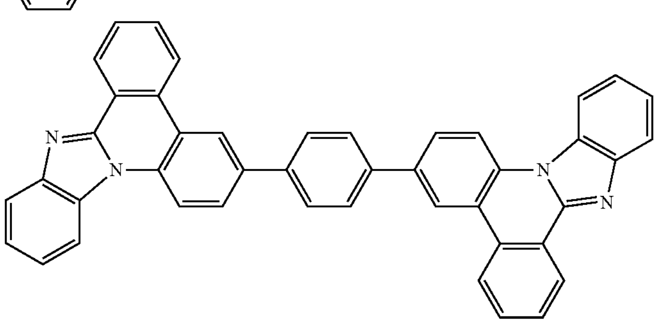

-continued
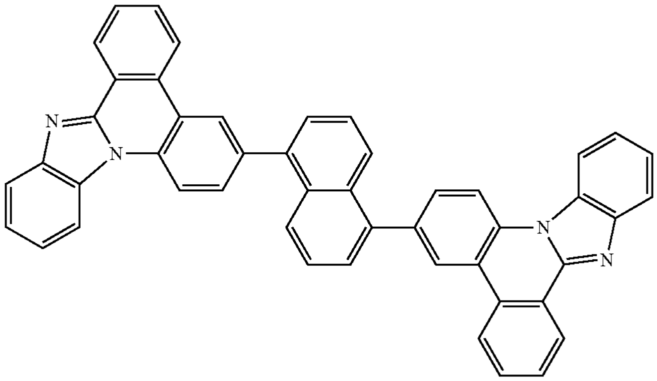
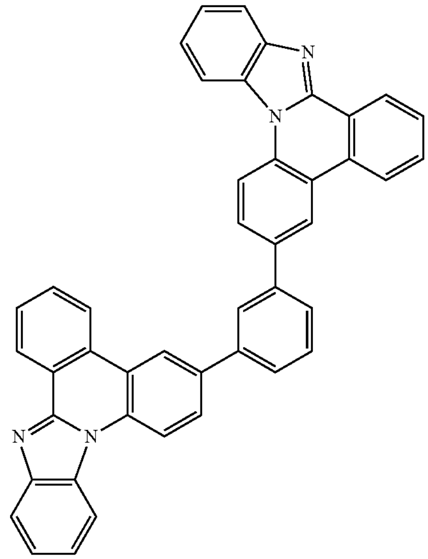
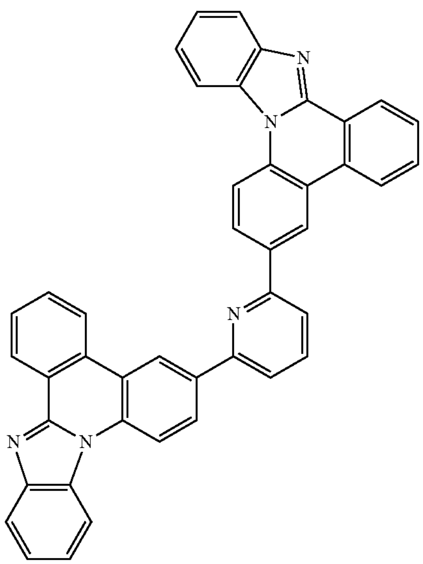
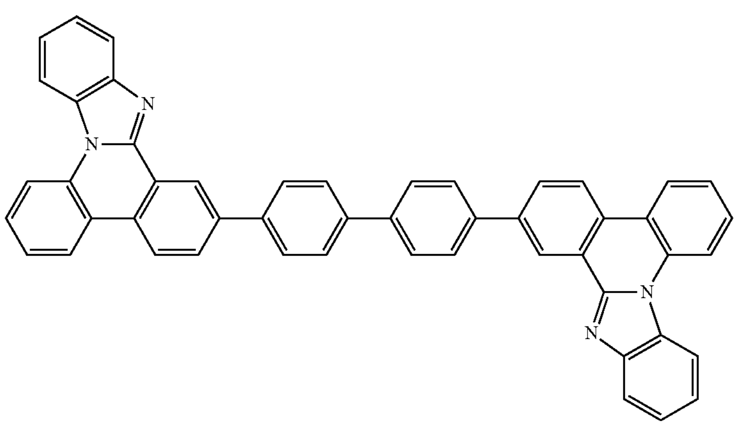

-continued
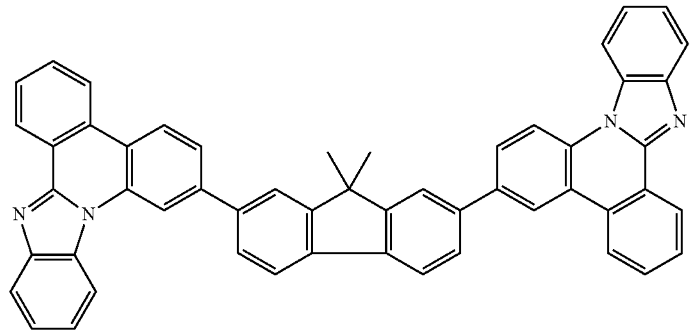
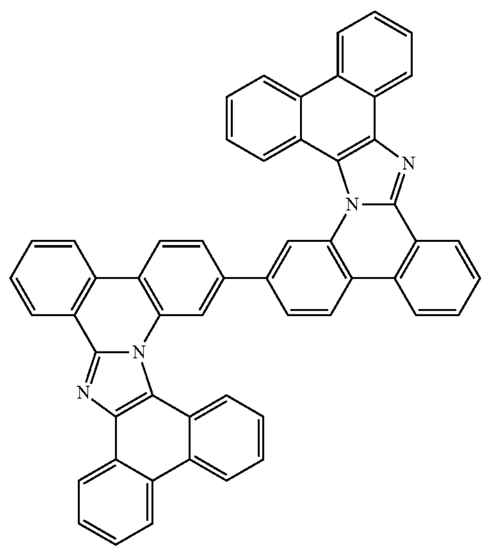
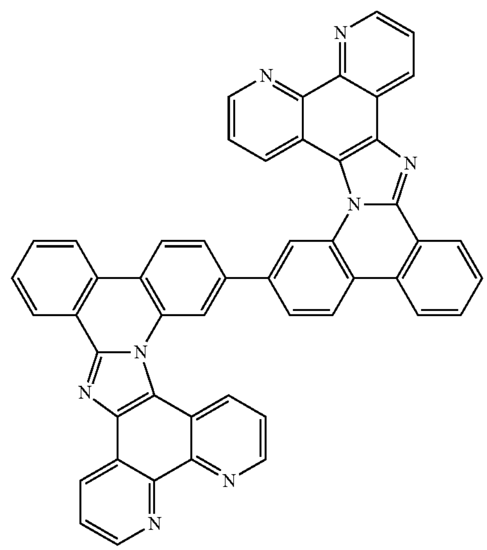
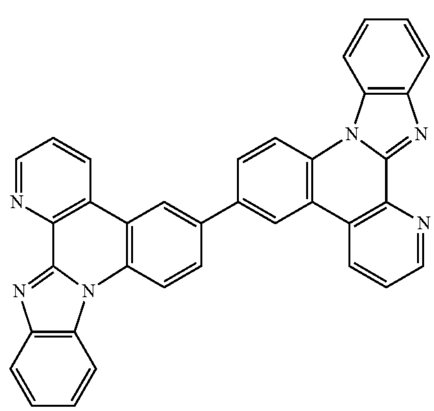
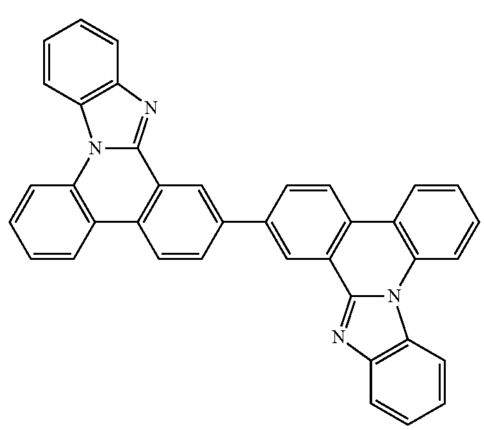

-continued
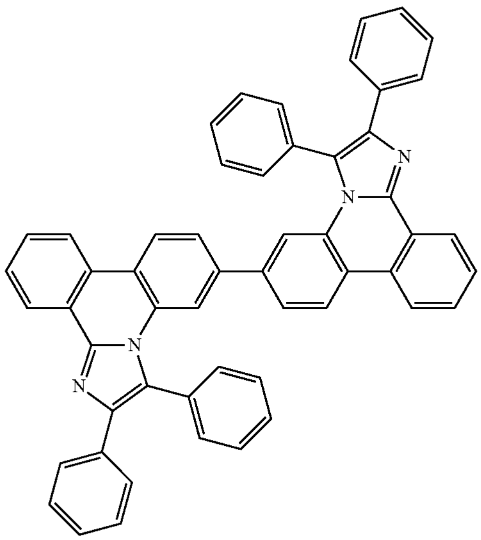
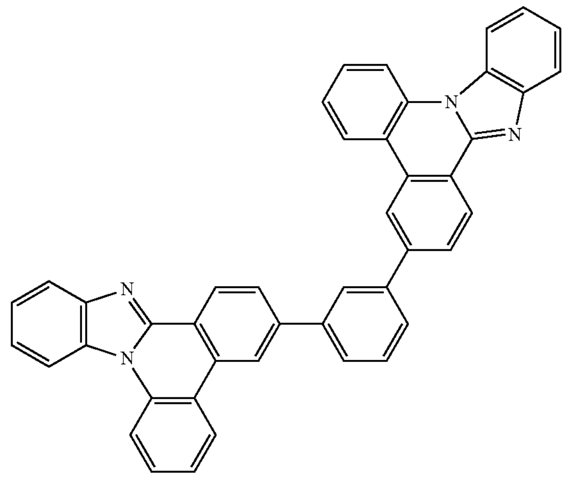
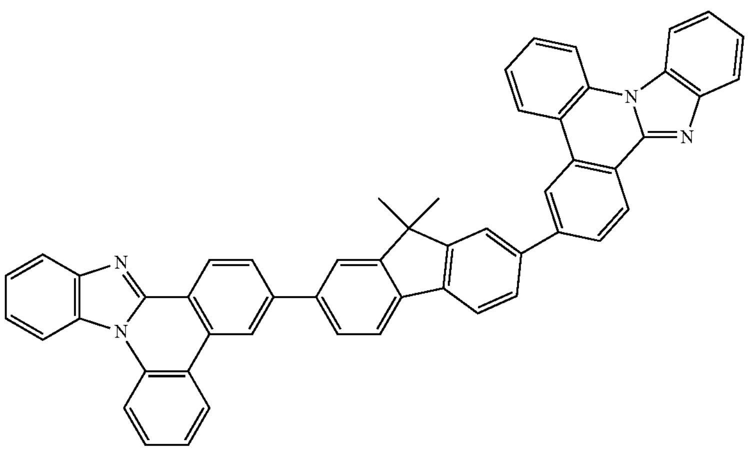
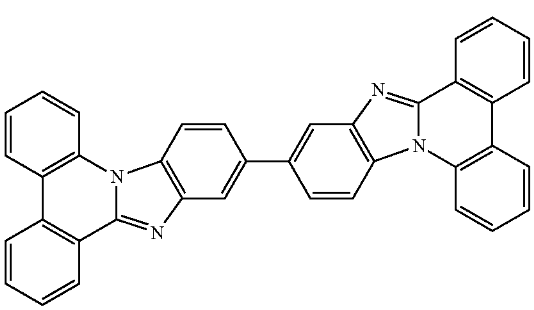
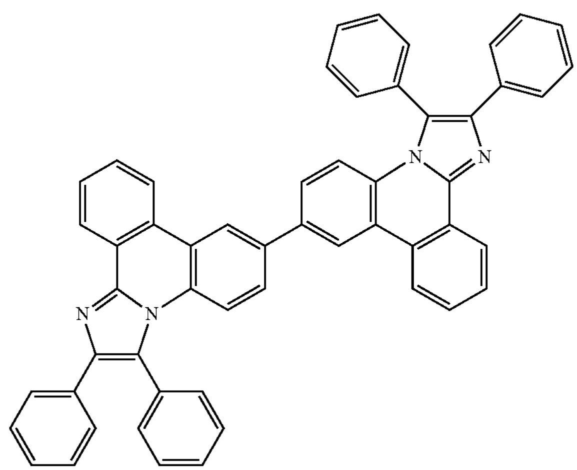

-continued
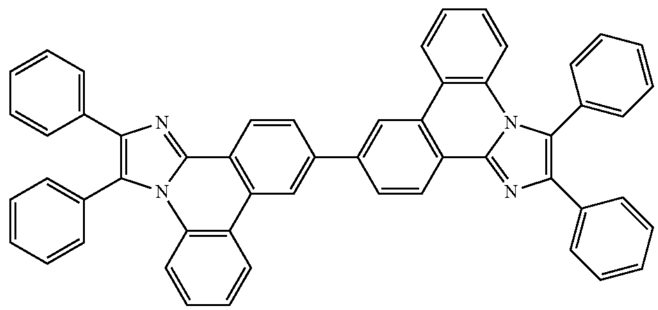
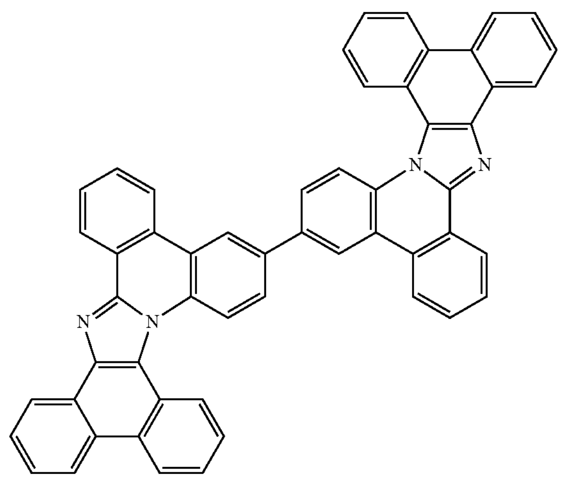
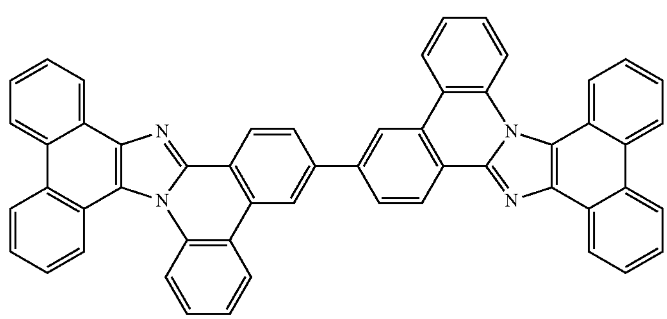
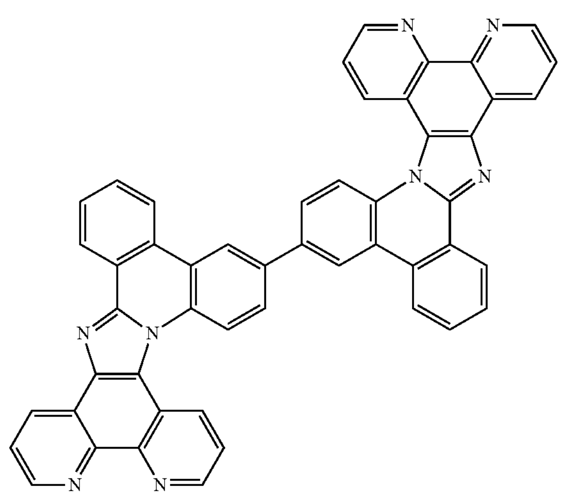

-continued
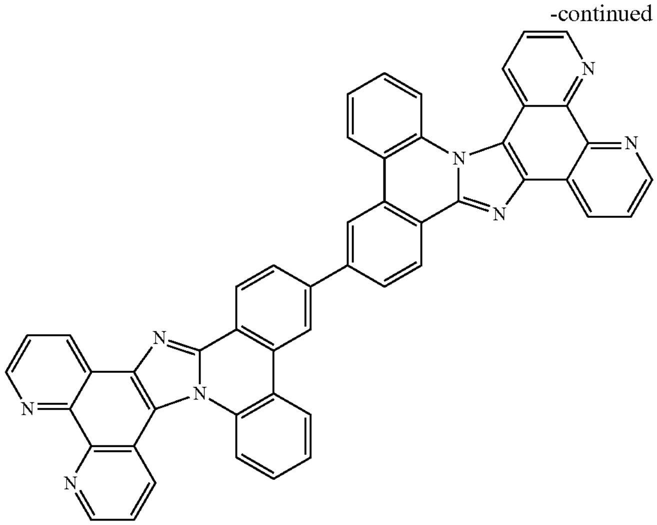
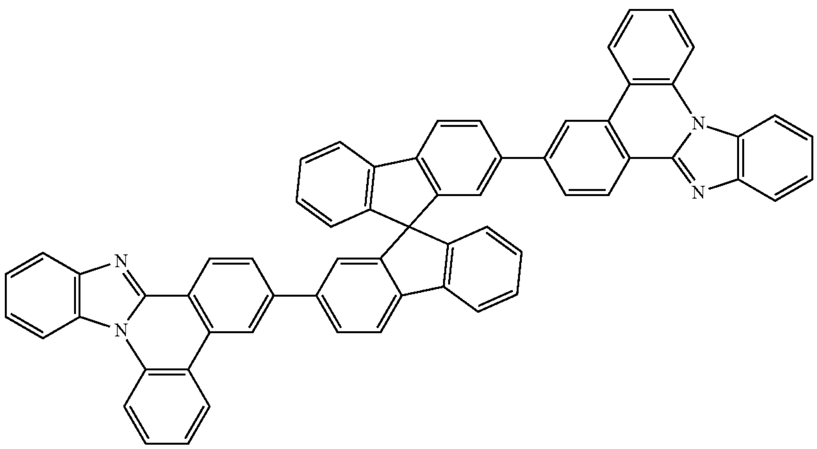
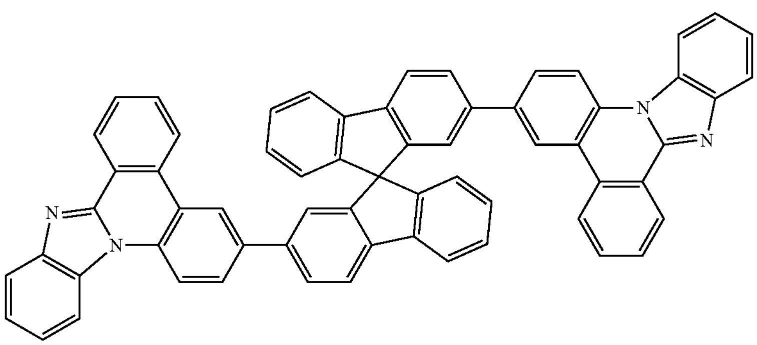
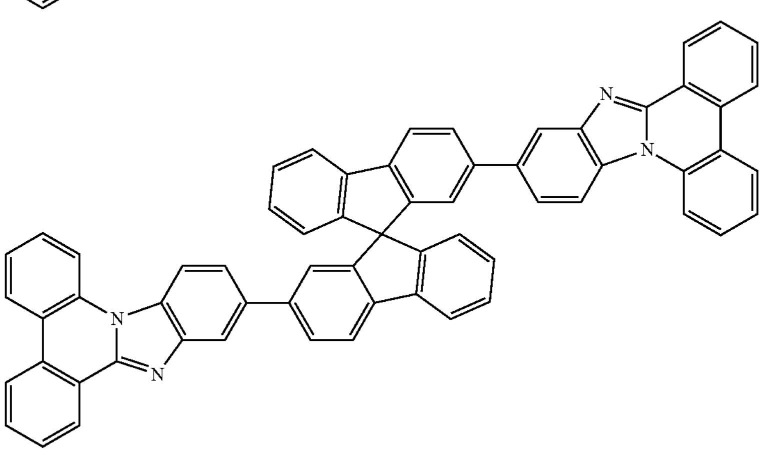

-continued
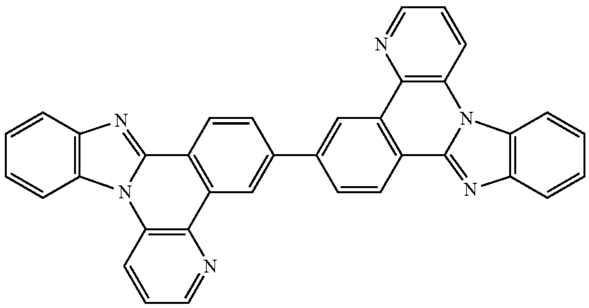
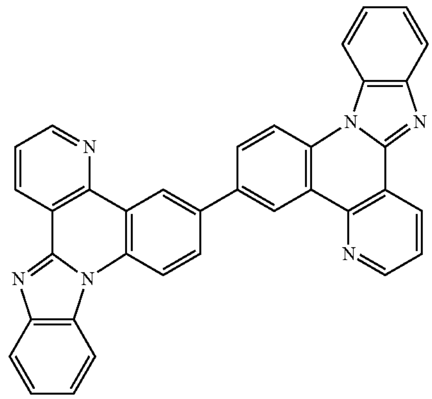
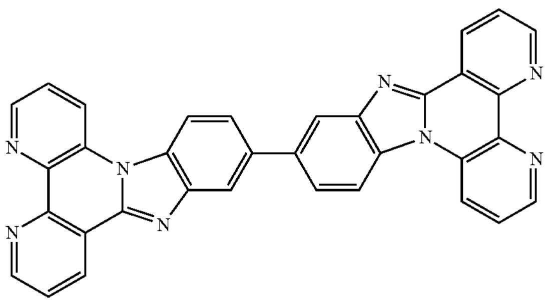
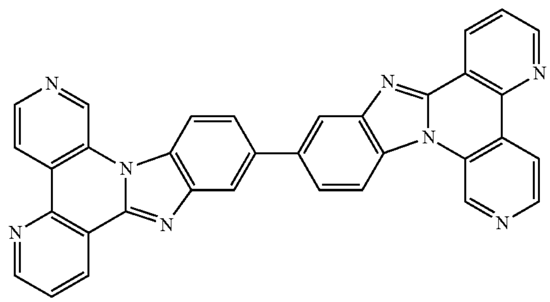
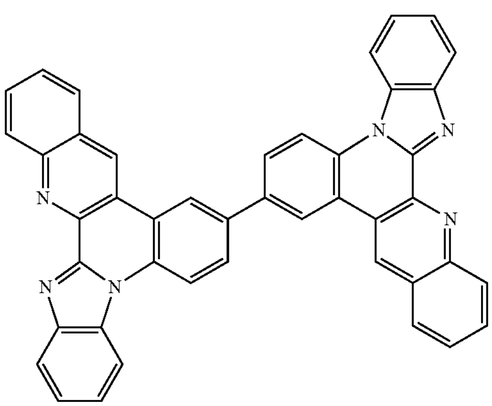
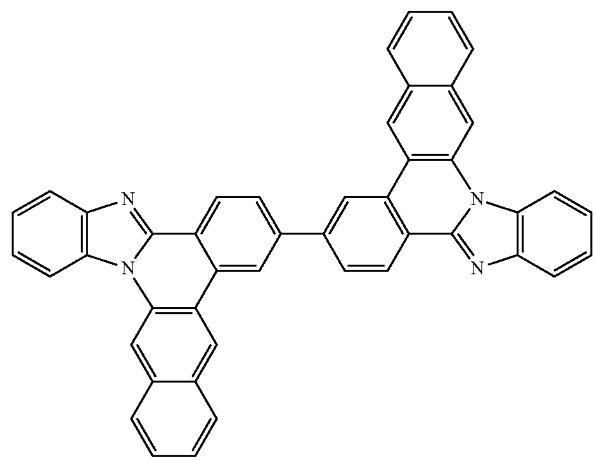
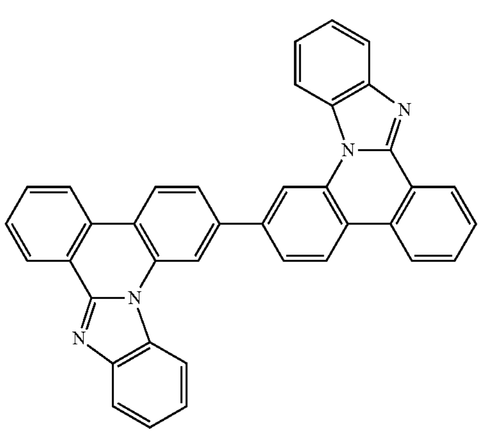
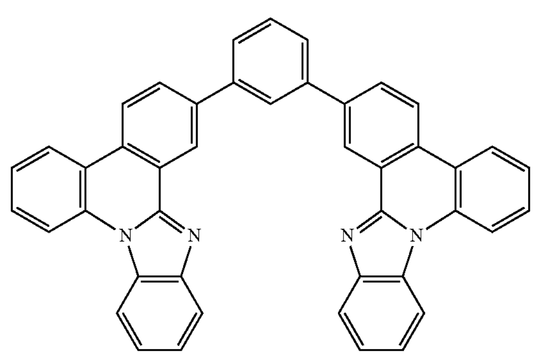

-continued
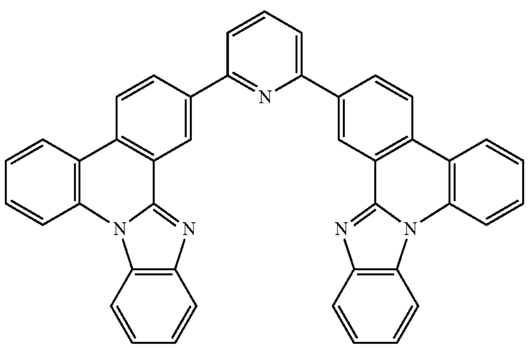
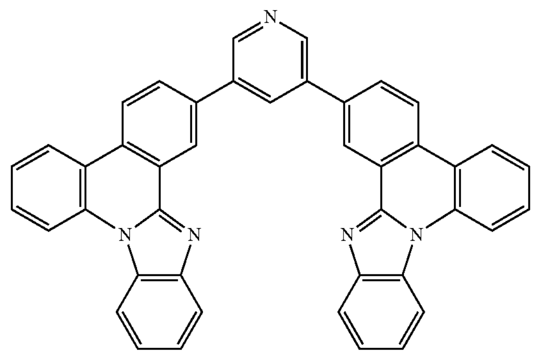
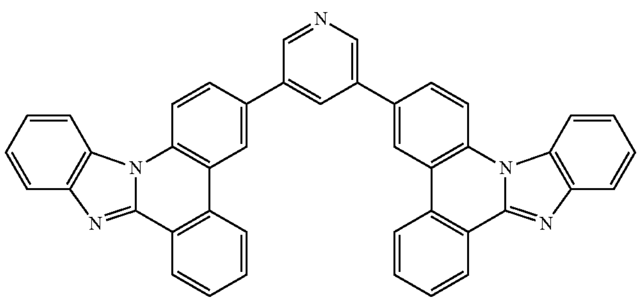
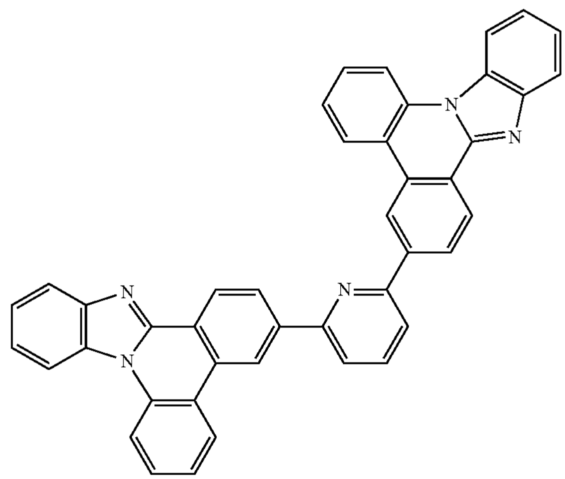
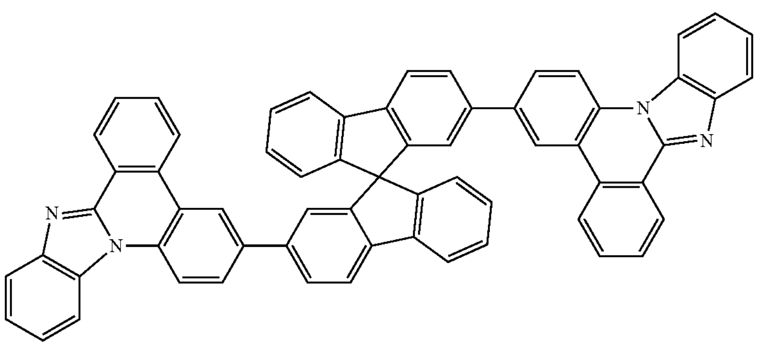
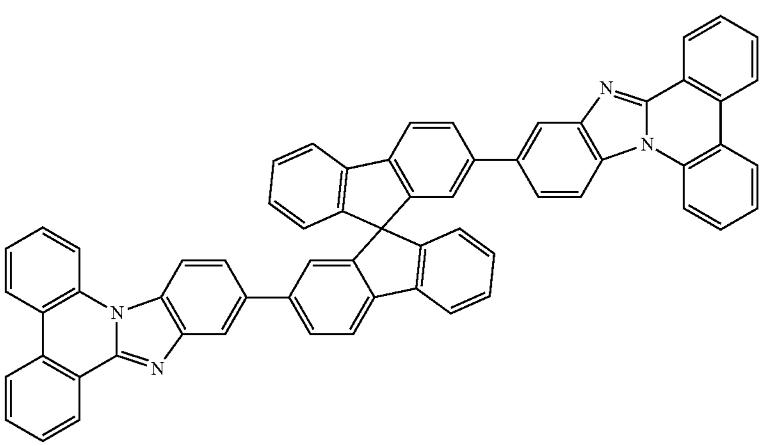

-continued
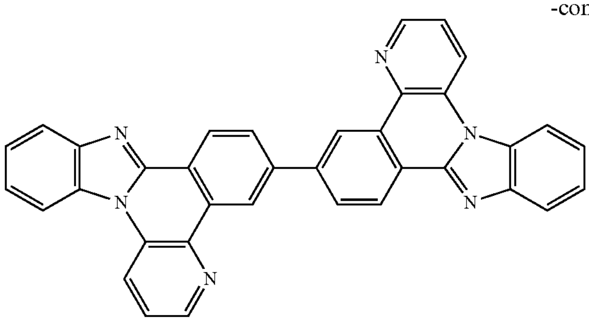
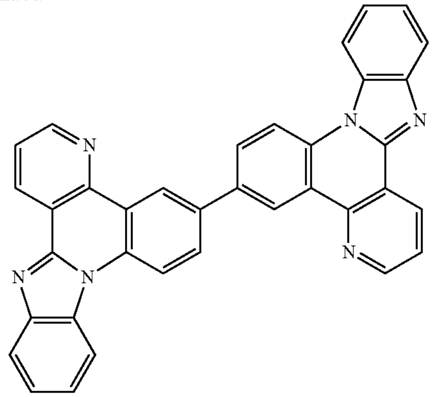
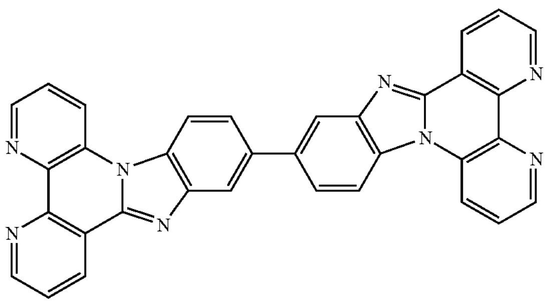
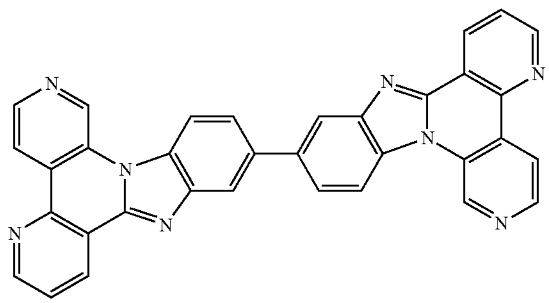
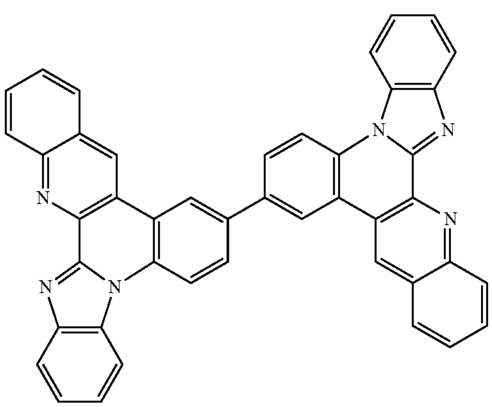
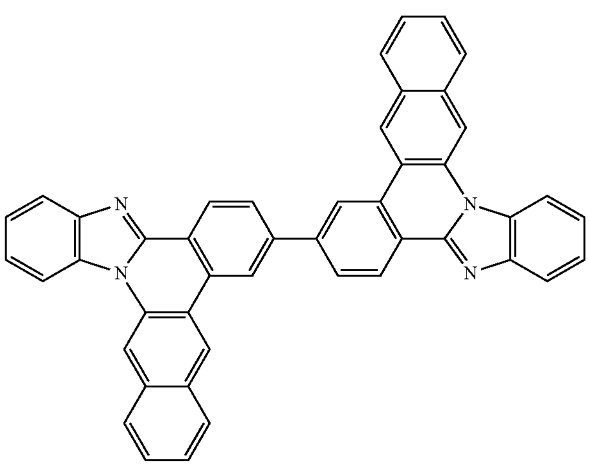
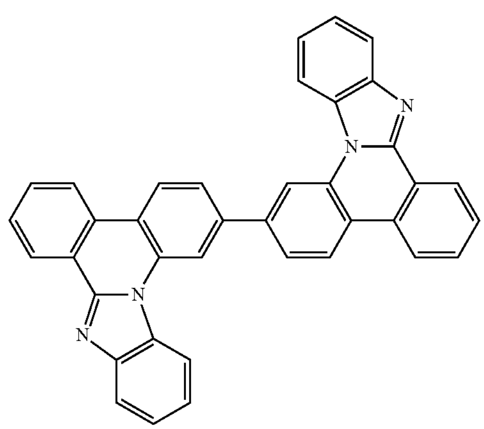

-continued
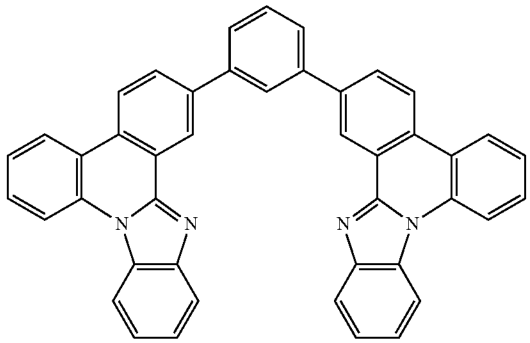
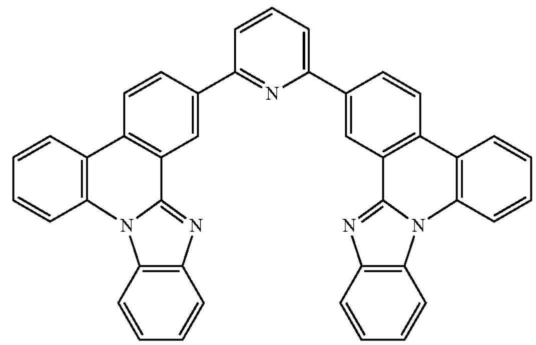
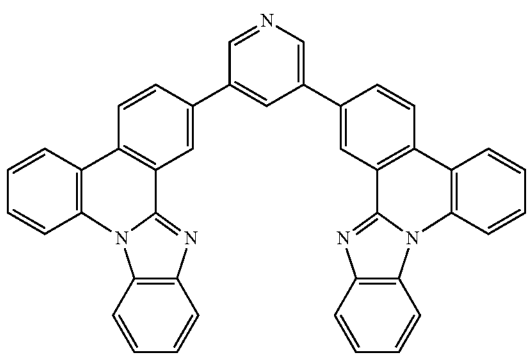
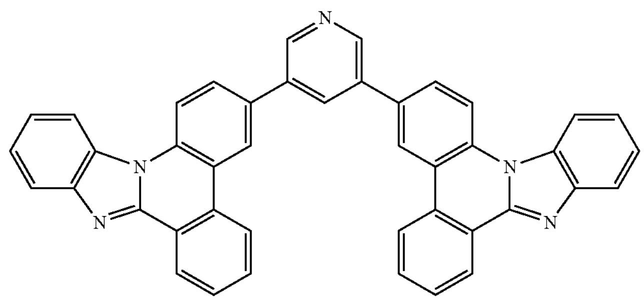
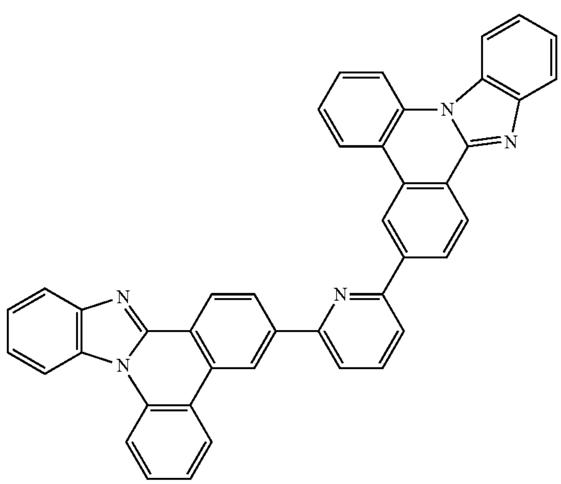
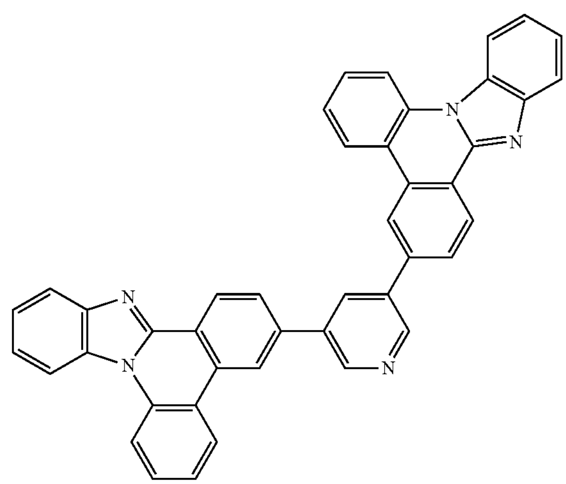
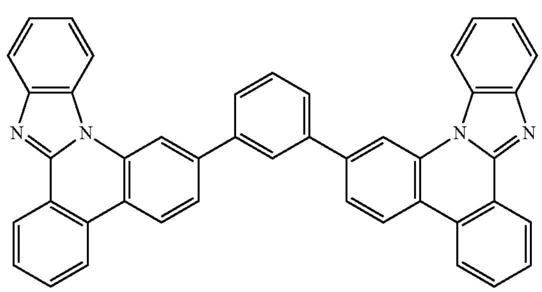
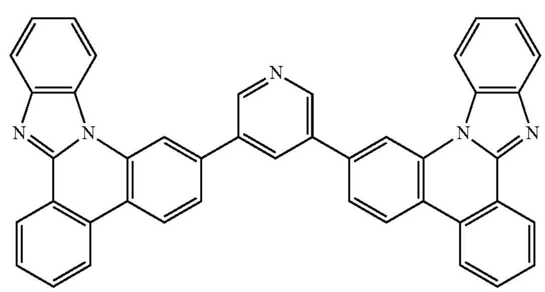

-continued
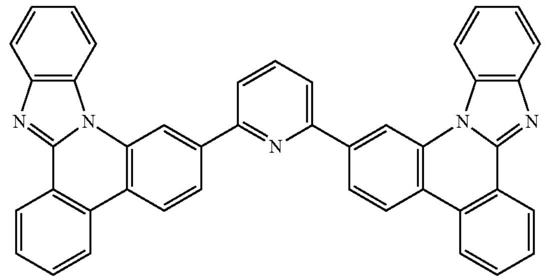
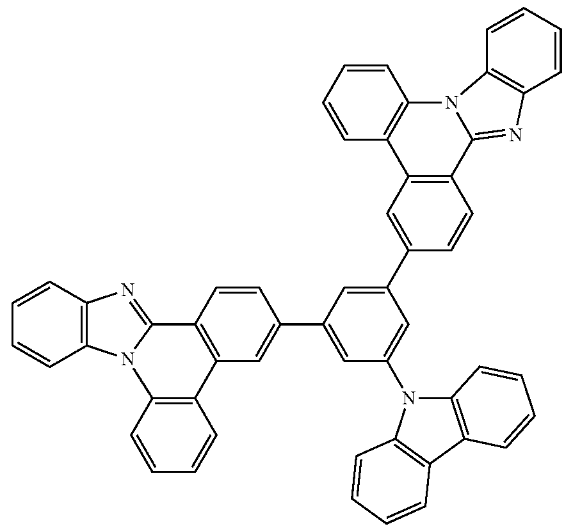
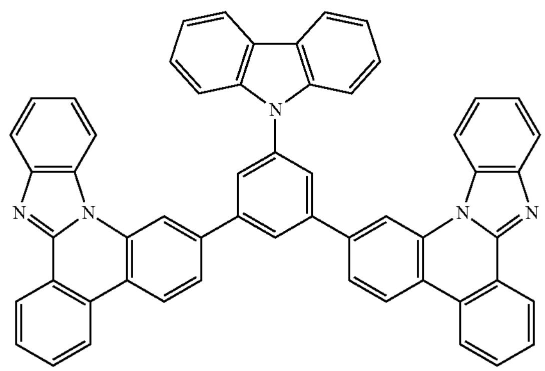
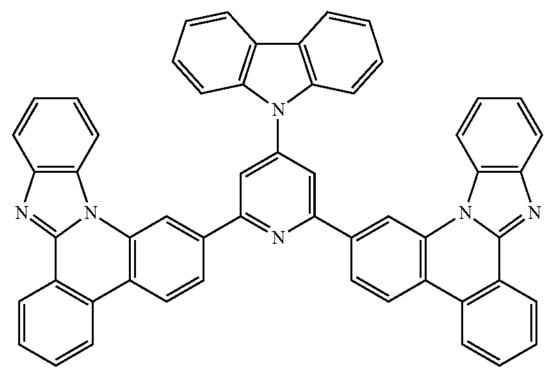
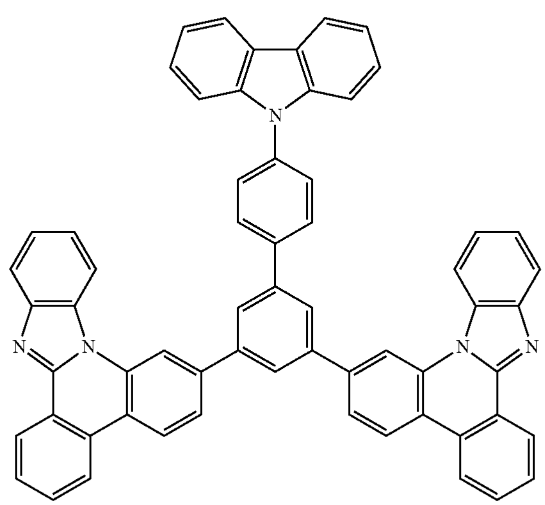
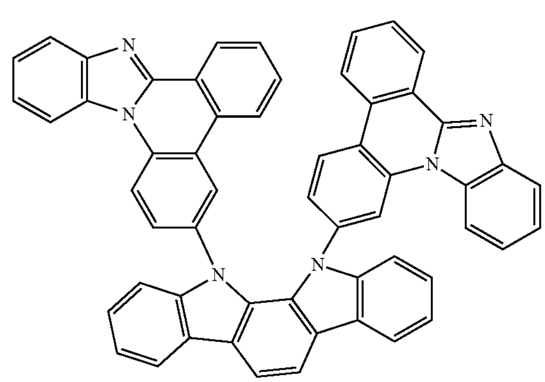

-continued
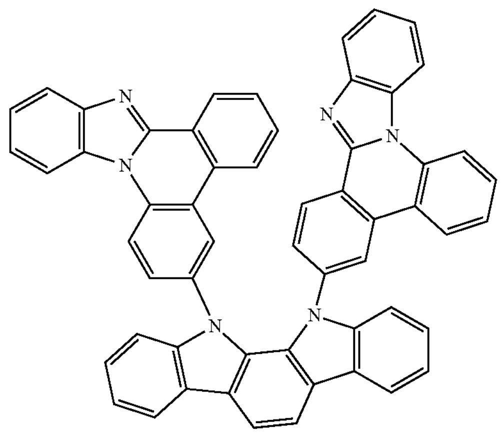
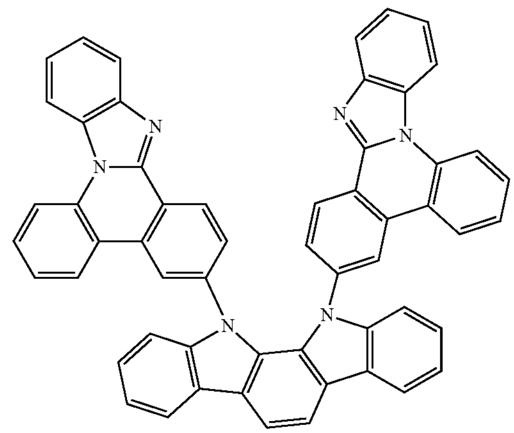
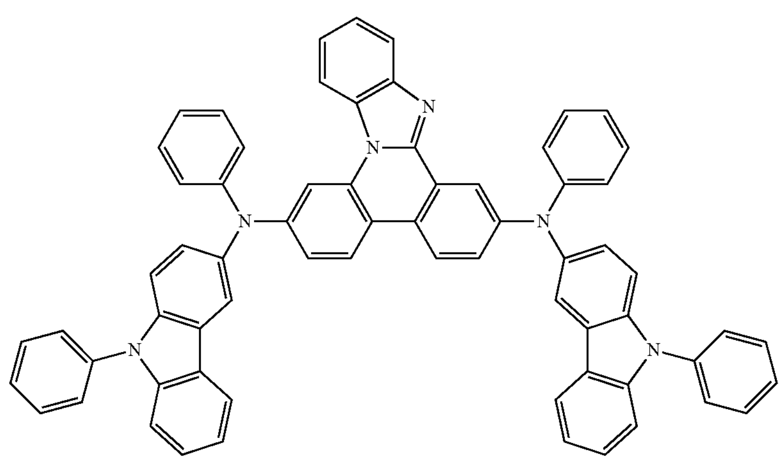
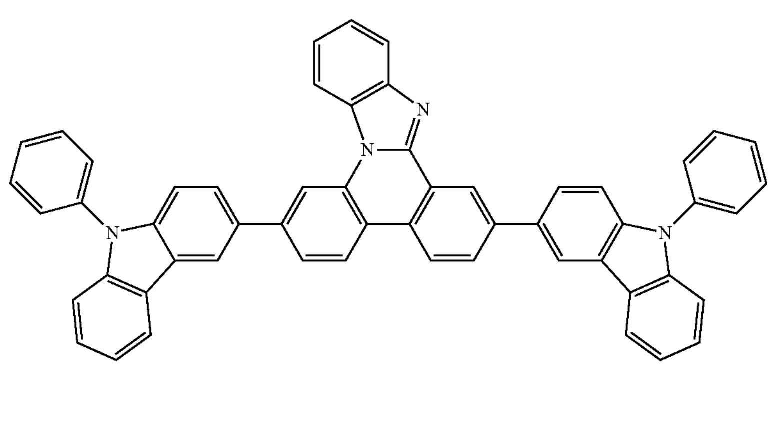

-continued
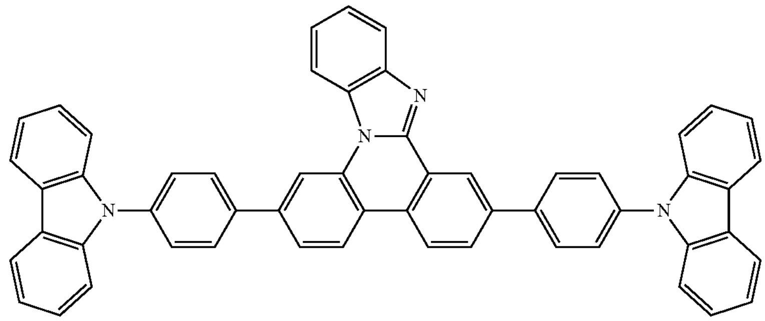
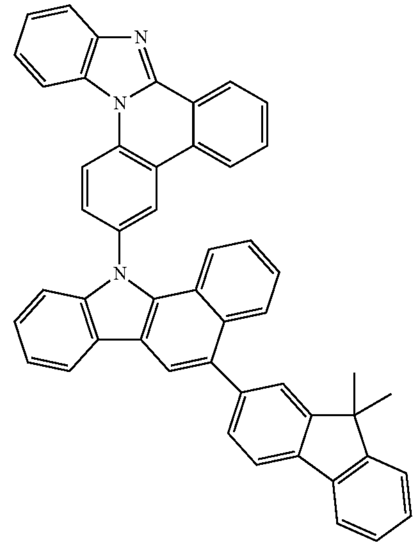
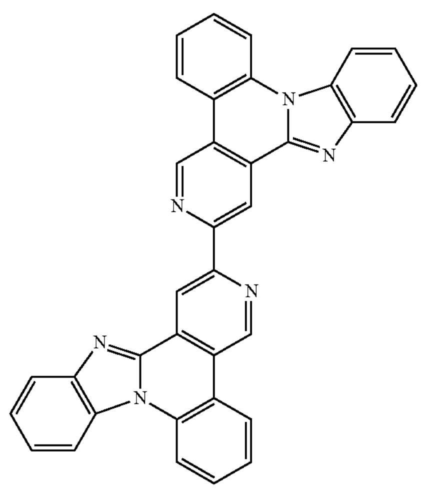
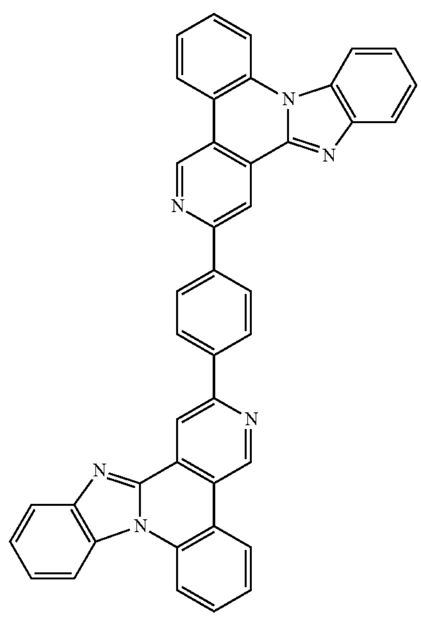
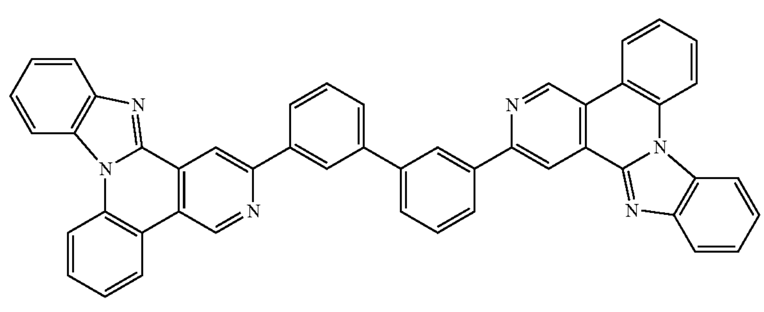

-continued
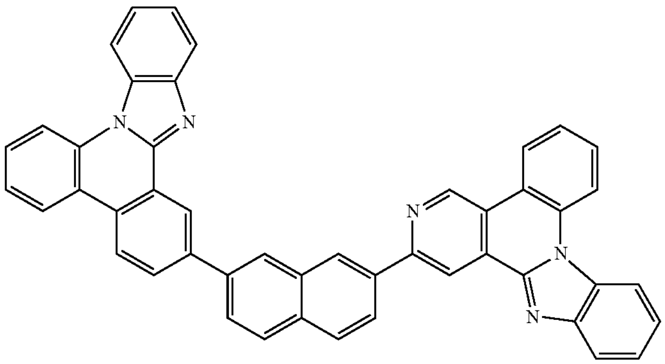
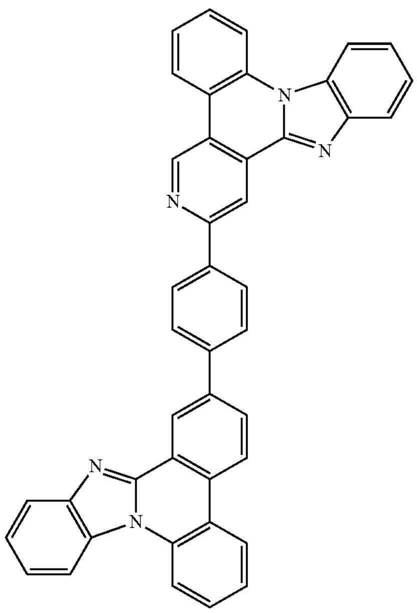
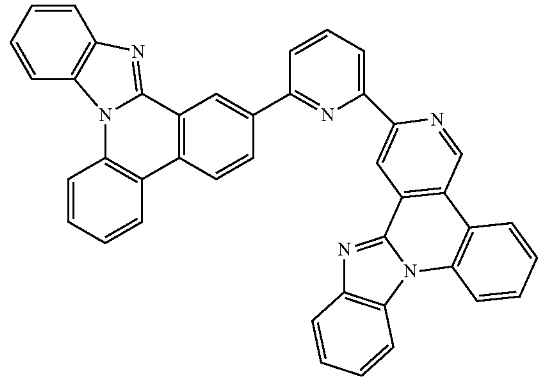
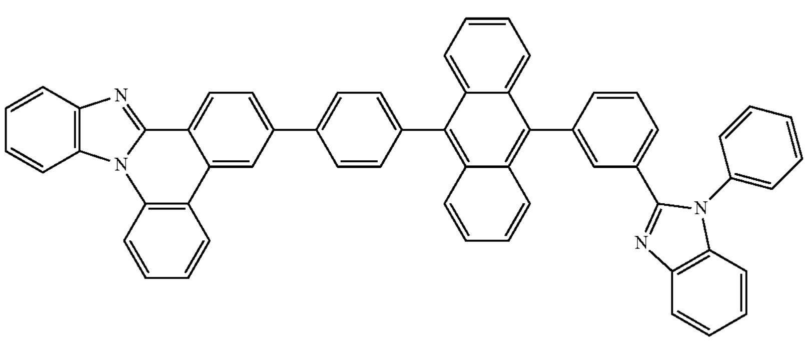
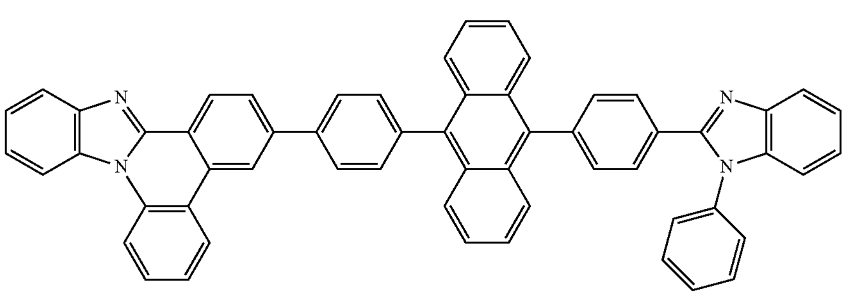

-continued
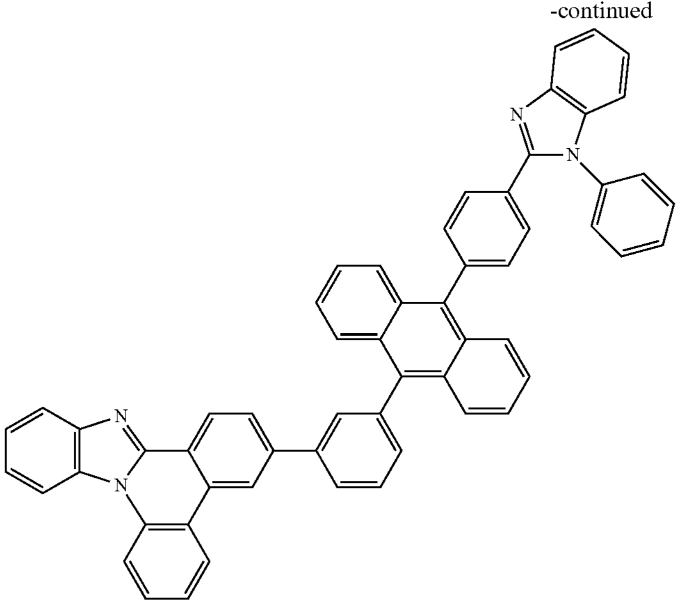
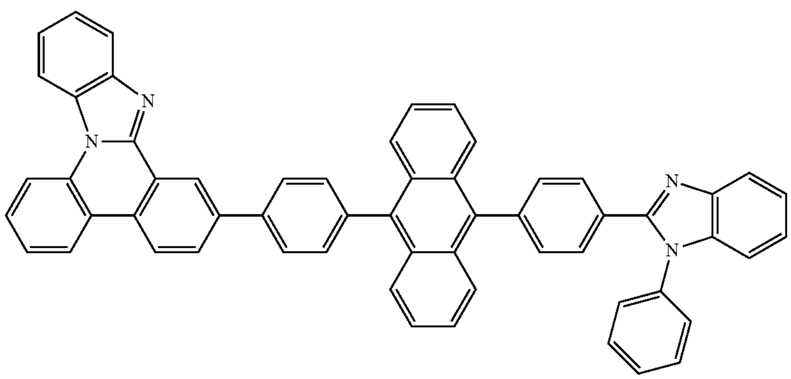
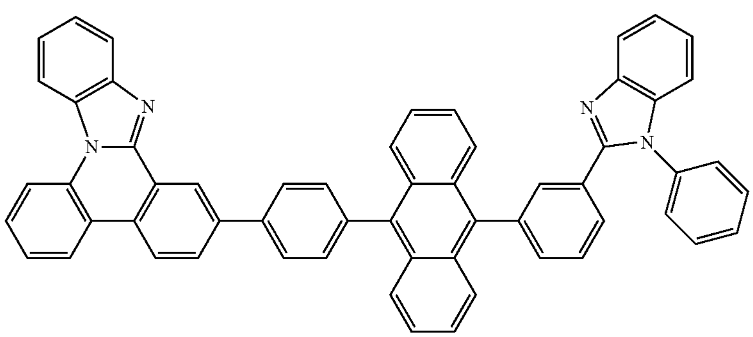
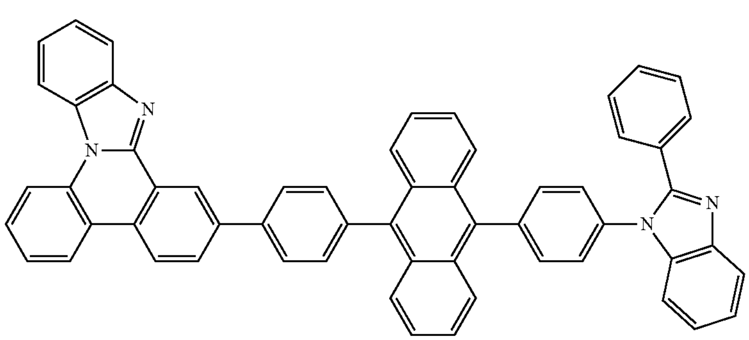

-continued
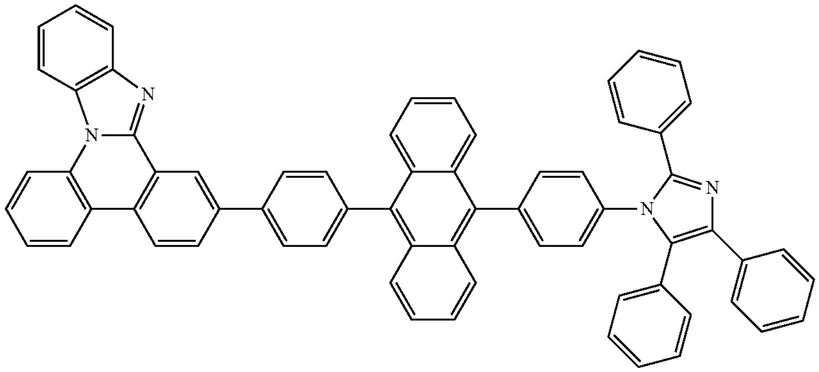
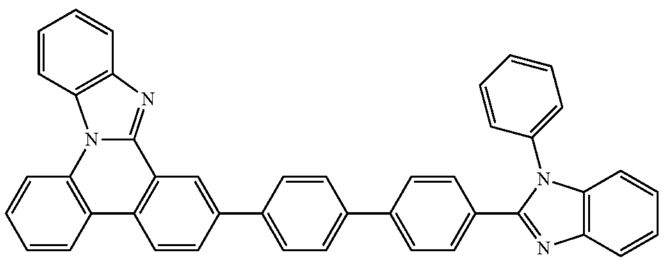
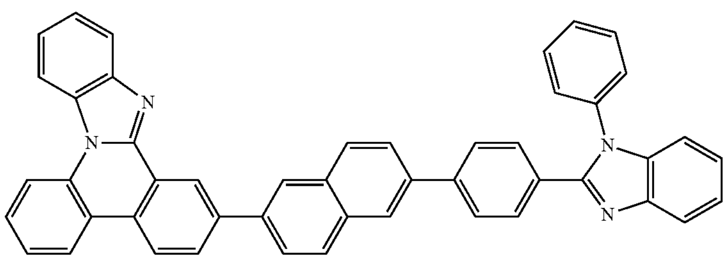
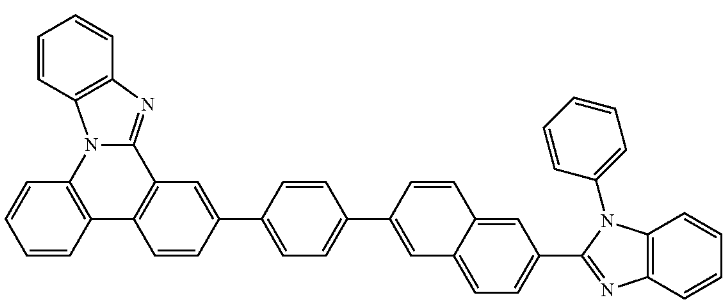
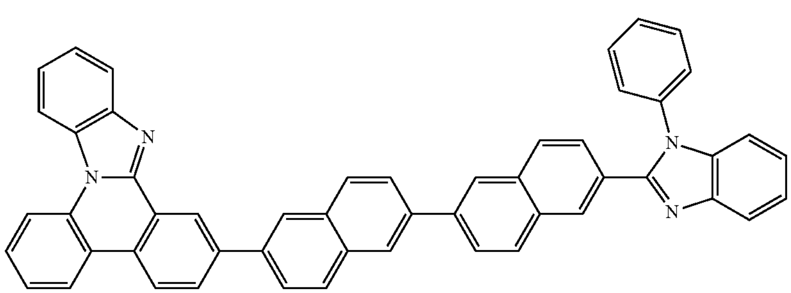

-continued
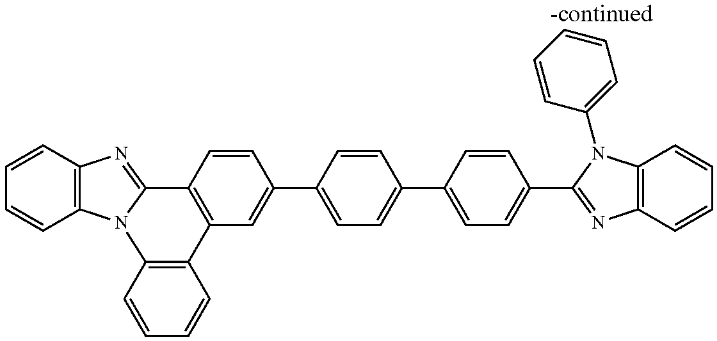
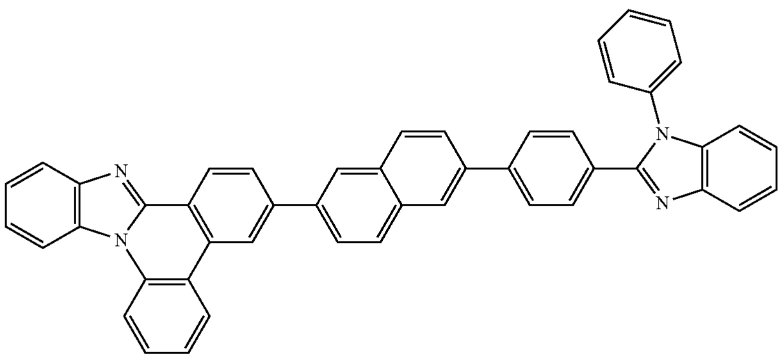
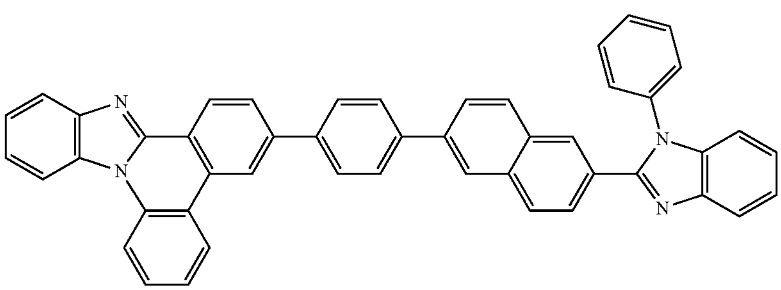
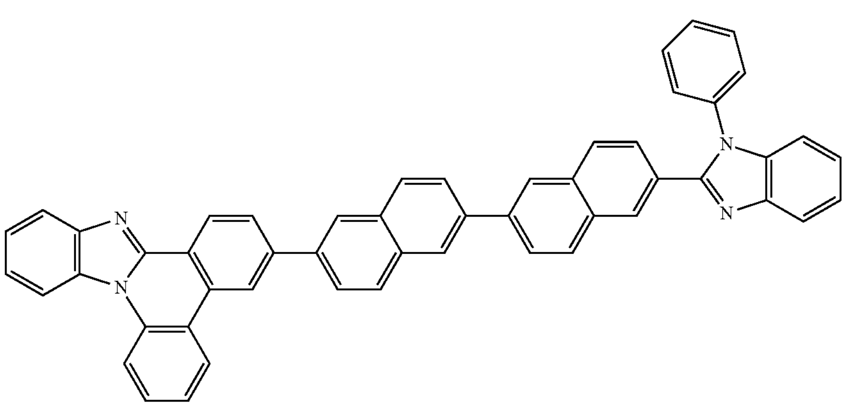

-continued
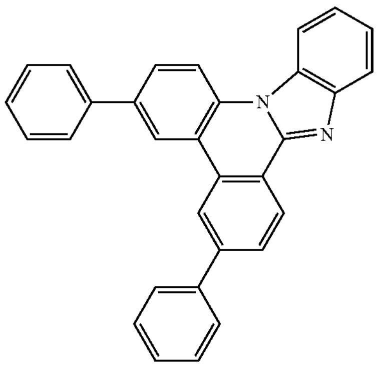
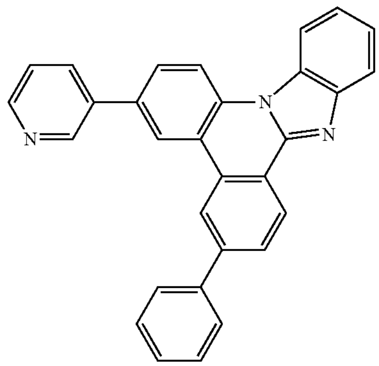
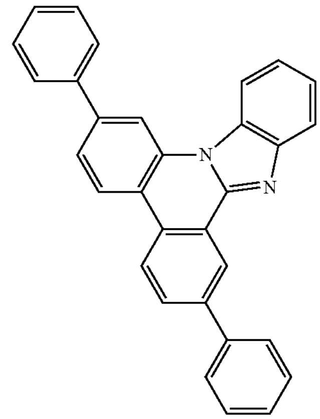
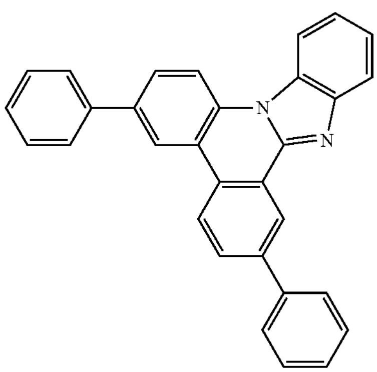
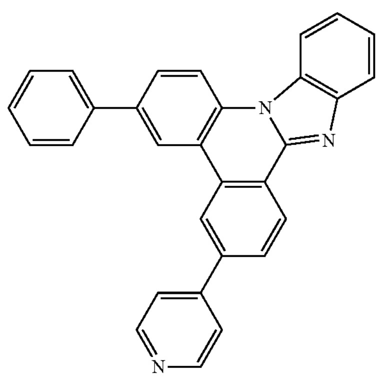
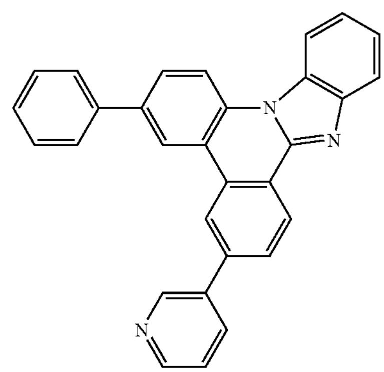
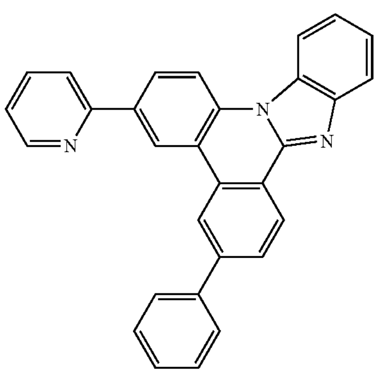
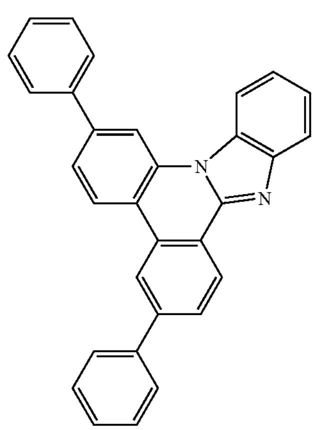
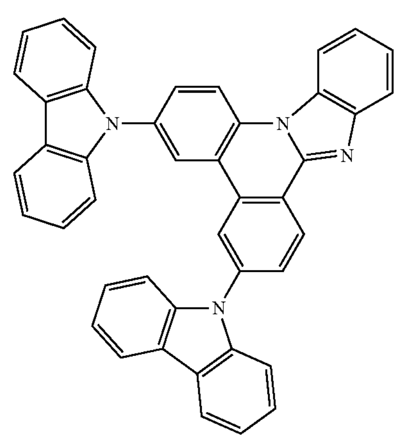

-continued
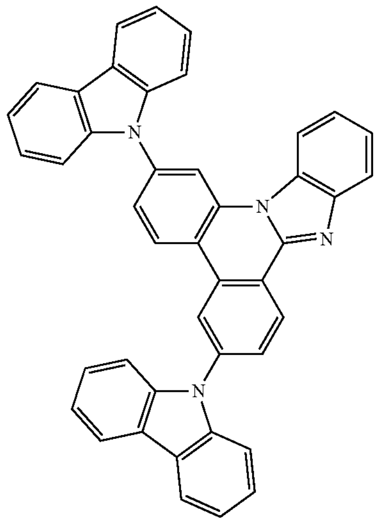
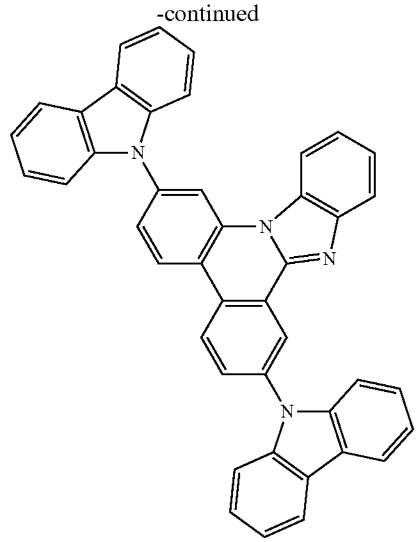
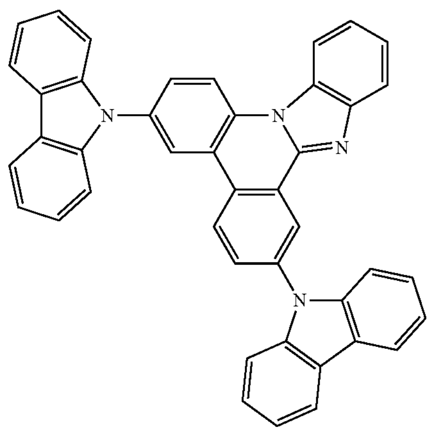
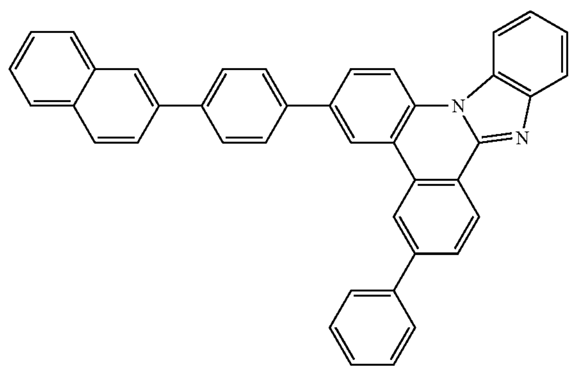
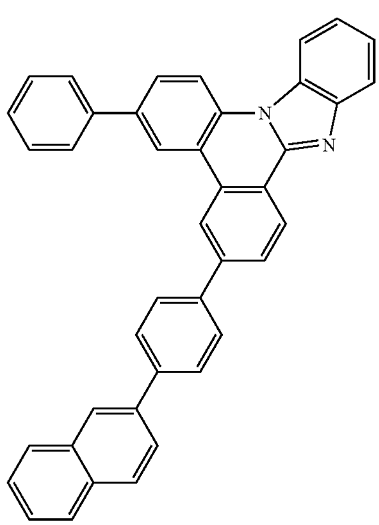
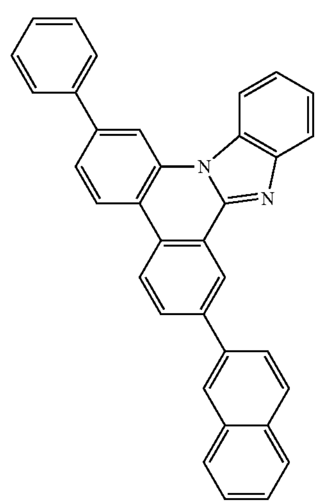
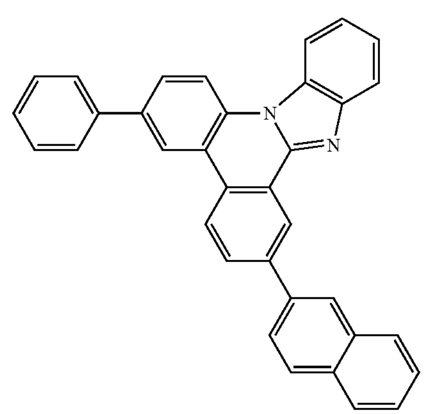

-continued
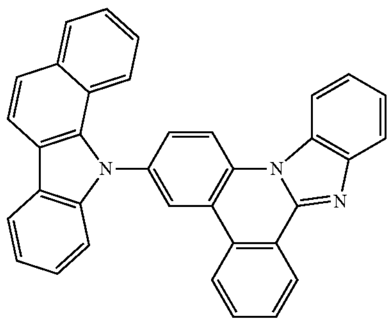
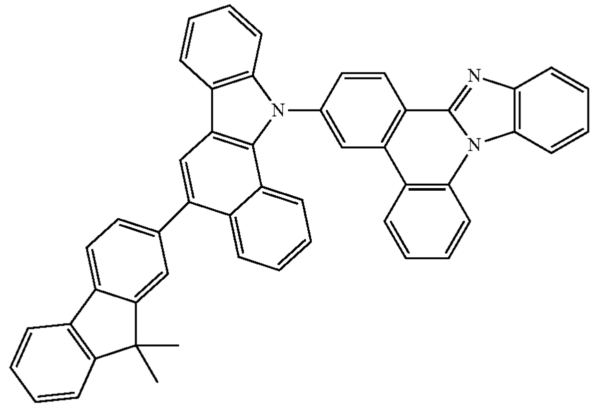
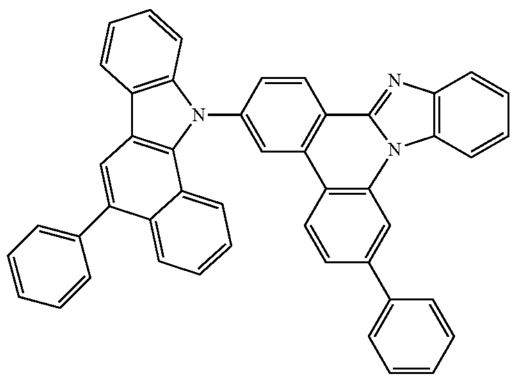
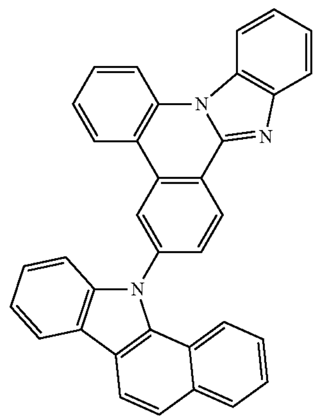
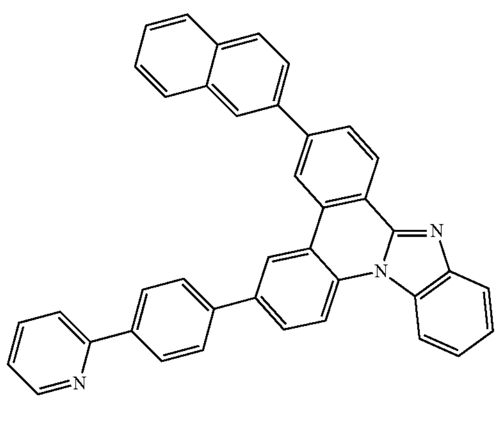
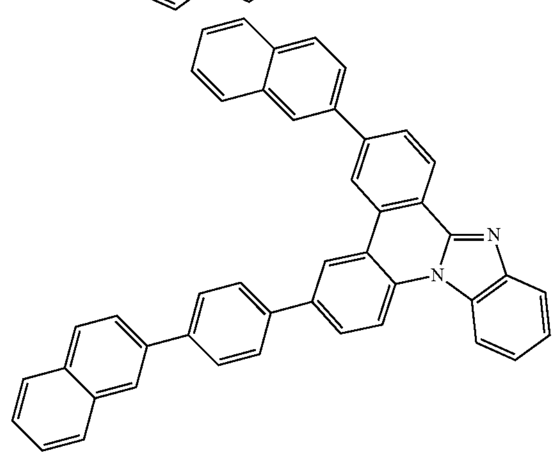
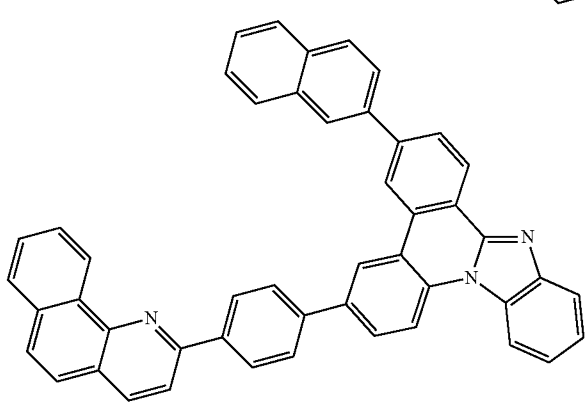
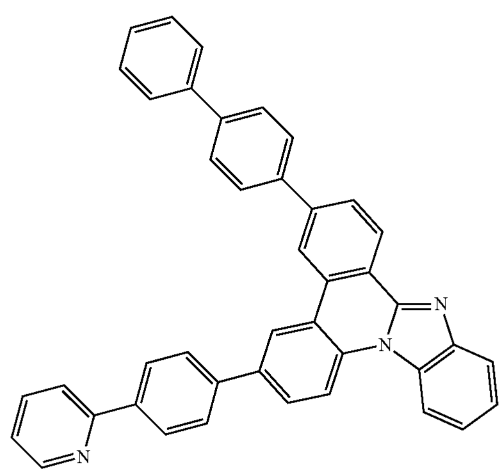

-continued
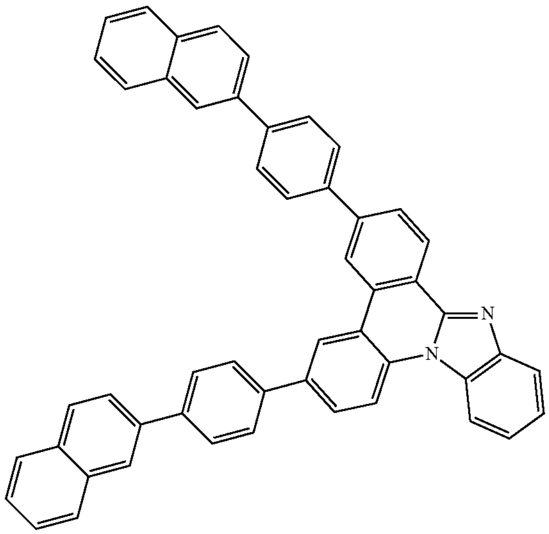
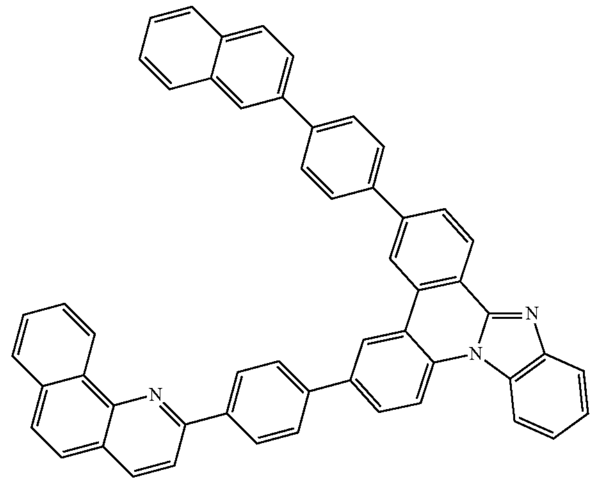
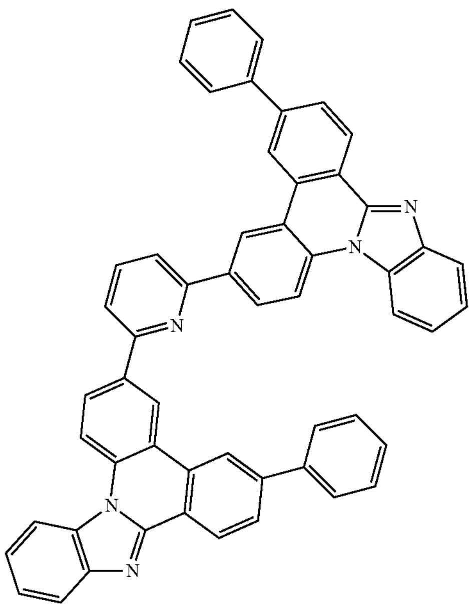
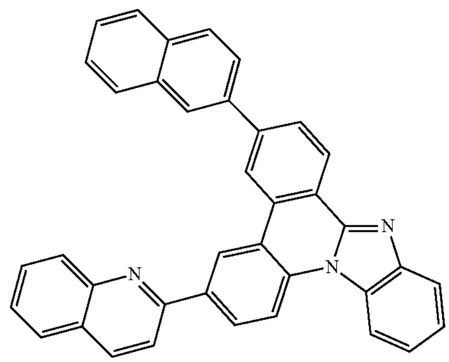
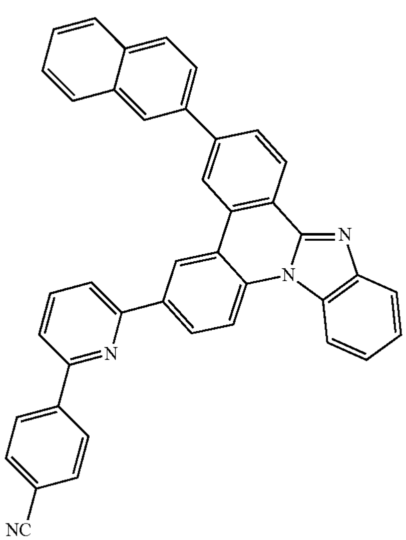
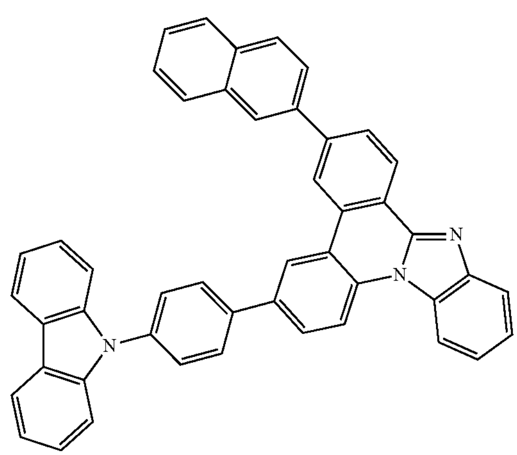

-continued
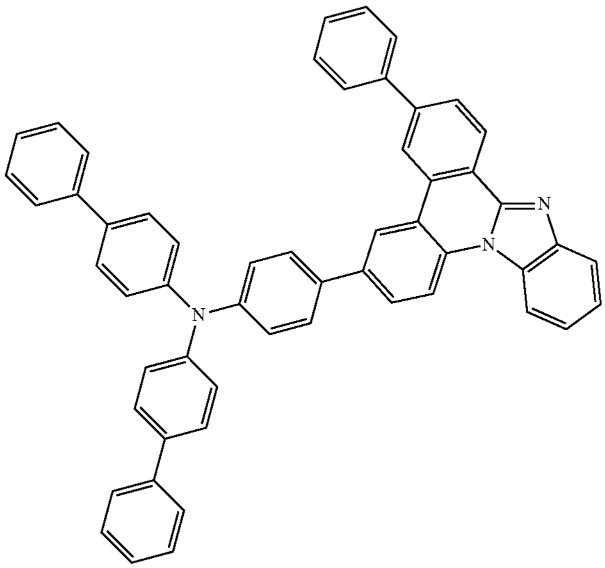
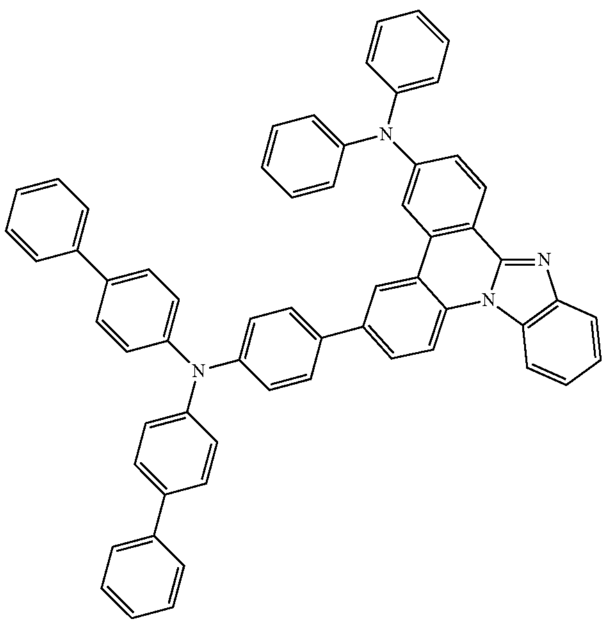
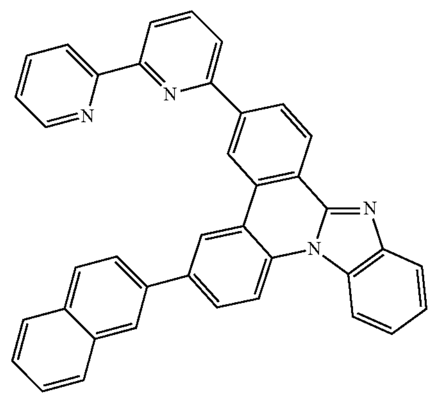
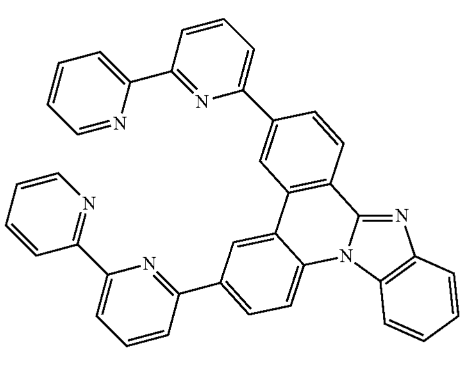
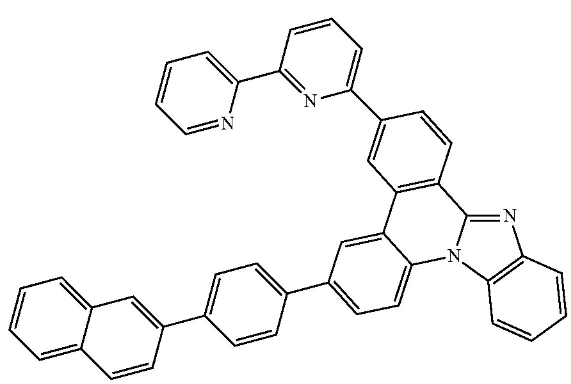

-continued
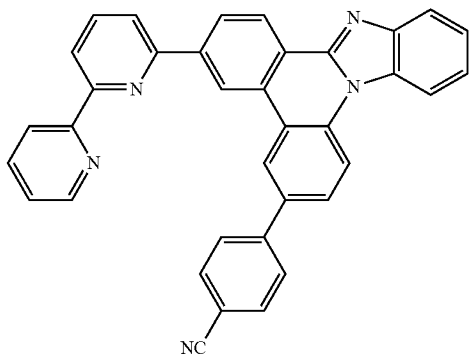
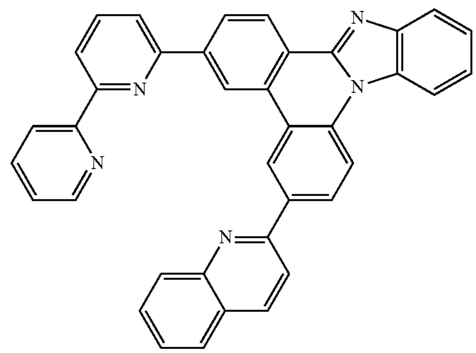
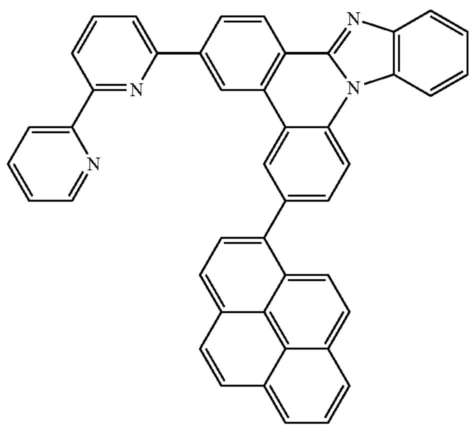
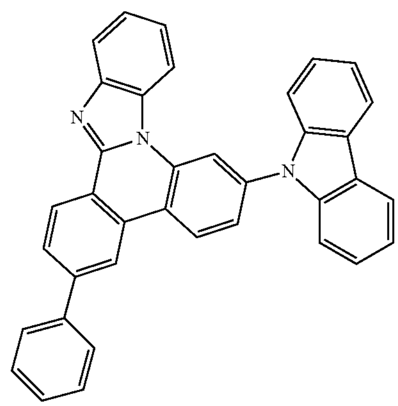
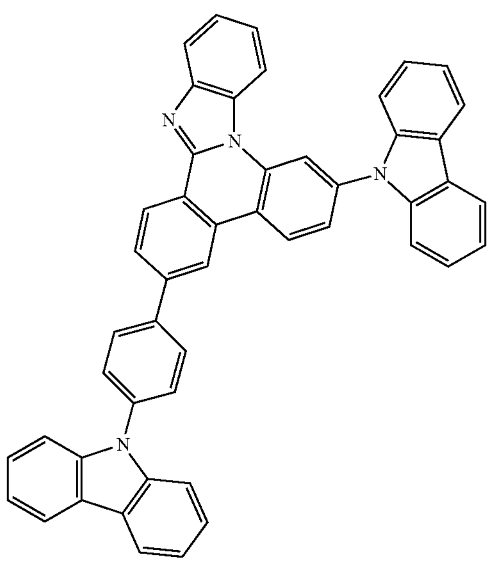
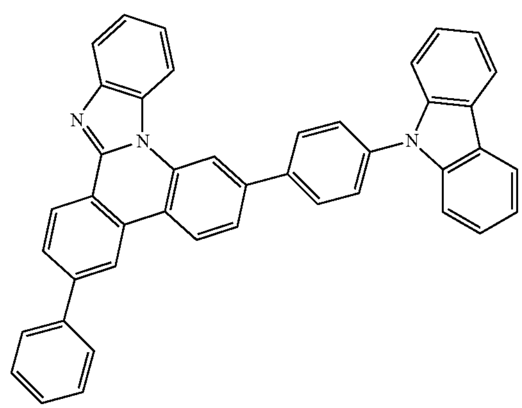
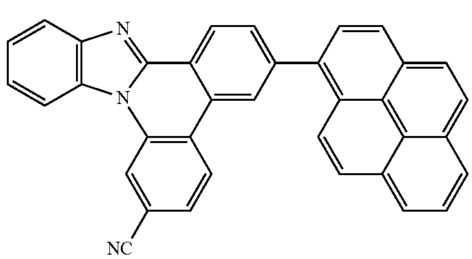
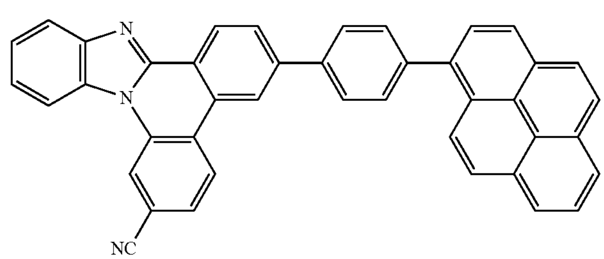

-continued
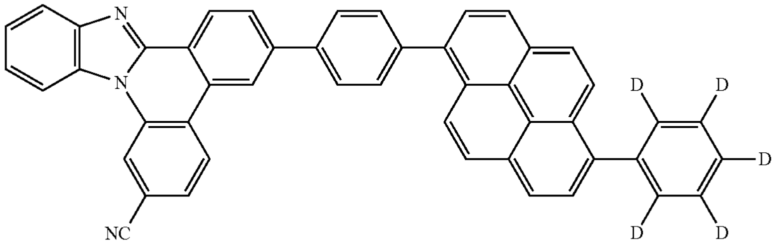
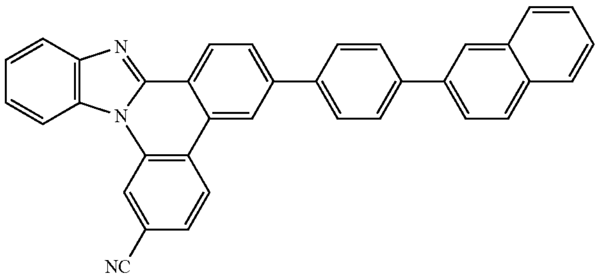
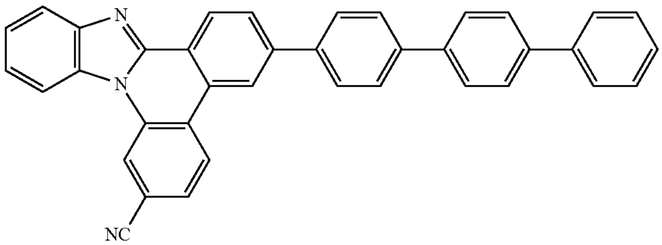
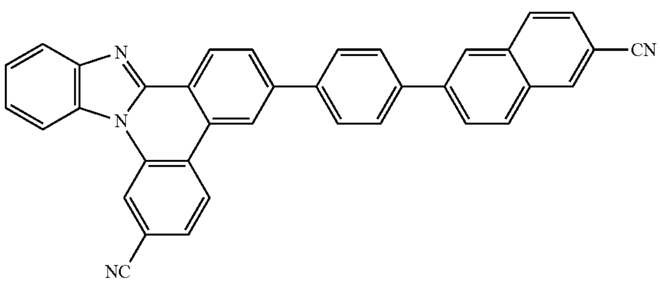
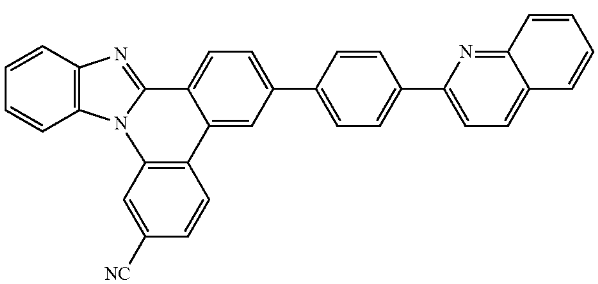
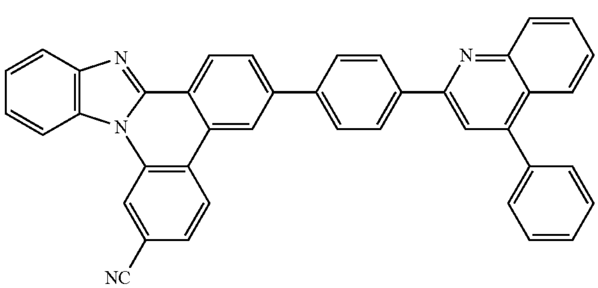
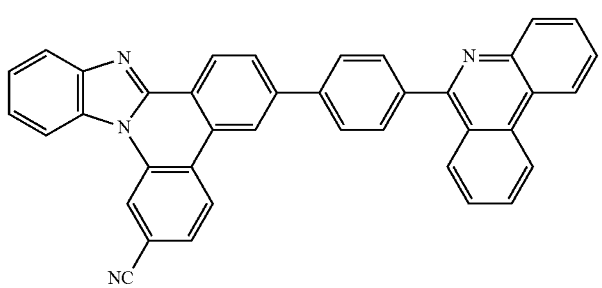

-continued
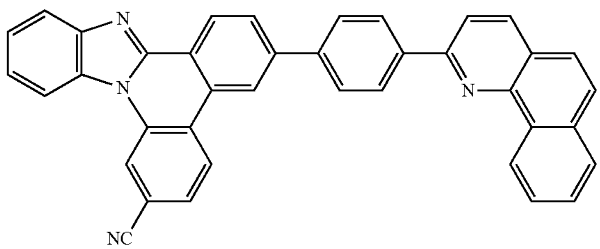
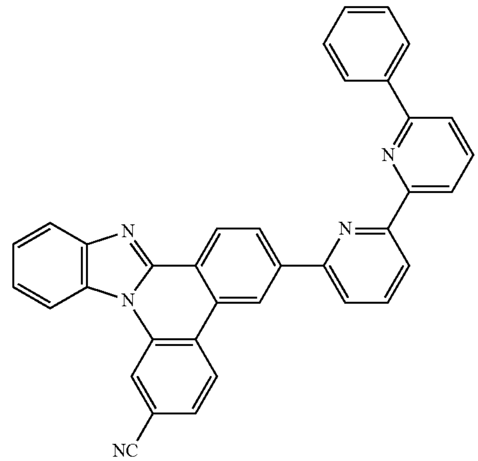
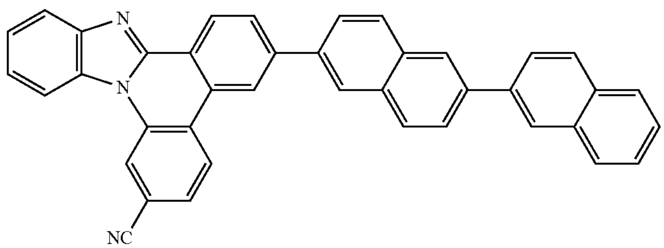
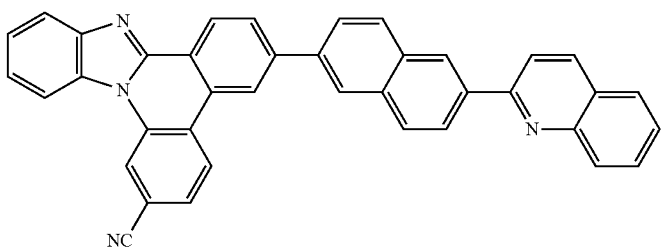
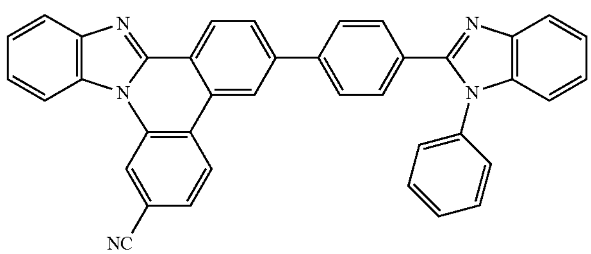
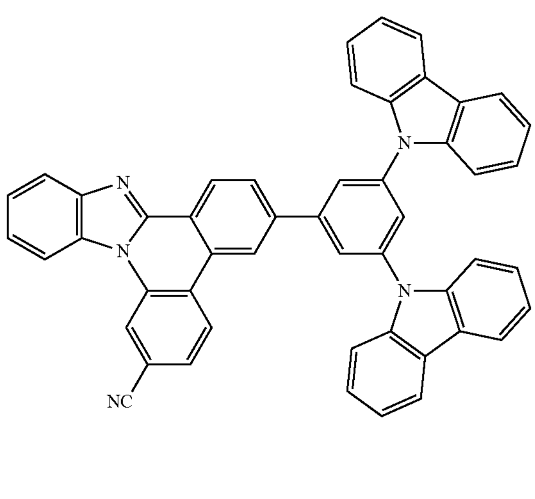
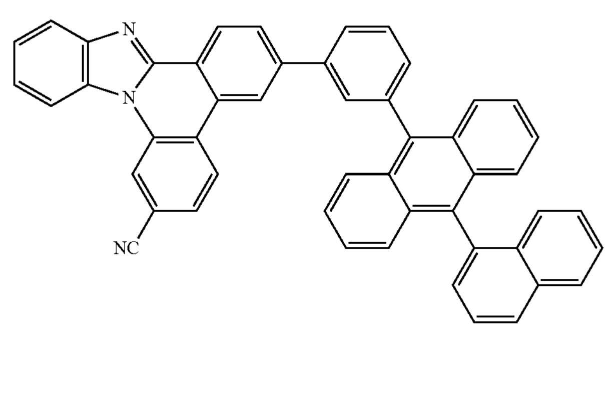

-continued
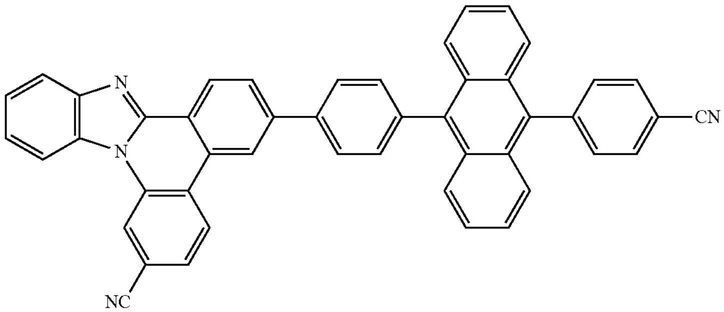
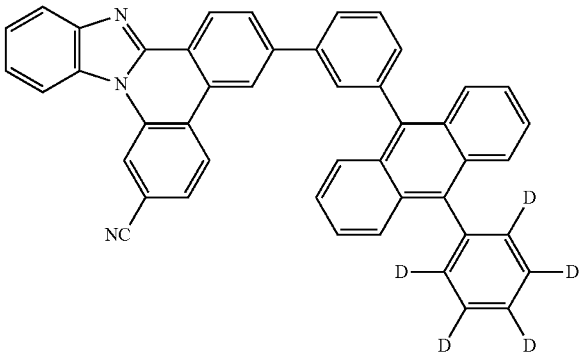
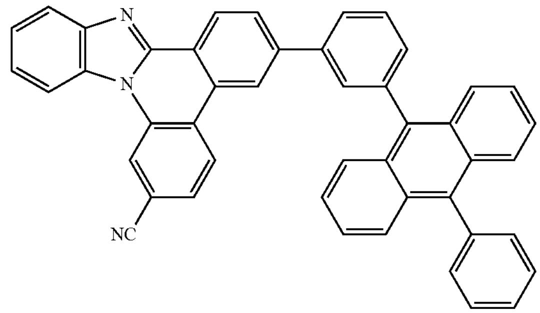
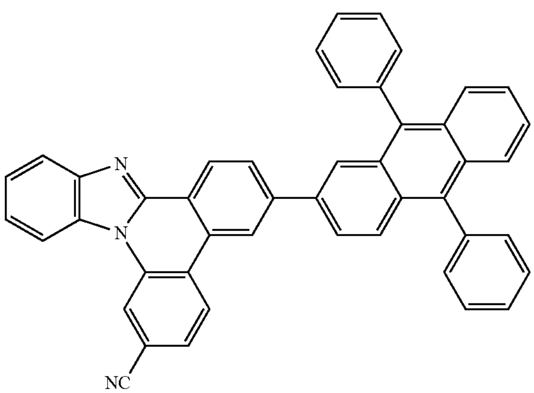
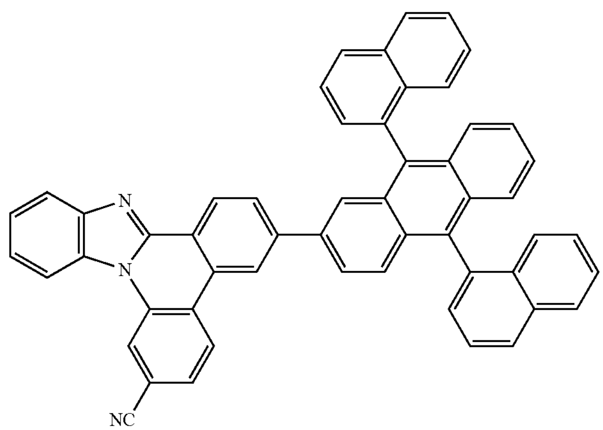
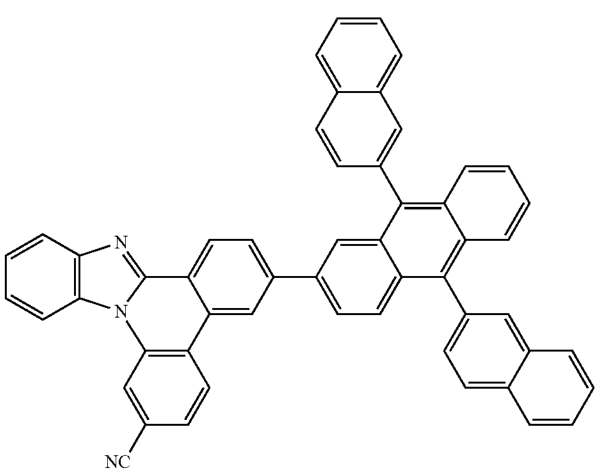

-continued
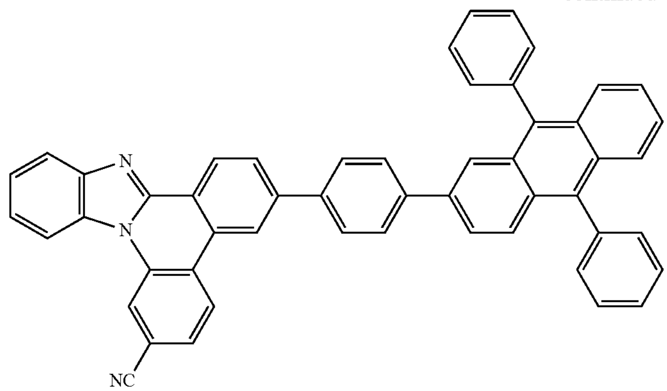
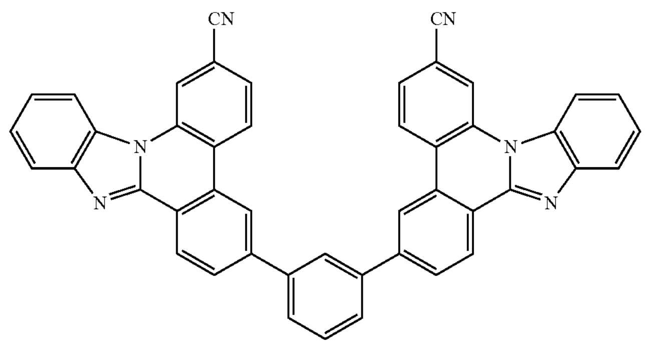
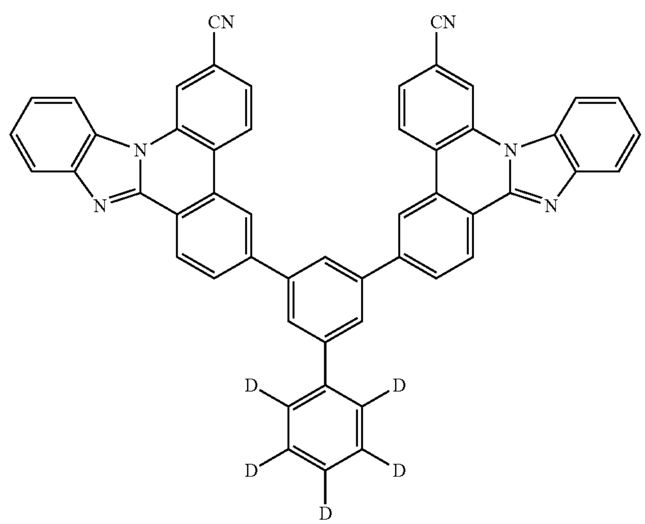
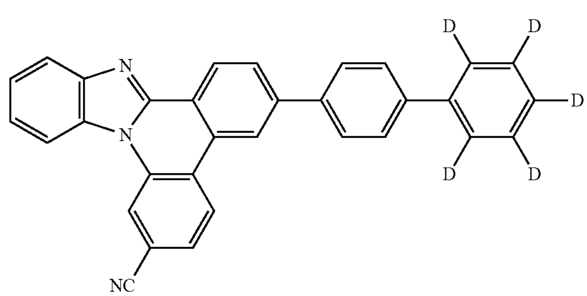

-continued
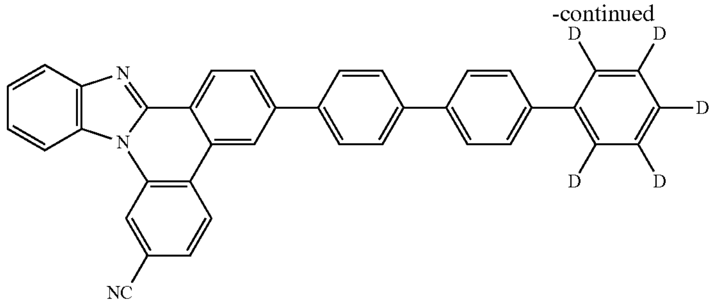
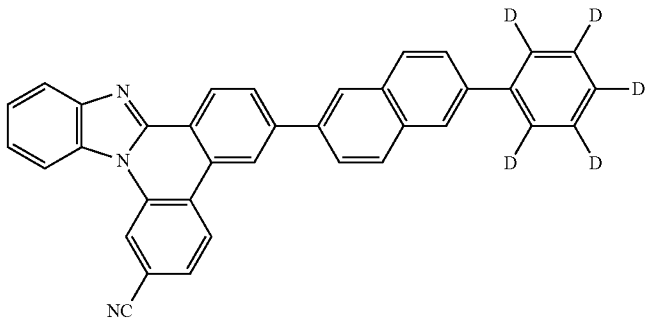
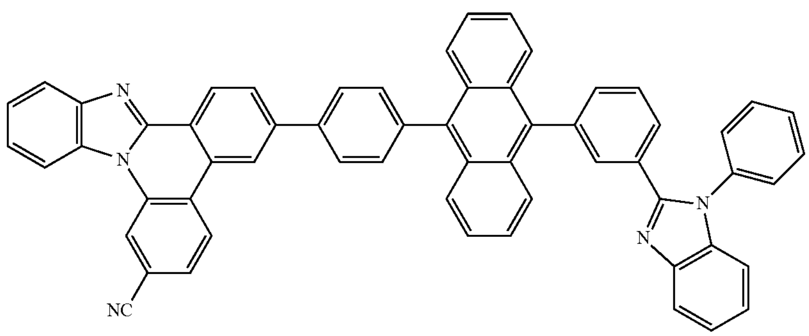
The compound represented by Formula 4 may be represented by one of the group consisting of the following structural formulas, but is not limited thereto.
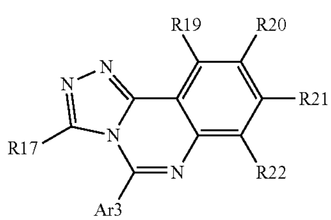
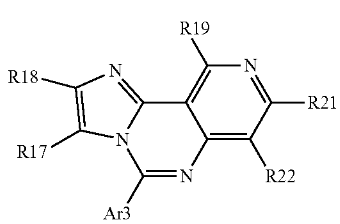
-continued
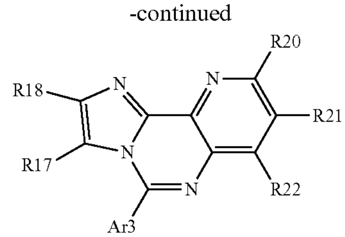
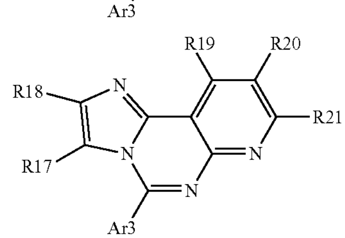
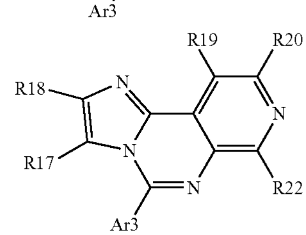

-continued
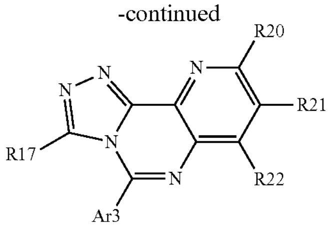
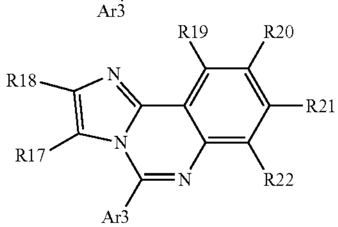
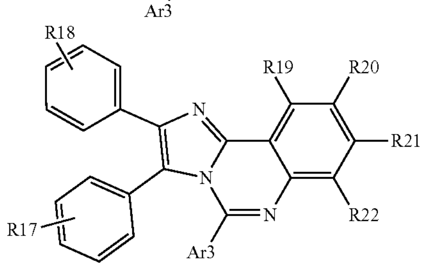
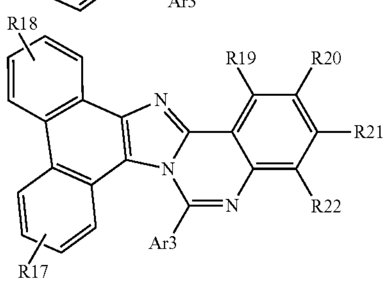
-continued
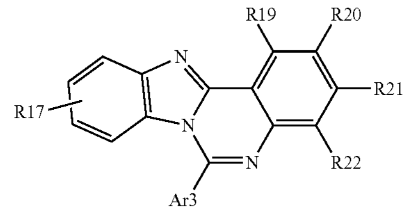
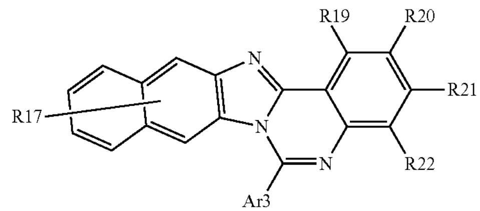
In the structural formulas, R17 to R22 and Ar3 are the same as those defined in Formula 4.
Further, the compound represented by Formula 4 may be represented by the following Formula 10, but is not limited thereto.
[Formula 10]
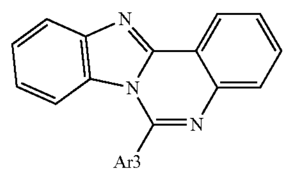
In Formula 10, Ar3 is selected from the following Table.
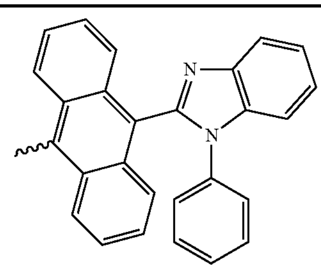
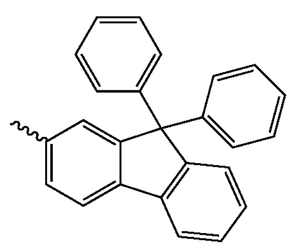
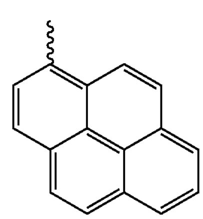

-continued
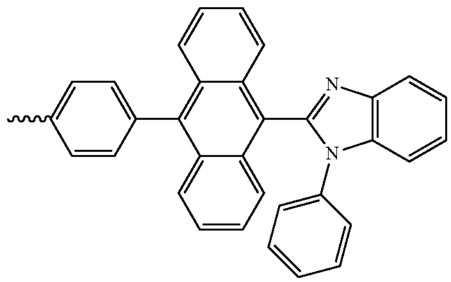
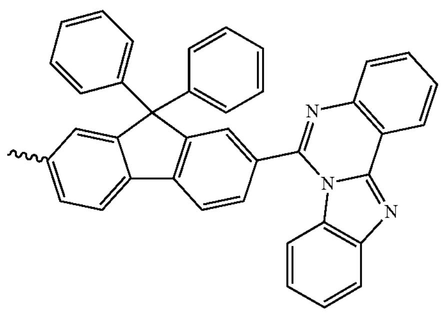
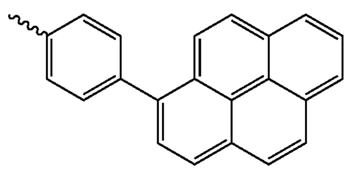
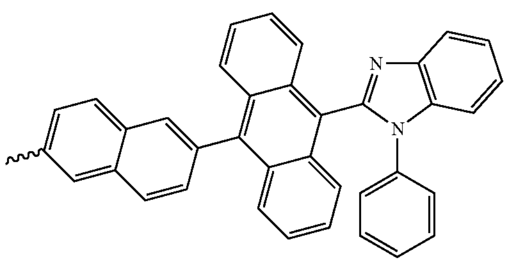
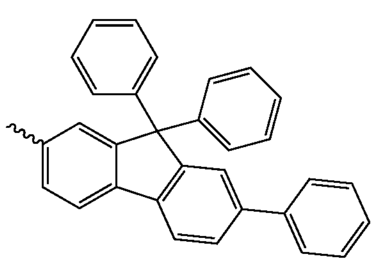
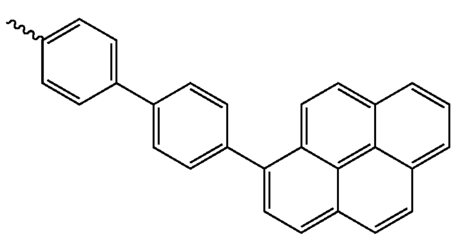

-continued
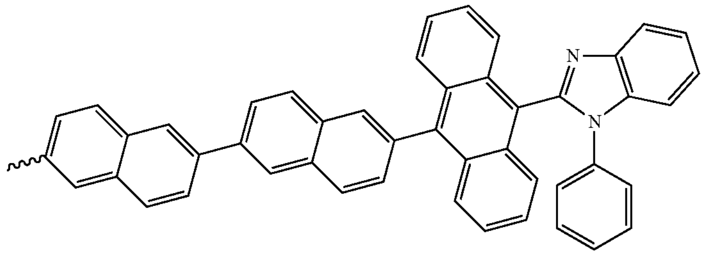
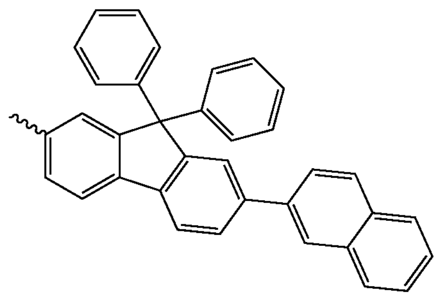
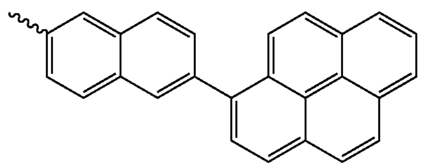
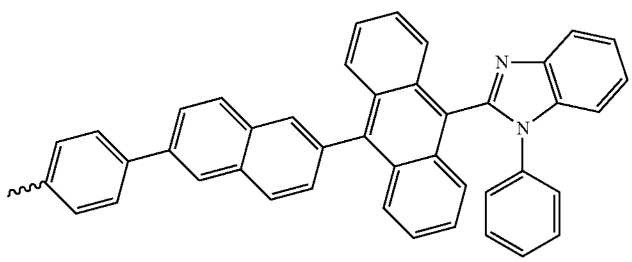
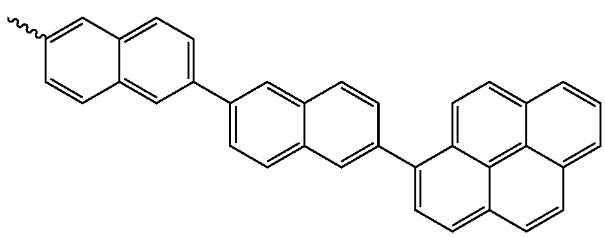
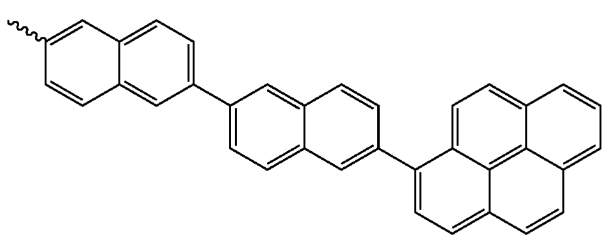

-continued
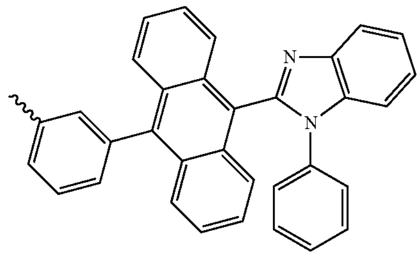
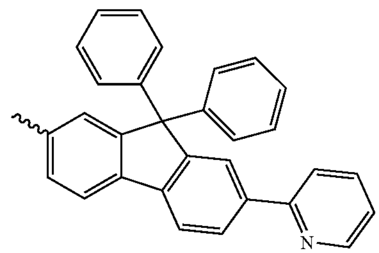
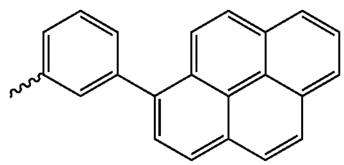
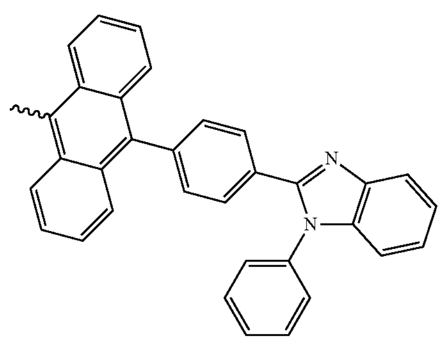
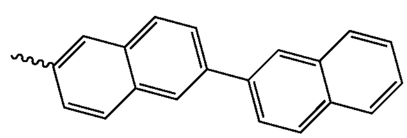
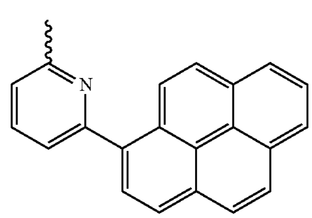

-continued
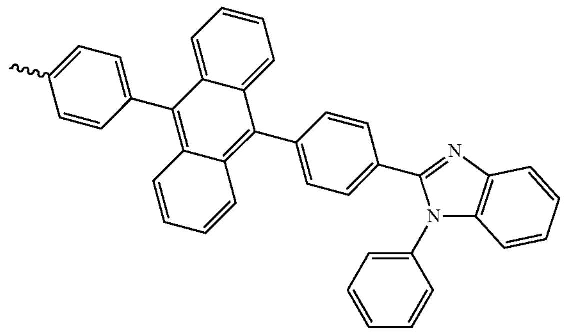
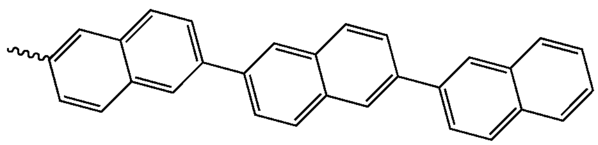
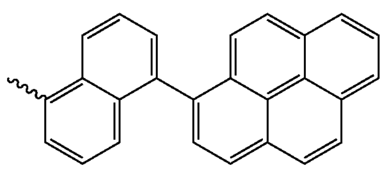
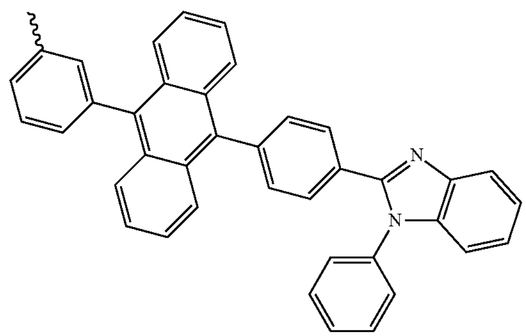
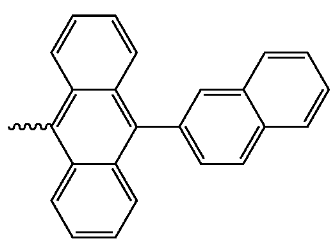
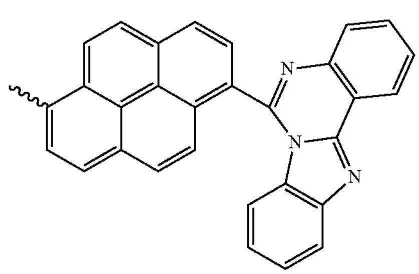

-continued
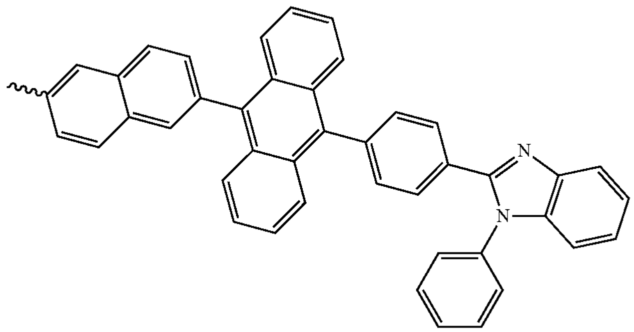
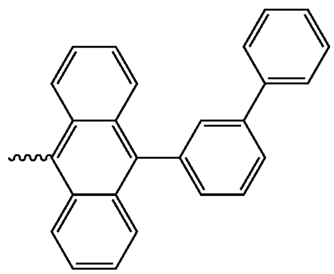
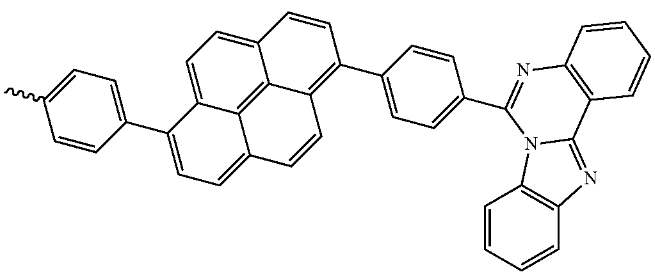
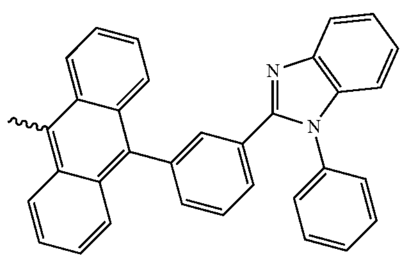
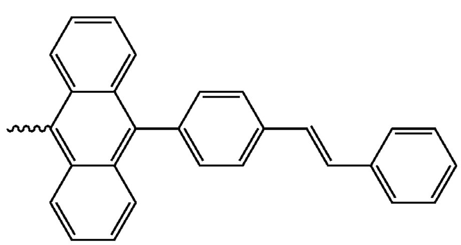
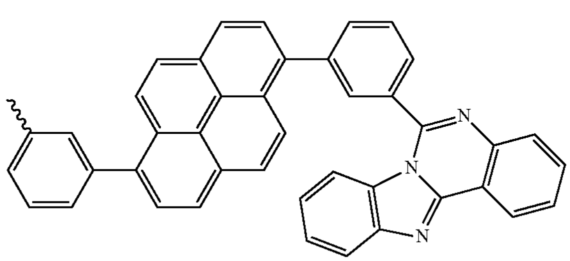

-continued
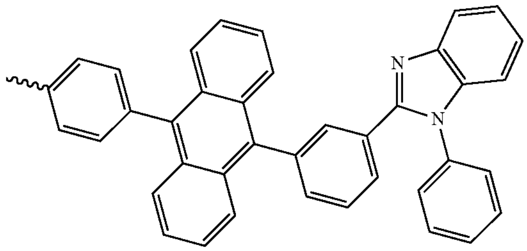
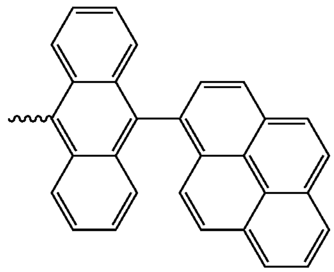
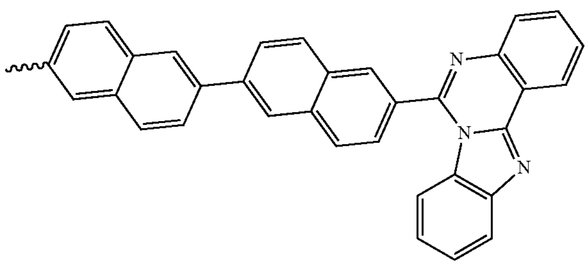
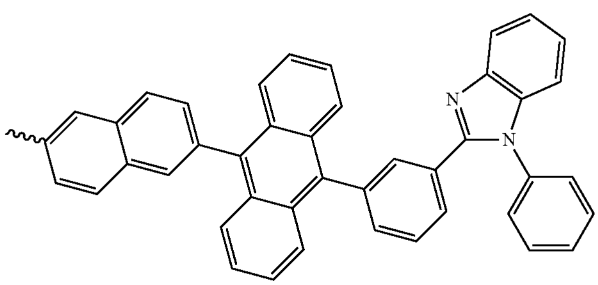
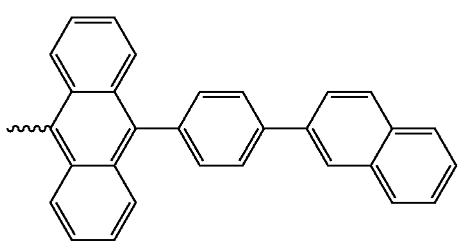
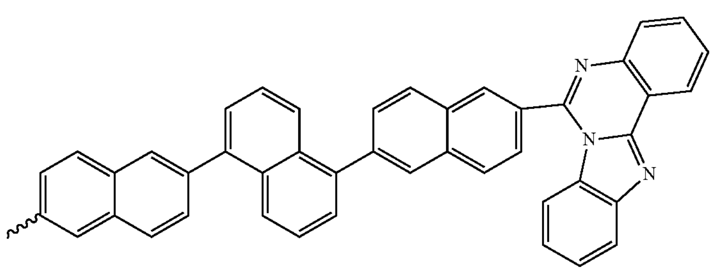

-continued
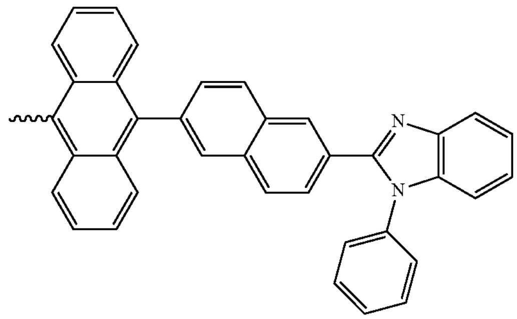
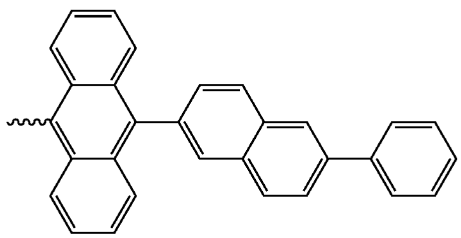
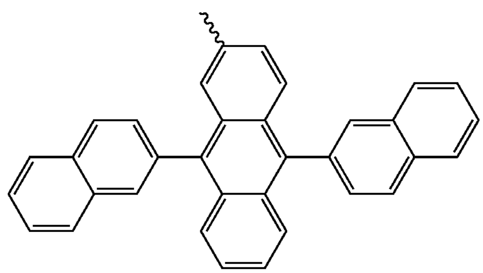
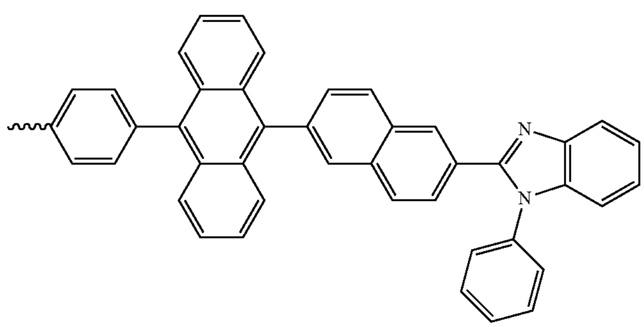
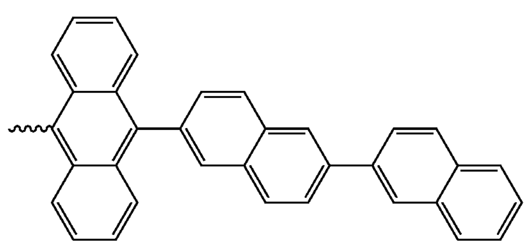

-continued
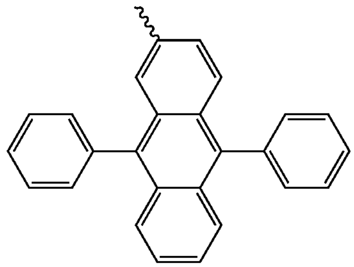
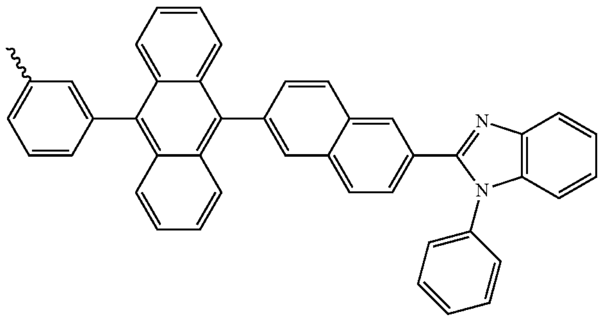
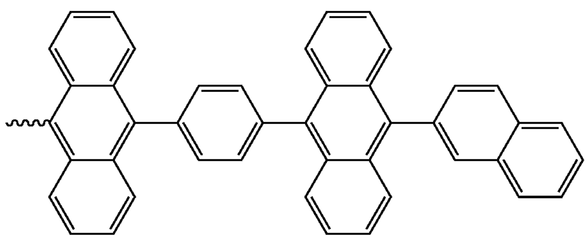
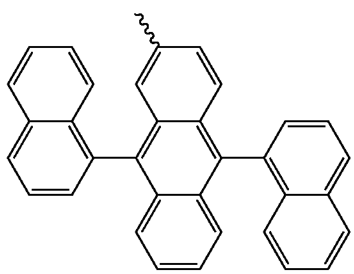
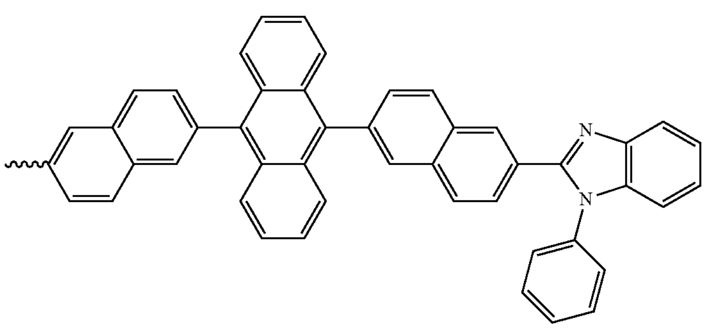

-continued
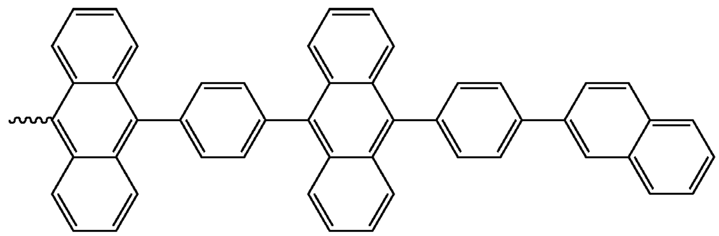
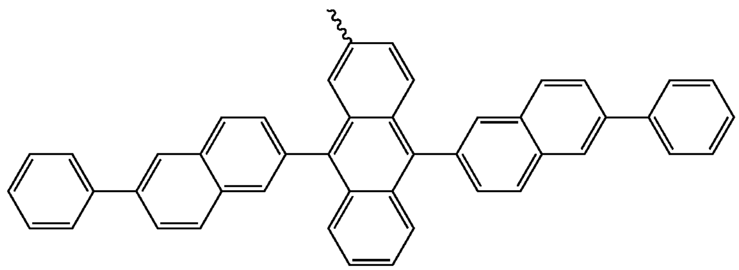
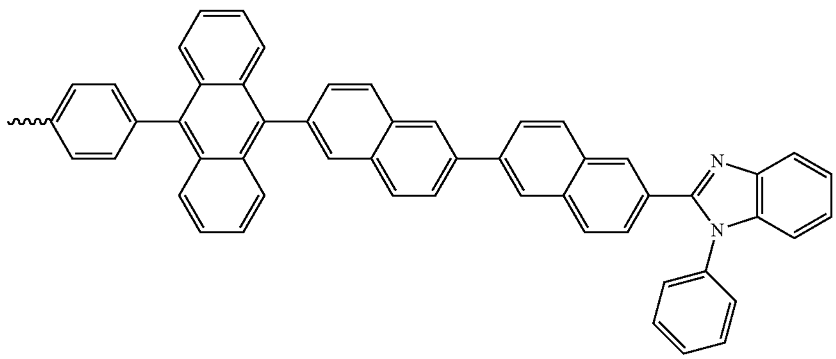
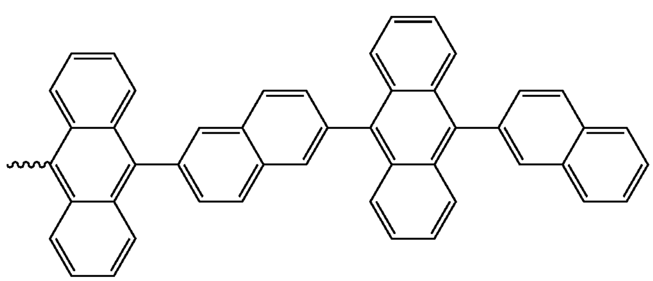
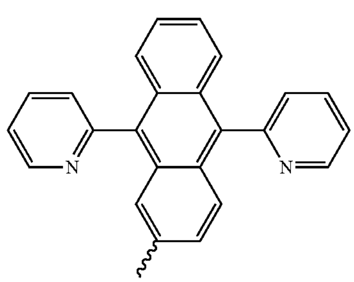

-continued
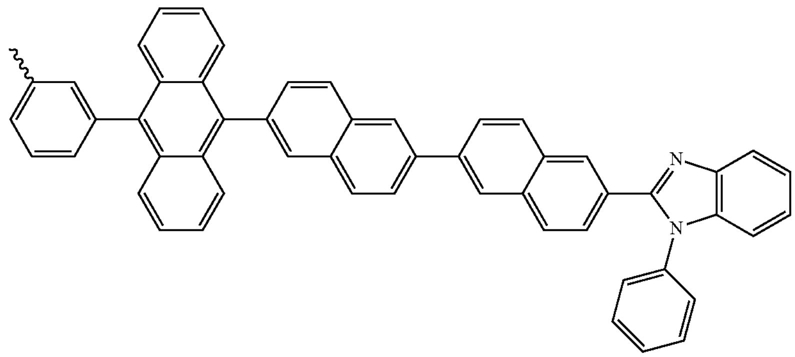
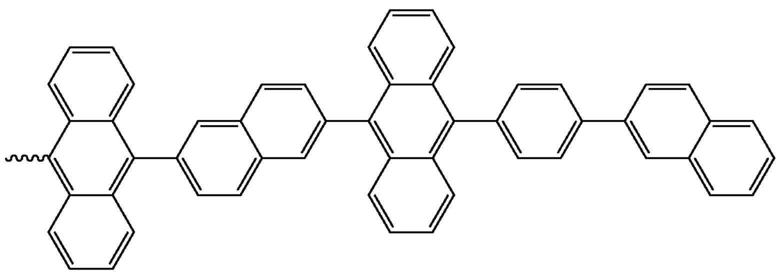
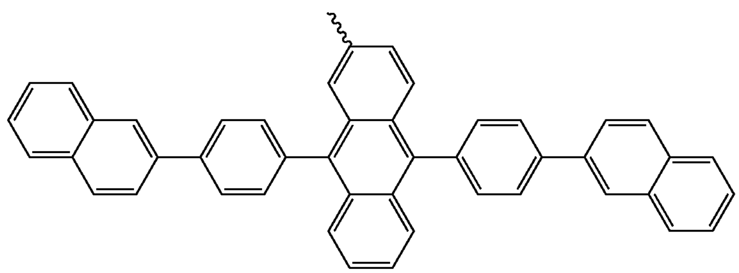
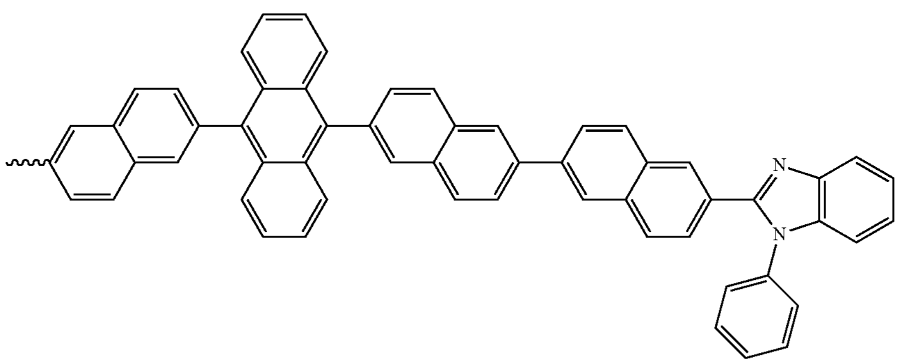
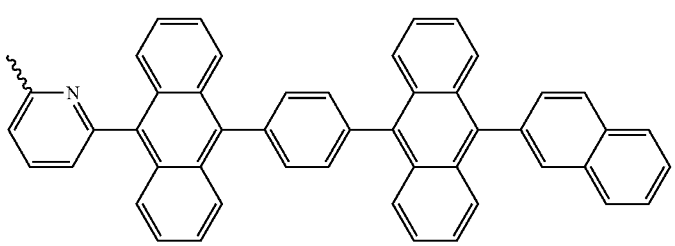

-continued
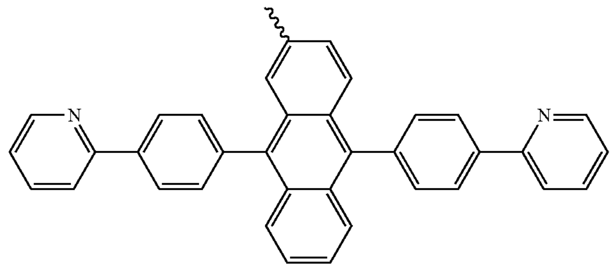
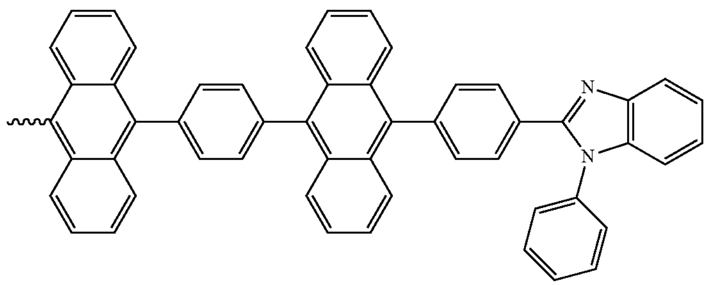
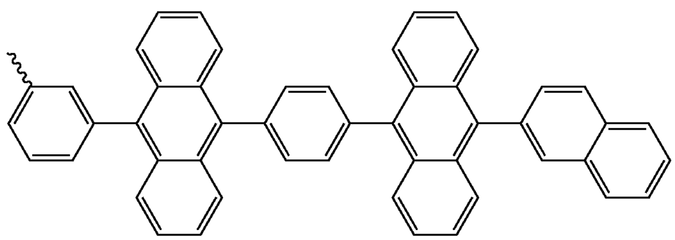
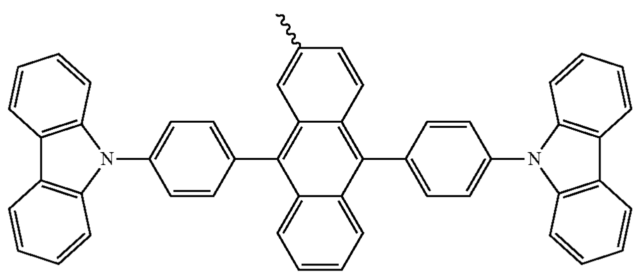
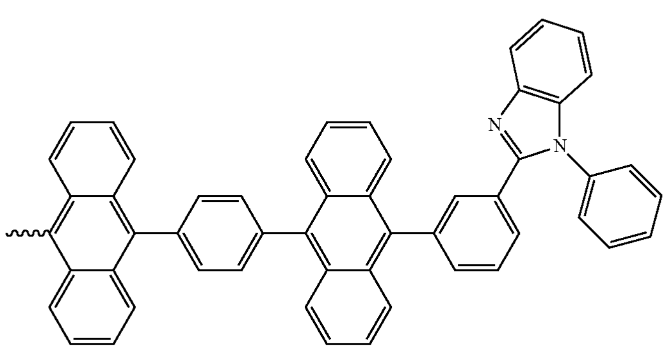

-continued
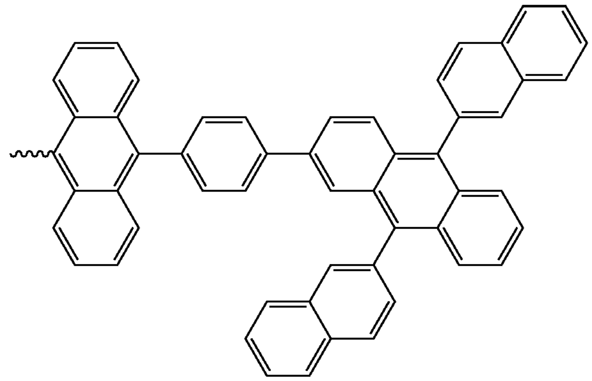
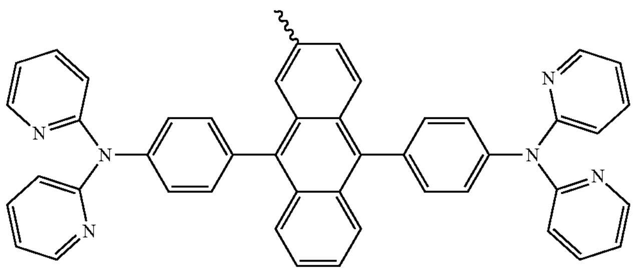
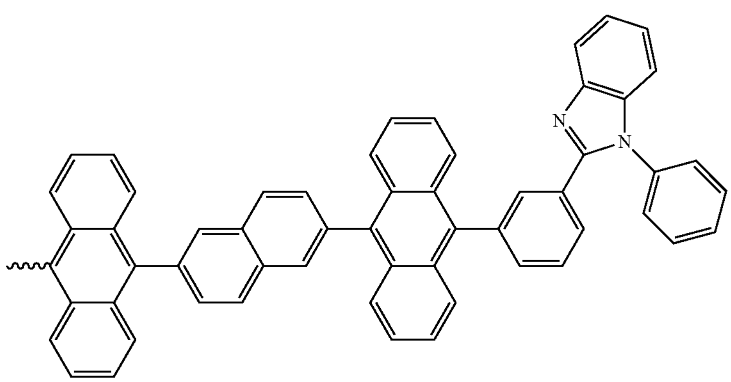
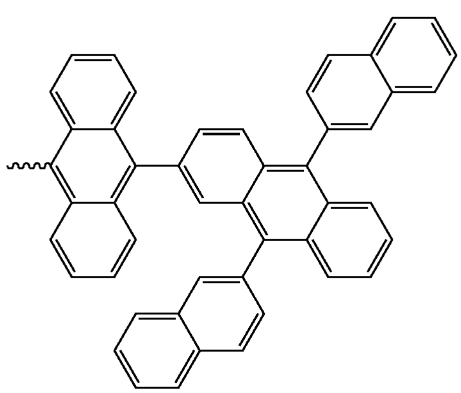

-continued
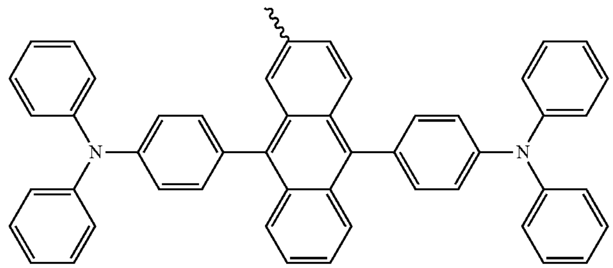
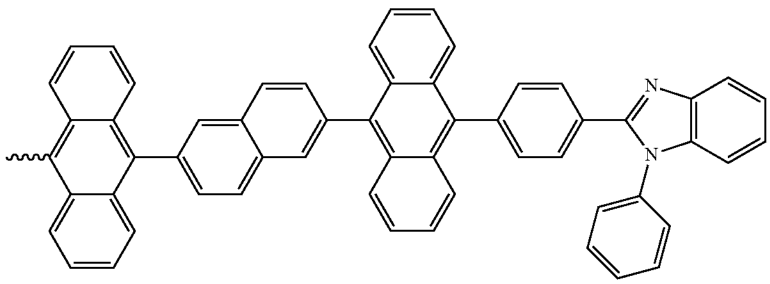
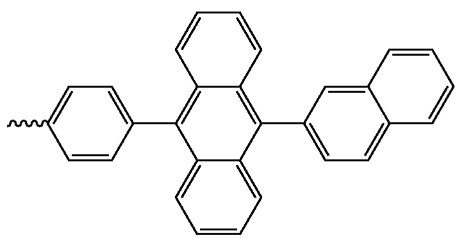
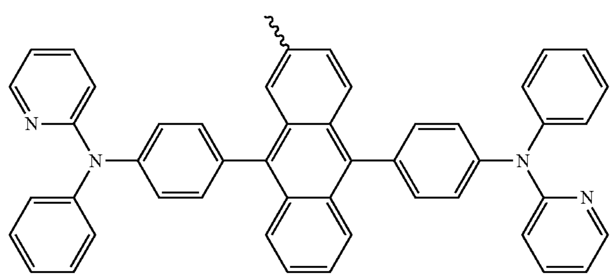
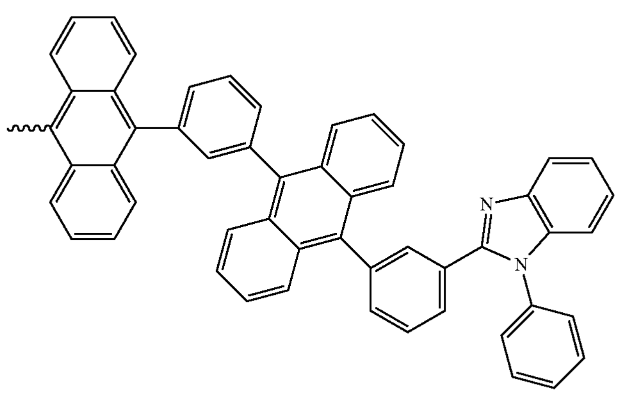

-continued
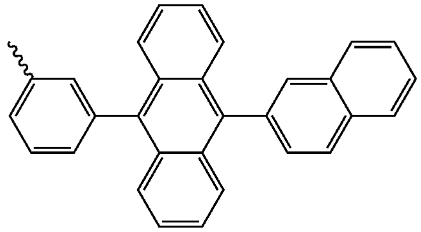
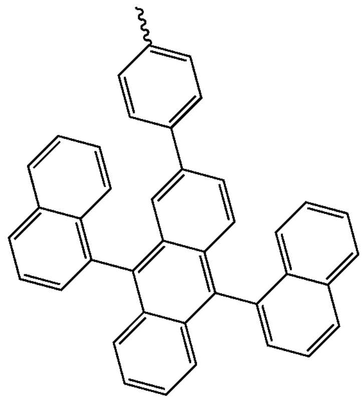
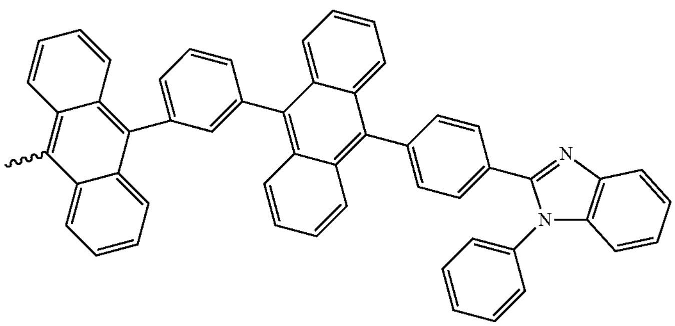
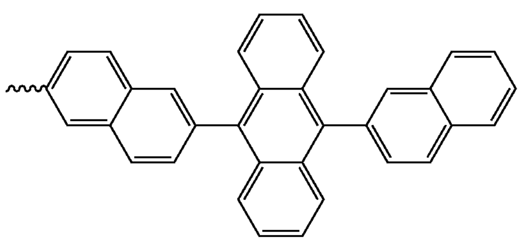
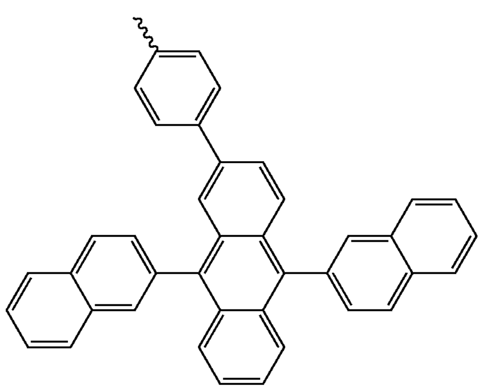

-continued
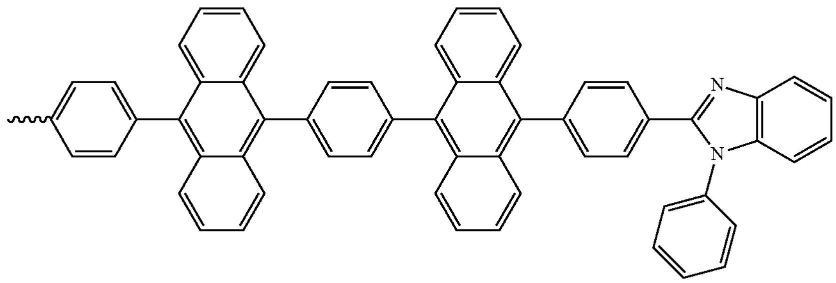
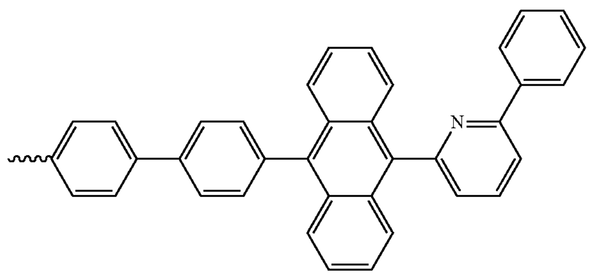
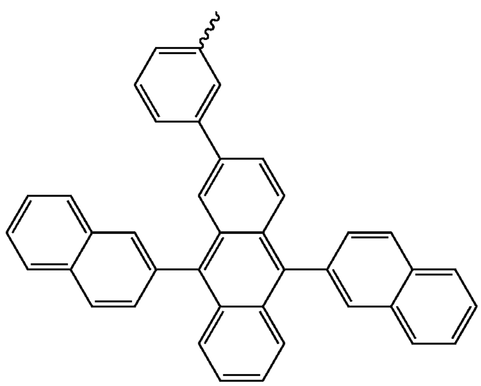
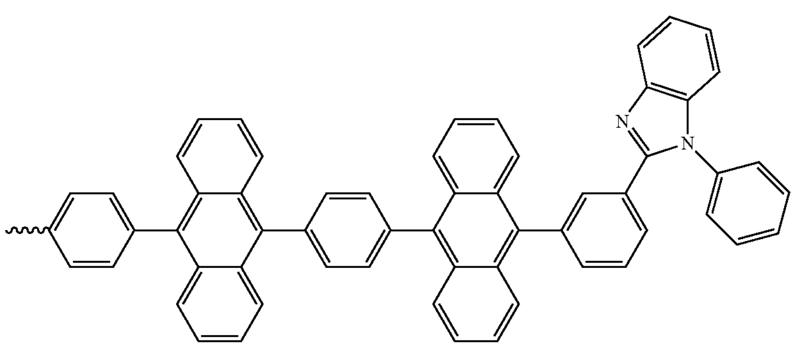
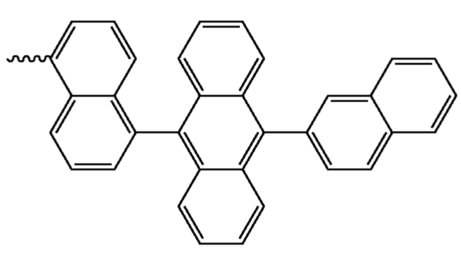

-continued
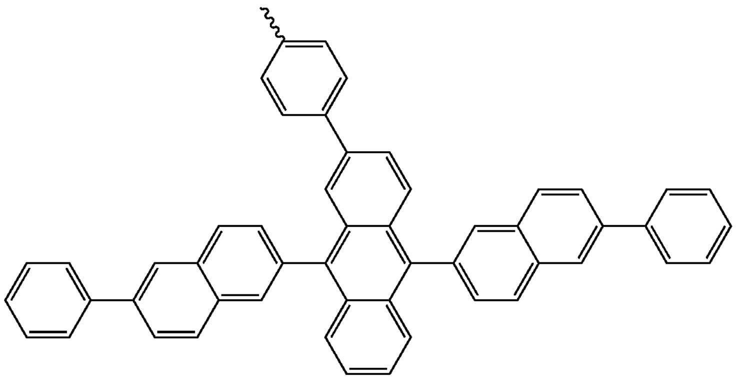
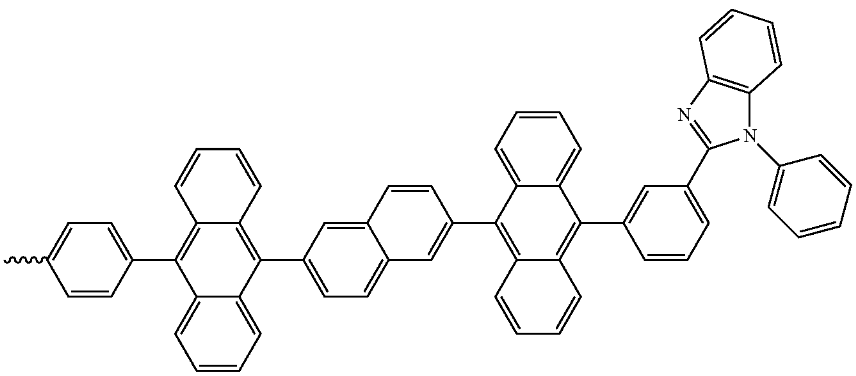
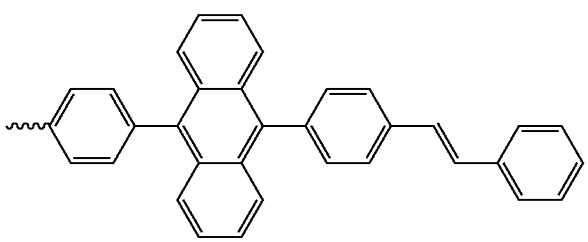
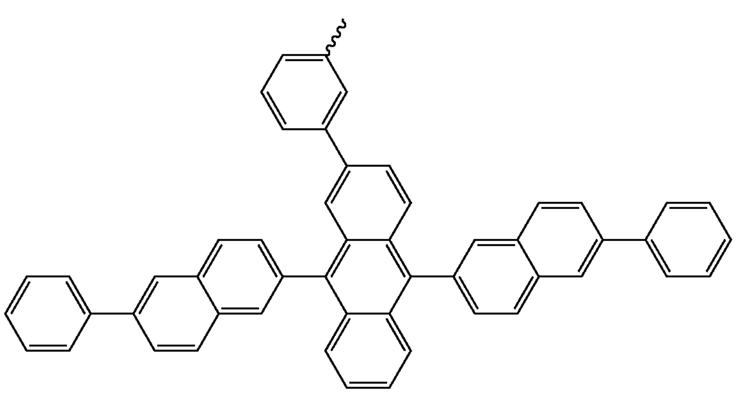

-continued
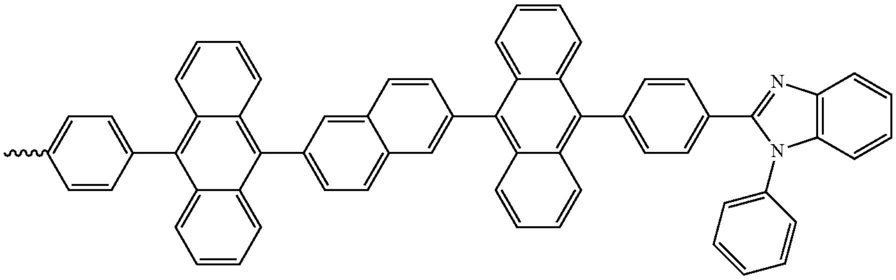
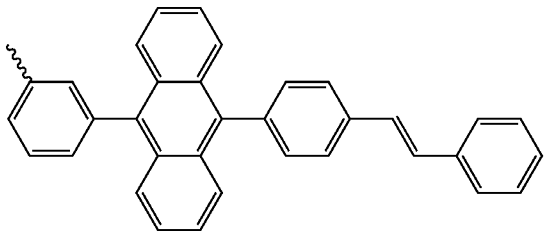
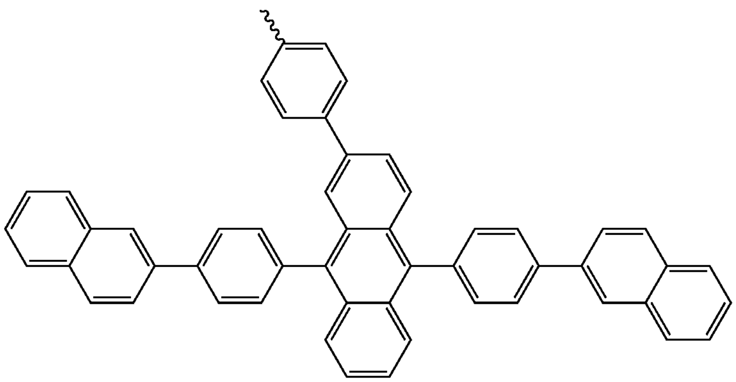
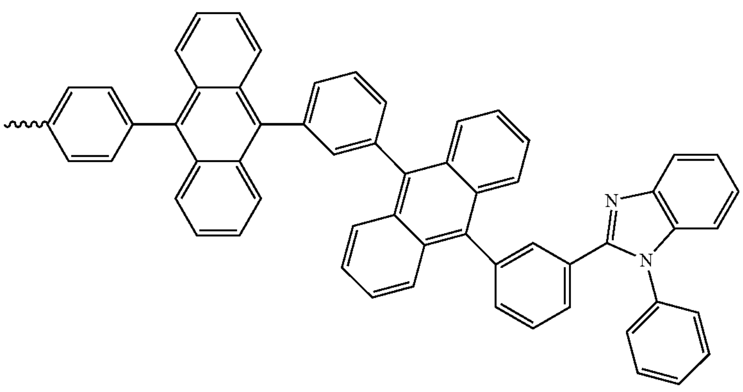
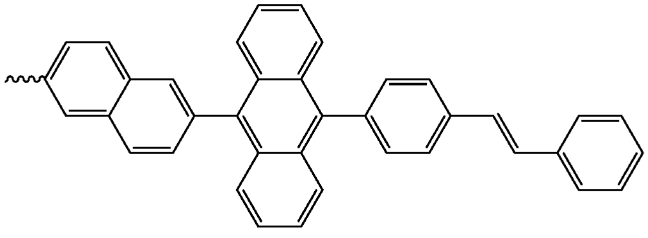

-continued
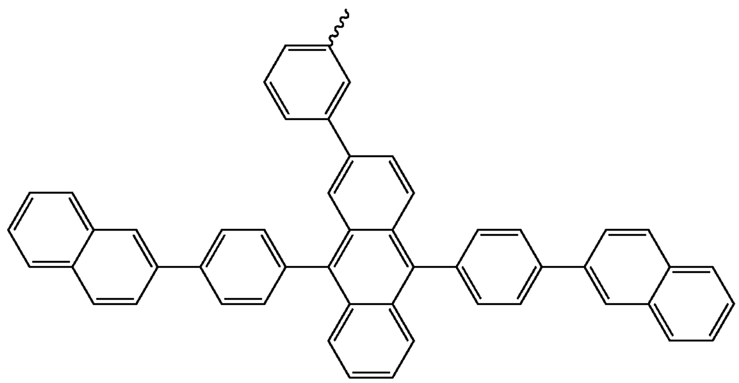
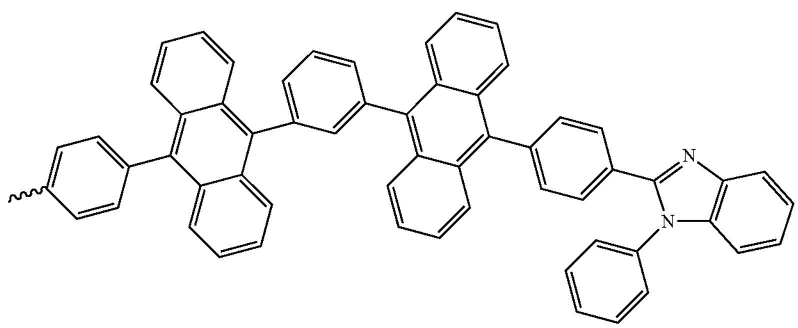
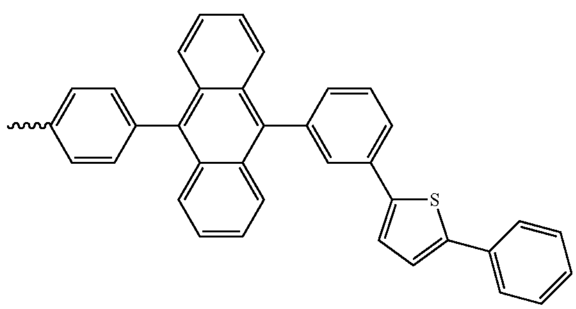
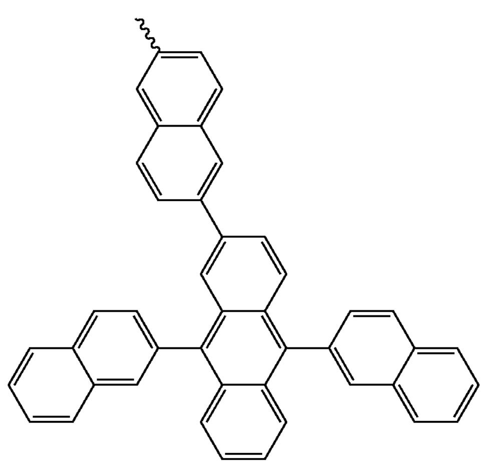

-continued
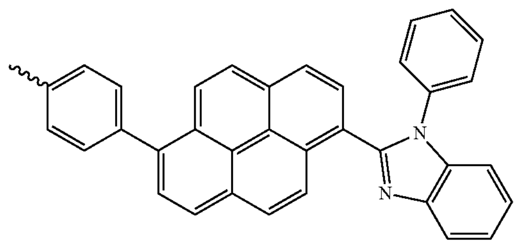
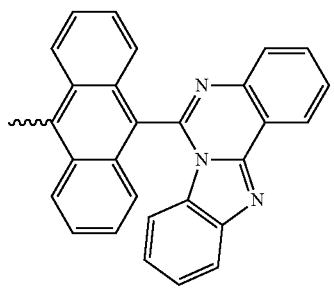
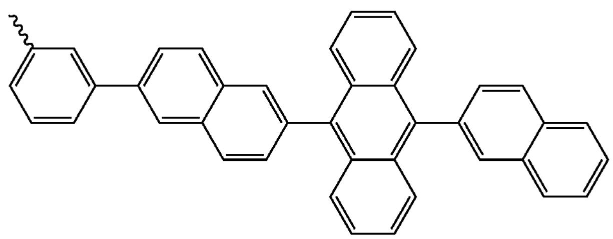
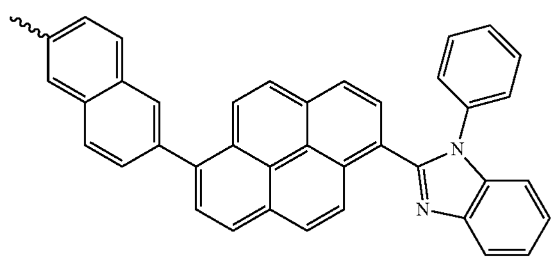
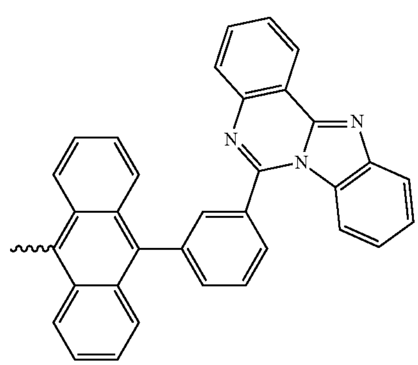

-continued
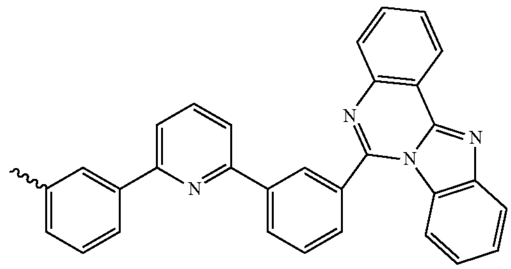
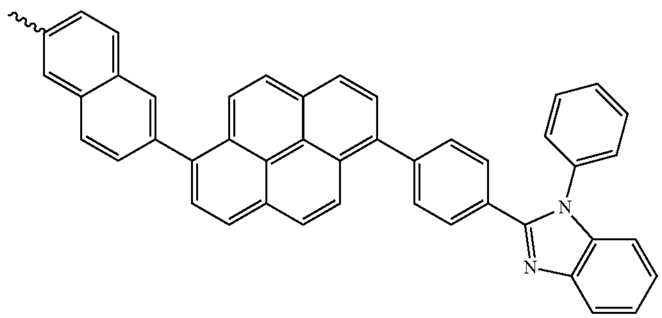
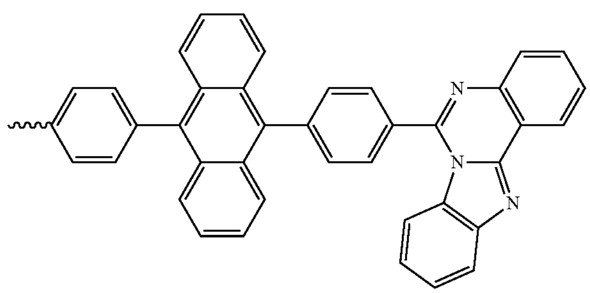
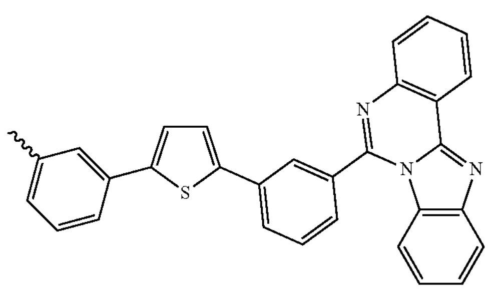
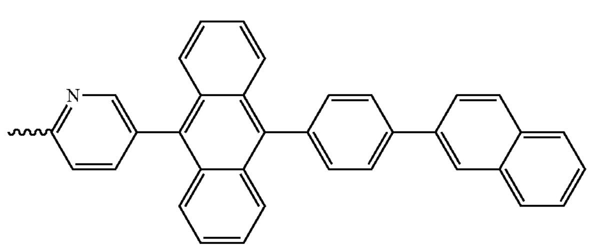

-continued
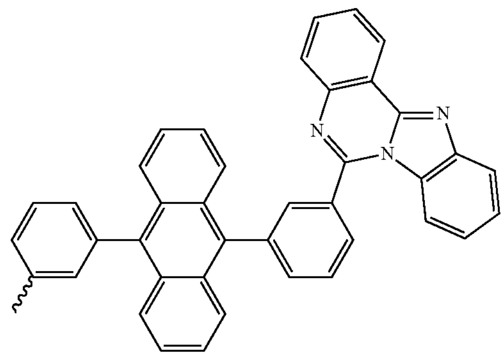
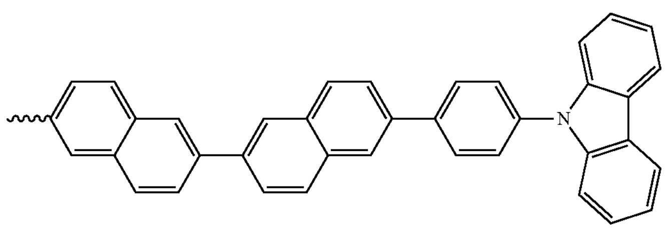
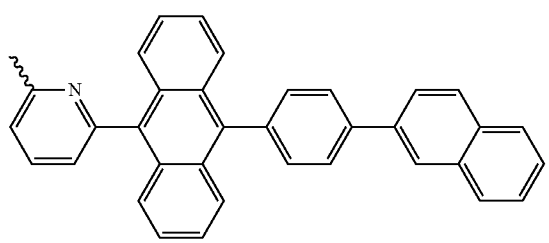
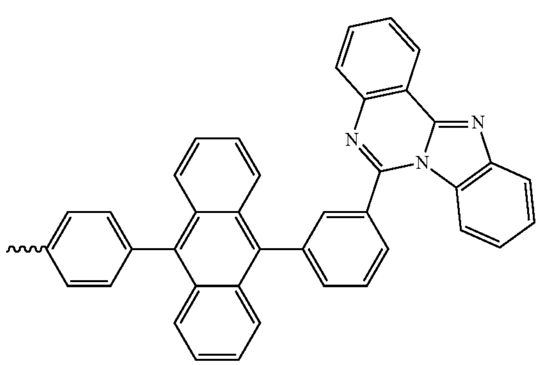

-continued
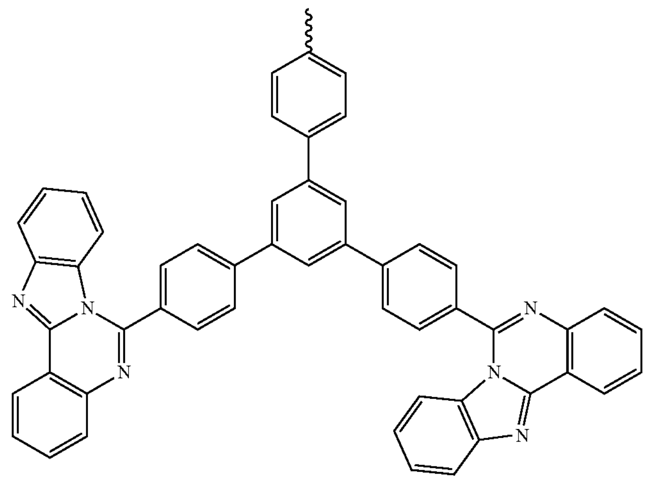
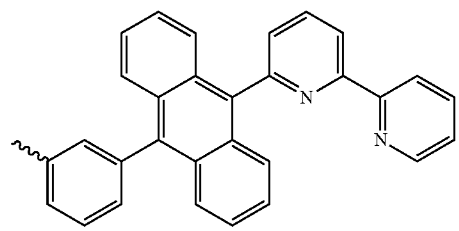
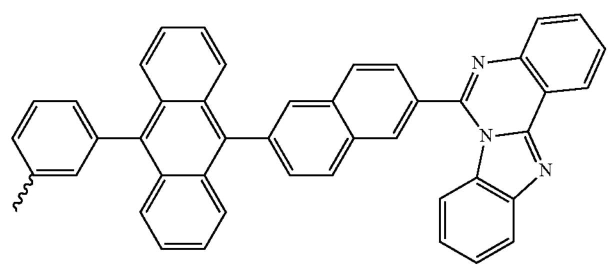
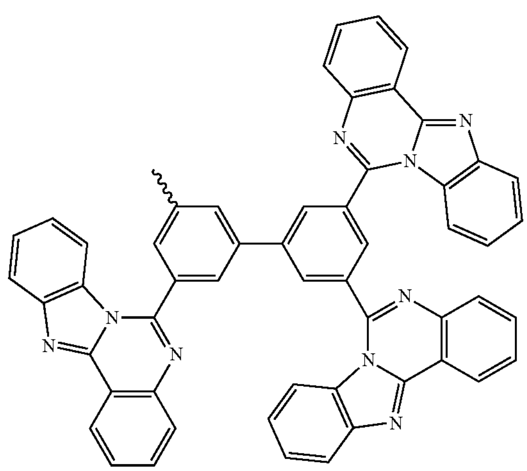

-continued
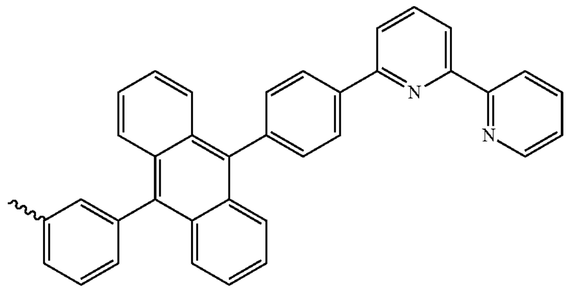
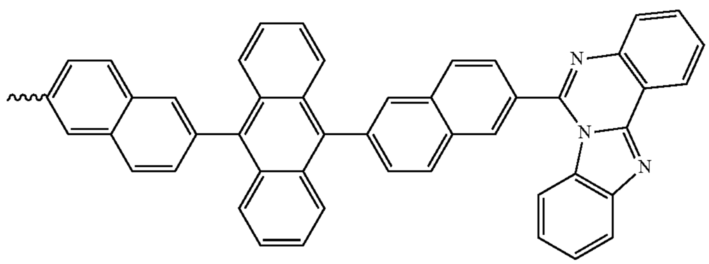
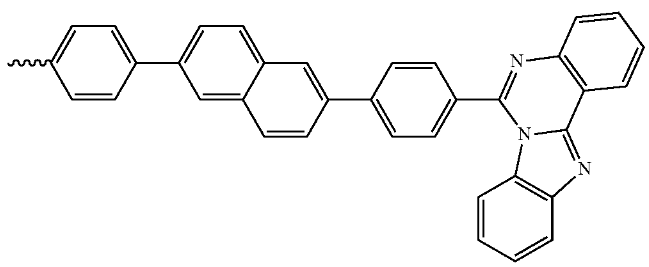
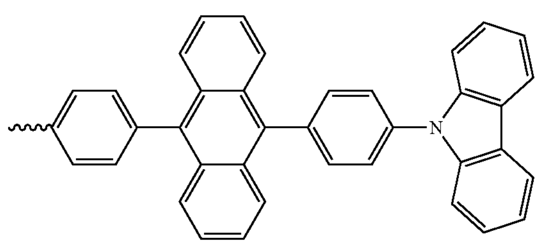
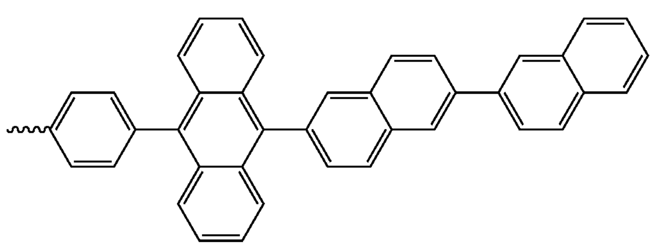

-continued
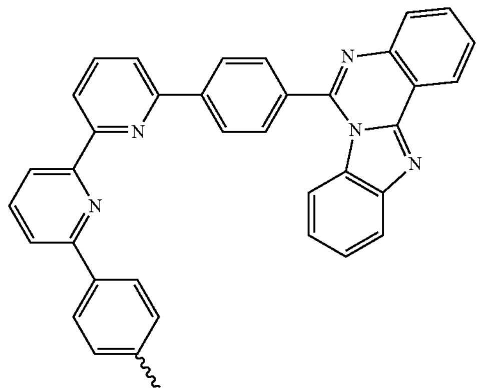
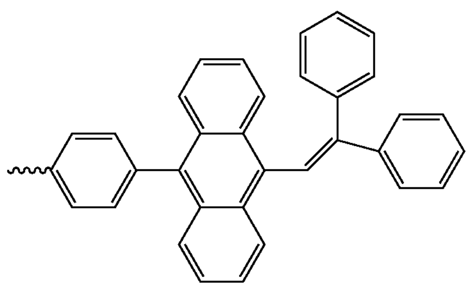
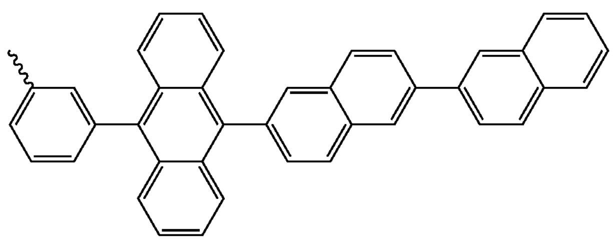
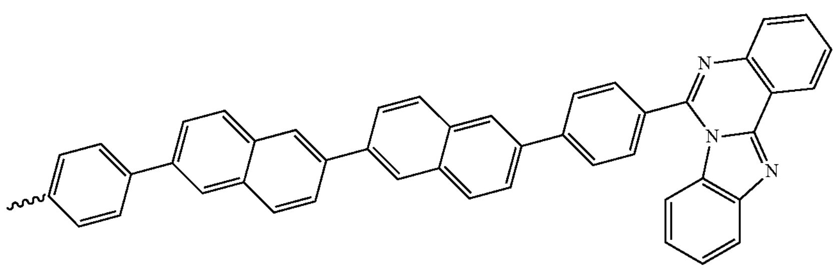
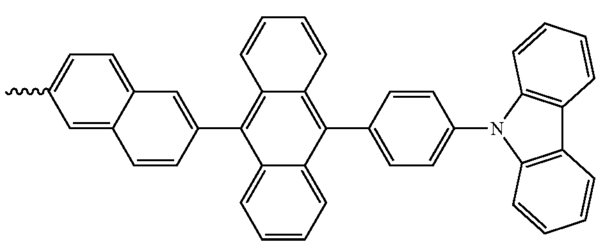

-continued
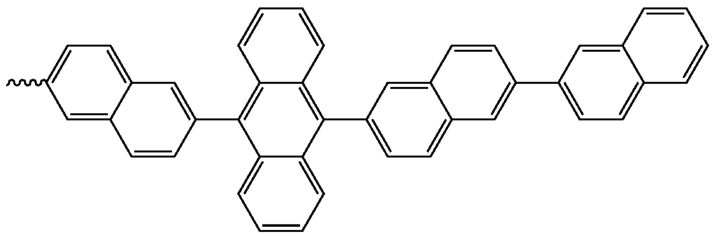
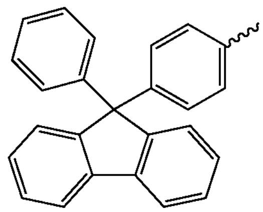
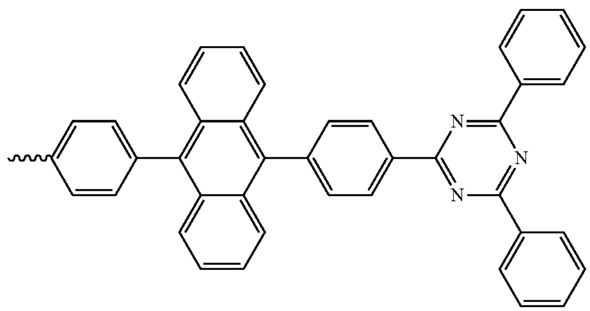
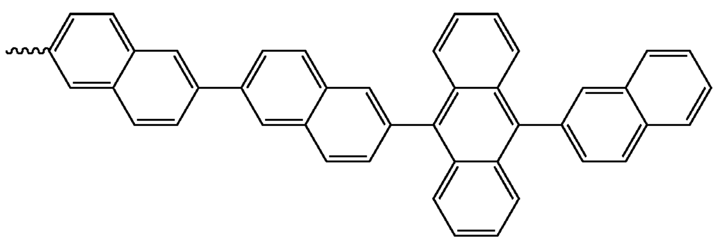
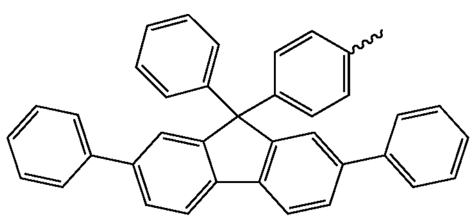
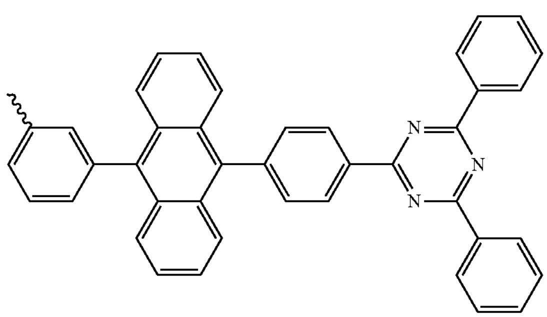

-continued
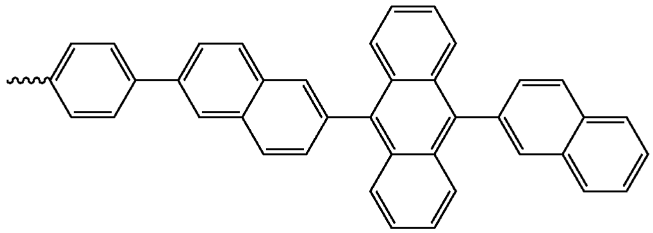
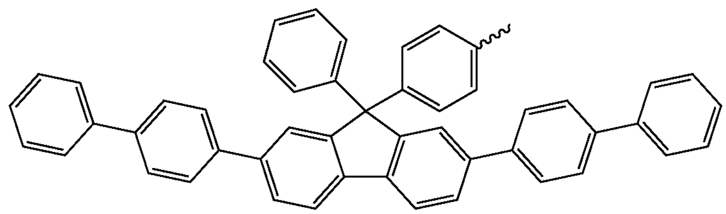
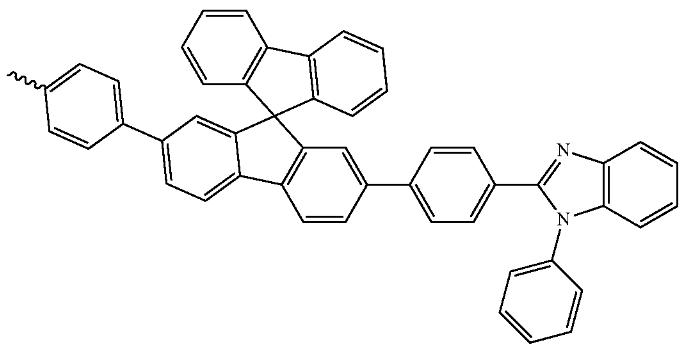
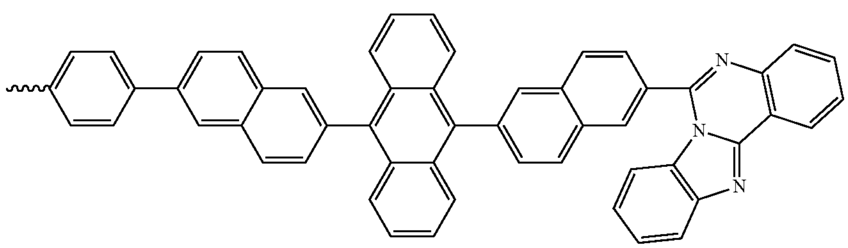
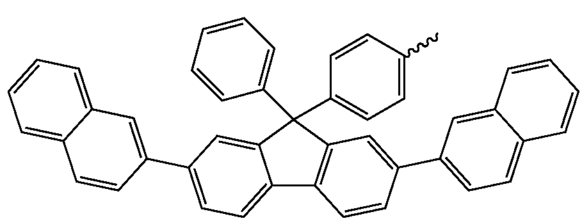
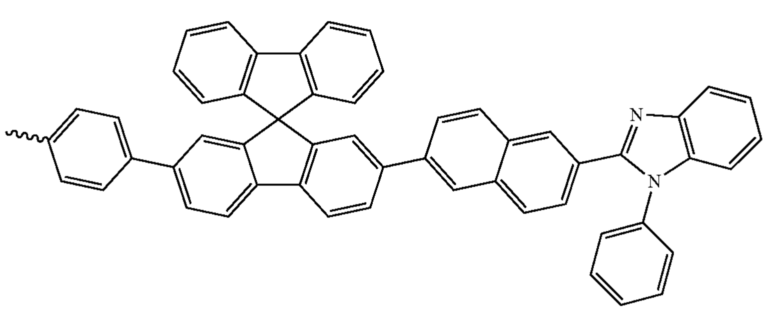

-continued
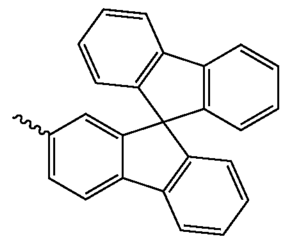
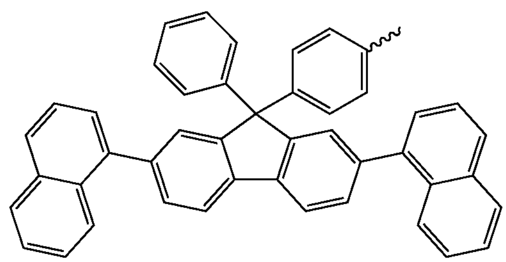
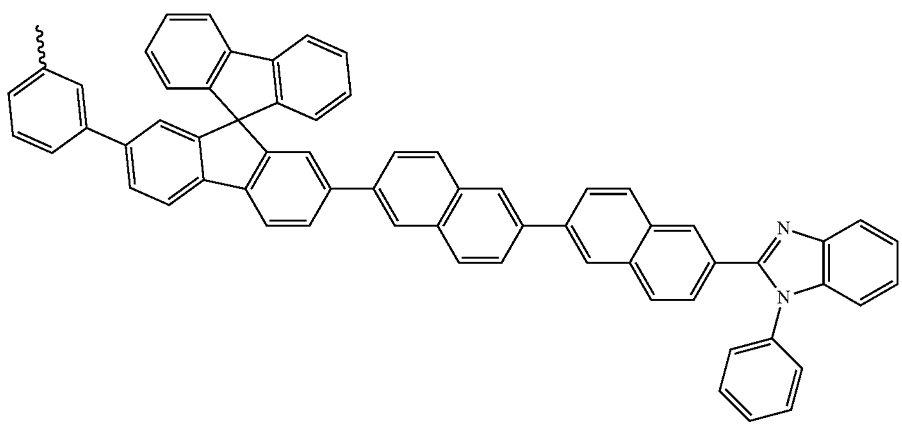
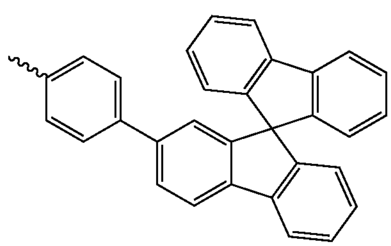
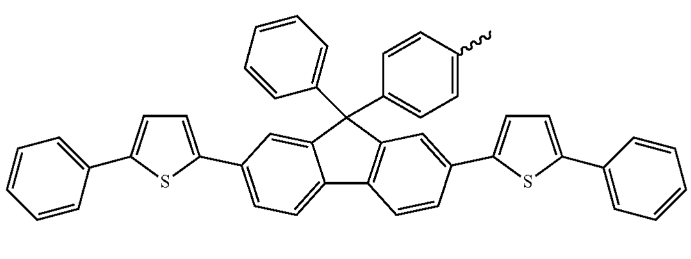

-continued
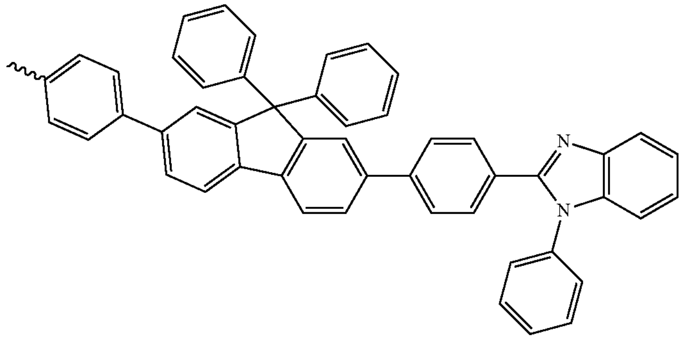
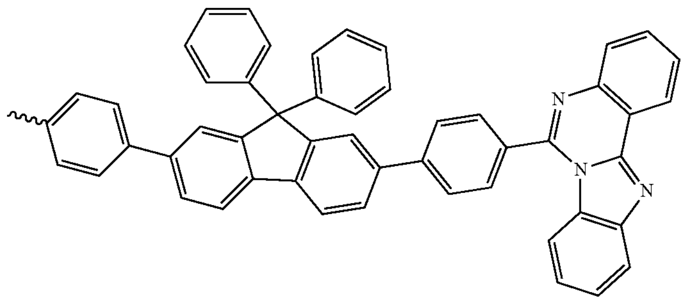
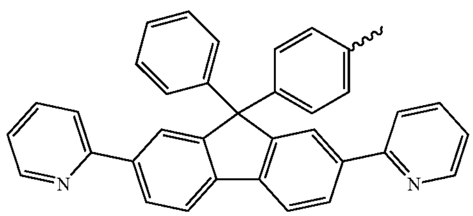
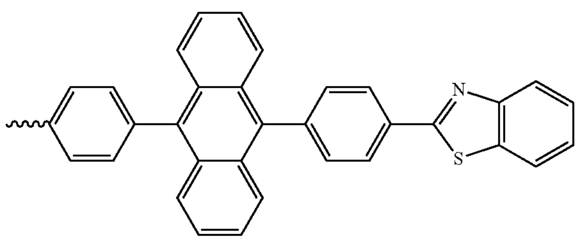
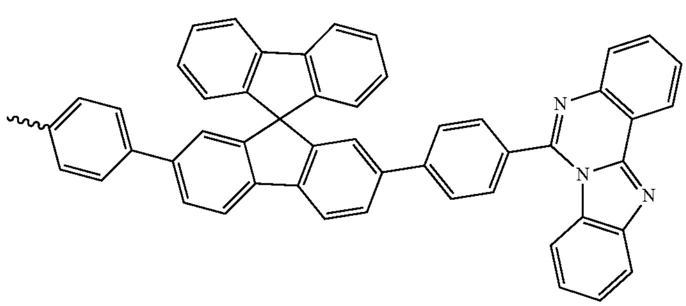
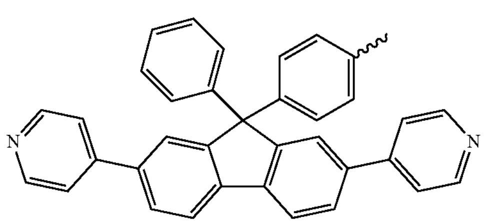

-continued
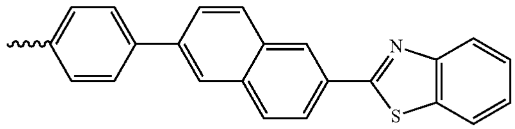
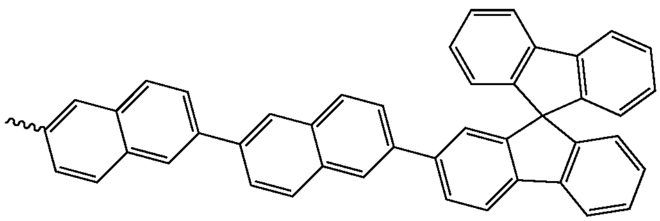
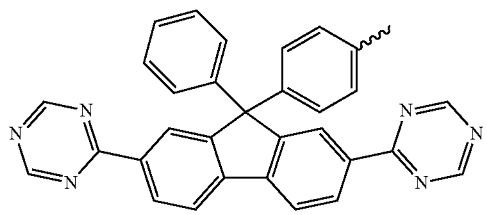
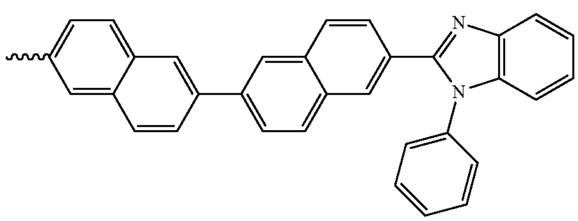
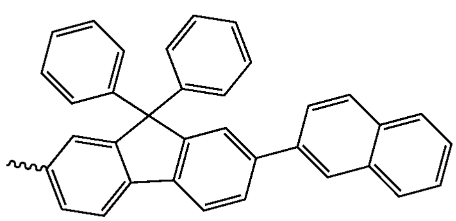
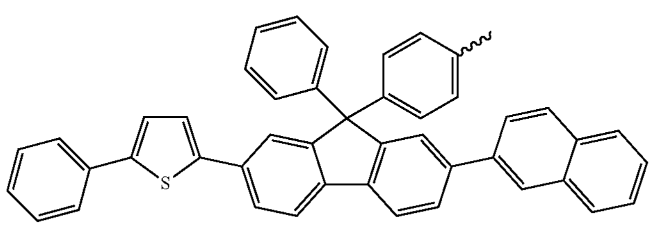
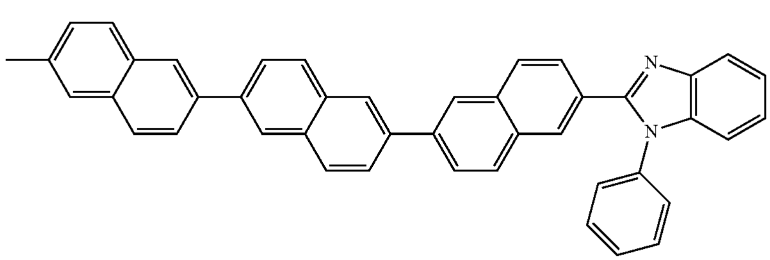 [SMILES: Cc1ccc2cc(-c3ccc4cc(-c5ccc6cc(-c7nc8ccccc8n7-c7ccccc7)ccc6c5)ccc4c3)ccc2c1]

-continued
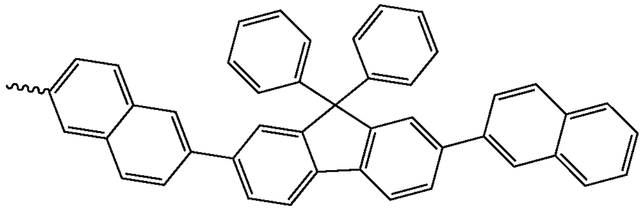
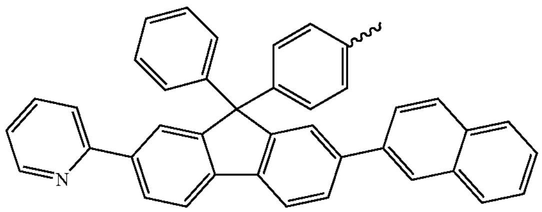
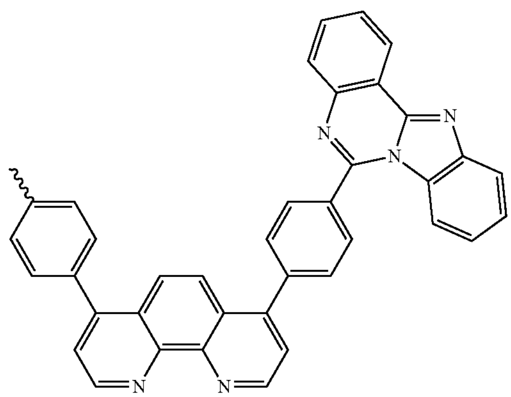
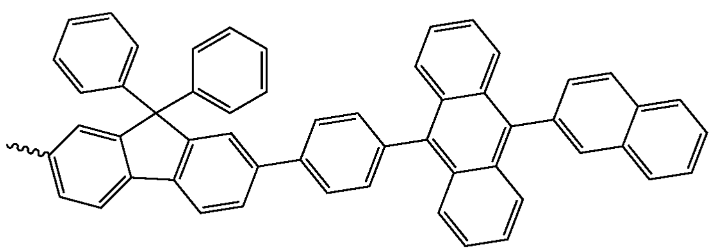
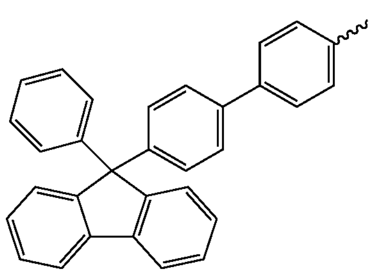
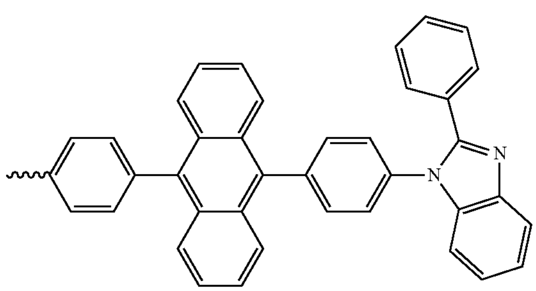

-continued
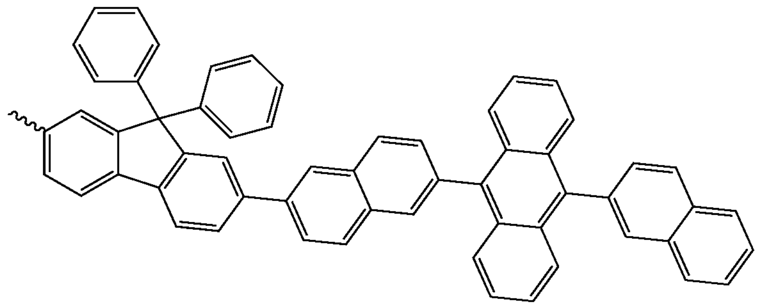
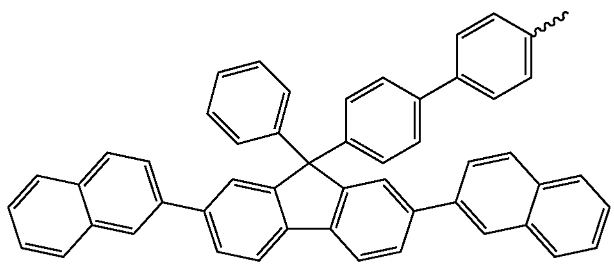
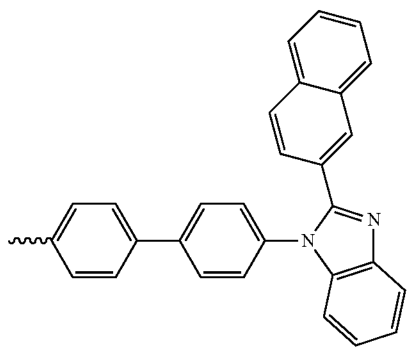
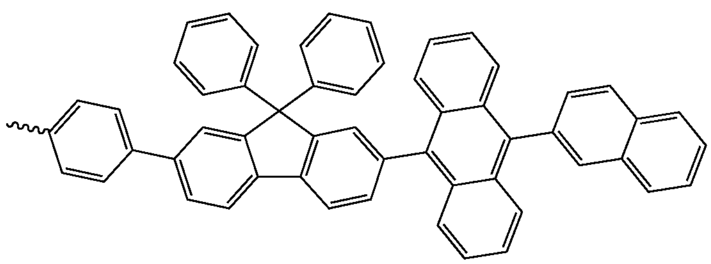
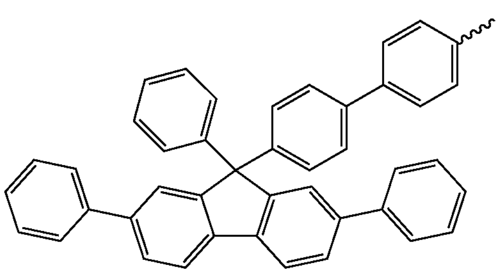

-continued
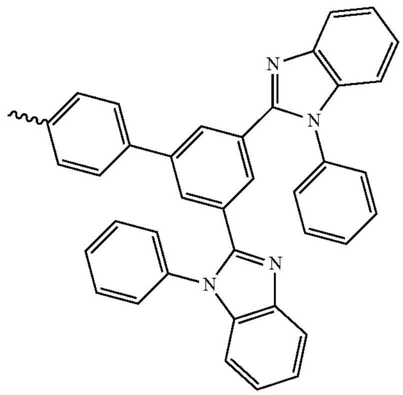
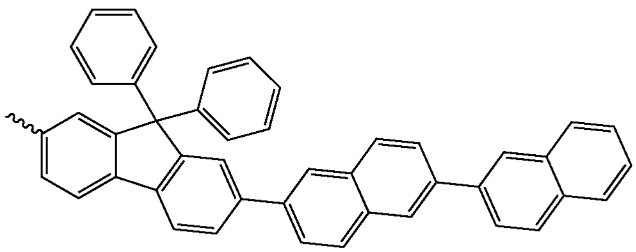
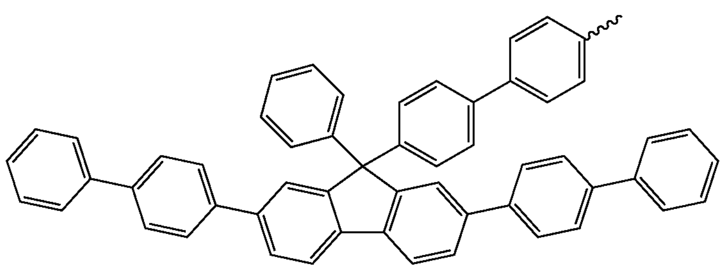
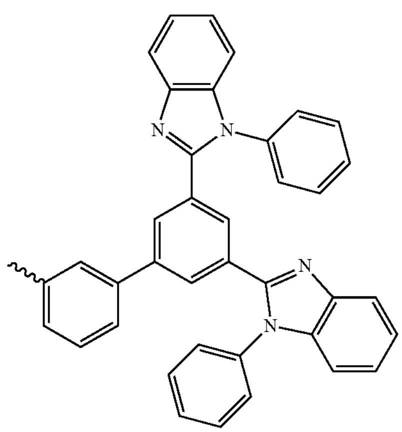

-continued
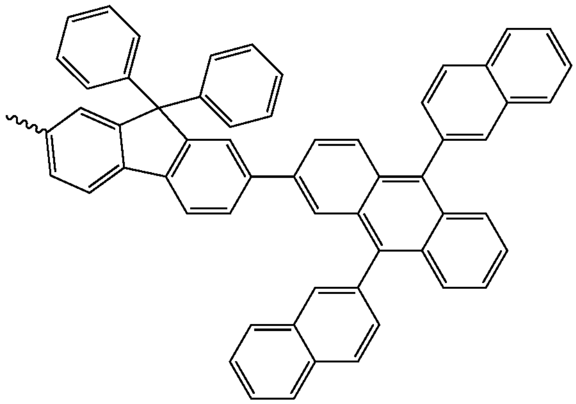
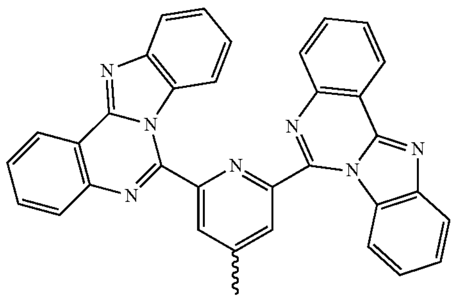
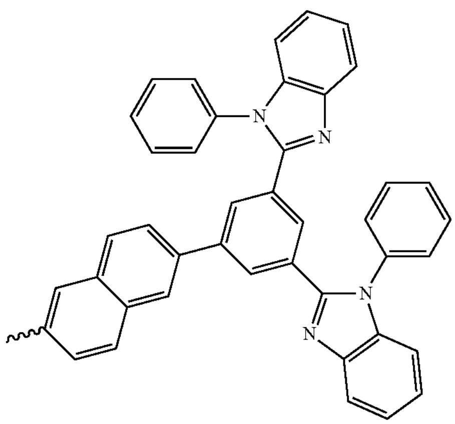
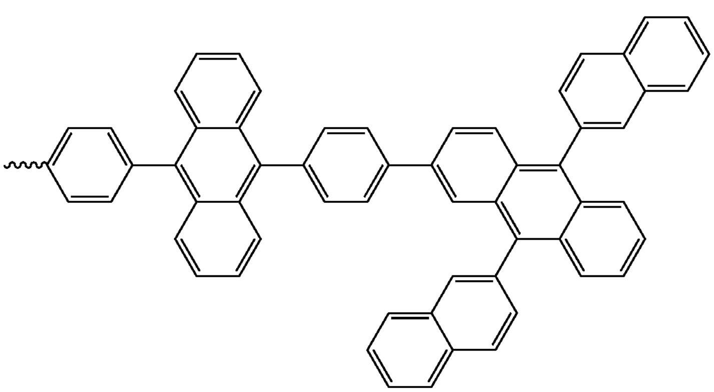

-continued
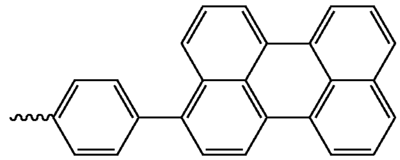
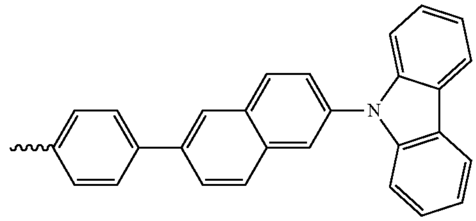
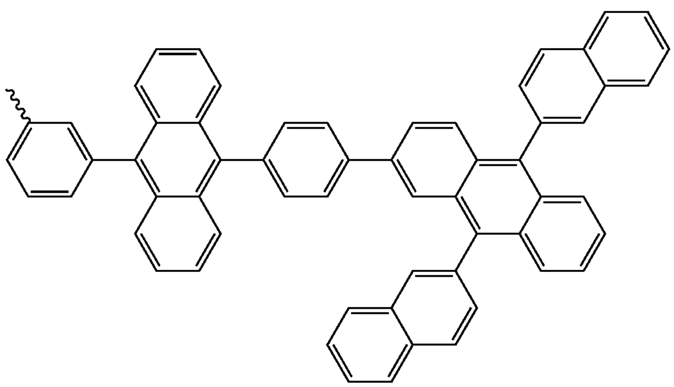
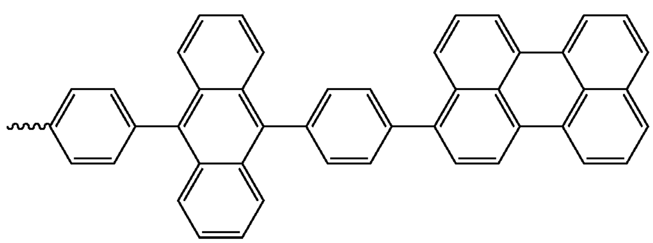
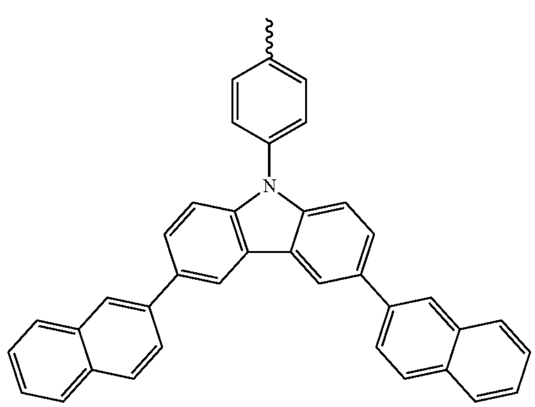

-continued
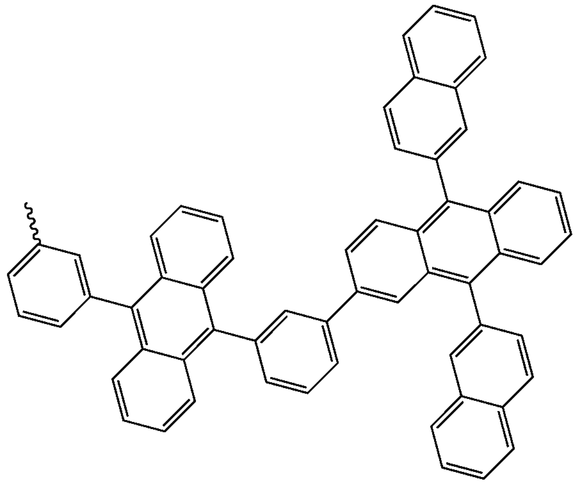
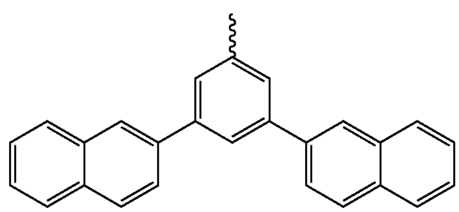
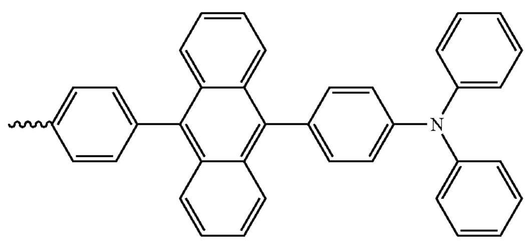
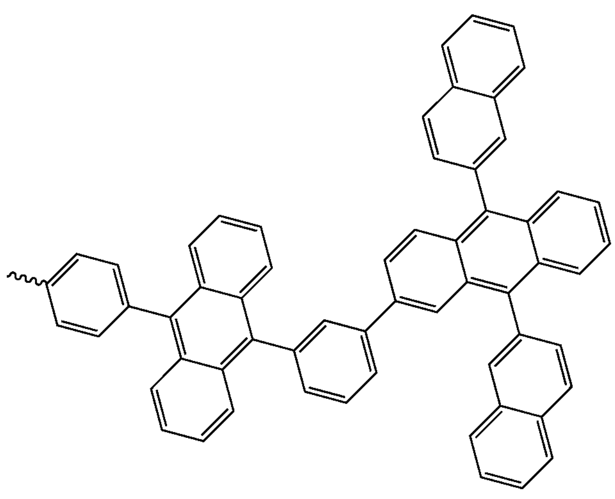

-continued
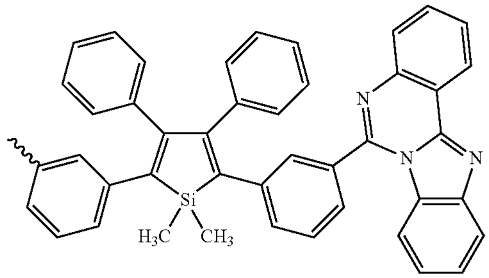
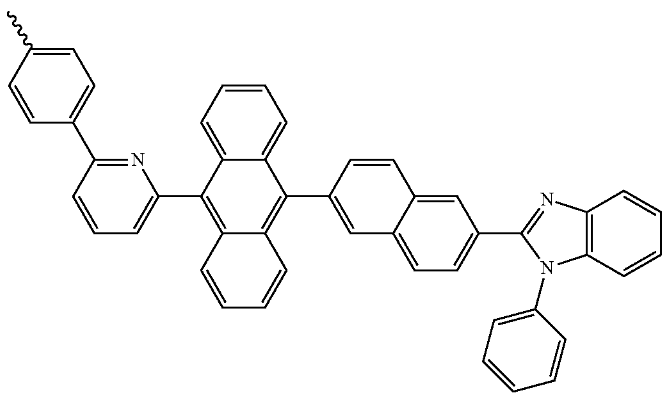
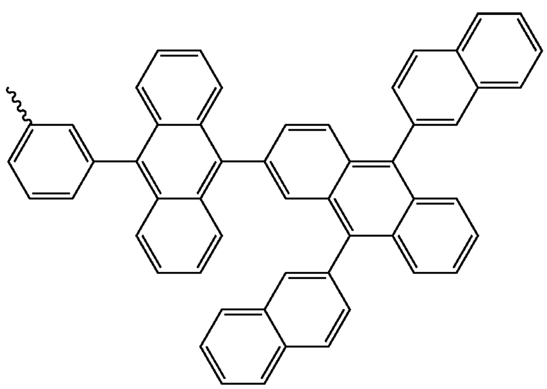
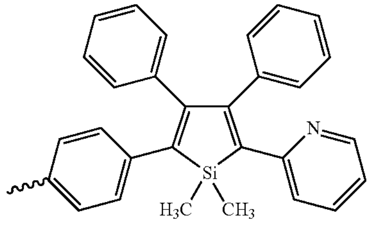

-continued
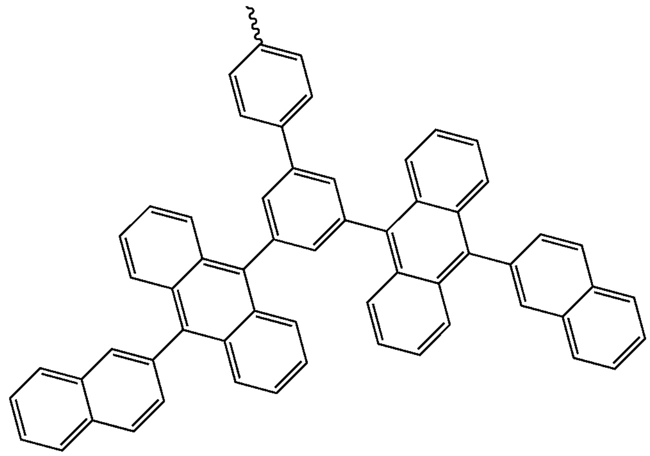
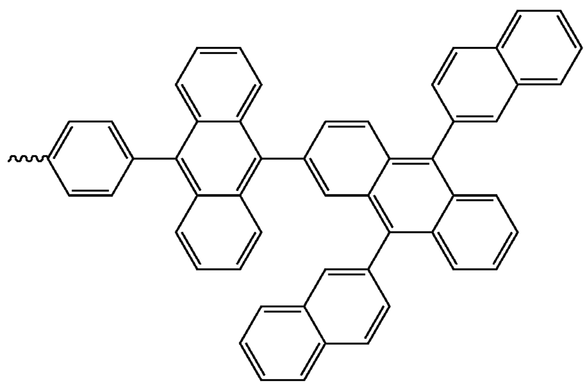
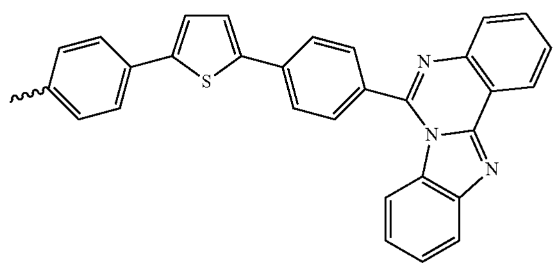
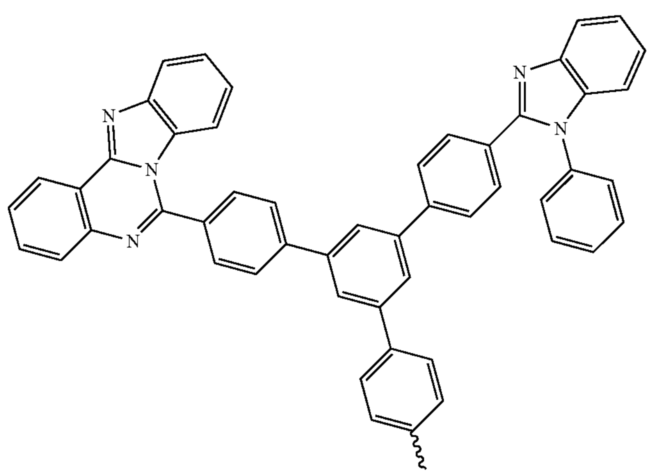

-continued
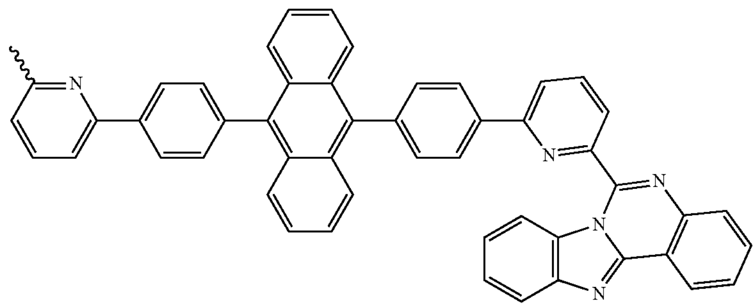
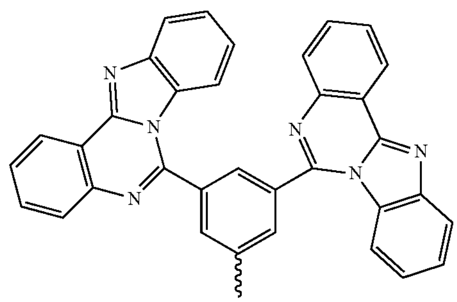
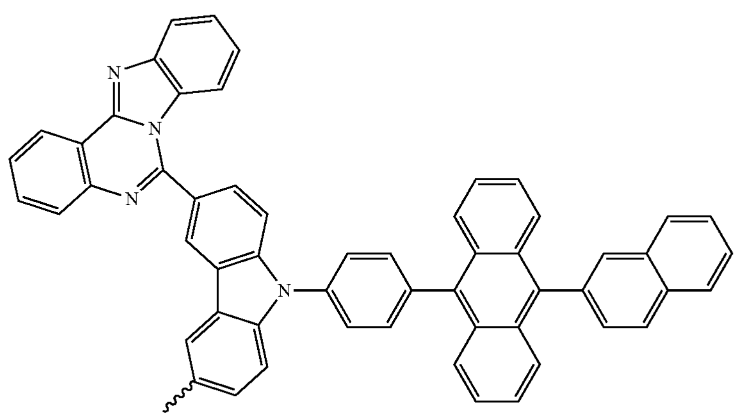
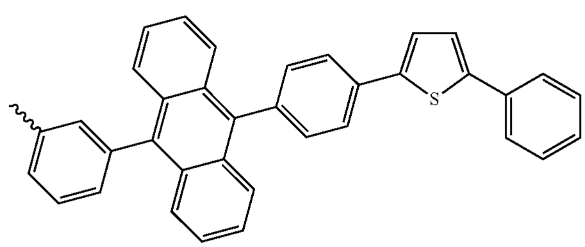
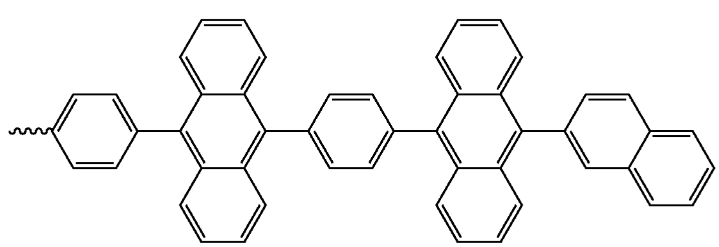

-continued
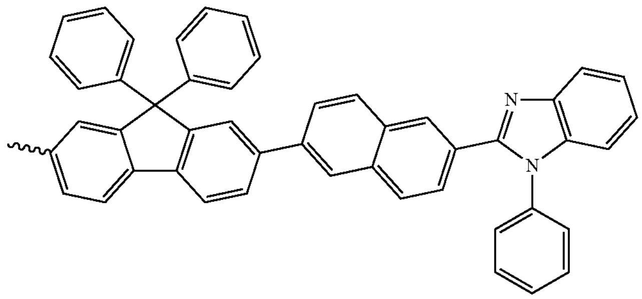
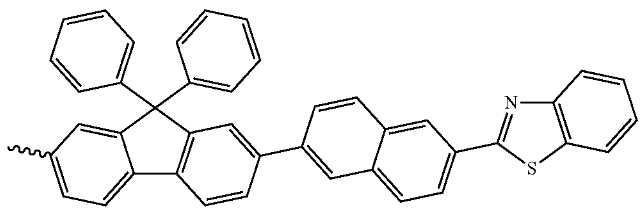
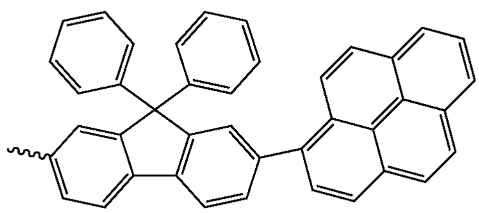
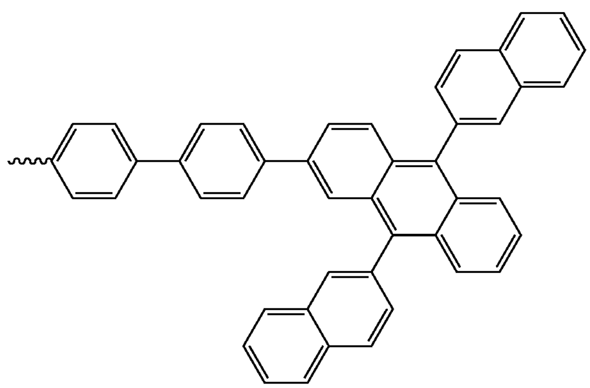
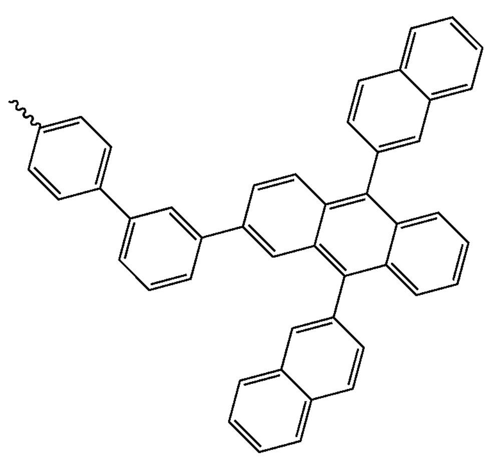

-continued
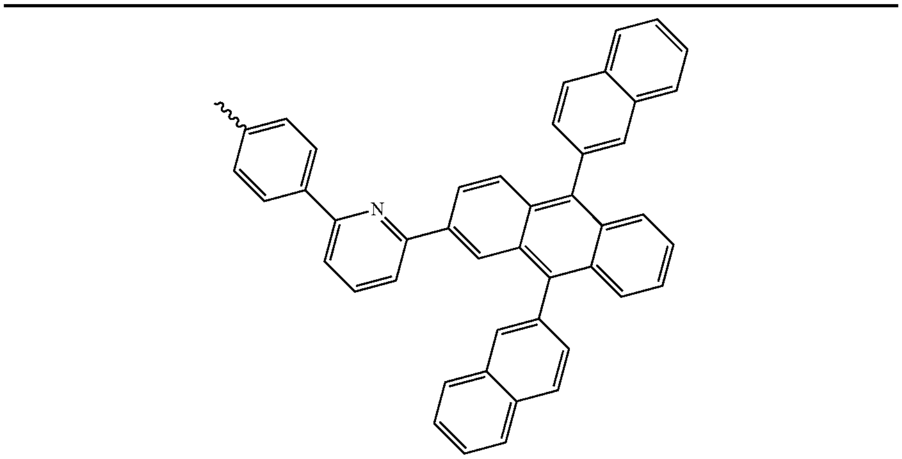
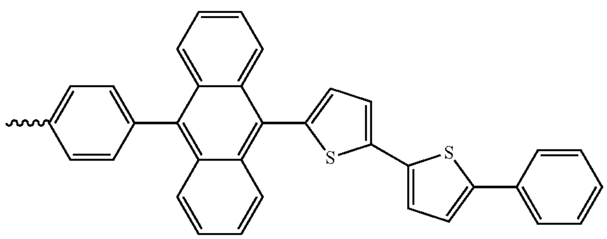
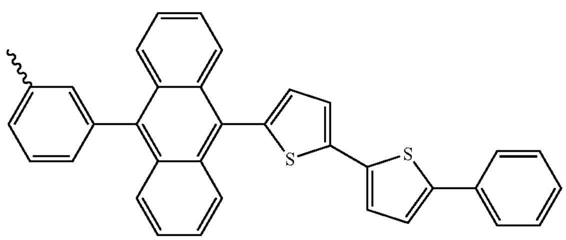
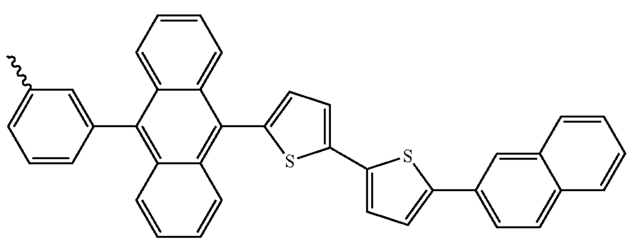
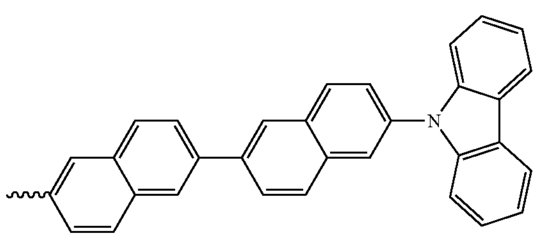

-continued
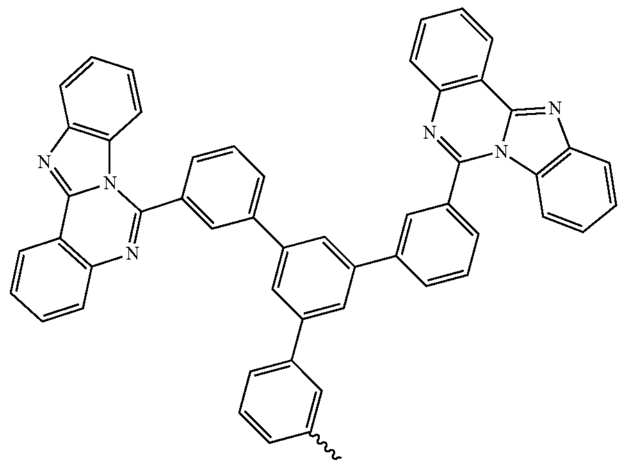
In addition, the compound represented by Formula 4 may be represented by one of the following structural formulas, but is not limited thereto.
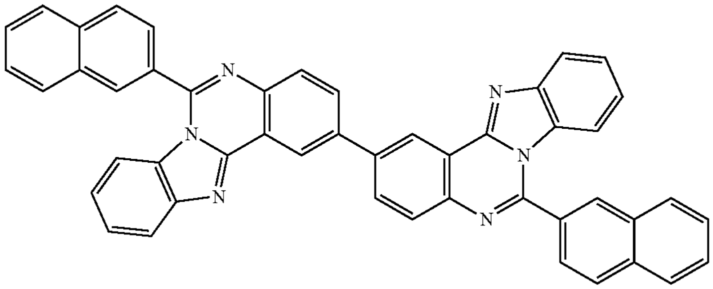
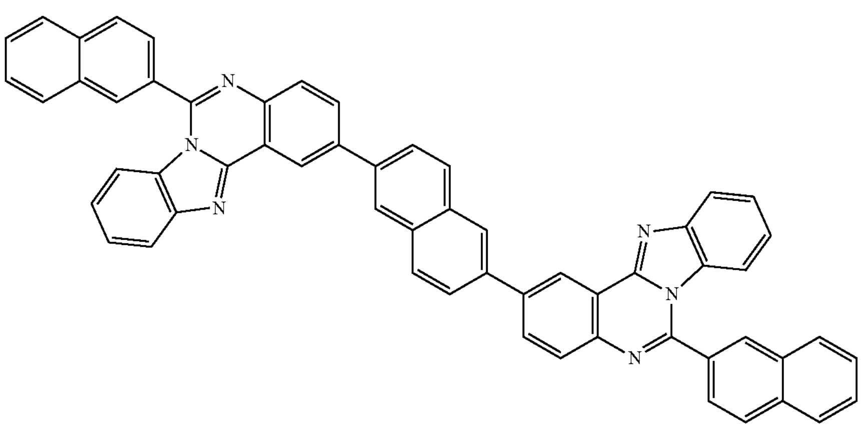

-continued
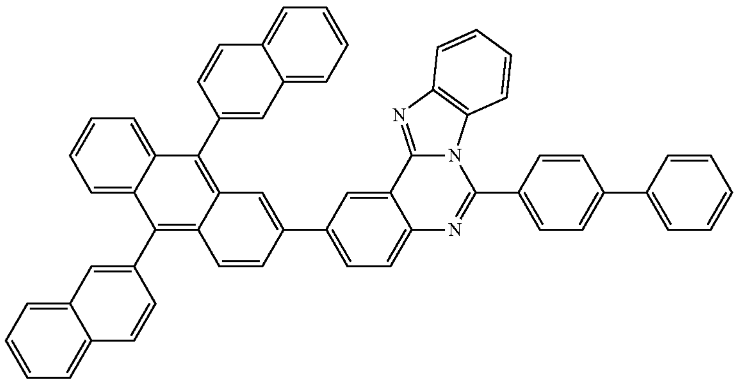
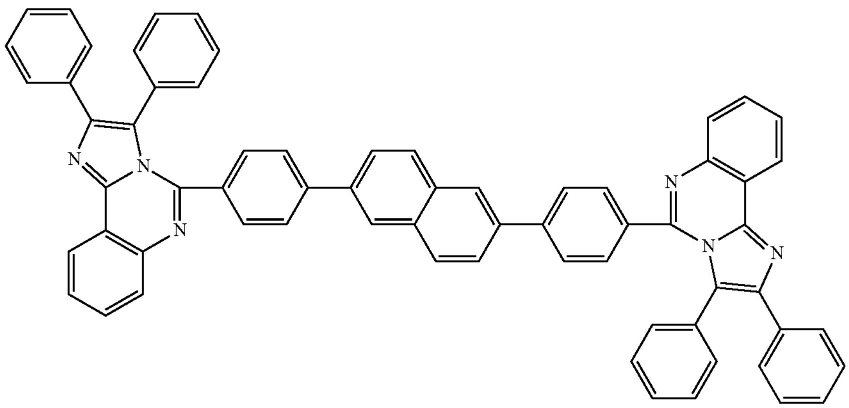
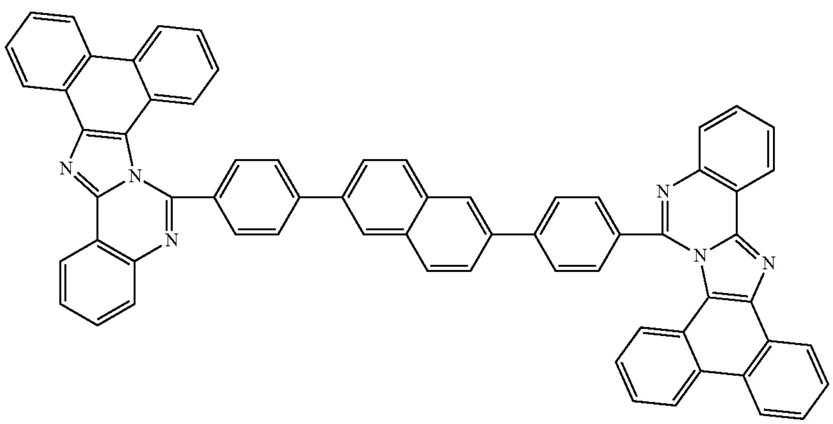
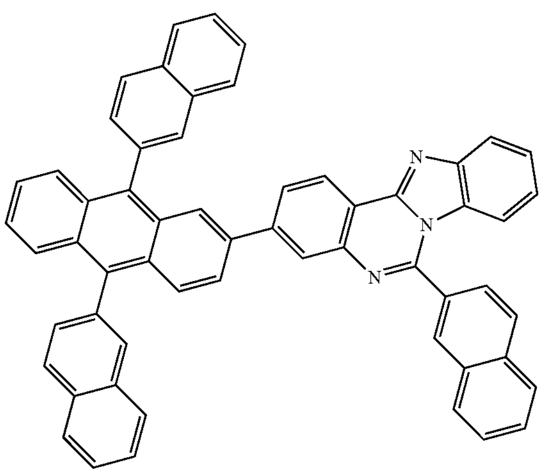

-continued
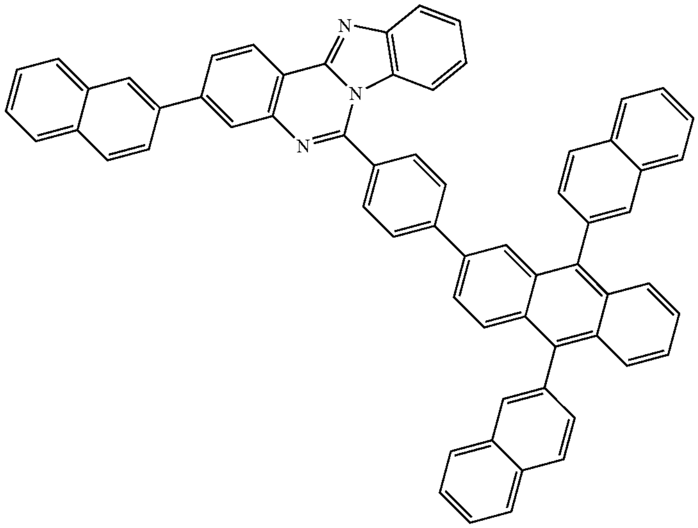
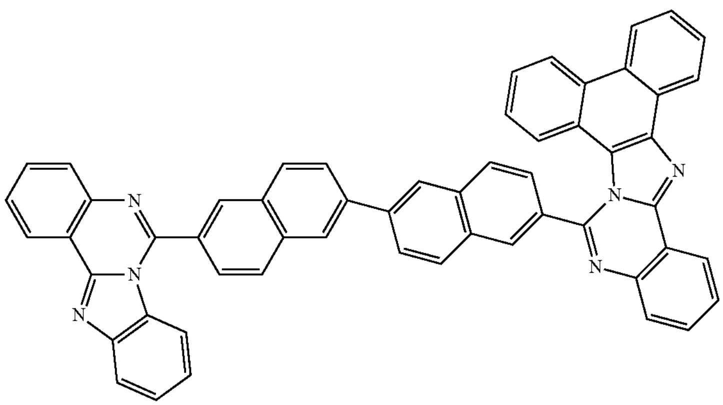
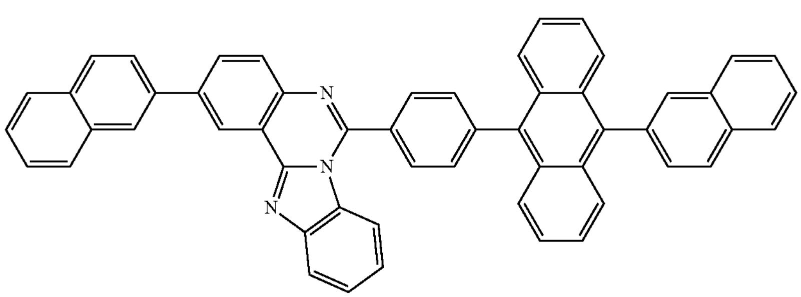
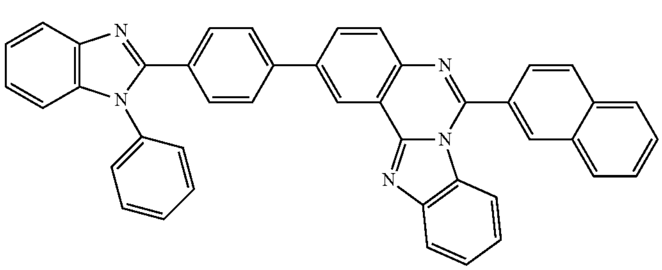

-continued
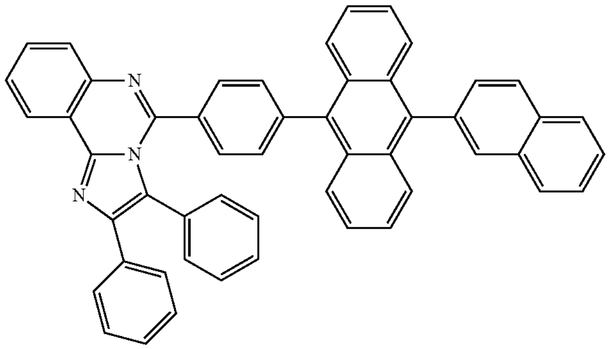
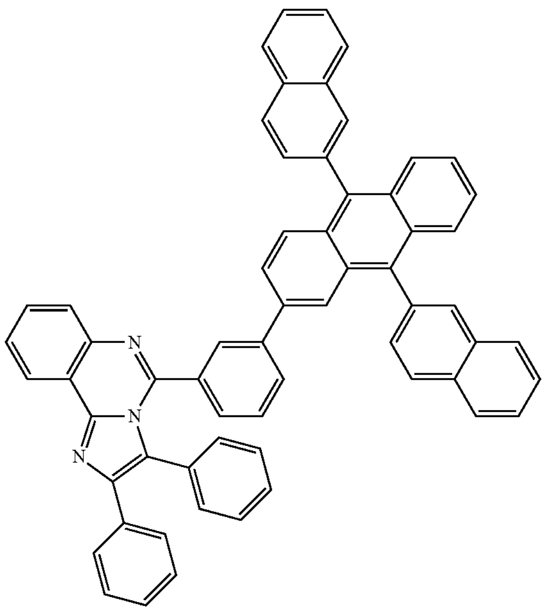
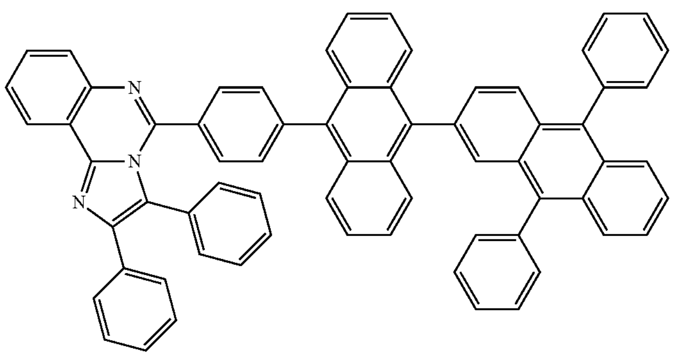
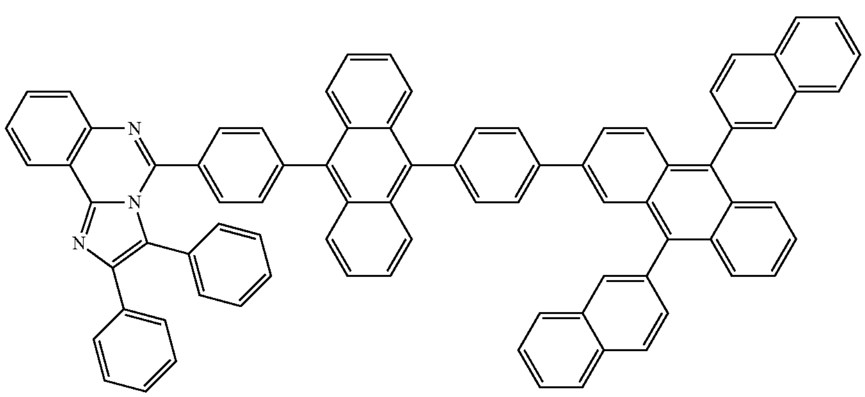

-continued
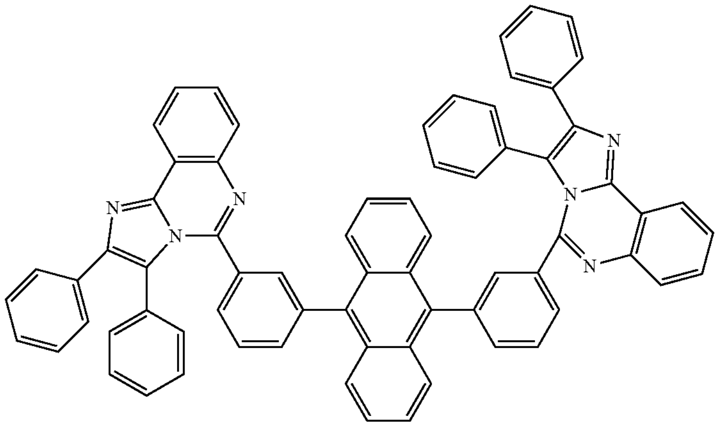
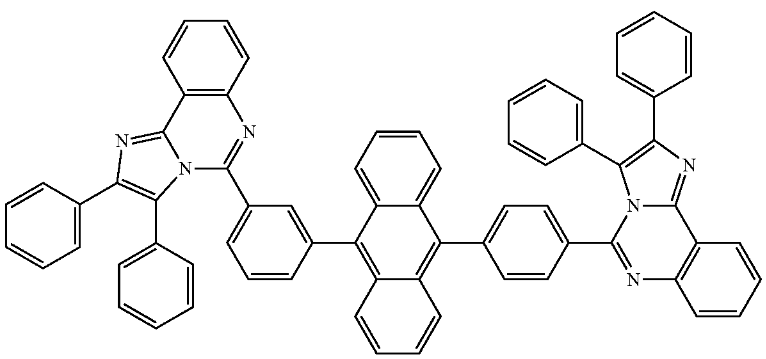
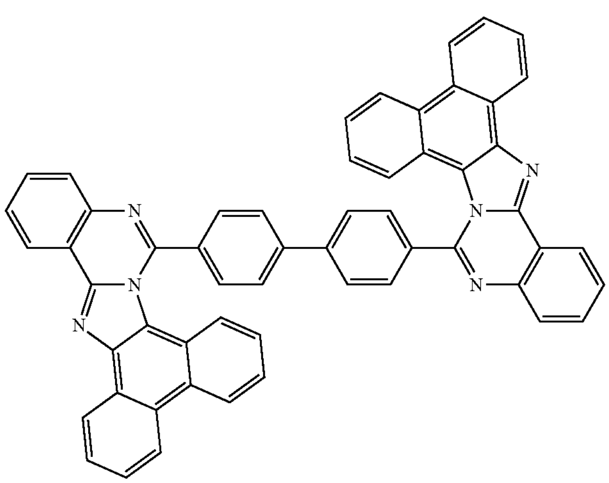

-continued
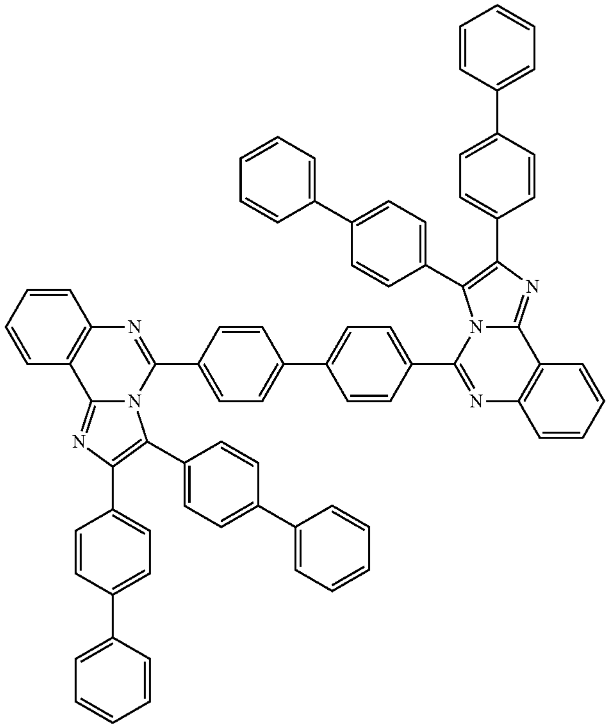
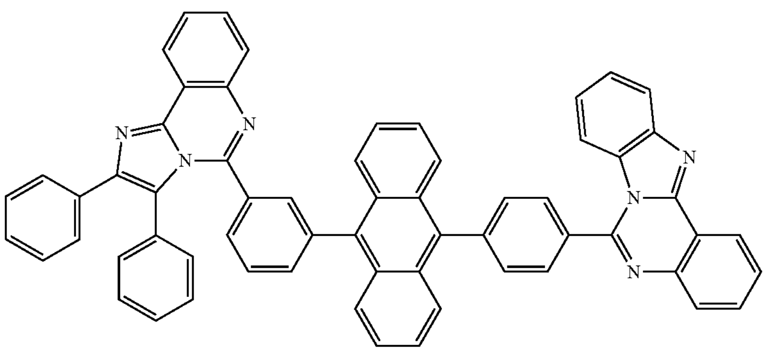
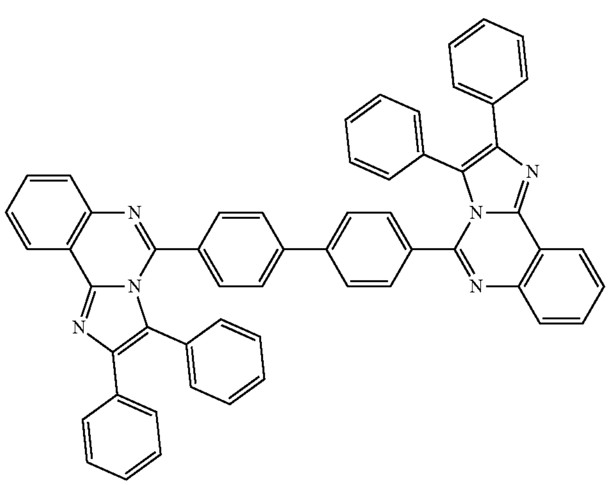

-continued
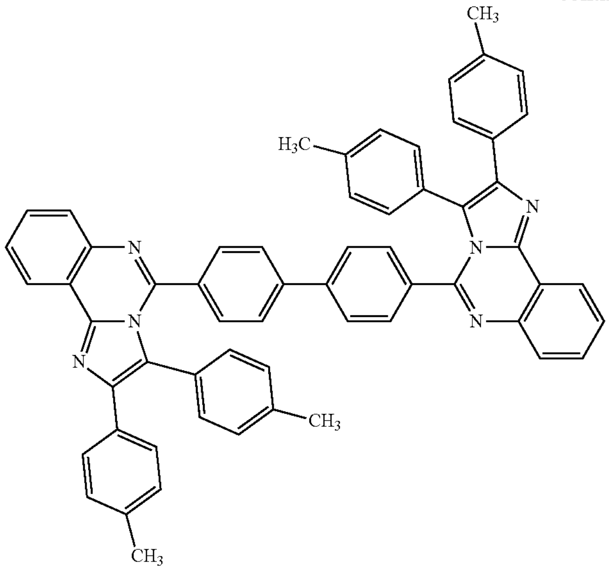
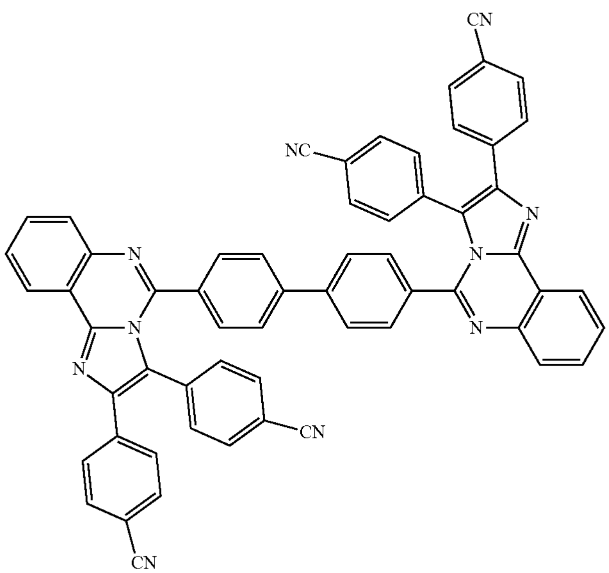
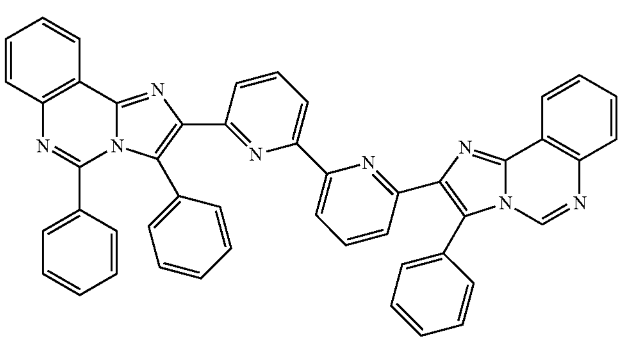

-continued
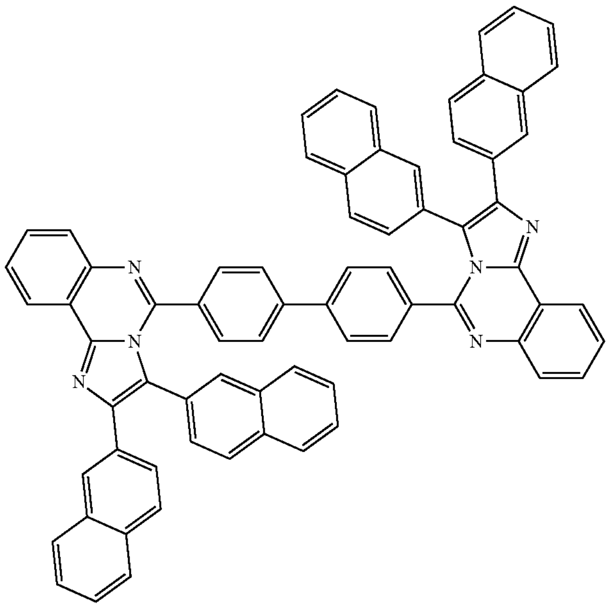
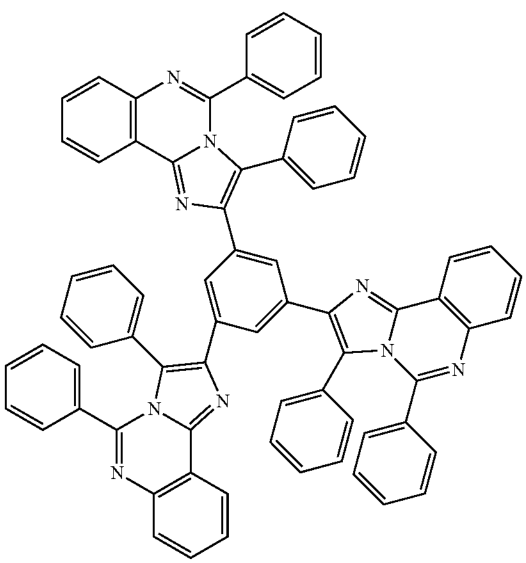
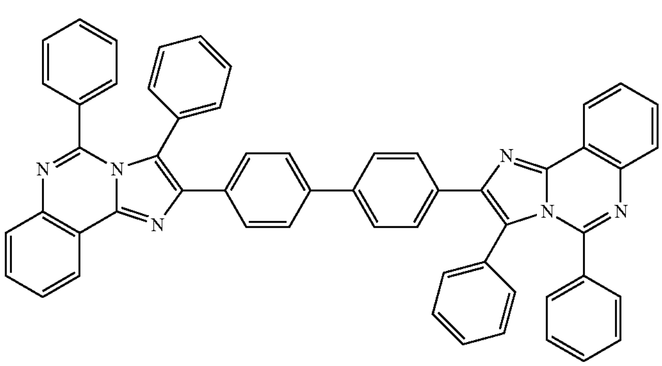

-continued
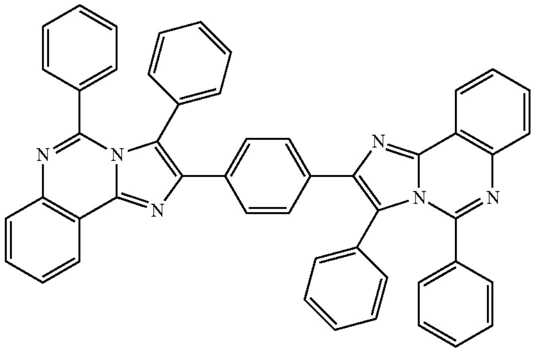
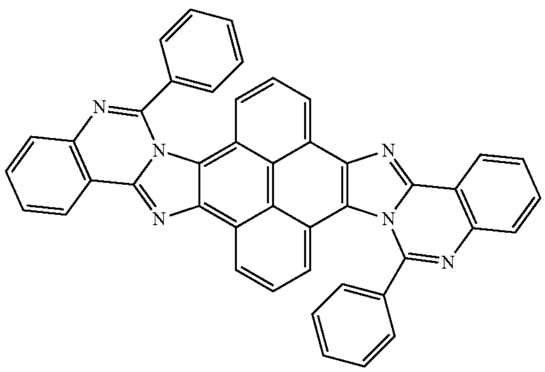
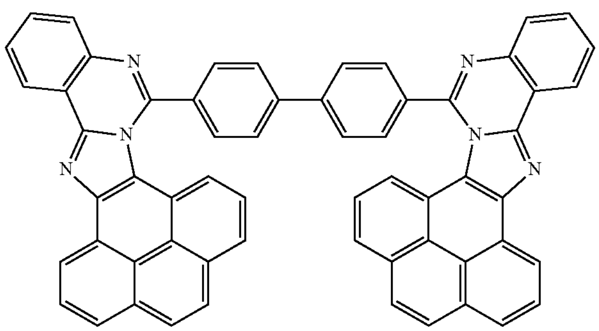
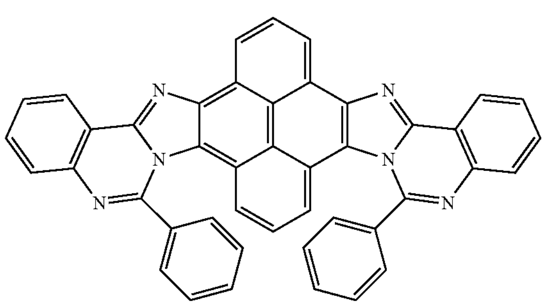
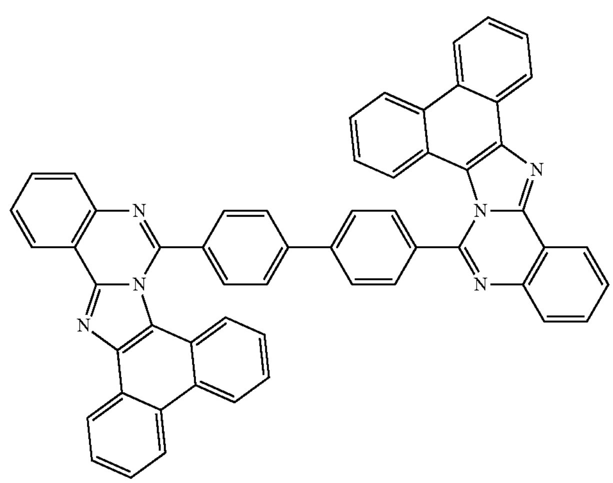

-continued
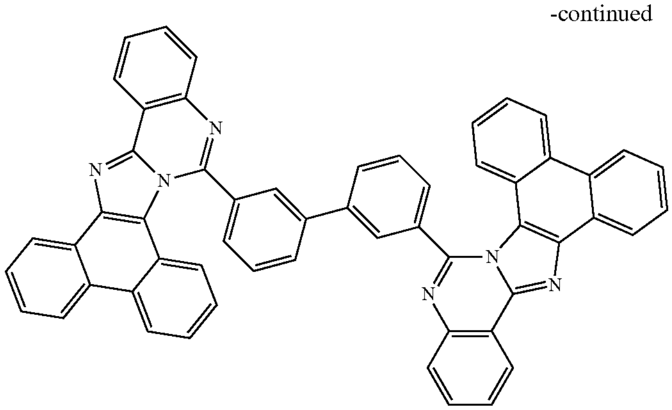
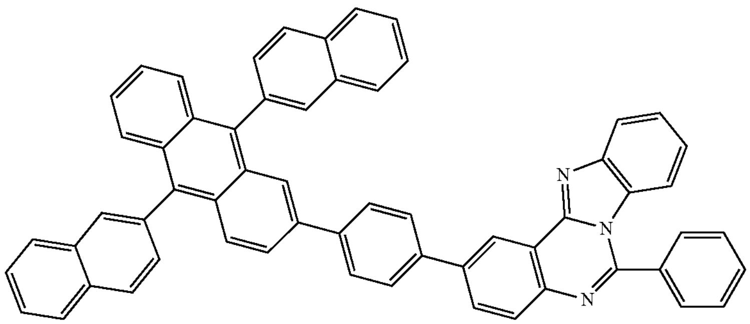
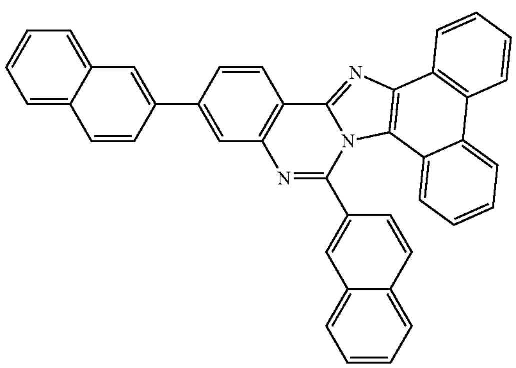
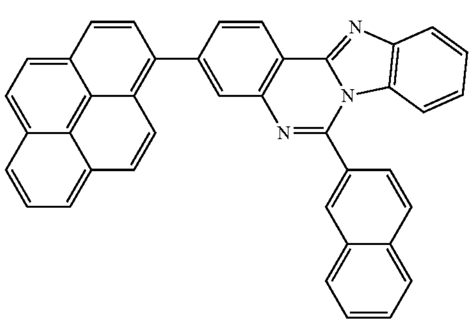

-continued
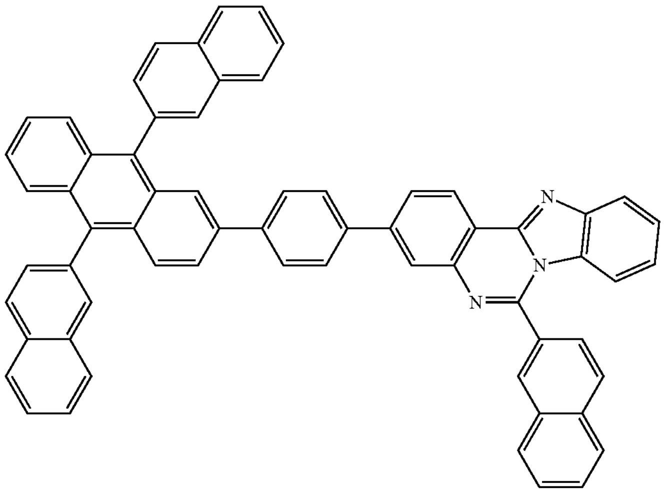
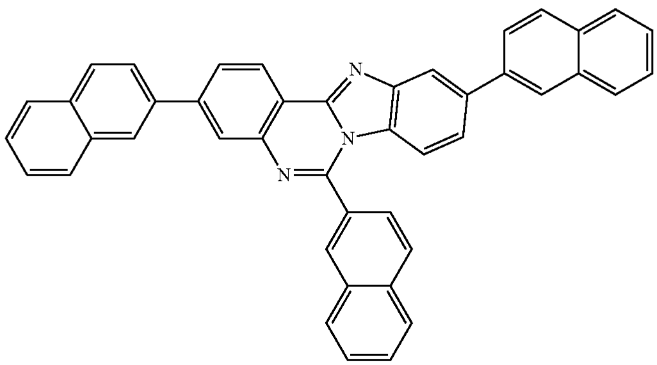
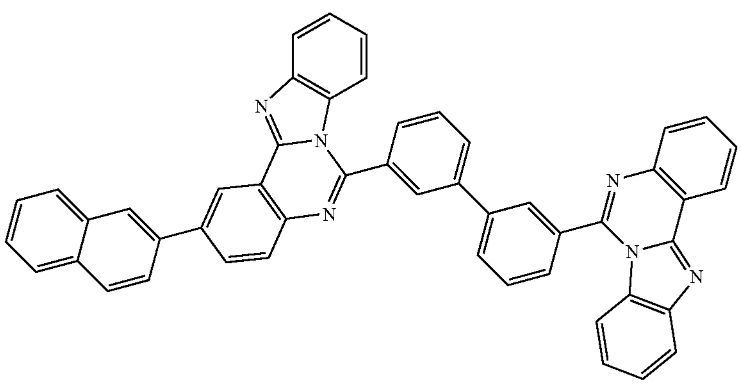
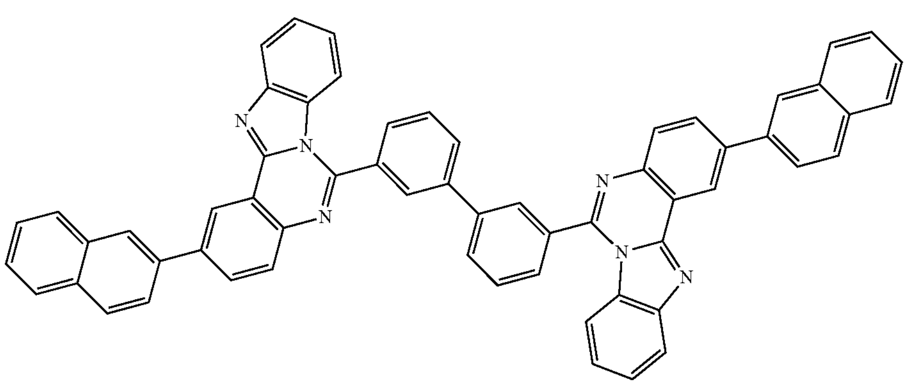

-continued
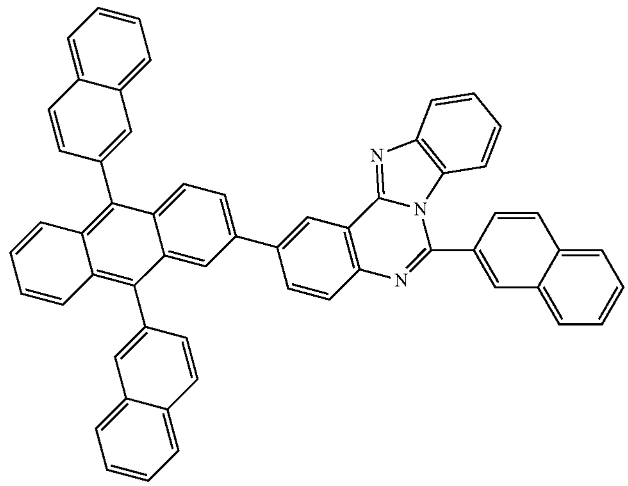
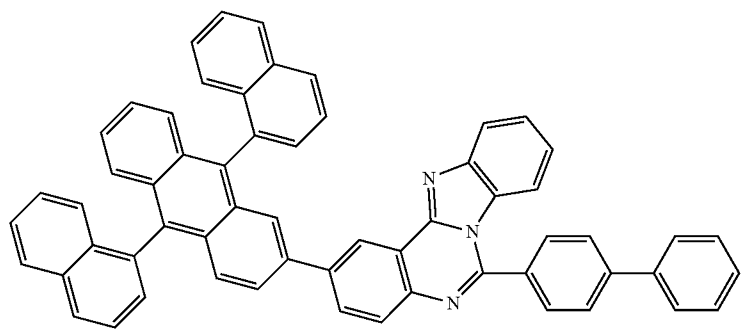
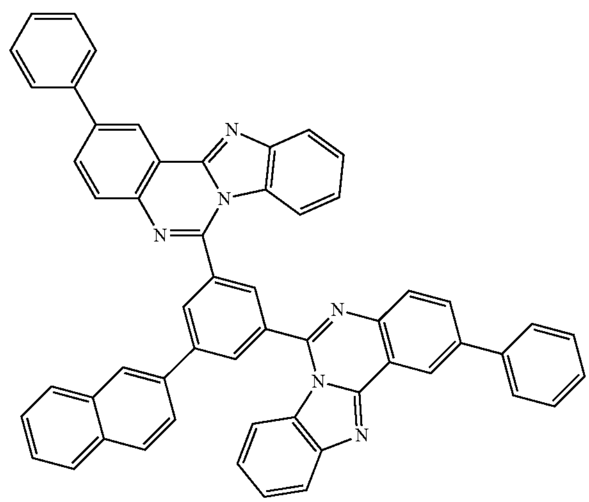
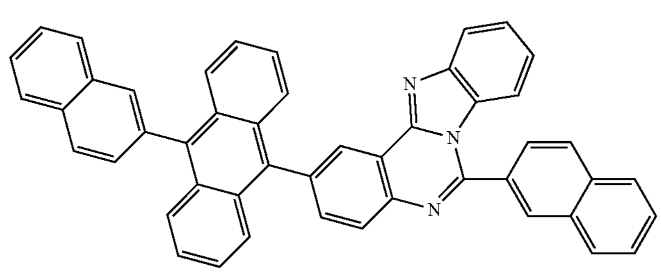

-continued

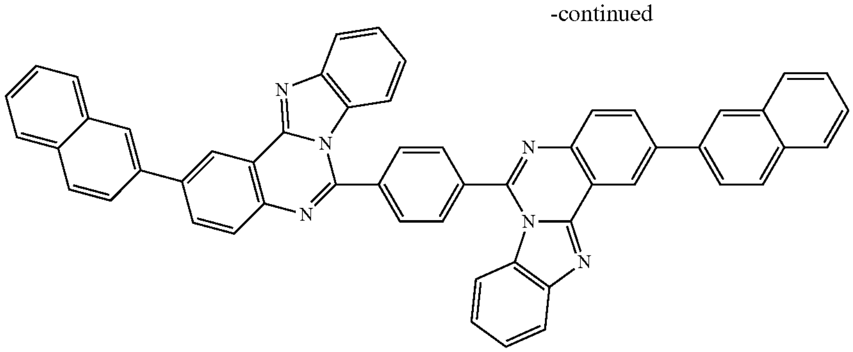

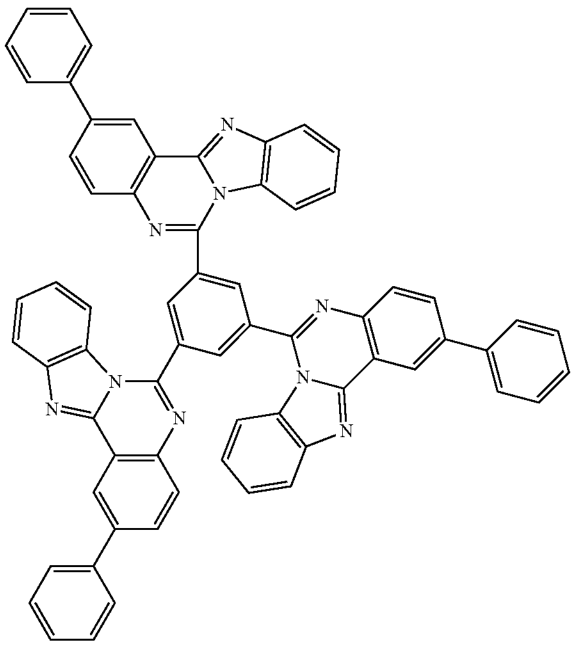

As shown in FIG. 1, an organic light emitting diode typically consists of a substrate 1, an anode 2, a hole injection layer 5, a hole transporting layer 6, a light emitting layer 7, an electron transporting layer 8, and a cathode 4, and actually each layer may be constituted by a plurality of layers, or two or more materials may be mixed to form a layer, and an electron injection layer may be inserted in order to facilitate the injection of electrons between the electron transporting layer 8 and the cathode 4.

In the organic light emitting diode structure as above, in order to transfer holes derived from the anode 2 to the light emitting layer 7, when a hole transporting material, which is disposed between the anode 2 and the light emitting layer 7 and in contact with the light emitting layer 7, is a material having a fluorescent light emitting efficiency which is equal to or greater than that of NPB, electric charges (holes and electrons) injected from the anode 2 and the cathode 4 fail to be converted into light in the light emitting layer 7 and move toward a hole injection or transporting material layer which is in contact with the light emitting layer to contribute to light emission of the hole injection or transporting material, thereby deteriorating the characteristics of the diode.

In order to determine whether a material was better than NPB in terms of fluorescent light emitting properties, films having a thickness of 100 nm or more were respectively formed on a glass substrate by using a material which is in contact with the light emitting layer and is disposed between the light emitting layer and the anode and NPB, and UV wavelengths of the same intensity were irradiated thereon to compare the PL spectrum. At this time, a material having an intensity which is equal to or greater than the PL spectrum intensity of NPB based on the Max. peak of the spectrum is defined as a material which is equivalent to or better than NPB in fluorescent light emitting properties.

Materials are not particularly limited so long as they are equal to or better than NPB in fluorescent light emitting properties and have the above-mentioned properties as a material for forming a hole injection and transporting layer which is in contact with the light emitting layer, and any material typically used as an electric charge transporting material of holes in photoconductive materials in the related art may be used, or any one selected from known materials which are used in a hole injection layer of the EL diode may be used. Further, in addition to the aromatic amine derivative layer and the nitrogen-containing heterocyclic derivative layer, a layer constituting the hole transporting region may be provided, and any material for forming these layers may be selected from known materials as described above and used.

More specifically, examples of the compound having a fluorescent light emitting efficiency which is equal to or greater than that of NPB comprise compounds of the following Formulas 11 to 16, and the like, but are not limited thereto.

[Formula 11]

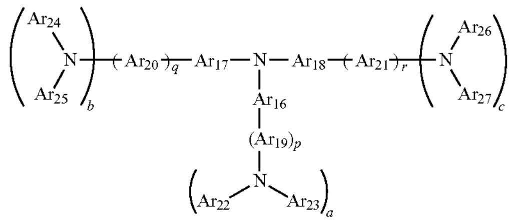

In Formula 11, Ar16 to Ar27 are the same as or different from each other and are each independently a substituted or unsubstituted aryl group having 6 to 50 carbon atoms, or a substituted or unsubstituted heteroaryl group having 5 to 50 carbon atoms, and Ar22 and Ar23, Ar24 and Ar25, or Ar26 and Ar27 may be connected to each other to form a saturated or unsaturated cyclic group, and a, b, c, p, q, and r are each independently an integer of 0 to 3, but at least one of a, b, and c is not 0.

[Formula 12]

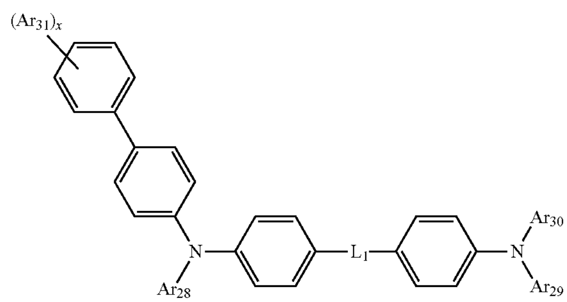

In Formula 12, $Ar_{28}$ to $Ar_{31}$ are the same as or different from each other and are each independently a substituted or unsubstituted aryl group having 6 to 50 carbon atoms, or a substituted or unsubstituted heteroaryl group having 5 to 50 carbon atoms, and Ar29 and Ar30 may be connected to each other to form a saturated or unsaturated cyclic group, $L_1$ is a direct bond, a substituted or unsubstituted arylene group having 6 to 50 carbon atoms, or a substituted or unsubstituted heteroarylene group having 5 to 50 carbon atoms, and x is an integer of 0 to 5.

[Formula 13]

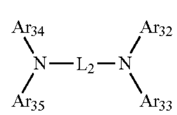

In Formula 13, $L_2$ is a substituted or unsubstituted arylene group having 10 to 40 carbon atoms, and $Ar_{32}$ to $Ar_{35}$ are the same as or different from each other and are each independently a substituted or unsubstituted aryl group having 6 to 50 carbon atoms, or a substituted or unsubstituted heteroaryl group having 5 to 50 carbon atoms, and $Ar_{32}$ and $Ar_{33}$ or $Ar_{34}$ and $Ar_{35}$ may be connected to each other, or one of $Ar_{32}$ to $Ar_{35}$ may be connected to $L_2$ or a substituent group of $L_2$ to form a saturated or unsaturated cyclic group.

Specific examples of $L_2$ in Formula 13 comprise a biphenylene group, a terphenylene group, a quaterphenylene group, a naphthylene group, an anthracenylene group, a phenanthrylene group, a chrysenylene group, a pyrenylene group, a fluorenylene group, a 2,6-diphenylnaphthalene-4',4"-ene group, 2-phenylnaphthalene-2,4'-ene group, a 1-phenylnaphthalene-1,4'-ene group, a 2,7-diphenylfluorenylene-4'4"-ene group, a fluorenylene group, a 9,10-diphenylanthracenylene-4',4"-ene group, a 6,12-diphenylchrysenylen-4',4"-ene group and the like.

Preferable examples of $L_2$ in Formula 13 comprise a biphenylene group, a terphenylene group, a fluorenylene group, a 2-phenylnaphthalene-2,4'-ene group, a 1-phenylnaphthalene-1,4'-ene group, and a 6,12-diphenylchrysenylen-4',4"-ene group.

[Formula 14]

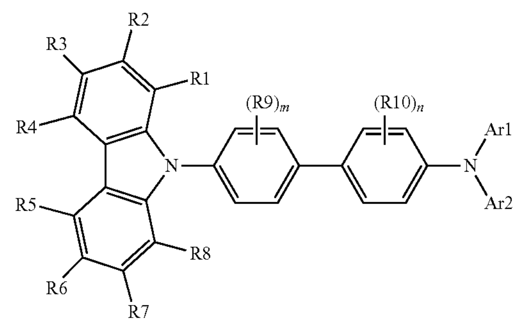

[Formula 15]

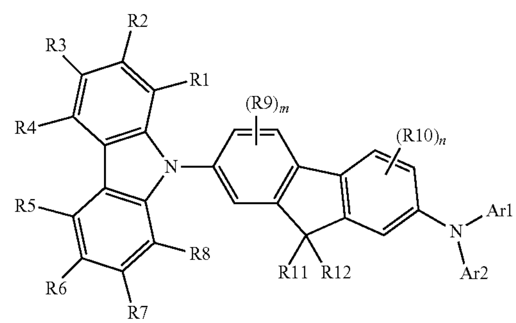

In Formulas 14 and 15,

R1 to R12 are the same as or different from each other and are each independently selected from the group consisting of a hydrogen, a halogen, an alkyl group having 1 to 10 carbon atoms, an alkenyl group having 2 to 10 carbon atoms, an alkoxy group having 1 to 10 carbon atoms, an aryl group having 6 to 20 carbon atoms, and a heteroaryl group having 5 to 20 carbon atoms, Ar1 and Ar2 are the same as or different from each other and are each independently selected from the group consisting of an aryl group having 6 to 20 carbon atoms and a heteroaryl group having 5 to 20 carbon atoms, and m and n are each independently an integer of 0 to 4.

[Formula 16]

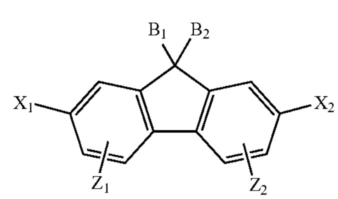

In Formula 16, $X_1$ is an N-carbazolyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; an N-phenoxazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; or an N-phenothiazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms, $X_1$ is an N-carbazolyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; an N-phenoxazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; or an N-phenothiazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms, $X_2$ is an N-carbazolyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; an N-phenoxazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; an N-phenothiazyl group which is unsubstituted or substituted by one or more selected from the group consisting of a halogen, an alkyl group having 1 to 10 carbon atoms, an alkoxy group having 1 to 10 carbon atoms, and an aryl group having 6 to 20 carbon atoms; or —NAr1Ar2, and Ar1 and Ar2 are each independently an aryl group having 6 to 20 carbon atoms, which is unsubstituted or substituted by one or more selected from the group consisting of a halogen, an alkyl group, an alkoxy group, and an aryl group; or a heteroaryl group having 5 to 20 carbon atoms, which is unsubstituted or substituted by one or more selected from the group consisting of a halogen, an alkyl group, an alkoxy group, and an aryl group, $B_1$ and $B_2$ are the same as or different from each other and are each independently a hydrogen; a deuterium; an alkyl group; an aryl group having 6 to 20 carbon atoms, which is unsubstituted or substituted by one or more selected from the group consisting of a halogen, an alkyl group, an alkoxy group, and an aryl group; a heteroaryl group having 5 to 20 carbon atoms, which is unsubstituted or substituted by one or more selected from the group consisting of a halogen, an alkyl group, an alkoxy group, and an aryl group; or an aralkyl group which is unsubstituted or substituted by one or more selected from the group consisting of a halogen, an alkyl group, an alkoxy group, and an aryl group, and $Z_1$ and $Z_2$ are the same as or different from each other and are each independently a hydrogen; a deuterium; a halogen; an alkyl group; an alkoxy group; an aryl group having 6 to 20 carbon atoms, which is selected from the group consisting of a halogen, an alkyl group, an alkoxy group, and an aryl group; or a heteroaryl group having 5 to 20 carbon atoms, which is selected from the group consisting of a halogen, an alkyl group, an alkoxy group, and an aryl group.

The compound represented by Formula 13 may be represented by the following Formula 17.

[Formula 17]

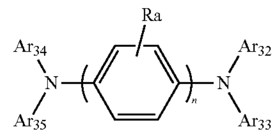

In Formula 17, Ar32 to Ar35 are the same as those defined in Formula 13,

Ra each independently represents a hydrogen, a deuterium, a halogen, an alkyl group, an aralkyl group, an alkenyl group, a cyano group, an amino group, an acyl group, an alkoxycarbonyl group, a carboxyl group, an alkoxy group, an aryloxy group, an alkylsulfonyl group, a hydroxyl group, an amide group, an aryl group, or a heteroaryl group, and these may be additionally substituted and may form a ring with those which are adjacent to each other, and n represents an integer of 2 to 4.

In Formula 17, each of Ar32 to Ar35 may be connected to an adjacent aryl group connected to N or may be connected to Ra to form a substituted or unsubstituted ring.

The compound represented by Formula 13 may be represented by the following Formula 18 or 19.

[Formula 18]

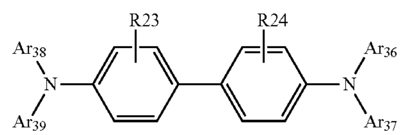

[Formula 19]

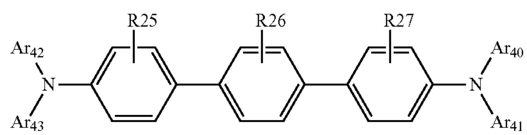

In Formulas 18 and 19, Ar40 to Ar43 are the same as the Ar32 to Ar35 defined in Formula 13, and R23 to R27 are the same as or different from each other and each independently represent a hydrogen, a deuterium, a halogen, an alkyl group, an aralkyl group, an alkenyl group, a cyano group, an amino group, an acyl group, an alkoxycarbonyl group, a carboxyl group, an alkoxy group, an aryloxy group, an alkylsulfonyl group, a hydroxyl group, an amide group, an aryl group, or a heteroaryl group, and these may be additionally substituted and may form a ring with those which are adjacent to each other.

Further, at least one of Ar36 to Ar39 in Formula 18 and at least one of Ar40 to Ar43 in Formula 19 are preferably a substituted or unsubstituted biphenyl group. Specific examples of the substituted or unsubstituted biphenyl group comprise a 2-biphenyl group, a 3-biphenyl group, a 4-biphenyl group, a p-terphenyl group, a m-terphenyl group, an o-terphenyl group, a 4'-methyl-biphenyl-4-yl group, a 4'-t-butyl-biphenyl-4-yl group, a 4'-(1-naphthyl)-biphenyl-4-yl group, a 4'-(2-naphthyl)-biphenyl-4-yl group, a 2-fluorenyl group, a 9,9-dimethyl-2-fluorenyl group, and the like. Preferably, the examples comprise a 3-biphenyl group, a 4-biphenyl group, a p-terphenyl group, a m-terphenyl group, and a 9,9-dimethyl-2-fluorenyl group. At the terminal of the substituted or unsubstituted biphenyl group, an arylamino group may be substituted.

Specific examples of the compound in Formula 13 comprise the following structural formulas, and the like, but are not limited thereto.

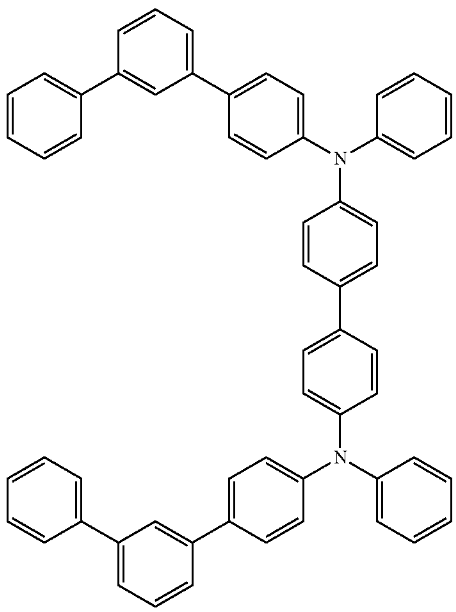

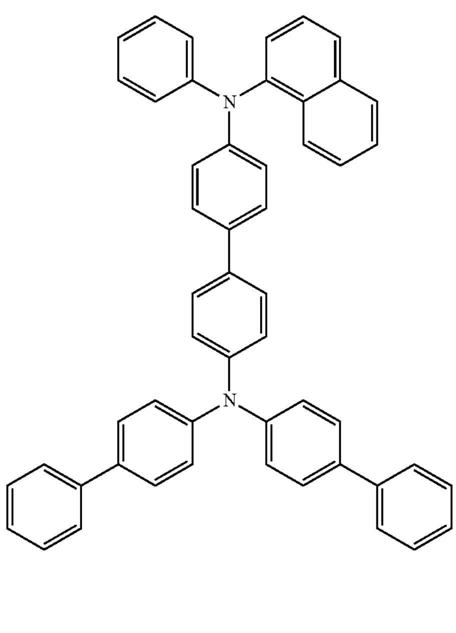

-continued

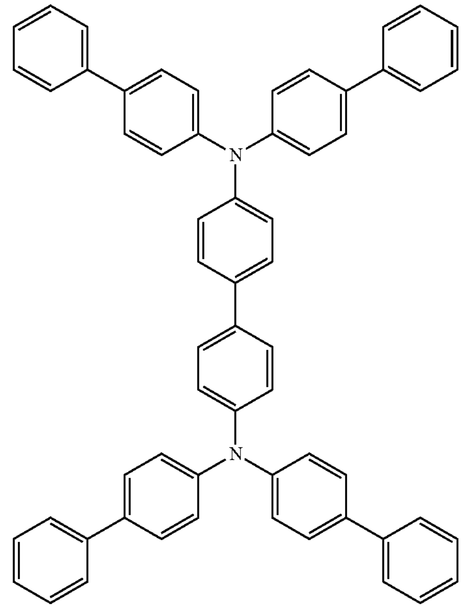

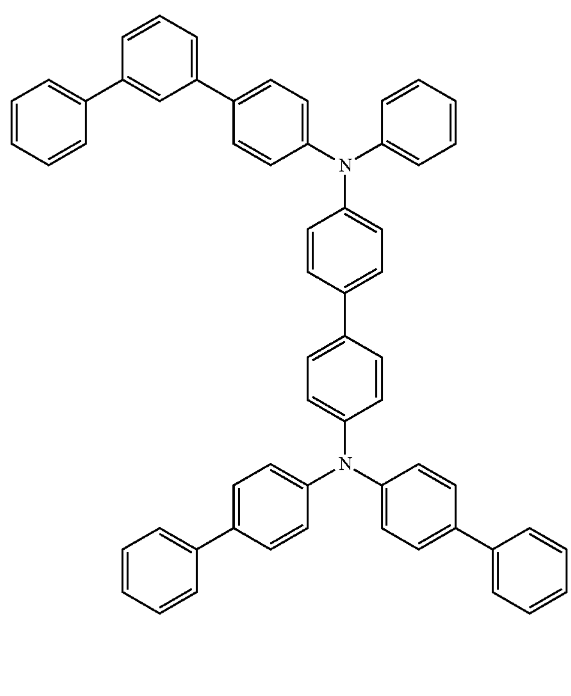

-continued
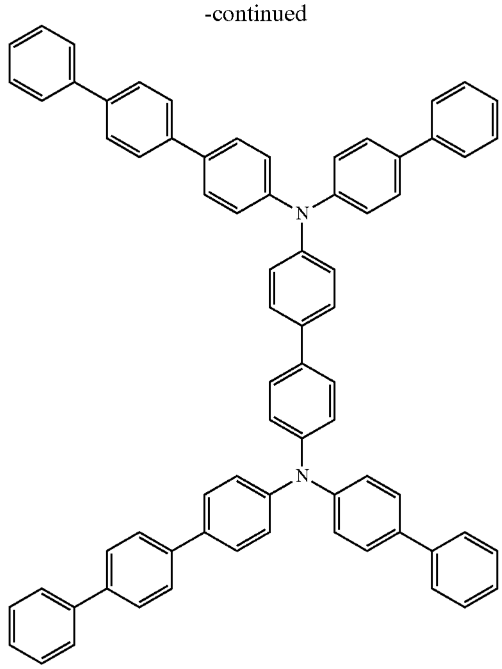
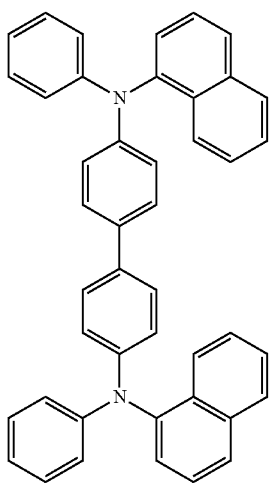
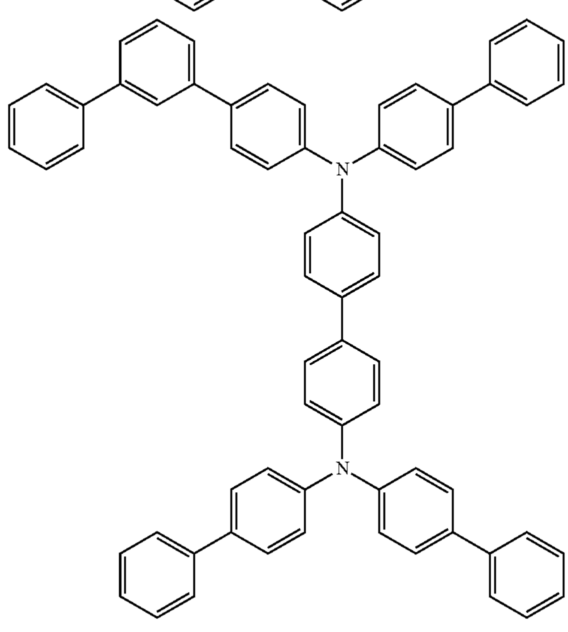
-continued
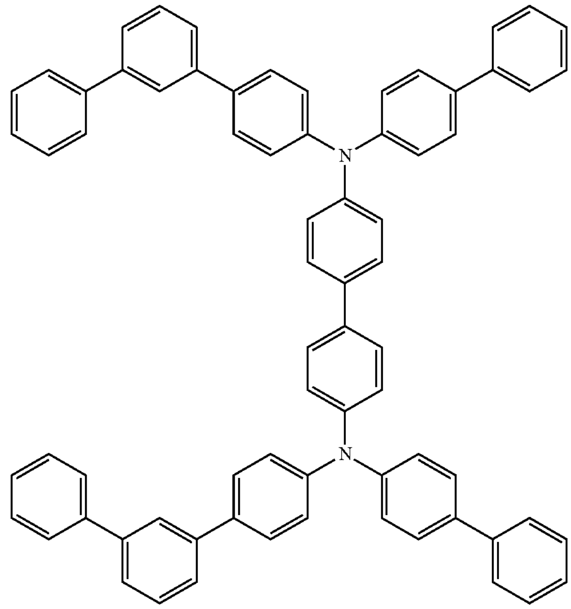
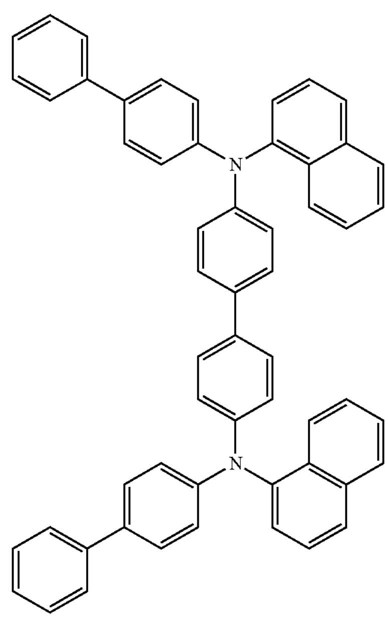

-continued
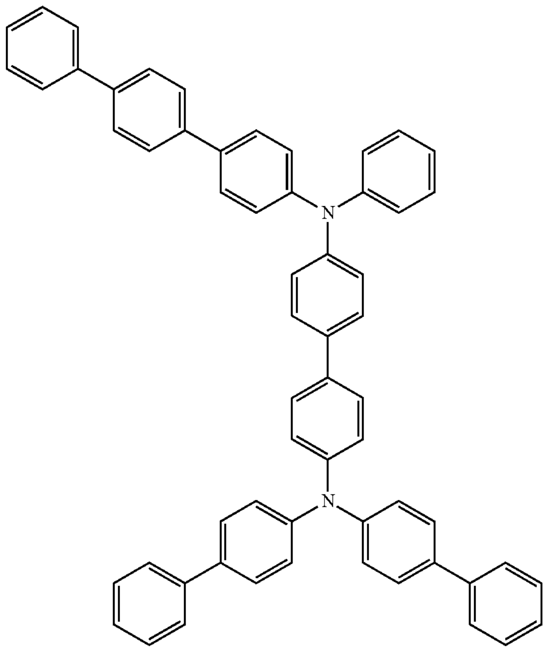
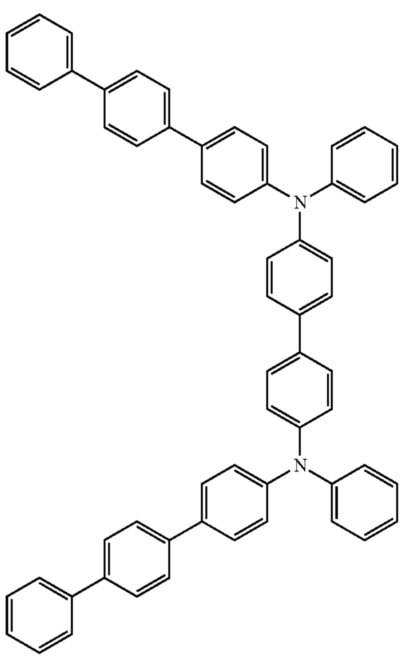
-continued
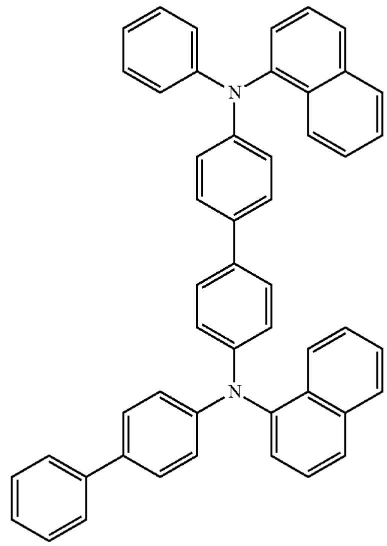
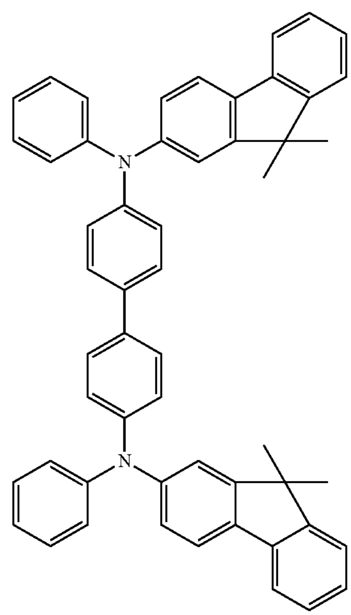

-continued
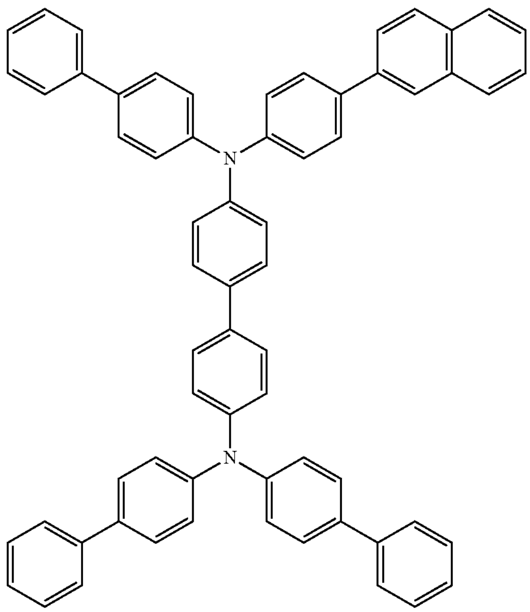
N
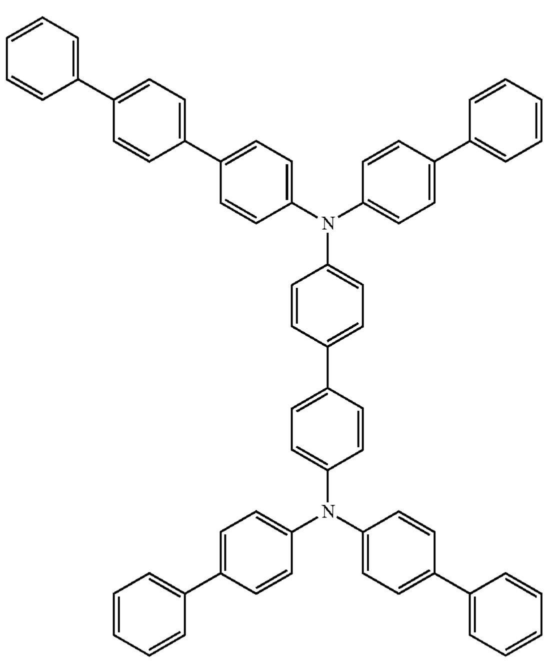
-continued
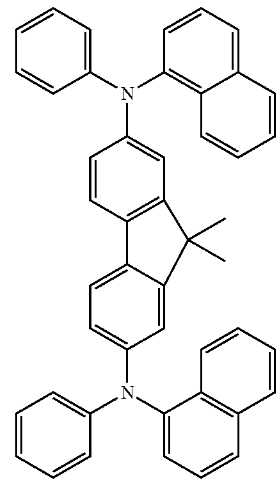
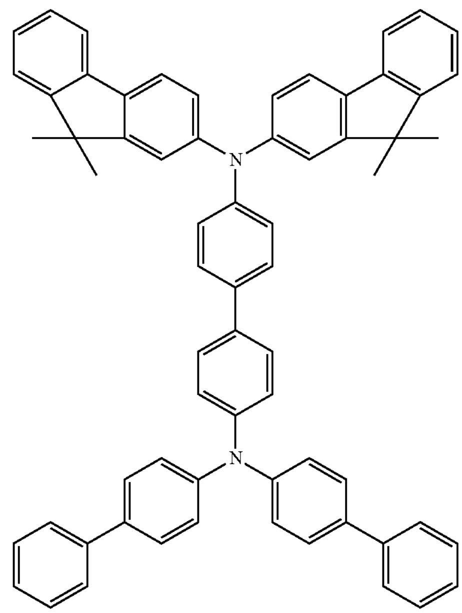
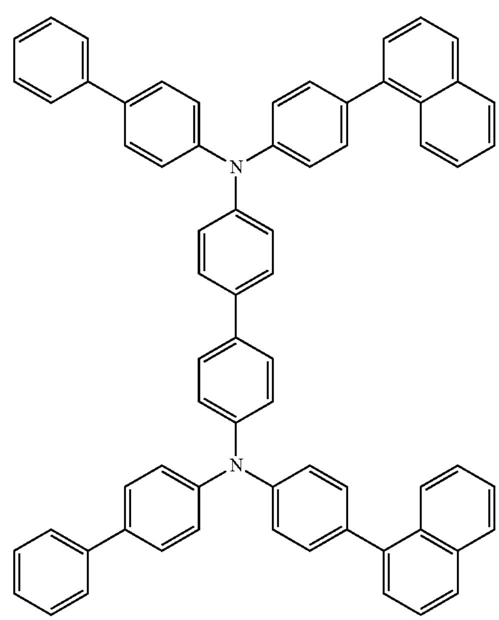

-continued
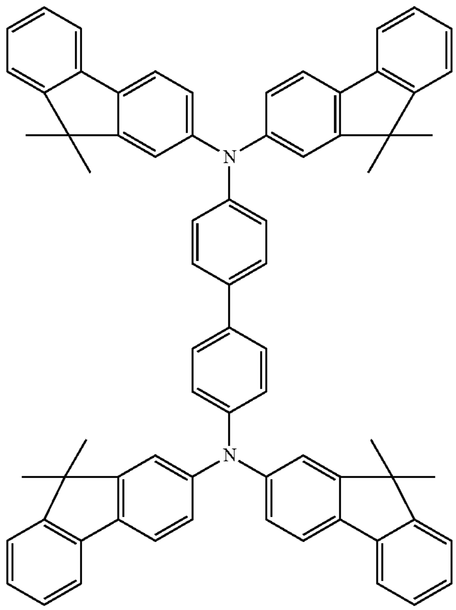
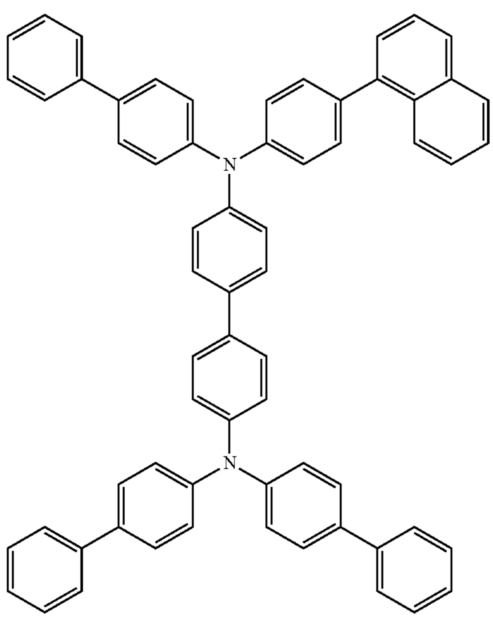
-continued
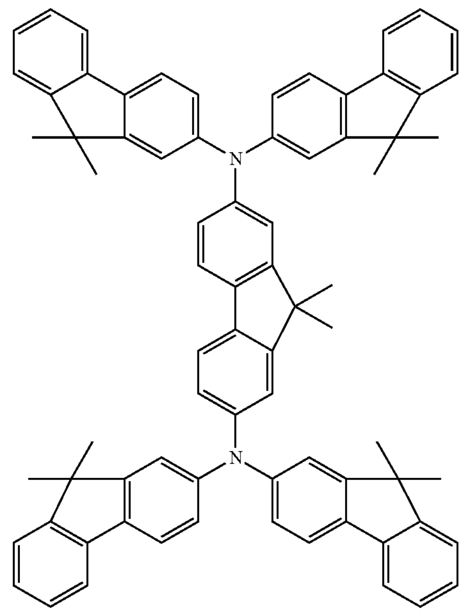
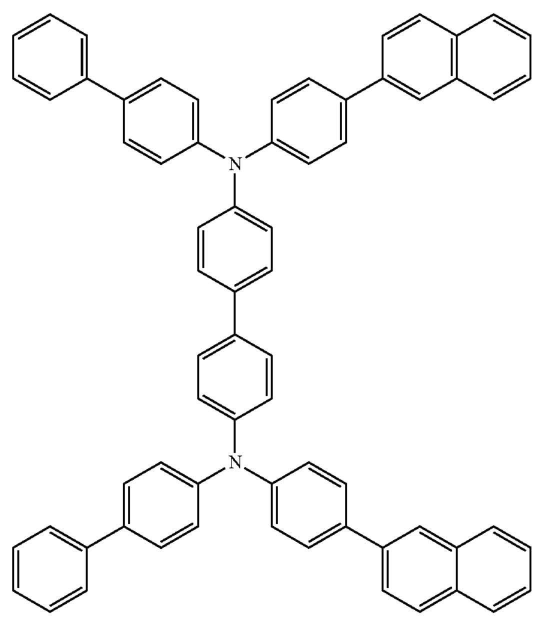

-continued
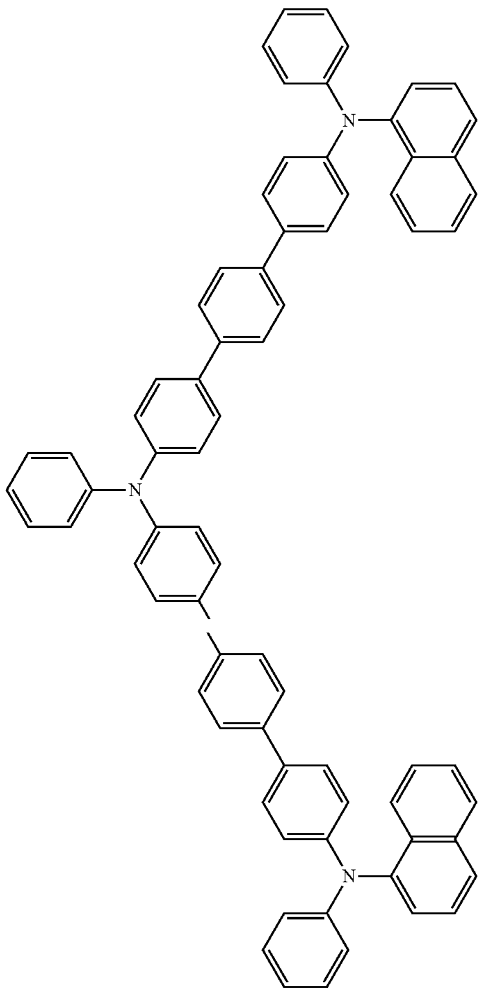 [SMILES: c1ccc(N(c2ccc(-c3ccc(-c4ccc(N(c5ccccc5)c5cccc6ccccc56)cc4)cc3)cc2)c2ccc(-c3ccc(-c4ccc(N(c5ccccc5)c5cccc6ccccc56)cc4)cc3)cc2)cc1]
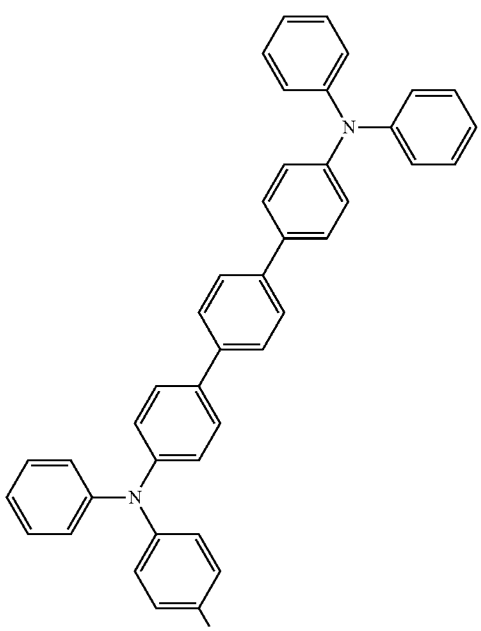
-continued
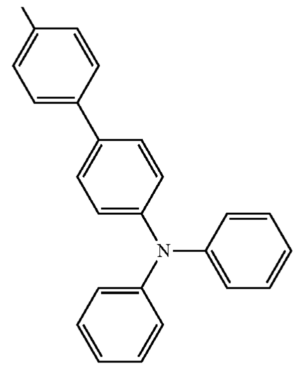
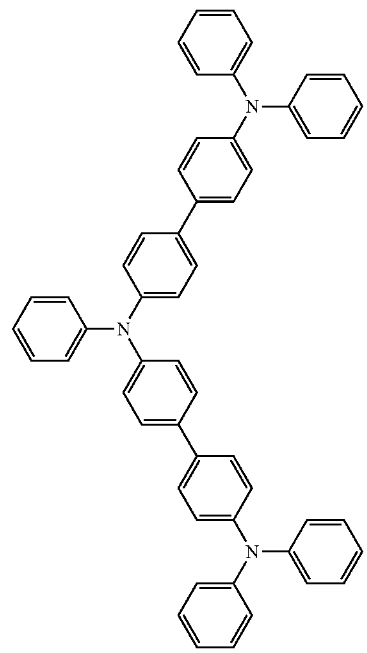
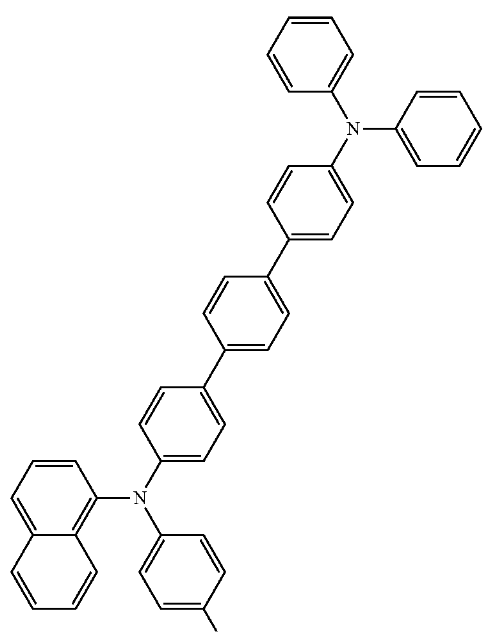

-continued
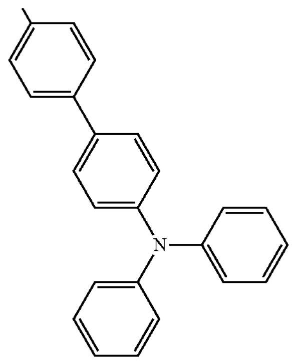
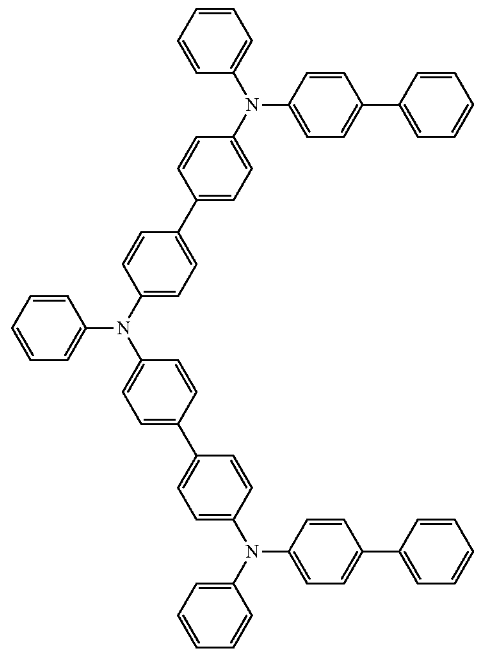
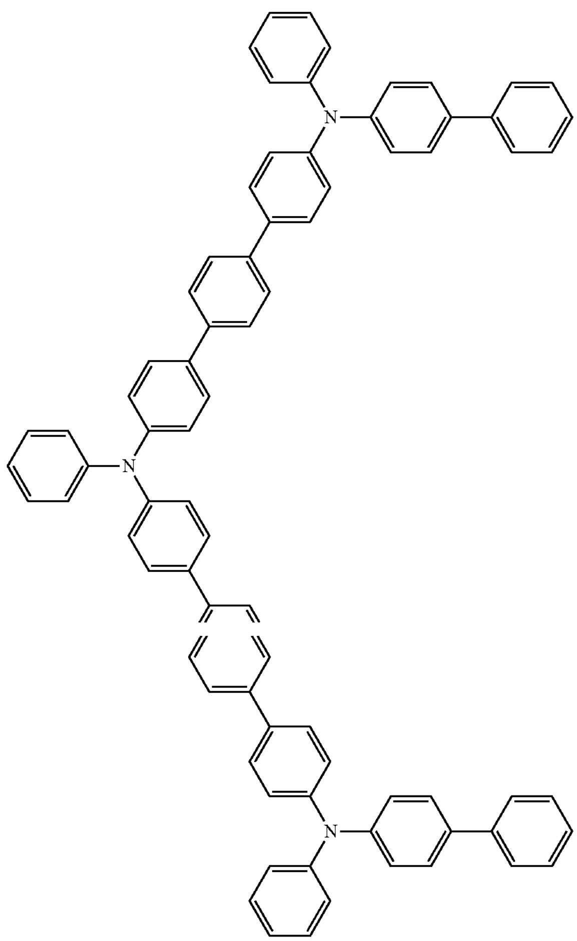
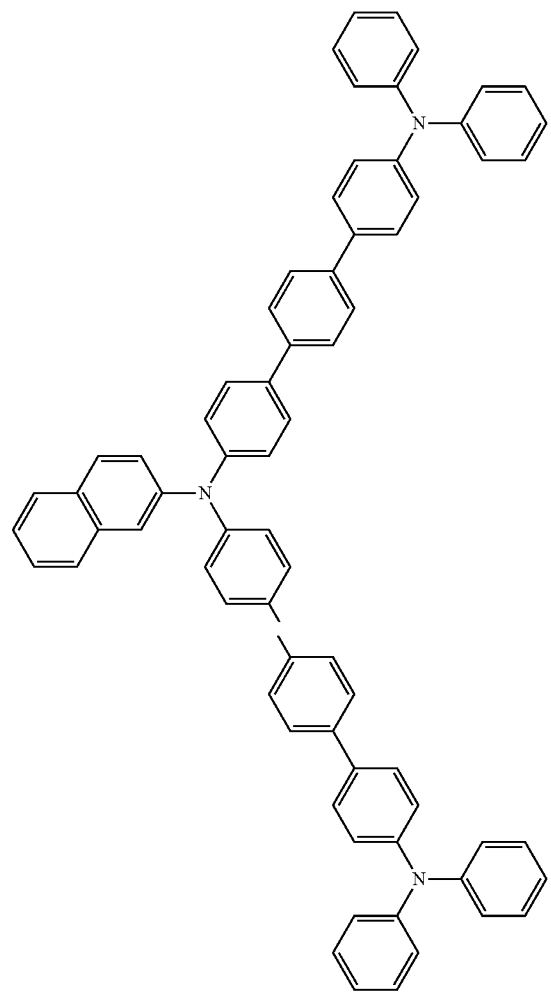 [SMILES: c1ccc(N(c2ccccc2)c2ccc(-c3ccc(-c4ccc(N(c5ccc(-c6ccc(-c7ccc(N(c8ccccc8)c8ccccc8)cc7)cc6)cc5)c5ccc6ccccc6c5)cc4)cc3)cc2)cc1]

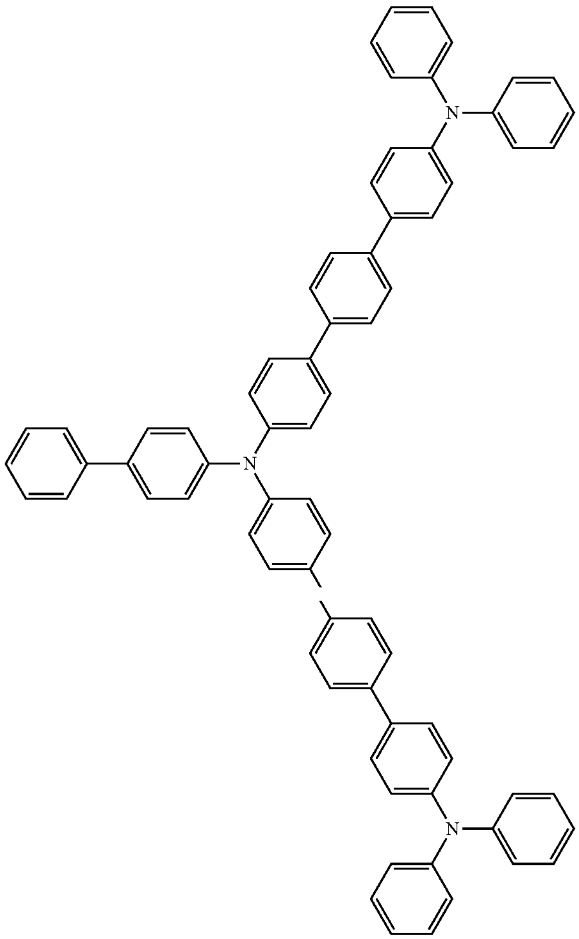 [SMILES: c1ccc(-c2ccc(N(c3ccc(-c4ccc(-c5ccc(N(c6ccccc6)c6ccccc6)cc5)cc4)cc3)c3ccc(-c4ccc(-c5ccc(N(c6ccccc6)c6ccccc6)cc5)cc4)cc3)cc2)cc1]
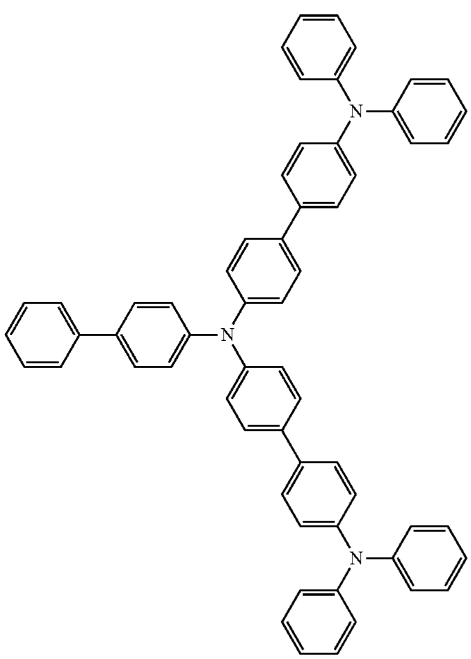
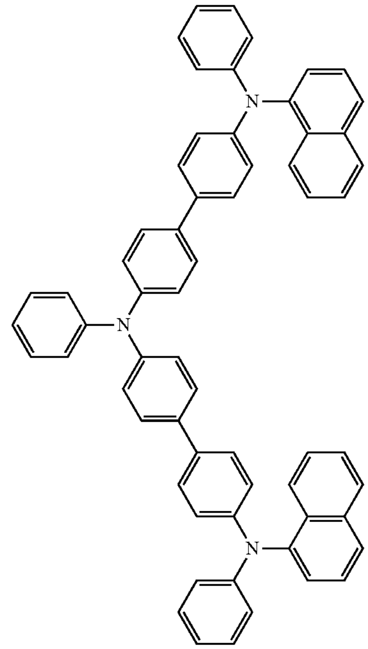
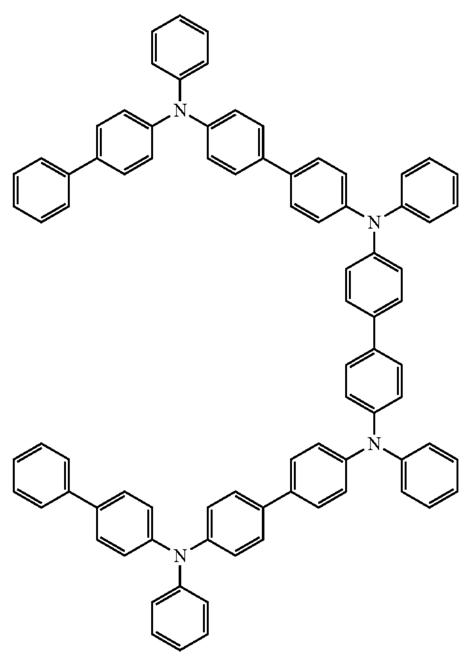

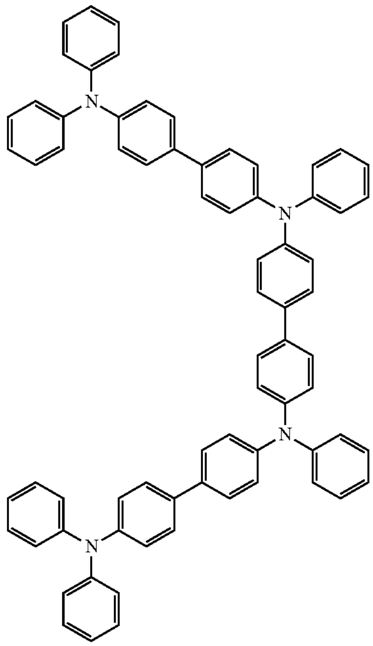
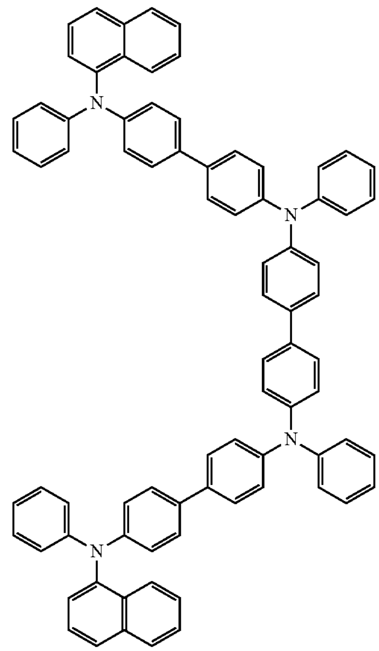
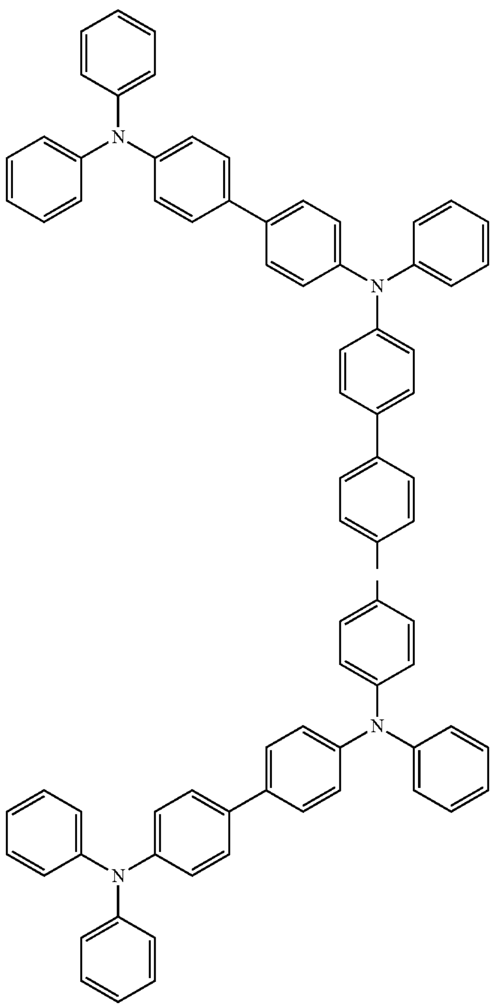
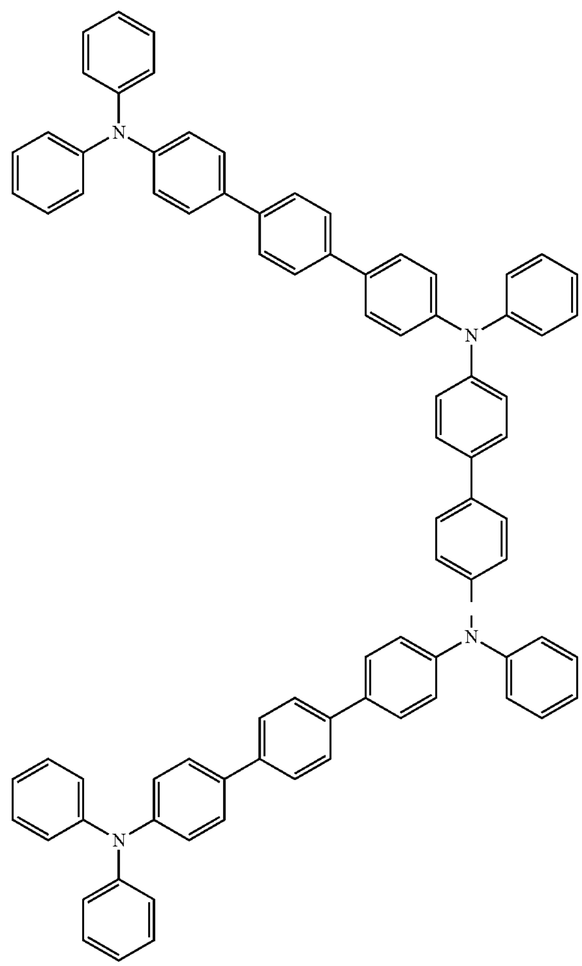

-continued

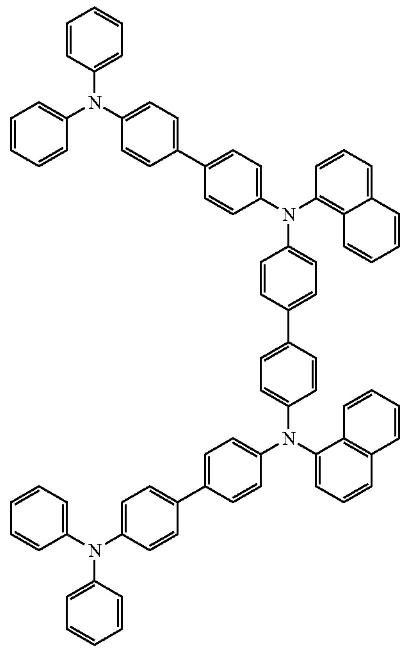

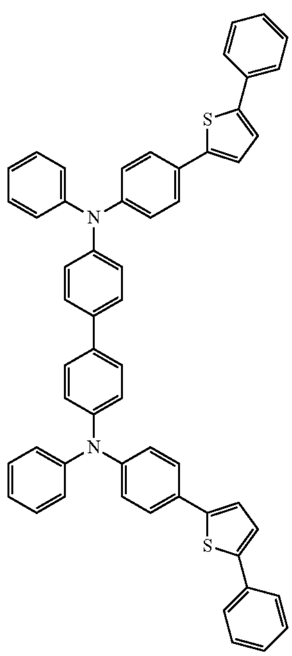 [SMILES: c1ccc(-c2ccc(-c3ccc(N(c4ccccc4)c4ccc(-c5ccc(N(c6ccccc6)c6ccc(-c7ccc(-c8ccccc8)s7)cc6)cc5)cc4)cc3)s2)cc1]

R1 to R12 in Formulas 14 and 15 may form a ring with those which are adjacent to each other. For example, R1 to R8 in Formulas 14 and 15 may be connected to those which are adjacent to each other to form a ring which is condensed to an N-carbazolyl group. In R1 to R8, a ring formed by connecting adjacent groups is typically a 5- or 8-membered ring, preferably a 5- or 8-membered ring, and more preferably a 6-membered ring. Further, the ring may be an aromatic ring or a non-aromatic ring, but preferably an aromatic ring. In addition, the ring may be an aromatic hydrocarbon ring or an aromatic hetero ring, but preferably an aromatic hydrocarbon ring.

In the N-carbazolyl group in Formulas 14 and 15, examples of a condensation ring connected to the N-carbazolyl group, which is formed by connecting any one of R1 to R8 to each other, comprise the following.

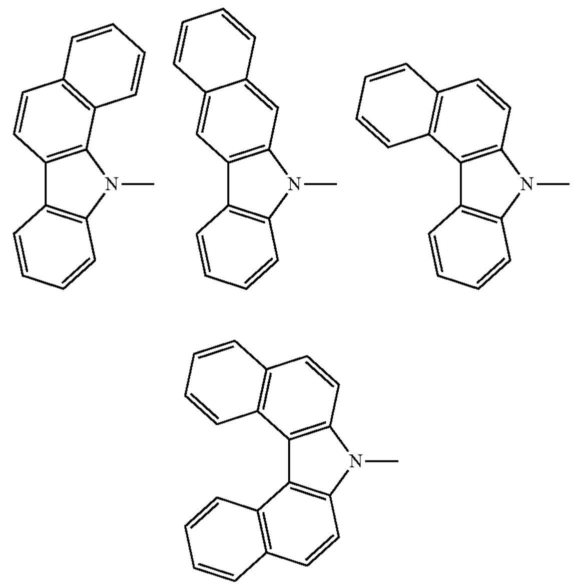

R1 to R8 in Formulas 14 and 15 comprise particularly preferably the case where they are all a hydrogen atom (that is, the N-carbazolyl group is unsubstituted), or the case where one or more of them are any one of a methyl group, a phenyl group, or a methoxy group, and the others are a hydrogen atom.

Specific examples of the compounds in Formulas 14 and 15 comprise the following structural formulas, and the like, but are not limited thereto.

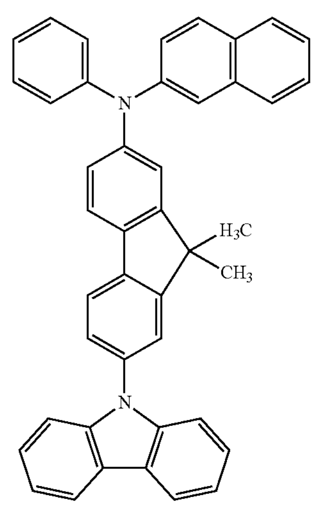

-continued
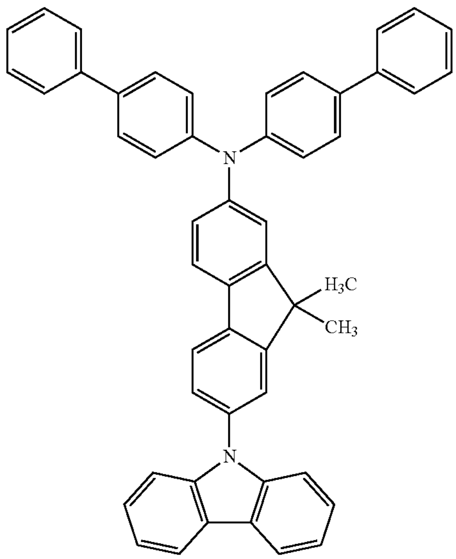
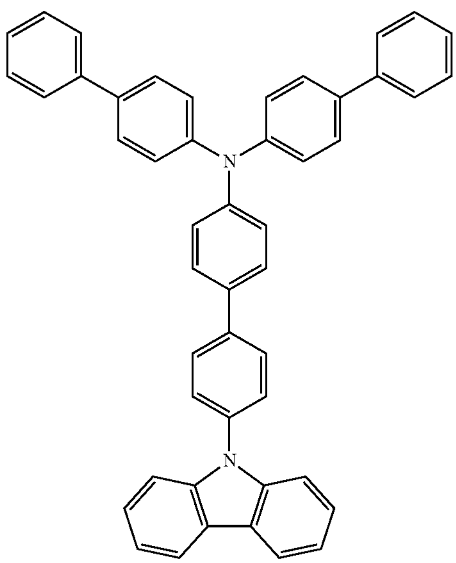
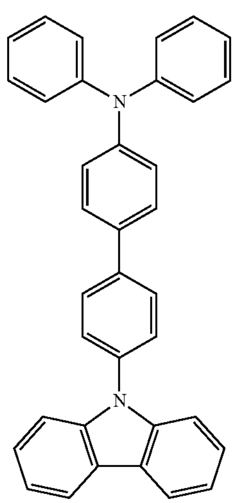
-continued
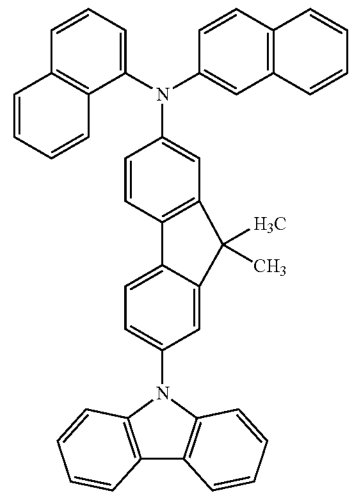
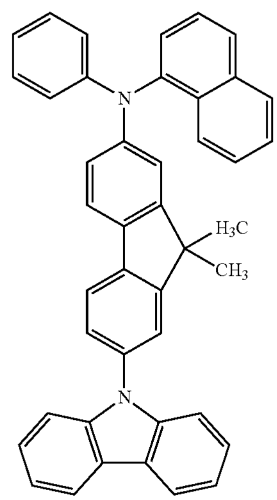
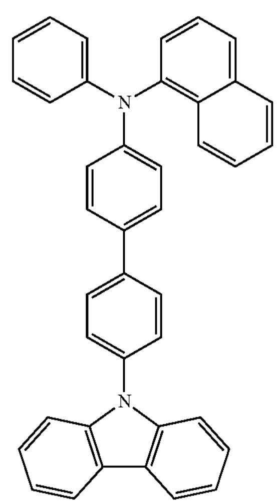

-continued
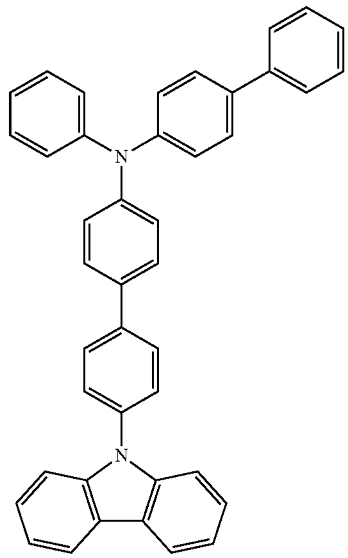
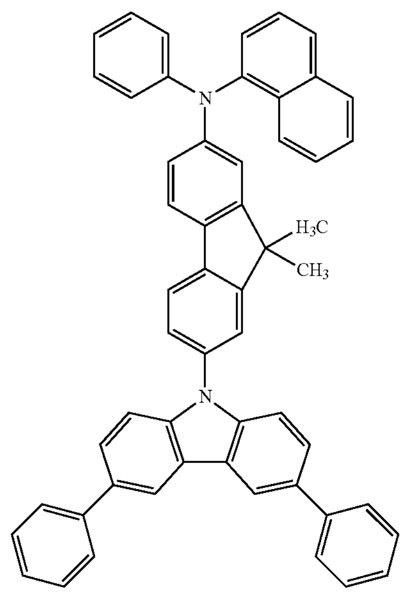
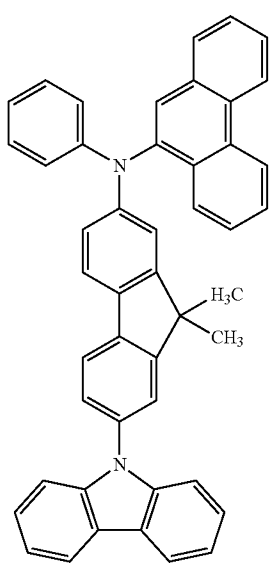
-continued
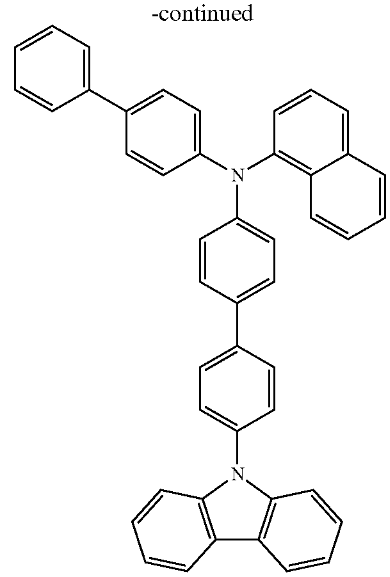
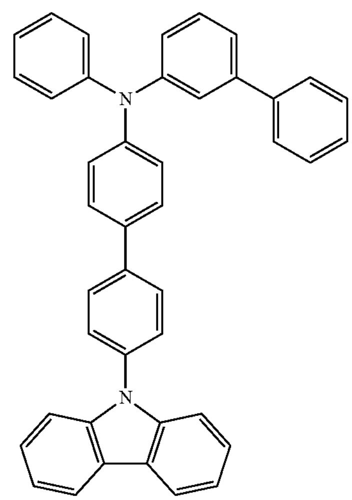
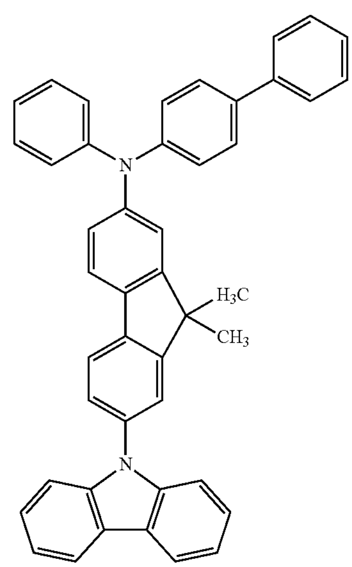

-continued
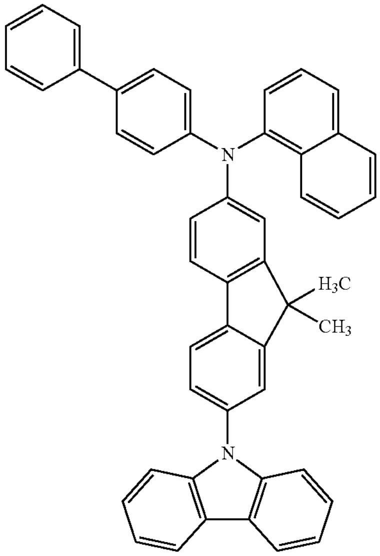
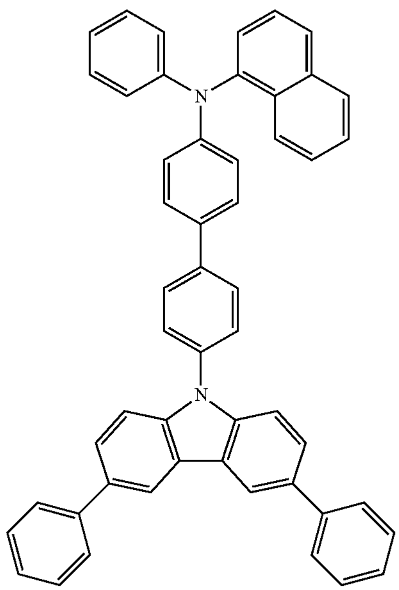
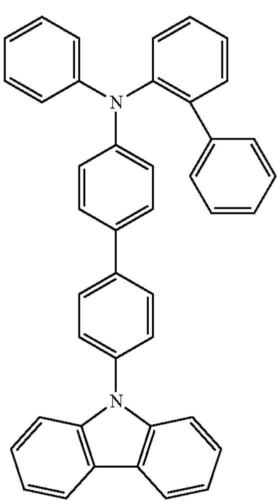
-continued
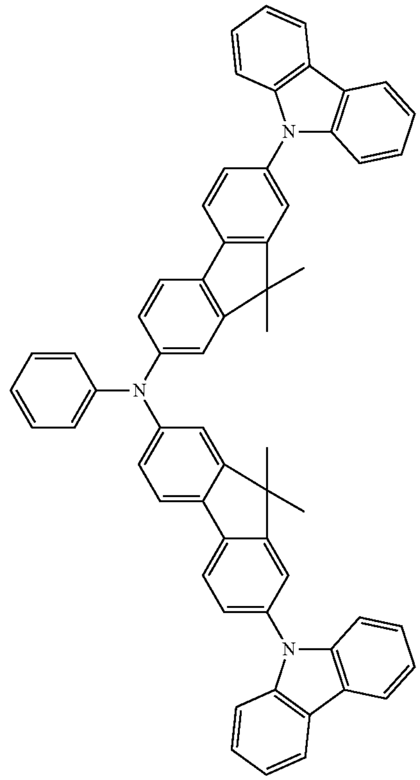
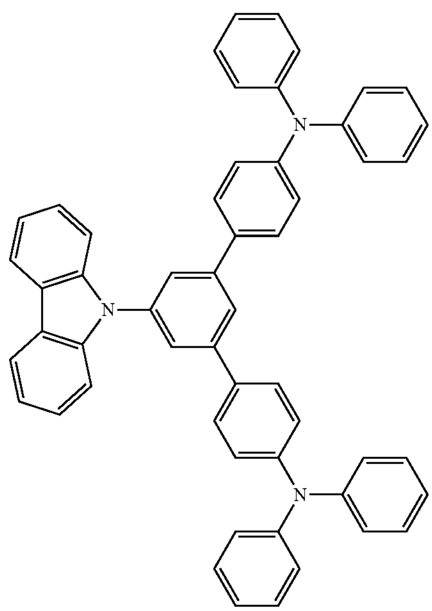

-continued
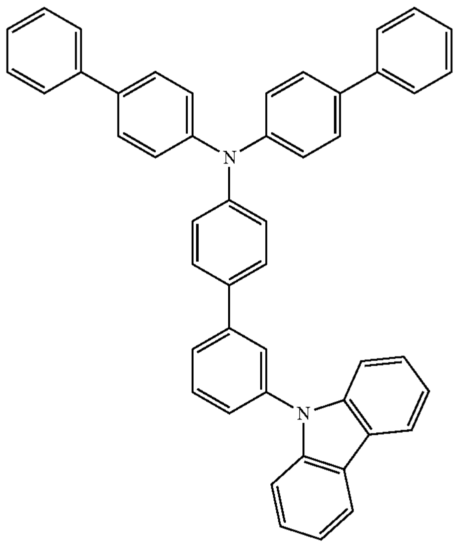
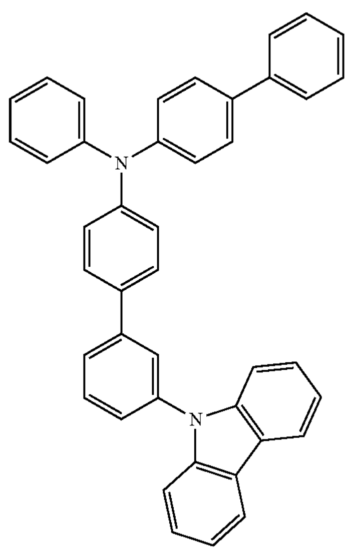
-continued
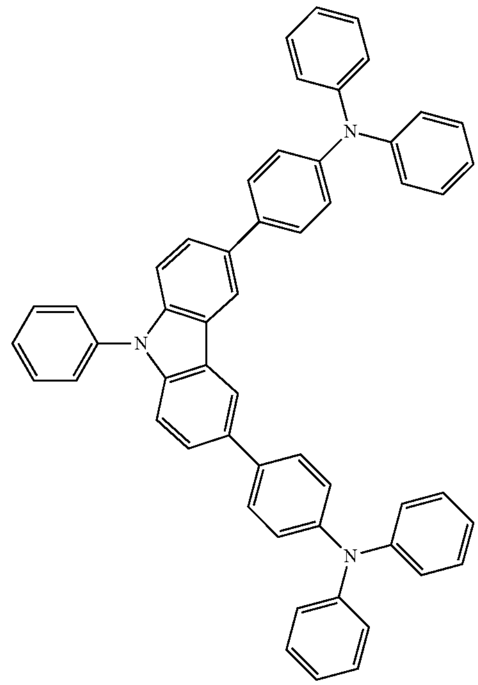
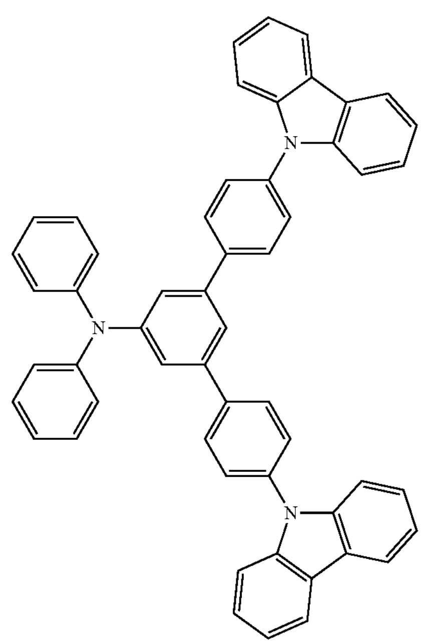

-continued
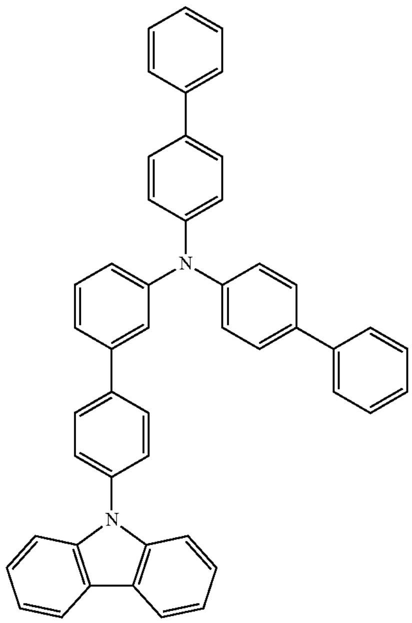
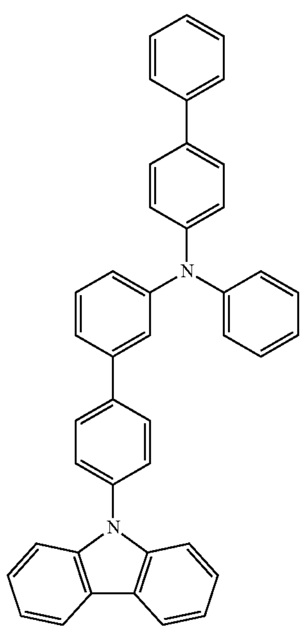
-continued
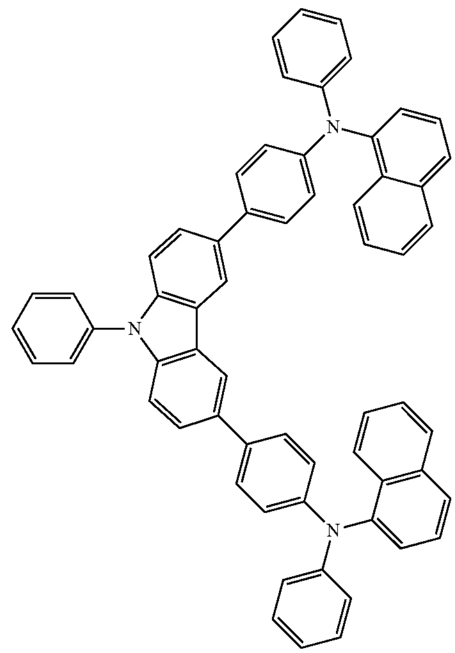
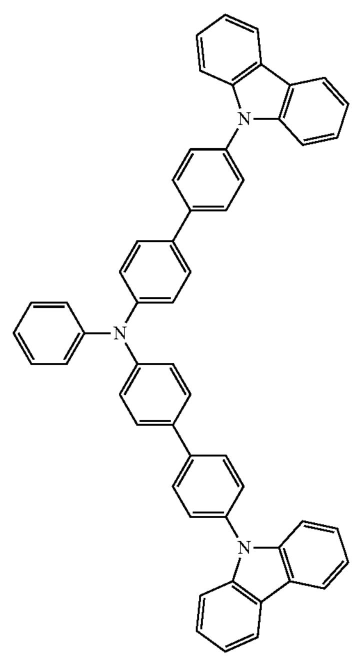

-continued
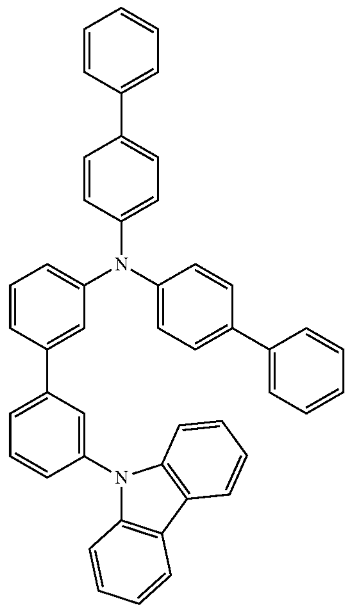
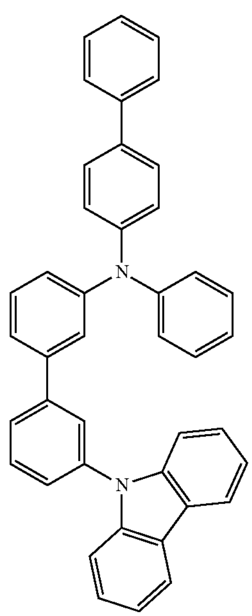
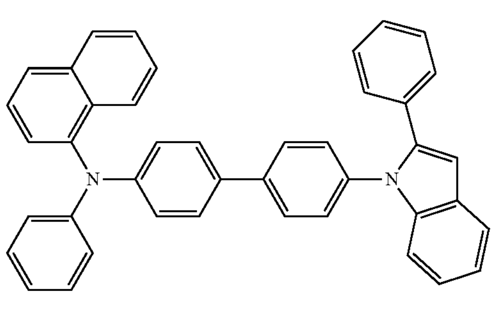
-continued
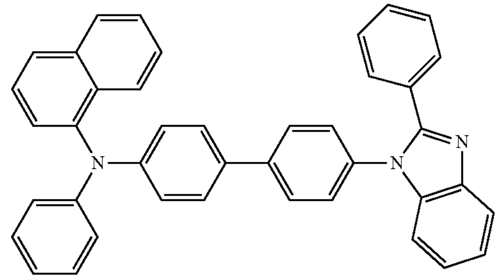
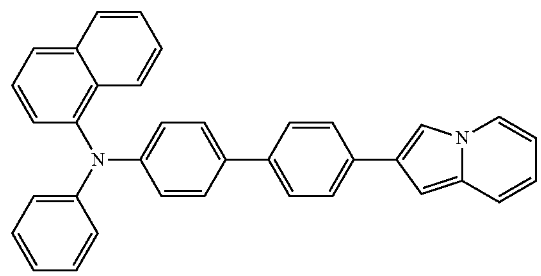
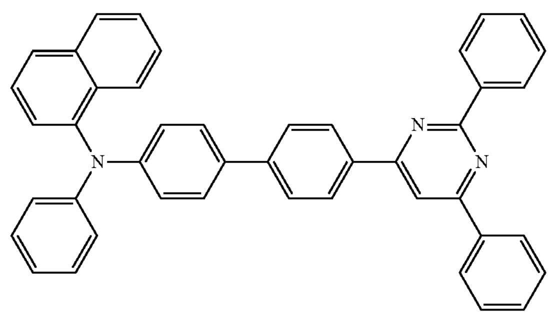
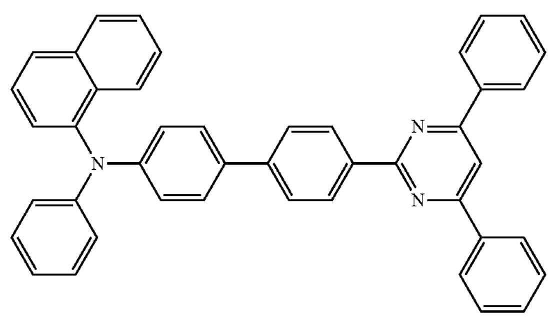
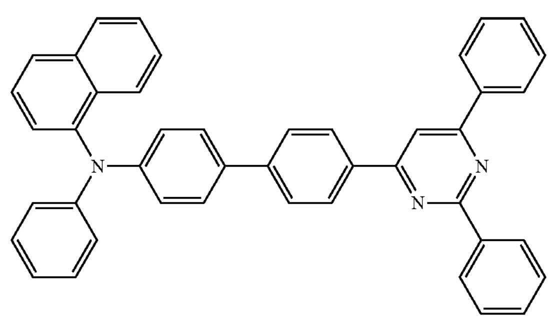

-continued
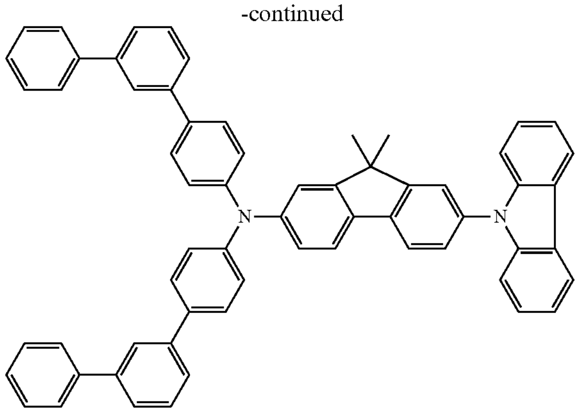
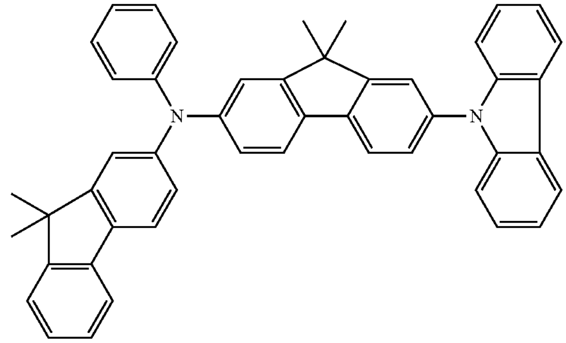
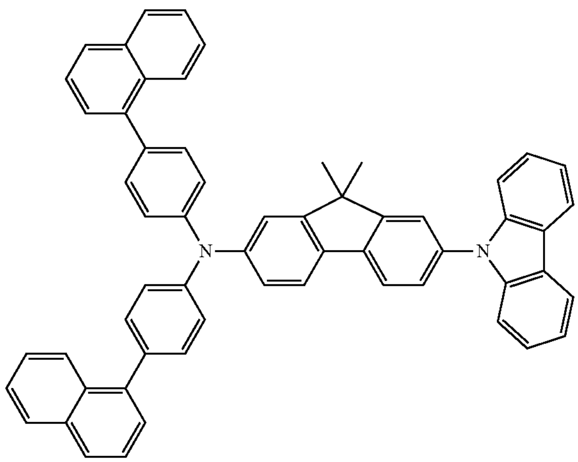
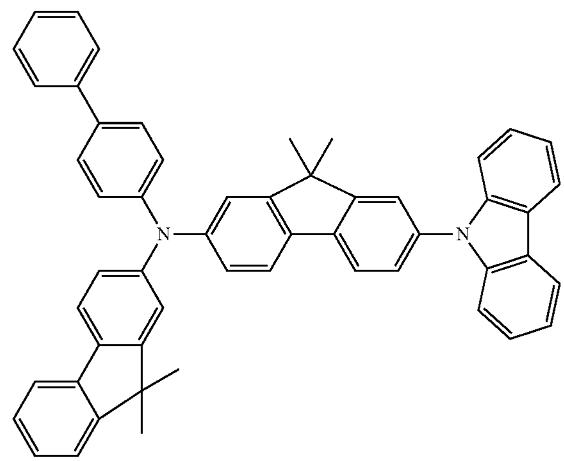
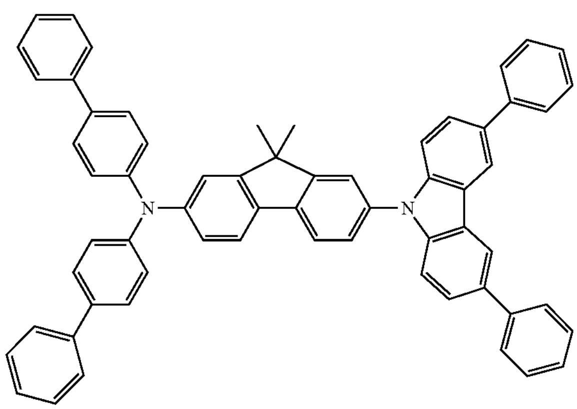
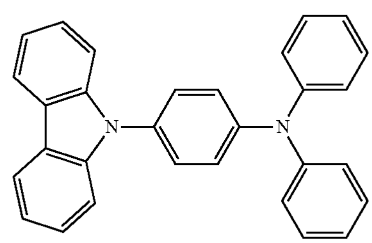
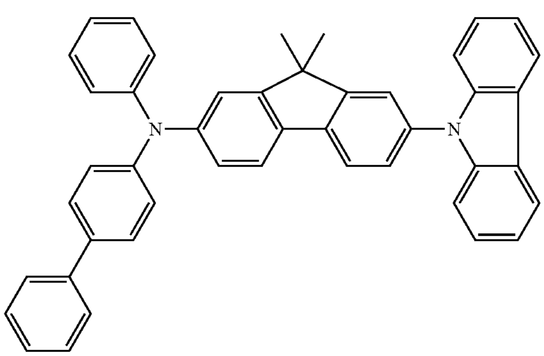
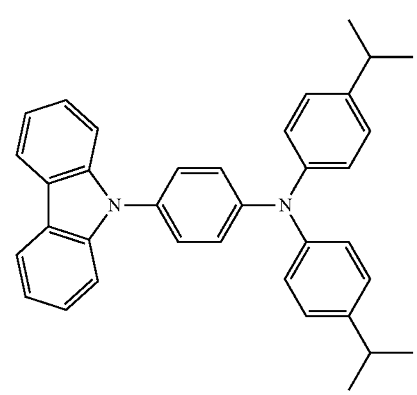

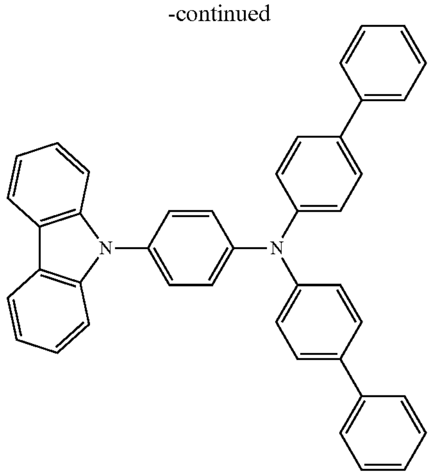
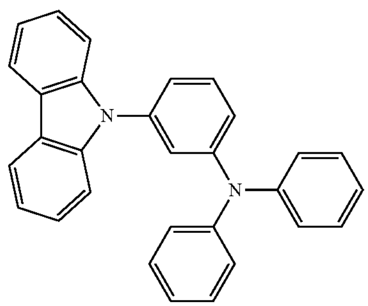
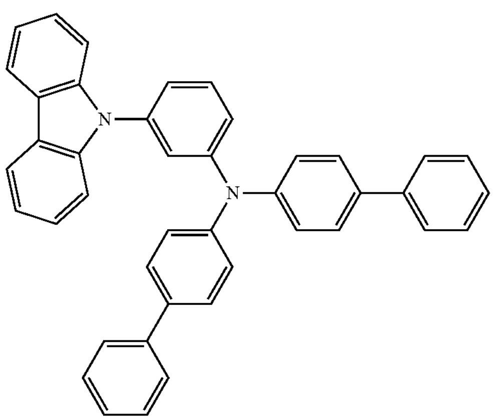
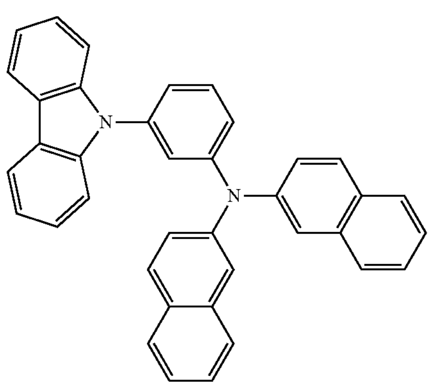
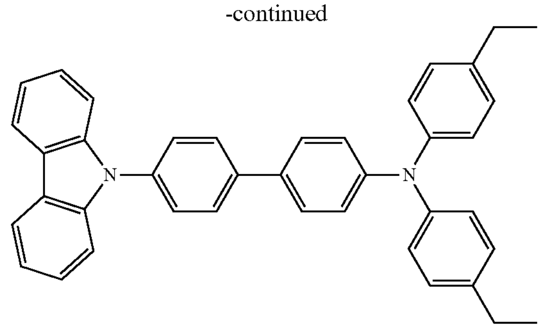
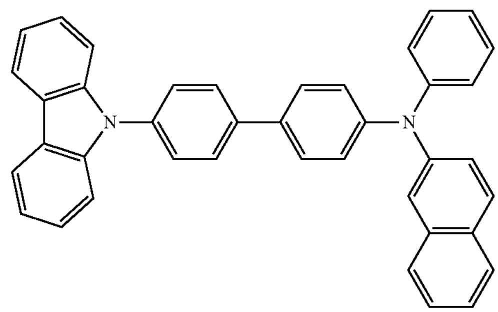
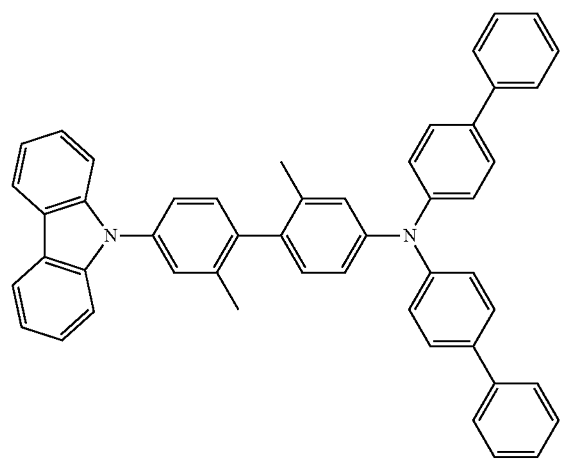
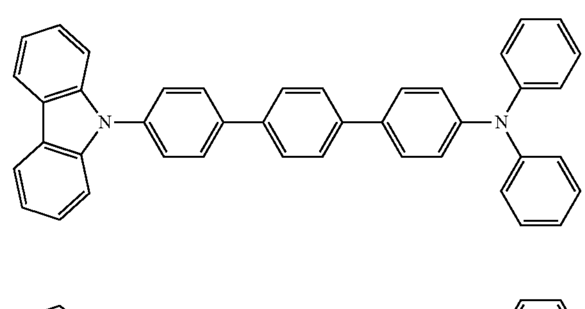
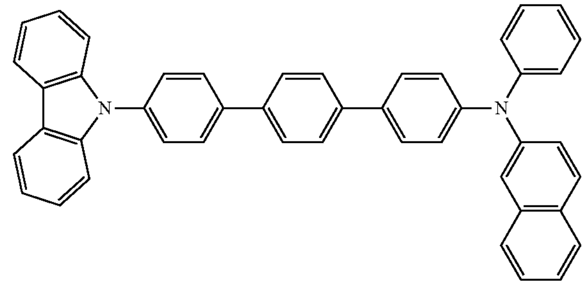

-continued
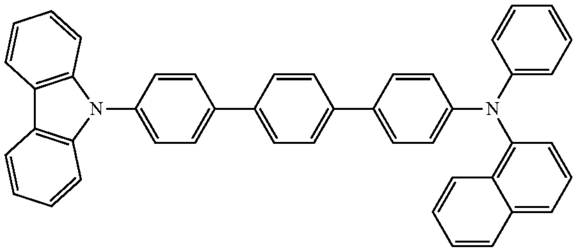
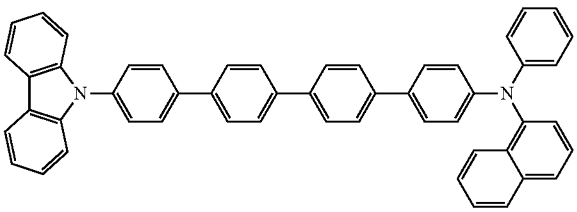
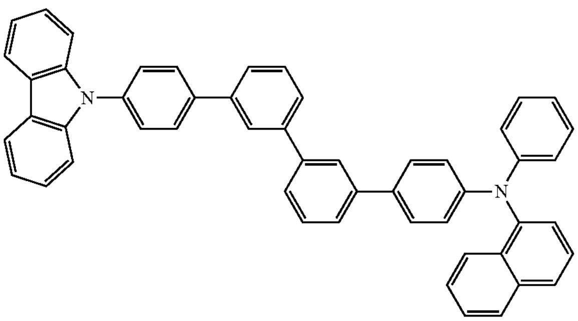
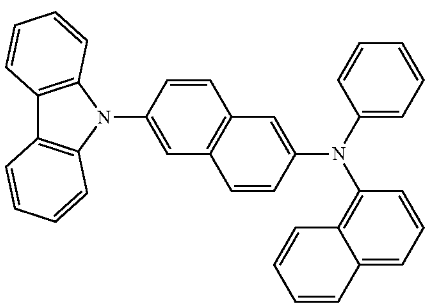
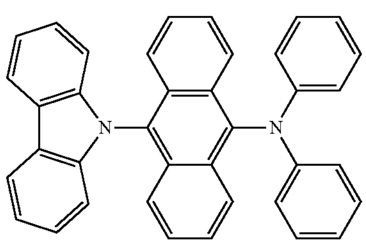
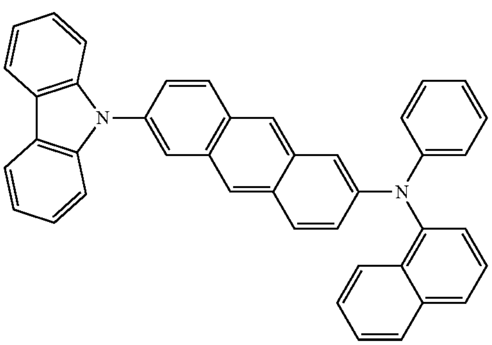
-continued
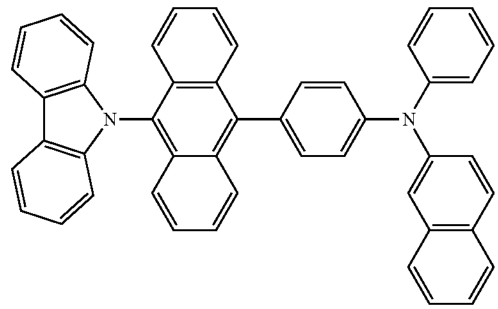
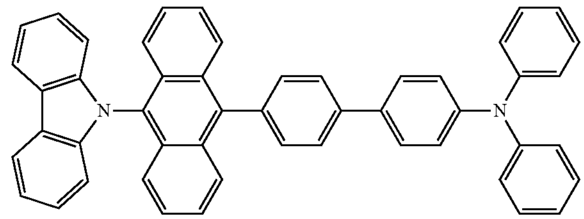
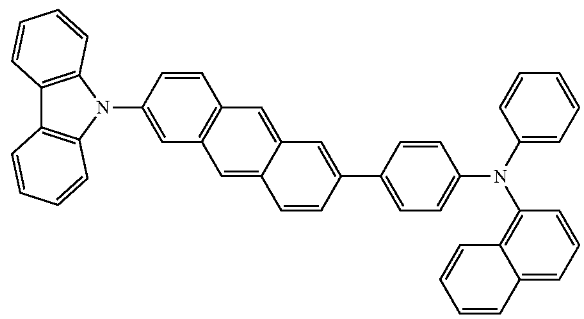
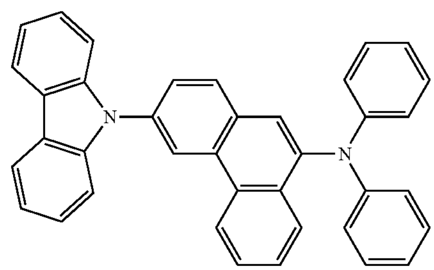
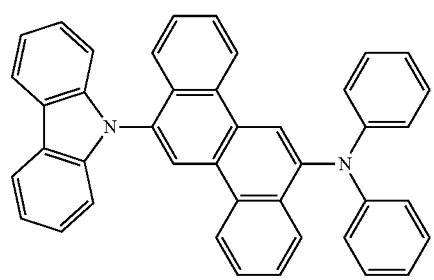
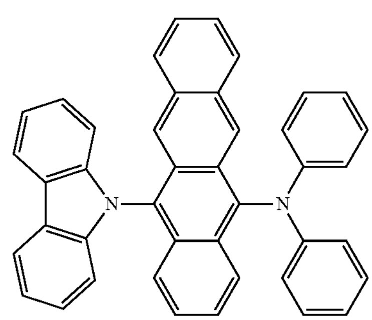

-continued

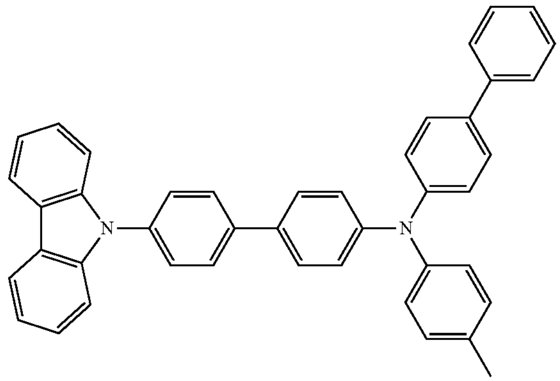

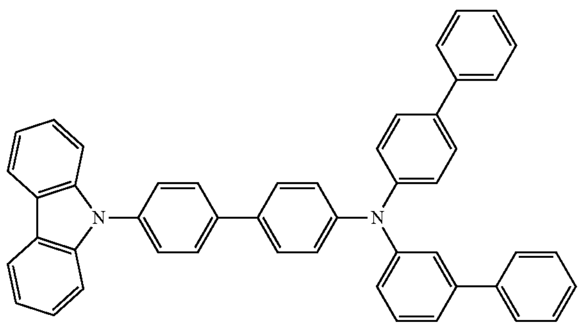

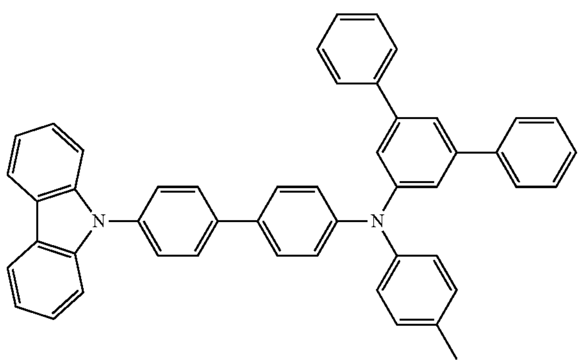

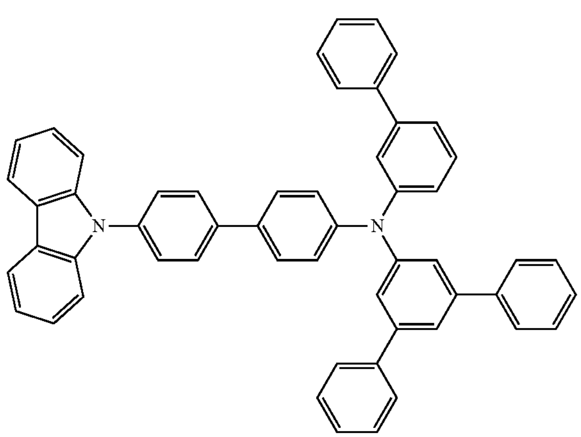

-continued

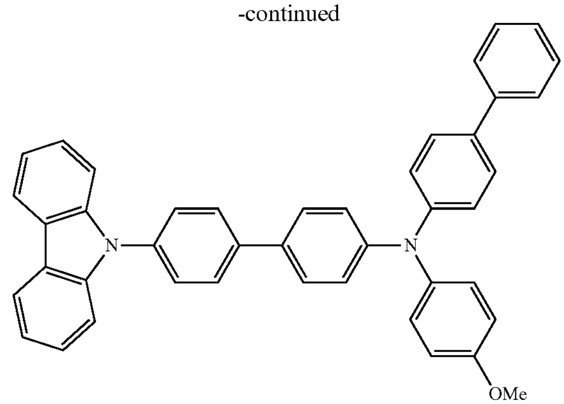

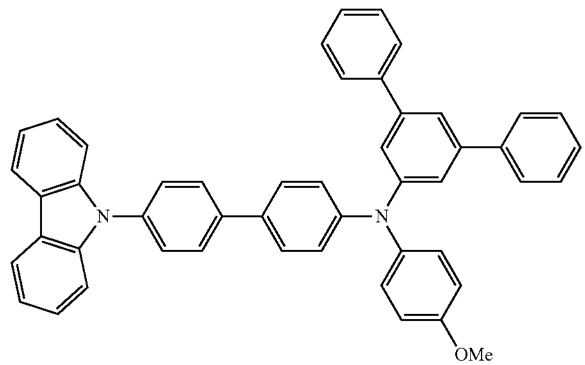 [SMILES: COc1ccc(N(c2ccc(-c3ccc(-n4c5ccccc5c5ccccc54)cc3)cc2)c2cc(-c3ccccc3)cc(-c3ccccc3)c2)cc1]

Specific examples of the substituted or unsubstituted N-carbazolyl group, substituted or unsubstituted N-phenoxazyl group, or substituted or unsubstituted N-phenothiazyl group of $X_1$ in Formula 16 comprise an N-carbazolyl group, a 2-methyl-N-carbazolyl group, a 3-methyl-N-carbazolyl group, a 4-methyl-N-carbazolyl group, a 3-n-butyl-N-carbazolyl group, a 3-n-hexyl-N-carbazolyl group, a-3-n-octyl-N-carbazolyl group, a 3-n-decyl-N-carbazolyl group, a 3,6-dimethyl-N-carbazolyl group, a 2-methoxy-N-carbazolyl group, a 3-methoxy-N-carbazolyl group, a 3-ethoxy-N-carbazolyl group, a 3-isopropoxy-N-carbazolyl group, a 3-n-butoxy-N-carbazolyl group, a 3-n-octyloxy-N-carbazolyl group, a 3-n-decyloxy-N-carbazolyl group, a 3-phenyl-N-carbazolyl group, a 3-(4'-methylphenyl)-N-carbazolyl group, a 3-chloro-N-carbazolyl group, an N-phenoxazyl group, an N-phenothiazyl group, a 2-methyl-N-phenothiazyl group, and the like.

Specific examples of the substituted or unsubstituted N-carbazolyl group, substituted or unsubstituted N-phenoxazyl group, and substituted or unsubstituted N-phenothiazyl group of $X_2$ in Formula 16 comprise a substituted or unsubstituted N-carbazolyl group, a substituted or unsubstituted N-phenoxazyl group, a substituted or unsubstituted N-phenothiazyl group which are exemplified as specific examples of $X_1$, and the like.

In the —NAr1Ar2 in Formula 16, Ar1 and Ar2 represent a substituted or unsubstituted aryl group or heteroaryl group. Specific examples of the Ar1 and Ar2 comprise a phenyl group, a 1-naphthyl group, a 2-naphthyl group, a 2-anthryl group, a 9-anthryl group, a 4-quinolyl group, a 4-pyridyl group, a 3-pyridyl group, a 2-pyridyl group, a 3-furyl group, a 2-furyl group, a 3-thienyl group, a 2-thienyl group, a 2-oxazolyl group, a 2-thiazolyl group, a 2-benzoxazolyl group, a 2-benzothiazolyl group, a 2-benzoimidazolyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 4-isopropylphenyl group, a 2-isopropylphenyl group, a 4-n-butylphenyl group, a 4-isobutylphenyl group, a 4-sec-butylphenyl group, a 2-sec-butylphenyl group, a 4-tert-butylphenyl group, a 3-tert-butylphenyl group, a 2-tert-butylphenyl group, a 4-n-pentylphenyl group, a 4-isopentylphenyl group, a 2-neopentylphenyl group, a 4-tert-pentylphenyl group, a 4-n-hexylphenyl group, a 4-(2'-ethylbutyl)phenyl group, a 4-n-heptylphenyl group, a 4-n-octylphenyl group, a 4-(2'-ethylhexyl)phenyl group, a 4-tert-octylphenyl group, a 4-n-decylphenyl group, a 4-n-dodecylphenyl group, a 4-n-tetradecylphenyl group, a 4-cyclopentylphenyl group, a 4-cyclohexylphenyl group, a 4-(4'-methylcyclohexyl)phenyl group, a 4-(4'-tert-butylcyclohexyl)phenyl group, a 3-cyclohexylphenyl group, a 2-cyclohexylphenyl group, a 4-ethyl-1-naphthyl group, a 6-n-butyl-2-naphthyl group, a 2,4-dimethylphenyl group, a 2,5-dimethylphenyl group, a 3,4-dimethylphenyl group, a 3,5-dimethylphenyl group, a 2,6-dimethylphenyl group, a 2,4-diethylphenyl group, a 2,3,5-trimethylphenyl group, a 2,3,6-trimethylphenyl group, a 3,4,5-trimethylphenyl group, a 2,6-diethylphenyl group, a 2,5-diisopropylphenyl group, a 2,6-diisobutylphenyl group, a 2,4-di-tert-butylphenyl group, a 2,5-di-tert-butylphenyl group, a 4,6-di-tert-butyl-2-methylphenyl group, a 5-tert-butyl-2-methylphenyl group, a 4-tert-butyl-2,6-dimethylphenyl group, a 4-methoxyphenyl group, a 3-methoxyphenyl group, a 2-methoxyphenyl group, a 4-ethoxyphenyl group, a 3-ethoxyphenyl group, a 2-ethoxyphenyl group, a 4-n-propoxyphenyl group, a 3-n-propoxyphenyl group, a 4-isopropoxyphenyl group, a 2-isopropoxyphenyl group, a 4-n-butoxyphenyl group, a 4-isobutoxyphenyl group, a 2-sec-butoxyphenyl group, a 4-n-pentyloxyphenyl group, a 4-isopentyloxyphenyl group, a 2-isopentyloxyphenyl group, a 4-neopentyloxyphenyl group, a 2-neopentyloxyphenyl group, a 4-n-hexyloxyphenyl group, a 2-(2'-ethylbutyl)oxyphenyl group, 4-n-octyloxyphenyl group, a 4-n-decyloxyphenyl group, a 4-n-dodecyloxyphenyl group, a 4-n-tetradecyloxyphenyl group, a 4-cyclohexyloxyphenyl group, a 2-cyclohexyloxyphenyl group, a 2-methoxy-1-naphthyl group, a 4-methoxy-1-naphthyl group, a 4-n-butoxy-1-naphthyl group, a 5-ethoxy-1-naphthyl group, a 6-methoxy-2-naphthyl group, a 6-ethoxy-2-naphthyl group, a 6-n -butoxy-2-naphthyl group, a 6-n-hexyloxy-2-naphthyl group, a 7-methoxy-2-naphthyl group, a 7-n -butoxy-2-naphthyl group, a 2-methyl-4-methoxyphenyl group, a 2-methyl-5-methoxyphenyl group, a 3-methyl-5-methoxyphenyl group, a 3-ethyl-5-methoxyphenyl group, a 2-methoxy-4-methylphenyl group, a 3-methoxy-4-methylphenyl group, a 2,4-dimethoxyphenyl group, a 2,5-dimethoxyphenyl group, a 2,6-dimethoxyphenyl group, a 3,4-dimethoxyphenyl group, a 3,5-dimethoxyphenyl group, a 3,5-diethoxyphenyl group, a 3,5-di-n-butoxyphenyl group, a 2-methoxy-4-ethoxyphenyl group, a 2-methoxy-6-ethoxyphenyl group, a 3,4,5-trimethoxyphenyl group, a 4-phenylphenyl group, a 3-phenylphenyl group, a 2-phenylphenyl group, a 4-(4'-methylphenyl)phenyl group, a 4-(3'-methylphenyl)phenyl group, a 4-(4'-methoxyphenyl)phenyl group, a 4-(4'-n-butoxyphenyl)phenyl group, a 2-(2'-methoxyphenyl)phenyl group, a 4-(4'-chlorophenyl)phenyl group, a 3-methyl-4-phenylphenyl group, a 3-methoxy-4-phenylphenyl group, a 4-fluorophenyl group, a 3-fluorophenyl group, a 2-fluorophenyl group, a 4-chlorophenyl group, a 3-chlorophenyl group, a 2-chlorophenyl group, a 4-bromophenyl group, a 2-bromophenyl group, a 4-chloro-1-naphthyl group, a 4-chloro-2-naphthyl group, a 6-bromo-2-naphthyl group, a 2,3-difluorophenyl group, a 2,4-difluorophenyl group, a 2,5-difluorophenyl group, a 2,6-difluorophenyl group, a 3,4-dilfluorophenyl group, a 3,5-difluorophenyl group, a 2,3-dichlorophenyl group, a 2,4-dichlorophenyl group, a 2,5-dichlorophenyl group, a 3,4-dichlorophenyl group, a 3,5-dichlorophenyl group, a 2,5-dibromophenyl group, a 2,4,6-trichlorophenyl group, a 2,4-dichloro-1-naphthyl group, a 1,6-dichloro-2-naphthyl group, a 2-fluoro-4-methylphenyl group, a 2-fluoro-5-methylphenyl group, a 3-fluoro-2-methylphenyl group, a 3-fluoro-4-methylphenyl group, a 2-methyl-4-fluorophenyl group, a 2-methyl-5-fluorophenyl group, a 3-methyl-4-fluorophenyl group, a 2-chloro-4-methylphenyl group, a 2-chloro-5-methylphenyl group, a 2-chloro-6-methylphenyl group, a 2-methyl-3-chlorophenyl group, a 2-methyl-4-chlorophenyl group, a 3-methyl-4-chlorophenyl group, a 2-chloro-4,6-dimethylphenyl group, a 2-methoxy-4-fluorophenyl group, a 2-fluoro-4-methoxyphenyl group, a 2-fluoro-4-ethoxyphenyl group, a 2-fluoro-6-methoxyphenyl group, a 3-fluoro-4-ethoxyphenyl group, a 3-chloro-4-methoxyphenyl group, a 2-methoxy-5-chlorophenyl group, a 3-methoxy-6-chlorophenyl group, a 5-chloro-2,4-dimethoxyphenyl group, and the like, but are not limited thereto.

Specific examples of the compound represented by Formula 16 comprise the following compounds (Nos. 1 to 100), but the present invention is not limited thereto.

1. 7-(N'-carbazolyl)-N,N-diphenyl-9H-fluorene-2-amine
2. 7-(N'-carbazolyl)-N-phenyl-N-(4'-methylphenyl)-9-methyl-9H-fluorene-2-amine
3. 7-(N'-carbazolyl)-N,N-diphenyl-9,9-diphenyl-9H-fluorene-2-amine
4. 7-(N'-carbazolyl)-N-phenyl-N-(3'-methylphenyl)-9,9-dimethyl-9H-fluorene-2-amine
5. 7-(N'-carbazolyl)-N-phenyl-N-(4'-methylphenyl)-9,9-dimethyl-9H-fluorene-2-amine
6. 7-(N'-carbazolyl)-N-phenyl-N-(4'-ethylphenyl)-9.9-dimethyl-9H-fluorene-2-amine
7. 7-(N'-carbazolyl)-N-phenyl-N-(4'-tert-butylphenyl)-9,9-dimethyl-9H-fluorene-2-amine
8. 7-(N'-carbazolyl)-N-phenyl-N-(3',4'-dimethylphenyl)-9,9-dimethyl-9H-fluorene-2-amine
9. 7-(N'-carbazolyl)-N-phenyl-N-(3',5'-dimethylphenyl)-9,9-dimethyl-9H-fluorene-2-amine
10. 7-(N'-carbazolyl)-N,N-di(3'-methylphenyl)-[0410]9,9-dimethyl-9H-fluorene-2-amine
11. 7-(N'-carbazolyl)-N,N-di(4'-methylphenyl)-9,9-dimethyl-9H-fluorene-2-amine
12. 7-(N'-carbazolyl)-N,N-di(4'-ethylphenyl)-9,9-dimethyl-9H-fluorene-2-amine
13. 7-(N'-carbazolyl)-N-phenyl-N-(3'-methoxyphenyl)-9,9-dimethyl-9H-fluorene-2-amine
14. 7-(N'-carbazolyl)-N-phenyl-N-(4'-methoxyphenyl)-9,9-dimethyl-9H-fluorene-2-amine
15. 7-(N'-carbazolyl)-N-phenyl-N-(4'-ethoxyphenyl)-9,9-dimethyl-9H-fluorene-2-amine
16. 7-(N'-carbazolyl)-N-phenyl-N-(4'-n-buthoxyphenyl)-9,9-dimethyl-9H-fluorene-2-amine
17. 7-(N'-carbazolyl)-N,N-di(4'-methoxyphenyl)-9,9-dimethyl-9H-fluorene-2-amine
18. 7-(N'-carbazolyl)-N-(3'-methylphenyl)-N-(4"-methoxyphenyl)-9,9-dimethyl-9H -fluorene-2-amine
19. 7-(N'-carbazolyl)-N-(4'-methylphenyl)-N-(4"-methoxyphenyl)-9,9-dimethyl-9H -fluorene-2-amine
20. 7-(N'-carbazolyl)-N-phenyl-N-(3'-fluorophenyl)-9,9-dimethyl-9H-fluorene-2-amine
21. 7-(N'-carbazolyl)-N-phenyl-N-(4'-chlorophenyl)-9,9-dimethyl-9H-fluorene-2-amine
22. 7-(N'-carbazolyl)-N-phenyl-N-(4'-phenylphenyl)-9,9-dimethyl-9H-fluorene-2-amine 23. 7-(N'-carbazolyl)-N-phenyl-N-(1'-naphthyl)-9,9-dimethyl-9H-fluorene-2-amine 24. 7-(N'-carbazolyl)-N-phenyl-N-(2'-naphthyl)-9,9-dimethyl-9H-fluorene-2-amine 25. 7-(N'-carbazolyl)-N-(4'-methylphenyl)-N-(2"-naphthyl)-9,9-dimethyl-9H-fluorene-2-amine 26. 7-(N'-carbazolyl)-N-phenyl-N-(2'-furyl)-9,9-dimethyl-9H-fluorene-2-amine 27. 7-(N'-carbazolyl)-N-phenyl-N-(2'-thienyl)-9,9-dimethyl-9H-fluorene-2-amine 28. 7-(N'-carbazolyl)-N,N-diphenyl-4-fluoro-9,9-dimethyl-9H-fluorene-2-amine 29. 7-(N'-carbazolyl)-N,N-diphenyl-3-methoxy-9,9-dimethyl-9H-fluorene-2-amine 30. 7-(N'-carbazolyl)-N,N-diphenyl-4-phenyl-9,9-dimethyl-9H-fluorene-2-amine 31. 7-(3'-methyl-N'-carbazolyl)-N,N-diphenyl-9,9-dimethyl-9H-fluorene-2-amine 32. 7-(3'-methoxy-N'-carbazolyl)-N,N-diphenyl-9,9-dimethyl-9H-fluorene-2-amine 33. 7-(3'-chloro-N'-carbazolyl)-N,N-diphenyl-9,9-dimethyl-9H-fluorene-2-amine 34. 2,7-di(N-carbazolyl)-9,9-dimethyl-9H-fluorene 35. 7-(N'-phenoxazyl)-N,N-diphenyl-9,9-dimethyl-9H-fluorene-2-amine 36. 7-(N'-phenoxazyl)-N,N-di(4'-methylphenyl)-9,9-dimethyl-9H-fluorene-2-amine 37. 2,7-di(N-phenoxazyl)-9,9-dimethyl-9H-fluorene 38. 7-(N'-phenothiazyl)-N,N-diphenyl-9,9-dimethyl-9H-fluorene-2-amine 39. 7-(N'-phenothiazyl)-N-phenyl-N-(3'-methylphenyl)-9,9-dimethyl-9H-fluorene-2-amine 40. 7-(N'-phenothiazyl)-N-phenyl-N-(4'-methylphenyl)-9,9-dimethyl-9H-fluorene-2-amine 41. 7-(N'-phenothiazyl)-N,N-di(4'-methylphenyl)-9,9-dimethyl-9H-fluorene-2-amine 42. 7-(N'-phenothiazyl)-N-phenyl-N-(4'-methoxyphenyl)-9,9-dimethyl-9H-fluorene-2-amine 43. 7-(N'-phenothiazyl)-N-phenyl-N-(2'-naphthyl)-9,9-dimethyl-9H-fluorene-2-amine 44. 2,7-di(N-phenothiazyl)-9,9-dimethyl-9H-fluorene 45. 7-(N'-carbazolyl)-N,N-diphenyl-9,9-diethyl-9H-fluorene-2-amine 46. 7-(N'-carbazolyl)-N-phenyl-N-(4'-methylphenyl)-[0446]9,9-diethyl-9H-fluorene-2-amine 47. 7-(N'-carbazolyl)-N,N-di(4'-methylphenyl)-9,9-diethyl-9H-fluorene-2-amine 48. 7-(N'-carbazolyl)-N-phenyl-N-(3'-methoxyphenyl)-9,9-diethyl-9H-fluorene-2-amine 49. 7-(N'-carbazolyl)-N,N-diphenyl-4-methyl-9,9-diethyl-9H-fluorene-2-amine 50. 7-(N'-carbozolyl)-N,N-diphenyl-9-isopropyl-9H-fluorene-2-amine 51. 7-(N'-carbazolyl)-N,N-diphenyl-9,9-di-n-propyl-9H-fluorene-2-amine 52. 7-(N'-carbazolyl)-N-phenyl-N-(4'-methylphenyl)-9,9-di-n-propyl-9H-fluorene-2-amine 53. 7-(N'-carbazolyl)-N-phenyl-N-(4'-methoxyphenyl)-9,9-di-n-propyl-9H-fluorene-2-amine 54. 2,7-di(N-carbazolyl)-9,9-di-n-propyl-9H-fluorene 55. 2,7-di(N-phenoxazyl)-9,9-di-n-propyl-9H-fluorene 56. 7-(N'-carbazolyl)-N,N-diphenyl-9,9-di-n-butyl-9H-fluorene-2-amine 57. 7-(N'-carbazolyl)-N,N-di(4'-methylphenyl)-9,9-di-n-butyl-9H-fluorene-2-amine 58. 2,7-di(N'-carbazolyl)-9,9-di-n-butyl-9H-fluorene 59. 7-(N'-carbazolyl)-N-phenyl-N-(4'-methoxyphenyl)-9,9-di-n-pentyl-9H-fluorene-2-amine 60. 7-(N'-phenoxazyl)-N-phenyl-N-(3'-methoxyphenyl)-9,9-di-n-pentyl-9H-fluorene-2-amine 61. 7-(N'-carbazolyl)-N,N-di(4"-methoxyphenyl)-9,9-di-n-pentyl-9H-fluorene-2-amine 62. 2,7-di(N'-carbazolyl)-9,9-di-n-pentyl-9H-fluorene 63. 7-(N'-carbazolyl)-N,N-diphenyl-9,9-di-n-hexyl-9H-fluorene-2-amine 64. 7-(N'-carbazolyl)-N,N-di(4'-methylphenyl)-9,9-di-n-hexyl-9H-fluorene-2-amine 65. 7-(N'-carbazolyl)-N,N-diphenyl-9-cyclohexyl-9H-fluorene-2-amine 66. 7-(N'-carbazolyl)-N,N-diphenyl-9,9-di-n-octyl-9H-fluorene-2-amine 67. 7-(N'-phenoxazyl)-N,N-di(4'-methylphenyl)-9,9-di-n-octyl-9H-fluorene-2-amine 68. 7-(N'-carbazolyl)-N,N-diphenyl-9-methyl-9-ethyl-9H-fluorene-2-amine 69. 7-(N'-carbazolyl)-N,N-diphenyl-9-methyl-9-n-propyl-9H-fluorene-2-amine 70. 7-(N'-phenothiazyl)-N,N-diphenyl-9-methyl-9-n-propyl-9H-fluorene-2-amine 71. 7-(N'-carbazolyl)-N,N-diphenyl-9-ethyl-9-n-hexyl-9H-fluorene-2-amine 72. 7-(N'-carbazolyl)-N,N-diphenyl-9-ethyl-9-cyclohexyl-9H-fluorene-2-amine 73. 7-(N'-carbazolyl)-N,N-diphenyl-9-benzyl-9H-fluorene-2-amine 74. 7-(N'-carbazolyl)-N,N-diphenyl-9,9-dibenzyl-9H-fluorene-2-amine 75. 7-(N'-carbazolyl)-N,N-diphenyl-9,9-di(4'-methylbenzyl)-9H-fluorene-2-amine 76. 7-(N'-carbazolyl)-N,N-diphenyl-9,9-di(4'-methoxybenzyl)-9H-fluorene-2-amine 77. 7-(N'-carbazolyl)-N-phenyl-N-(4'-methylphenyl)-9,9-dibenzyl-9H-fluorene-2-amine 78. 7-(N'-carbazolyl)-N,N-di(4'-methylphenyl)-9,9-dibenzyl-9H-fluorene-2-amine 79. 7-(N'-carbazolyl)-N-phenyl-N-(4'-methoxyphenyl)-9,9-dibenzyl-9H-fluorene-2-amine 80. 7-(N'-carbazolyl)-N-phenyl-N-(4'-phenylphenyl)-9,9-dibenzyl-9H-fluorene-2-amine 81. 7-(N'-carbazolyl)-N-phenyl-N-(2'-naphthyl)-9,9-dibenzyl-9H-fluorene-2-amine 82. 7-(N'-phenoxazyl)-N-phenyl-N-(4'-methylphenyl)-[0482]9,9-dibenzyl-9H -fluorene-2-amine 83. 7-(N'-phenothiazyl)-N,N-di(4'-methylphenyl)-9,9-dibenzyl-9H-fluorene-2-amine 84. 2,7-di(N-carbazolyl)-9,9-dibenzyl-9H-fluorene 85. 2,7-di(N-carbazolyl)-9,9-di(4'-methylbenzyl)-9H-fluorene 86. 2-(N-carbazolyl)-7-(N'-phenothiazyl)-9,9-dibenzyl-9H-fluorene 87. 7-(N'-carbazolyl)-N,N-diphenyl-9-methyl-9-benzyl-9H-fluorene-2-amine 88. 7-(N'-phenoxazyl)-N,N-diphenyl-9-ethyl-9-benzyl-9H-fluorene-2-amine 89. 7-(N'-carbazolyl)-N,N-diphenyl-9,9-diphenyl-9H-fluorene-2-amine 90. 7-(N'-carbazolyl)-N-phenyl-N-(4'-methylphenyl)-9,9-diphenyl-9H-fluorene-2-amine 91. 7-(N'-carbazolyl)-N,N-di(4'-methylphenyl)-9,9-diphenyl-9H-fluorene-2-amine 92. 7-(N'-carbazolyl)-N-phenyl-N-(3'-methylphenyl)-9,9-di(4"-methylphenyl)-9H -fluorene-2-amine 93. 7-(N'-carbazolyl)-N-phenyl-N-(3'-methylphenyl)-9,9-di(4"-methoxyphenyl)-9H -fluorene-2-amine 94. 7-(N'-phenoxazyl)-N,N-di(4'-methylphenyl)-9,9-diphenyl-9H-fluorene-2-amine 95. 7-(N'-phenothiazyl)-N,N-diphenyl-9,9-diphenyl-9H-fluorene-2-amine 96. 2.7-di(N'-carbazolyl)-9,9-di(4'-methylphenyl)-9H-fluorene 97. 2-(N-carbazolyl)-7-(N'-phenoxazyl)-9,9-diphenyl-9H-fluorene 98. 2-(N-phenoxazyl)-7-(N'-phenothiazyl)-9,9-diphenyl-9H-fluorene 99. 7-(N'-carbazolyl)-N-phenyl-N-(4'-methylphenyl)-9-methyl-9-phenyl-9H-fluorene-2-amine 100. 7-(N'-carbazolyl)-N,N-diphenyl-9-ethyl-9-phenyl-9H-fluorene-2-amine As the materials for the hole-injection layer and hole transporting layer, the above-mentioned substances may be used. However, porphyrin compounds (disclosed in Japanese Patent Application Laid-Open No. Sho 63-295695, and the like), aromatic tertiary amine compounds and styrylamine compounds (see U.S. Pat. No. 4,127,412, Japanese Patent Application Laid-Open Nos. Sho 53-27033, Sho 54-58445, Sho 55-79450, Sho 55-144250, Sho 56-119132, Sho 61-295558, Sho 61-98353, Sho 63-295695, and the like) are used, and particularly aromatic tertiary amine compounds may be used.

Further, for example, 4,4'-bis(N-(1-naphthyl)-N-phenylamino)biphenyl (hereinafter, it is abbreviated by NPD), which has in the molecule thereof two condensed aromatic rings, disclosed in U.S. Pat. No. 5,061,569, 4,4',4"-tris(N-(3-methylphenyl)-N-phenylamino)triphenylamine (hereinafter, it is abbreviated by MTDATA) wherein three triphenylamine units are linked to each other in a star-burst form, disclosed in Japanese Patent Application Laid-Open No. Hei 4-308688, and the like may be used.

When these compounds are disposed between the anode and the light emitting layer and in contact with the light emitting layer, the material to be comprised between the light emitting layer and the cathode may comprise one or more of the above-described compounds represented by Formulas 1 to 4.

In the organic light emitting diode according to the present invention, the organic material layer comprising a compound having a fluorescent light emitting efficiency equal to or greater than the fluorescent light emitting efficiency of NPB between the anode and the light emitting layer may additionally comprise a p-type dopant. The p-type dopant may comprise $F_4$-TCNQ, $FeCl_3$, and the like, but is not limited thereto.

The $F_4$-TCNQ has a HOMO energy level of −8.53 eV and a LUMO energy level of −6.23 eV, and has the following structural formula.

[$F_4$-TCNQ]

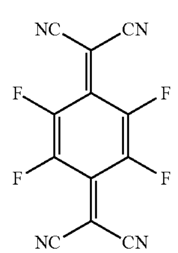

In the present invention, the organic material layer comprising a compound having a fluorescent light emitting efficiency equal to or greater than the fluorescent light emitting efficiency of NPB between the anode and the light emitting layer may reduce the driving voltage of the organic light emitting diode by additionally comprising a p-type dopant.

A preferred embodiment of the present invention is a diode containing a reducing dopant in an electron-transporting region or in an interfacial region between the cathode and the organic layer.

A specific embodiment of the present invention comprises one or more selected from the group consisting of the compounds represented by Formulas 1 to 4 in the electron-transporting region or in the interfacial region between the cathode and the organic layer, and may additionally comprise a reducing dopant which will be described below.

Here, the reducing dopant is defined as a substance which may reduce an electron-transporting compound. Accordingly, various substances which have certain reducing properties may be used. For example, at least one substance selected from the group consisting of alkali metals, alkaline earth metals, rare earth metals, alkali metal oxides, alkali metal halides, alkaline earth metal oxides, alkaline earth metal halides, rare earth metal oxides or rare earth metal halides, alkali metal organic complexes, alkaline earth metal organic complexes, and rare earth metal organic complexes may be preferably used.

Further, more specifically, preferable reducing dopants comprise at least one alkali metal selected from the group consisting of Na (work function: 2.36 eV), K (work function: 2.28 eV), Rb (work function: 2.16 eV) and Cs (work function: 1.95 eV); or at least one alkaline earth metal selected from the group consisting of Ca (work function: 2.9 eV), Sr (work function: 2.0 to 2.5 eV) and Ba (work function: 2.52 eV). However, a substance having a work function of 2.9 eV or less is particularly preferable. Among these, a more preferable reducing dopant is at least one alkali metal selected from the group consisting of K, Rb and Cs. Rb or Cs is even more preferable, and Cs is most preferable. These alkali metals are particularly excellent in reducing ability. Thus, the addition of a relatively small amount thereof to an electron-injecting zone improves the light emission luminance of the organic light emitting diode or makes the service life thereof long. As the reducing dopant having a work function of 2.9 eV or less, a combination of two or more of these alkali metals is also preferred. Combinations containing Cs, for example, combinations of Cs and Na, Cs and K, Cs and Rb, or Cs, Na and K are particularly preferable. The combination containing Cs makes it possible to exhibit the reducing ability efficiently. The light emission luminance of the organic light emitting diode may be improved or the service life thereof may be made long by the addition thereof to its electron-injecting zone. Further, as the reducing dopant, alkali metal complexes such as LiQ, NaQ, and the like may be applied.

The content of the reducing dopant is not particularly limited, and may be appropriately selected by thosed skilled in the art, according to its use and characteristics. More specifically, the content of the reducing dopant may be 0.01 to 90 wt % based on the total weight of materials constituting the electron transporing layer, but is not limited thereto.

In the present invention, an electron injection layer formed of an insulator or a semiconductor may be additionally provided between the cathode and the organic material layer. Accordingly, current leakage may be effectively prevented to improve the injection of electrons. As the insulator, at least one metal compound selected from the group consisting of alkali metal calcogenides, alkaline earth metal calcogenides, alkali metal halides, and alkaline earth metal halides may be preferably used. When the electron injection layer is formed of these alkali metal calcogenides, and the like, the injection of electrons may be preferably further improved.

Specifically preferable alkali metal calcogenides comprise, for example, $Li_2O$, LiO, $Na_2S$, $Na_2Se$, NaO, and the like, and preferable alkaline earth metal calcogenides comprise, for example, CaO, BaO, SrO, BeO, BaS, CaSe, and the like. Further, preferable alkali metal halides comprise, for example, LiF, NaF, KF, LiCl, KCl, NaCl, and the like. In addition, preferable alkaline earth metal halides comprise, for example, fluorides such as $CaF_2$, $BaF_2$, $SrF_2$, $MgF_2$ and $BeF_2$, or halides other than fluorides.

In the organic light emitting diode according to the present invention, the light emitting layer may comprise a phosphorescent material or fluorescent material. The phosphorescent material may comprise green phosphorescent materials, red phosphorescent materials, blue phosphorescent materials, and the like, but is not limited thereto.

For the cathode, metals, alloys, electroconductive compounds, and mixtures thereof, which have a small work function (4 eV or less) are used as an electrode material. Specific examples of the electrode material comprise sodium, sodium-potassium alloys, magnesium, lithium, magnesium•silver alloys, aluminum/aluminum oxide, aluminum•lithium alloys, indium, rare earth metals, and the like.

This cathode may be manufactured by forming the electrode materials into a thin film by methods, such as deposition, sputtering, and the like.

When light emission from the light emitting layer is outcoupled through the cathode, it is preferred to make the transmittance of the cathode to the light emission larger than 10%.

Further, the sheet resistance of the cathode is preferably several hundreds Ω/□ or less, and the film thickness thereof is usually 5 nm to 1 μm, and preferably 50 to 200 nm.

In addition, when the cathode is formed of a semi-transparent semi-reflective electrode, the thickness of the above-mentioned material may be adjusted.

For example, the organic light emitting diode according to the present invention may be manufactured by depositing a metal or a metal oxide having conductivity, or an alloy thereof on a substrate to form an anode by using a physical vapor deposition (PVD) method such as sputtering or e-beam evaporation, forming an organic material layer which comprises a hole injection layer, a hole transporting layer, a light emitting layer, and an electron transporting layer thereon, and then depositing a material which may be used as a cathode thereon. In addition to these methods, an organic light emitting diode may be manufactured by sequentially depositing a cathode material, an organic material layer and an anode material on a substrate.

The organic material layer may be a multi-layer structure comprising the hole injection layer, the hole transporting layer, the light emitting layer, the electron transporting layer, and the like, but may also be a mono-layer structure without being limited thereto. Further, the organic material layer may be manufactured with fewer layers by using various polymer materials formed by a solvent process other than a deposition method, for example, methods, such as spin coating, dip coating, doctor blading, screen printing, inkjet printing, or thermal transfer method, and the like.

Hereinafter, the present invention will be described in more detail through Examples. However, the following Examples are only for the illustration of the present invention and the scope of the present invention is not to be construed as being limited by the Examples.

EXAMPLE

The compounds used in Examples 1 to 24 and Comparative Examples 1 to 8 are as follows.

[cp1]

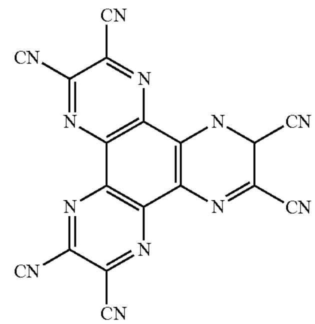

[cp2]

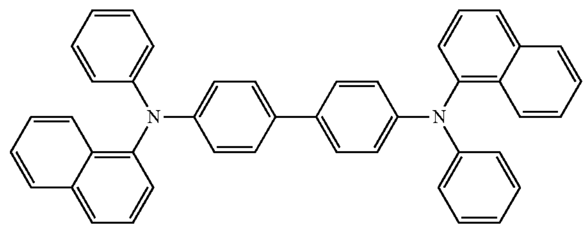

[cp3]

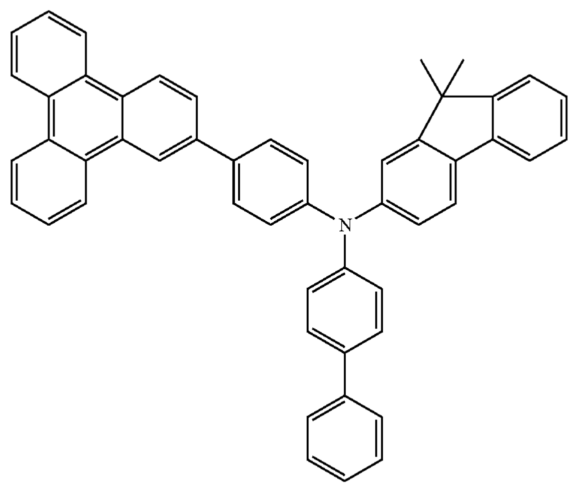

[cp4]

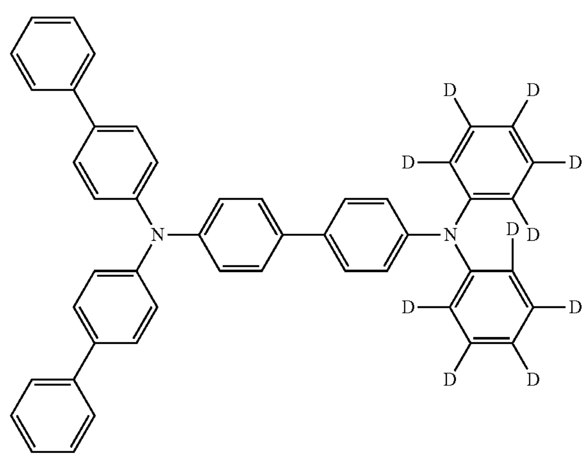

-continued
[cp5]
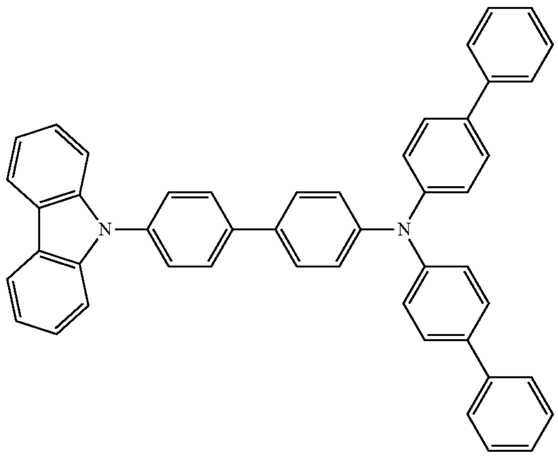
[cp6]
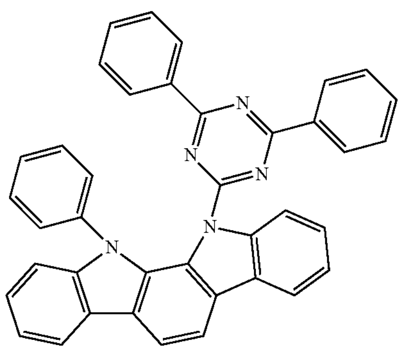
[cp7]
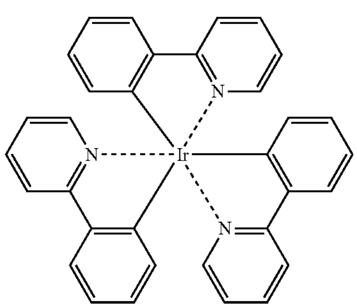
-continued
[cp8]
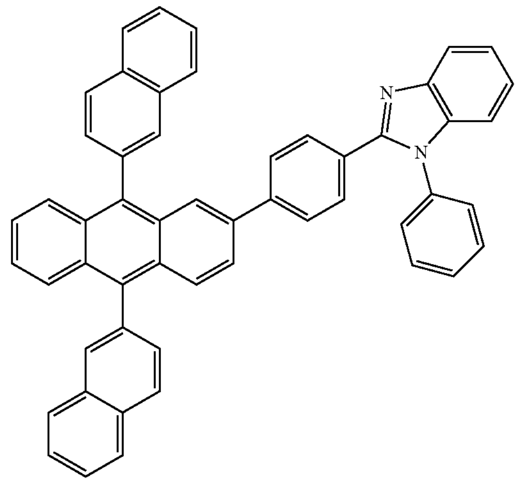
[cp9]
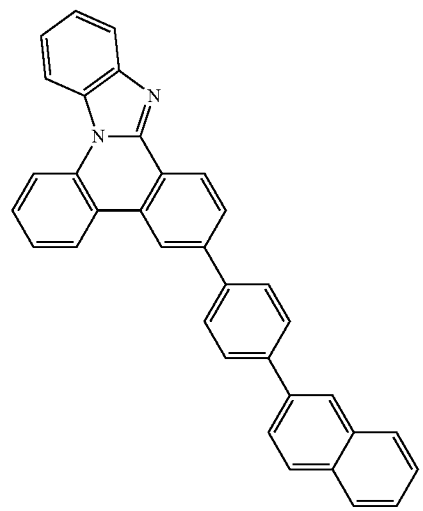
[cp10]
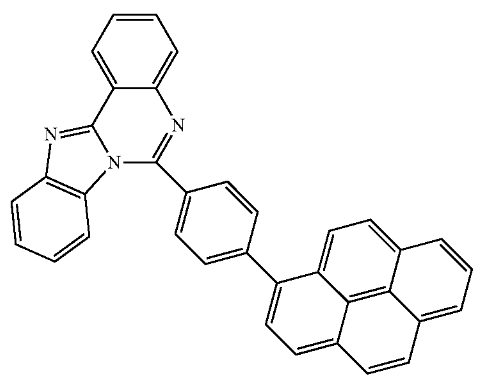
[cp11]
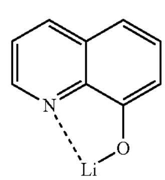

-continued
[cp12]
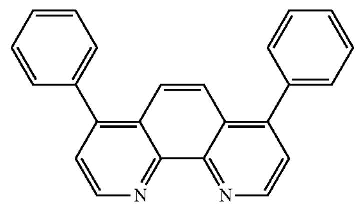
[cp13]
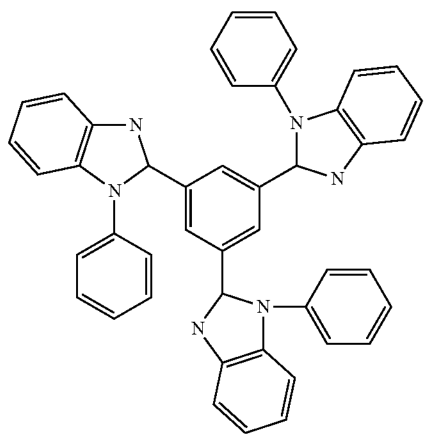
[cp14]
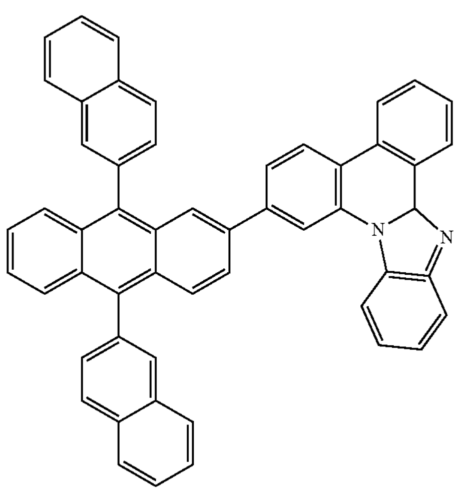
[cp15]
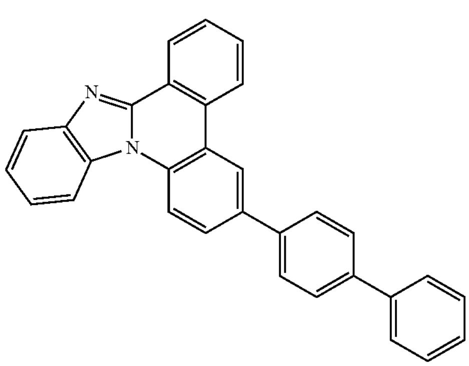
-continued
[cp16]
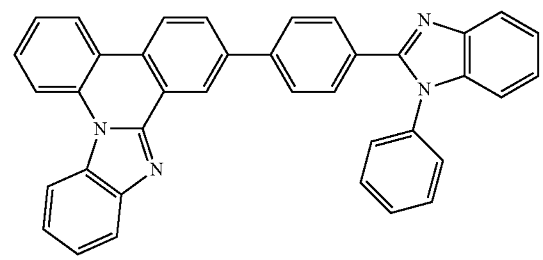
[cp17]
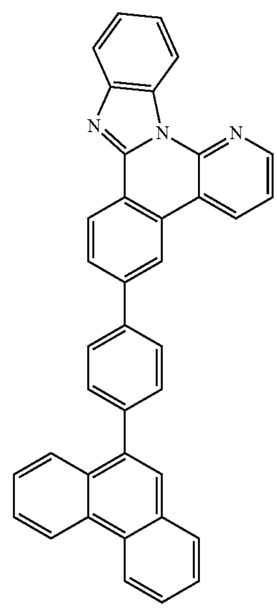
[cp18]
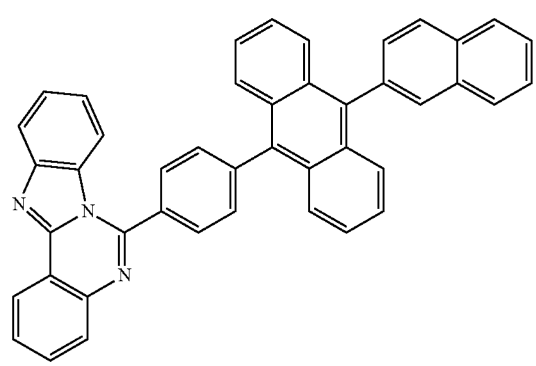

-continued

[cp19]

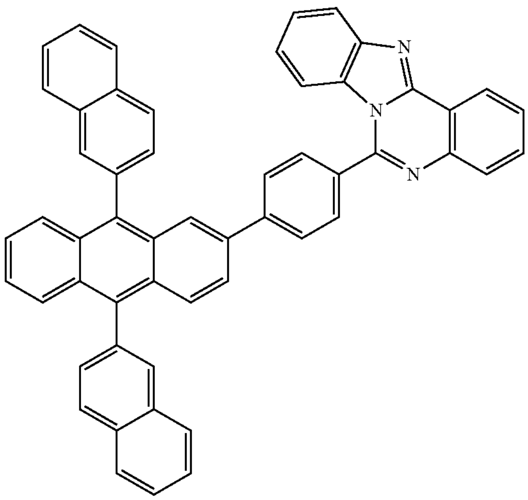

In order to measure the fluorescent light emission efficiencies of cp2 to cp5 as hole injection materials used in Examples and Comparative Examples, each of cp2 to cp5 was deposited to a thickness of 100 nm on a glass substrate by heating each of the materials in vacuum.

Figure 2:
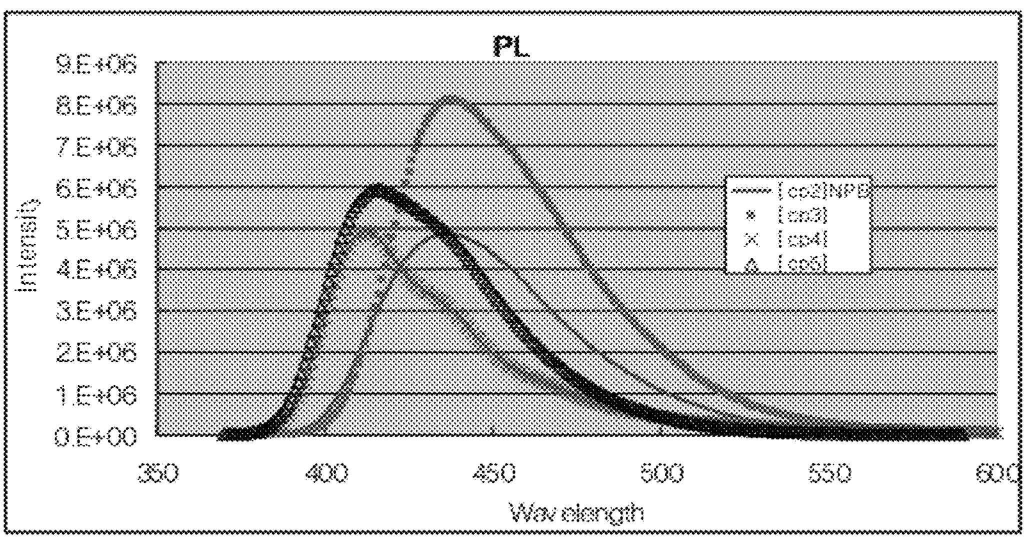
FIG. 2 is a PL spectrum when light having a wavelength of 350 nm is irradiated with a 400 W xenon lamp after hole transporting materials used in Examples 1 to 16 and Comparative Examples 1 to 8 are deposited onto a glass substrate to a thickness of 100 nm.

Light having a wavelength of 350 nm was irradiated on a film on which each of cp2 to cp5 was deposited to a thickness of 100 nm by using a 400 W Xenon lamp as a light source, and a PL spectrum was obtained and shown in FIG. 2. In FIG. 2, it is determined that the intensity of max. PL spectra of specimens on which cp3 to cp5 were deposited was higher than that of max. PL spectrum of specimens on which cp2, which is NPB was deposited.

EXAMPLE 1

A transparent electrode (Indium Tin Oxide) was deposited as a hole injection electrode to a thickness of 100 nm on a glass substrate, and was subjected to oxygen plasma at a pressure of 30 mTorr and a power of 80 w for 30 sec. [cp1] was deposited to a thickness of 30 nm thereon by heating the compound [cp1] in vacuum. [cp2] which was NPB as a hole injection layer was deposited to a thickness of 100 nm thereon. [cp7] as a light emitting dopant was doped in an amount of 16% while [cp6] as a light emitting layer was deposited to a thickness of 30 nm thereon. Subsequently, an organic light emitting diode was manufactured by depositing [cp8], which is a part of Formula 1, as an electron transporting and injection layer to a thickness of 20 nm thereon, depositing LiF as an electron injection layer to a thickness of 1 nm thereon, and depositing Al as an electron injection electrode to a thickness of 150 nm thereon.

EXAMPLE 2

An organic light emitting diode was manufactured in the same manner as in Example 1, except that [cp3], which is a part of Formula 4, was used instead of [cp2] which was NPB as a hole transporting layer in Example 1.

EXAMPLE 3

An organic light emitting diode was manufactured in the same manner as in Example 1, except that [cp4], which is a part of Formula 10 was used instead of [cp2] which was NPB as a hole transporting layer in Example 1.

EXAMPLE 4

An organic light emitting diode was manufactured in the same manner as in Example 1, except that [cp5], which is a part of Formula 11, was used instead of [cp2] which was NPB as a hole transporting layer in Example 1.

EXAMPLE 5

An organic light emitting diode was manufactured in the same manner as in Example 1, except that [cp8] and [cp11], which are a part of Formula 1, as an electron transporting layer were mixed in a ratio of 1:1 and deposited to a thickness of 20 nm in Example 1.

EXAMPLE 6

An organic light emitting diode was manufactured in the same manner as in Example 2, except that [cp8] and [cp11], which are a part of Formula 1 as an electron transporting layer were mixed in a ratio of 1:1 and deposited to a thickness of 20 nm in Example 2.

EXAMPLE 7

An organic light emitting diode was manufactured in the same manner as in Example 3, except that [cp8] and [cp11], which are a part of Formula 1 as an electron transporting layer were mixed in a ratio of 1:1 and deposited to a thickness of 20 nm in Example 3.

EXAMPLE 8

An organic light emitting diode was manufactured in the same manner as in Example 4, except that [cp8] and [cp11], which are a part of Formula 1 as an electron transporting layer were mixed in a ratio of 1:1 and deposited to a thickness of 20 nm in Example 4.

EXAMPLE 9

An organic light emitting diode was manufactured in the same manner as in Example 1, except that [cp9], which is a part of Formula 3, as an electron transporting layer was deposited to a thickness of 20 nm in Example 1.

EXAMPLE 10

An organic light emitting diode was manufactured in the same manner as in Example 2, except that [cp9], which is a part of Formula 3, as an electron transporting layer was deposited to a thickness of 20 nm in Example 2.

EXAMPLE 11

An organic light emitting diode was manufactured in the same manner as in Example 3, except that [cp9], which is a part of Formula 3, as an electron transporting layer was deposited to a thickness of 20 nm in Example 3.

EXAMPLE 12

An organic light emitting diode was manufactured in the same manner as in Example 4, except that [cp9], which is a part of Formula 3, as an electron transporting layer was deposited to a thickness of 20 nm in Example 4.

EXAMPLE 13

An organic light emitting diode was manufactured in the same manner as in Example 9, except that [cp9] and [cp11], which are a part of Formula 3, as an electron transporting layer were mixed in a ratio of 1:1 and deposited to a thickness of 20 nm in Example 9.

EXAMPLE 14

An organic light emitting diode was manufactured in the same manner as in Example 10, except that [cp9] and [cp11], which are a part of Formula 3, as an electron transporting layer were mixed in a ratio of 1:1 and deposited to a thickness of 20 nm in Example 10.

EXAMPLE 15

An organic light emitting diode was manufactured in the same manner as in Example 11, except that [cp9] and [cp11], which are a part of Formula 3, as an electron transporting layer were mixed in a ratio of 1:1 and deposited to a thickness of 20 nm in Example 11.

EXAMPLE 16

An organic light emitting diode was manufactured in the same manner as in Example 12, except that [cp9] and [cp11], which are a part of Formula 3, as an electron transporting layer were mixed in a ratio of 1:1 and deposited to a thickness of 20 nm in Example 12.

EXAMPLE 17

An organic light emitting diode was manufactured in the same manner as in Example 1, except that [cp10], which is a part of Formula 4, as an electron transporting layer was deposited to a thickness of 20 nm in Example 1.

EXAMPLE 18

An organic light emitting diode was manufactured in the same manner as in Example 2, except that [cp10], which is a part of Formula 4, as an electron transporting layer was deposited to a thickness of 20 nm in Example 2.

EXAMPLE 19

An organic light emitting diode was manufactured in the same manner as in Example 3, except that [cp10], which is a part of Formula 4, as an electron transporting layer was deposited to a thickness of 20 nm in Example 3.

EXAMPLE 20

An organic light emitting diode was manufactured in the same manner as in Example 4, except that [cp10], which is a part of Formula 4, as an electron transporting layer was deposited to a thickness of 20 nm in Example 4.

EXAMPLE 21

An organic light emitting diode was manufactured in the same manner as in Example 9, except that [cp10] and [cp11], which are a part of Formula 4, as an electron transporting layer were mixed in a ratio of 1:1 and deposited to a thickness of 20 nm in Example 9.

EXAMPLE 22

An organic light emitting diode was manufactured in the same manner as in Example 10, except that [cp10] and [cp11], which are a part of Formula 4, as an electron transporting layer were mixed in a ratio of 1:1 and deposited to a thickness of 20 nm in Example 10.

EXAMPLE 23

An organic light emitting diode was manufactured in the same manner as in Example 11, except that [cp10] and [cp11], which are a part of Formula 4, as an electron transporting layer were mixed in a ratio of 1:1 and deposited to a thickness of 20 nm in Example 11.

EXAMPLE 24

An organic light emitting diode was manufactured in the same manner as in Example 12, except that [cp10] and [cp11], which are a part of Formula 4, as an electron transporting layer were mixed in a ratio of 1:1 and deposited to a thickness of 20 nm in Example 12.

EXAMPLE 25

An organic light emitting diode was manufactured in the same manner as in Example 5, except that [cp14] and [cp11], which are a part of Formula 3, as an electron transporting layer were mixed in a ratio of 1:1 and deposited to a thickness of 20 nm in Example 5.

EXAMPLE 26

An organic light emitting diode was manufactured in the same manner as in Example 6, except that [cp14] and [cp11], which are a part of Formula 3, as an electron transporting layer were mixed in a ratio of 1:1 and deposited to a thickness of 20 nm in Example 6.

EXAMPLE 27

An organic light emitting diode was manufactured in the same manner as in Example 7, except that [cp15] and [cp11], which are a part of Formula 3, as an electron transporting layer were mixed in a ratio of 1:1 and deposited to a thickness of 20 nm in Example 7.

EXAMPLE 28

An organic light emitting diode was manufactured in the same manner as in Example 8, except that [cp15] and [cp11], which are a part of Formula 3, as an electron transporting layer were mixed in a ratio of 1:1 and deposited to a thickness of 20 nm in Example 8.

EXAMPLE 29

An organic light emitting diode was manufactured in the same manner as in Example 5, except that [cp16] and [cp11], which are a part of Formula 3, as an electron transporting layer were mixed in a ratio of 1:1 and deposited to a thickness of 20 nm in Example 5.

EXAMPLE 30

An organic light emitting diode was manufactured in the same manner as in Example 6, except that [cp16] and [cp11], which are a part of Formula 3, as an electron transporting layer were mixed in a ratio of 1:1 and deposited to a thickness of 20 nm in Example 6.

EXAMPLE 31

An organic light emitting diode was manufactured in the same manner as in Example 7, except that [cp17] and [cp11], which are a part of Formula 4, as an electron transporting layer were mixed in a ratio of 1:1 and deposited to a thickness of 20 nm in Example 7.

EXAMPLE 32

An organic light emitting diode was manufactured in the same manner as in Example 8, except that [cp17] and [cp11], which are a part of Formula 4, as an electron transporting layer were mixed in a ratio of 1:1 and deposited to a thickness of 20 nm in Example 8.

EXAMPLE 33

An organic light emitting diode was manufactured in the same manner as in Example 5, except that [cp18] and [cp11], which are a part of Formula 4, as an electron transporting layer were mixed in a ratio of 1:1 and deposited to a thickness of 20 nm in Example 5.

EXAMPLE 34

An organic light emitting diode was manufactured in the same manner as in Example 6, except that [cp18] and [cp11], which are a part of Formula 4, as an electron transporting layer were mixed in a ratio of 1:1 and deposited to a thickness of 20 nm in Example 6.

EXAMPLE 35

An organic light emitting diode was manufactured in the same manner as in Example 7, except that [cp19] and [cp11], which are a part of Formula 4, as an electron transporting layer were mixed in a ratio of 1:1 and deposited to a thickness of 20 nm in Example 7.

EXAMPLE 36

An organic light emitting diode was manufactured in the same manner as in Example 8, except that [cp19] and [cp11], which are a part of Formula 4, as an electron transporting layer were mixed in a ratio of 1:1 and deposited to a thickness of 20 nm in Example 8.

COMPARATIVE EXAMPLE 1

An organic light emitting diode was manufactured in the same manner as in Example 1, except that [cp11] as an electron transporting layer was deposited to a thickness of 20 nm in Example 1.

COMPARATIVE EXAMPLE 2

An organic light emitting diode was manufactured in the same manner as in Example 2, except that [cp11] as an electron transporting layer was deposited to a thickness of 20 nm in Example 2.

COMPARATIVE EXAMPLE 3

An organic light emitting diode was manufactured in the same manner as in Example 3, except that [cp11] as an electron transporting layer was deposited to a thickness of 20 nm in Example 3.

COMPARATIVE EXAMPLE 4

An organic light emitting diode was manufactured in the same manner as in Example 4, except that [cp11] as an electron transporting layer was deposited to a thickness of 20 nm in Example 4.

COMPARATIVE EXAMPLE 5

An organic light emitting diode was manufactured in the same manner as in Example 1, except that [cp12] as an electron transporting layer was deposited to a thickness of 20 nm in Example 1.

COMPARATIVE EXAMPLE 6

An organic light emitting diode was manufactured in the same manner as in Example 2, except that [cp12] as an electron transporting layer was deposited to a thickness of 20 nm in Example 2.

COMPARATIVE EXAMPLE 7

An organic light emitting diode was manufactured in the same manner as in Example 3, except that [cp12] as an electron transporting layer was deposited to a thickness of 20 nm in Example 3.

COMPARATIVE EXAMPLE 8

An organic light emitting diode was manufactured in the same manner as in Example 4, except that [cp12] as an electron transporting layer was deposited to a thickness of 20 nm in Example 4.

Diode characteristics of the thus-manufactured diodes, which were measured at a current density of 20 $mA/cm^2$, were shown in the following Table 1.

TABLE 1

| Classification | V | Cd/A | CIE-x | CIE-y |
|---|---|---|---|---|
| Example 1 | 5.206 | 37.68 | 0.3714 | 0.5956 |
| Example 2 | 5.325 | 42.585 | 0.3656 | 0.6005 |
| Example 3 | 5.681 | 16.54 | 0.3701 | 0.5982 |
| Example 4 | 5.426 | 37.77 | 0.3751 | 0.5922 |
| Example 5 | 4.45 | 36.78 | 0.3708 | 0.5955 |
| Example 6 | 4.569 | 40.005 | 0.3731 | 0.5942 |
| Example 7 | 5.653 | 16.85 | 0.3711 | 0.5974 |
| Example 8 | 5.222 | 37.615 | 0.3759 | 0.5919 |
| Example 9 | 6.117 | 39.14 | 0.3722 | 0.5954 |
| Example 10 | 5.538 | 42.91 | 0.3646 | 0.6014 |
| Example 11 | 7.697 | 23.315 | 0.3651 | 0.5999 |
| Example 12 | 6.196 | 43.14 | 0.3647 | 0.601 |
| Example 13 | 5.016 | 38.475 | 0.3696 | 0.5971 |
| Example 14 | 4.596 | 40.87 | 0.3707 | 0.5966 |

TABLE 1-continued

| Classification | V | Cd/A | CIE-x | CIE-y |
|---|---|---|---|---|
| Example 15 | 7.653 | 22.915 | 0.3657 | 0.5994 |
| Example 16 | 5.325 | 42.585 | 0.3656 | 0.6005 |
| Example 17 | 4.539 | 40.53 | 0.3785 | 0.5917 |
| Example 18 | 4.767 | 40.395 | 0.3775 | 0.592 |
| Example 19 | 5.57 | 39.925 | 0.377 | 0.5927 |
| Example 20 | 5.354 | 39.9 | 0.3773 | 0.5927 |
| Example 21 | 3.988 | 39.775 | 0.3771 | 0.5928 |
| Example 22 | 4.169 | 39.11 | 0.3774 | 0.5927 |
| Example 23 | 4.284 | 39.39 | 0.3762 | 0.5932 |
| Example 24 | 4.612 | 39.275 | 0.3769 | 0.593 |
| Example 25 | 5.566 | 34.83 | 0.358 | 0.605 |
| Example 26 | 5.794 | 28.18 | 0.355 | 0.600 |
| Example 27 | 5.471 | 27.724 | 0.358 | 0.601 |
| Example 28 | 5.462 | 32.3 | 0.359 | 0.604 |
| Example 29 | 5.54 | 32.49 | 0.360 | 0.6026 |
| Example 30 | 5.666 | 34.432 | 0.359 | 0.603 |
| Example 31 | 5.834 | 27.756 | 0.355 | 0.601 |
| Example 32 | 5.732 | 31.84 | 0.357 | 0.604 |
| Example 33 | 5.706 | 37.045 | 0.357 | 0.605 |
| Example 34 | 5.469 | 37.23 | 0.357 | 0.605 |
| Example 35 | 5.66 | 34.51 | 0.358 | 0.604 |
| Example 36 | 6.187 | 38.793 | 0.357 | 0.605 |
| Comparative Example 1 | 5.936 | 2.5225 | 0.3339 | 0.5957 |
| Comparative Example 2 | 4.911 | 1.8355 | 0.3477 | 0.5814 |
| Comparative Example 3 | 7.48 | 4.809 | 0.346 | 0.6055 |
| Comparative Example 4 | 6.928 | 3.2845 | 0.3379 | 0.6065 |
| Comparative Example 5 | 6.007 | 2.3625 | 0.3339 | 0.5975 |
| Comparative Example 6 | 4.936 | 1.879 | 0.3458 | 0.5842 |
| Comparative Example 7 | 7.532 | 4.7775 | 0.3443 | 0.6077 |
| Comparative Example 8 | 7.02 | 3.274 | 0.3397 | 0.6046 |

Figure 3:
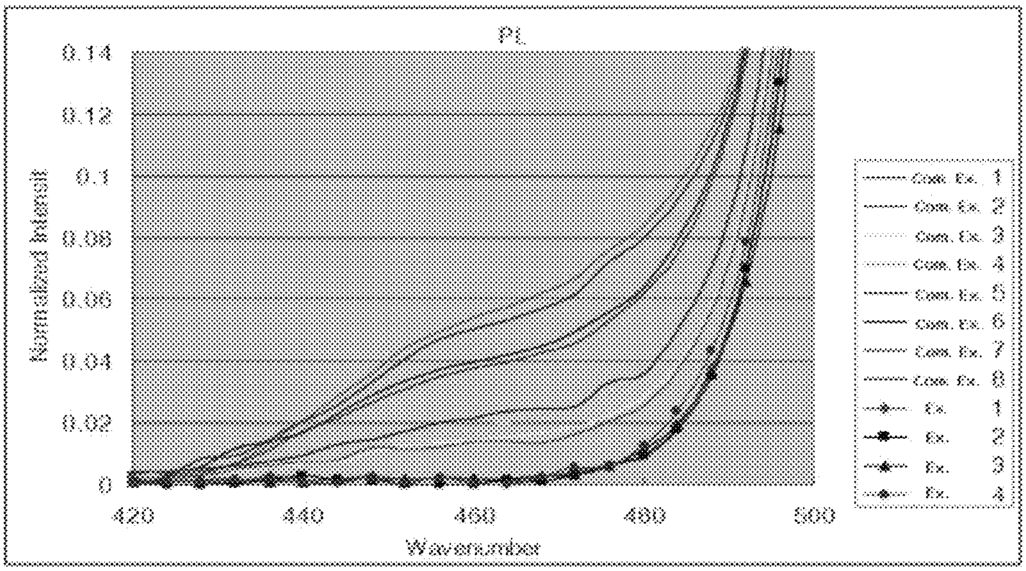
FIG. 3 is a graph comparing magnified light emission characteristics generated from 420 nm to 500 nm when diodes used in Comparative Examples 1 to 8 and Examples 1 to 4 are driven at a current density of 20 $mA/cm^2$.
Figure 4:
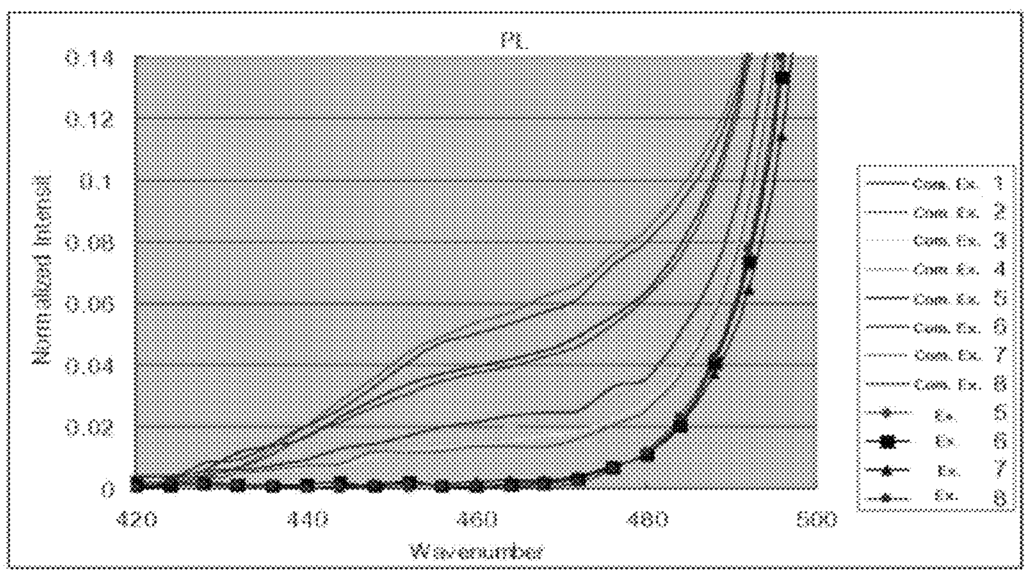
FIG. 4 is a graph comparing magnified light emission characteristics generated from 420 nm to 500 nm when diodes used in Comparative Examples 1 to 8 and Examples 5 to 8 are driven at a current density of 20 $mA/cm^2$.
Figure 5:
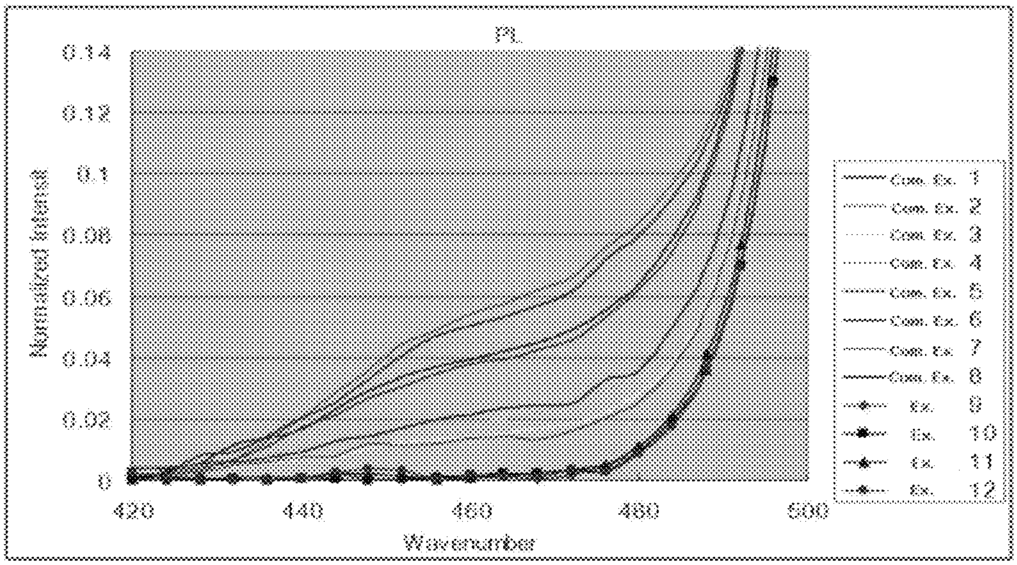
FIG. 5 is a graph comparing magnified light emission characteristics generated from 420 nm to 500 nm when diodes used in Comparative Examples 1 to 8 and Examples 9 to 12 are driven at a current density of 20 $mA/cm^2$.
Figure 6:
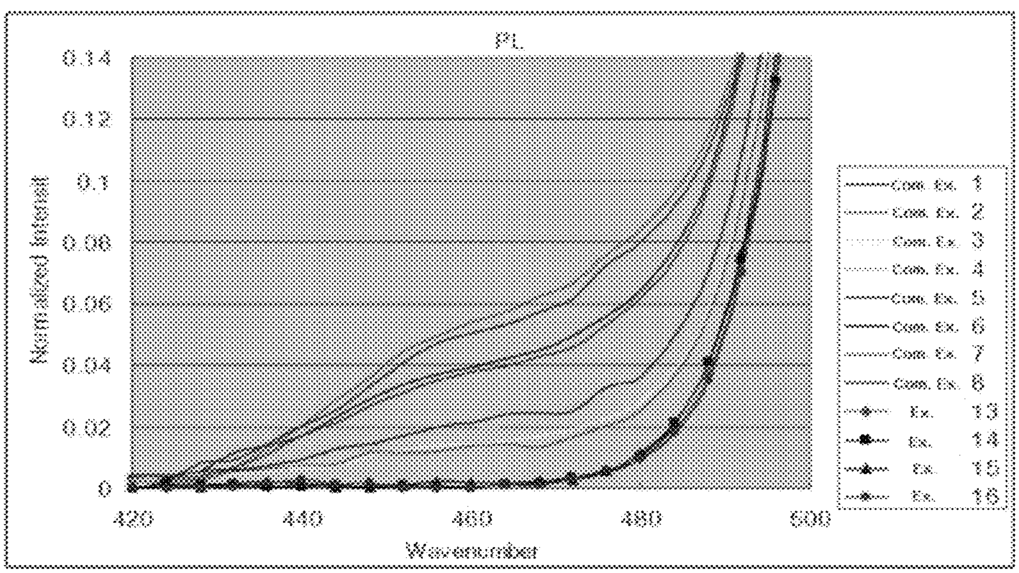
FIG. 6 is a graph comparing magnified light emission characteristics generated from 420 nm to 500 nm when diodes used in Comparative Examples 1 to 8 and Examples 13 to 16 are driven at a current density of 20 $mA/cm^2$.
Figure 7:
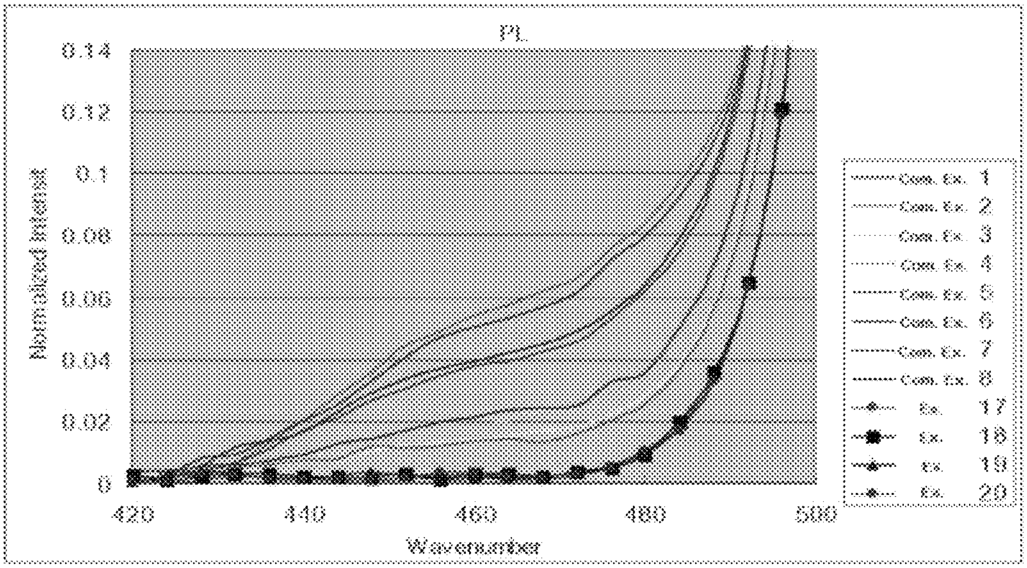
FIG. 7 is a graph comparing magnified light emission characteristics generated from 420 nm to 500 nm when diodes used in Comparative Examples 1 to 8 and Examples 17 to 20 are driven at a current density of 20 $mA/cm^2$.
Figure 8:
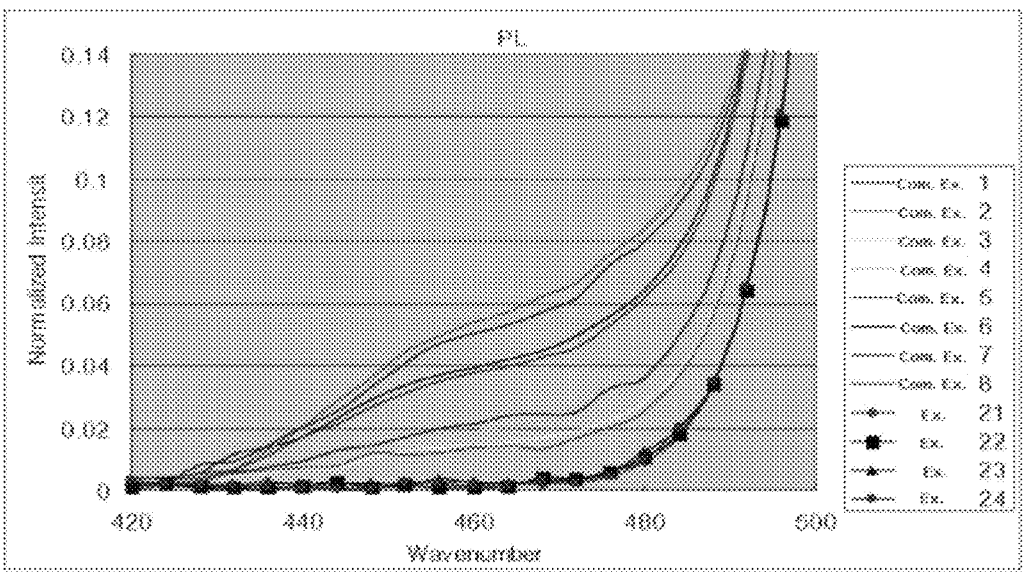
FIG. 8 is a graph comparing magnified light emission characteristics generated from 420 nm to 500 nm when diodes used in Comparative Examples 1 to 8 and Examples 21 to 24 are driven at a current density of 20 $mA/cm^2$.
Figure 9:
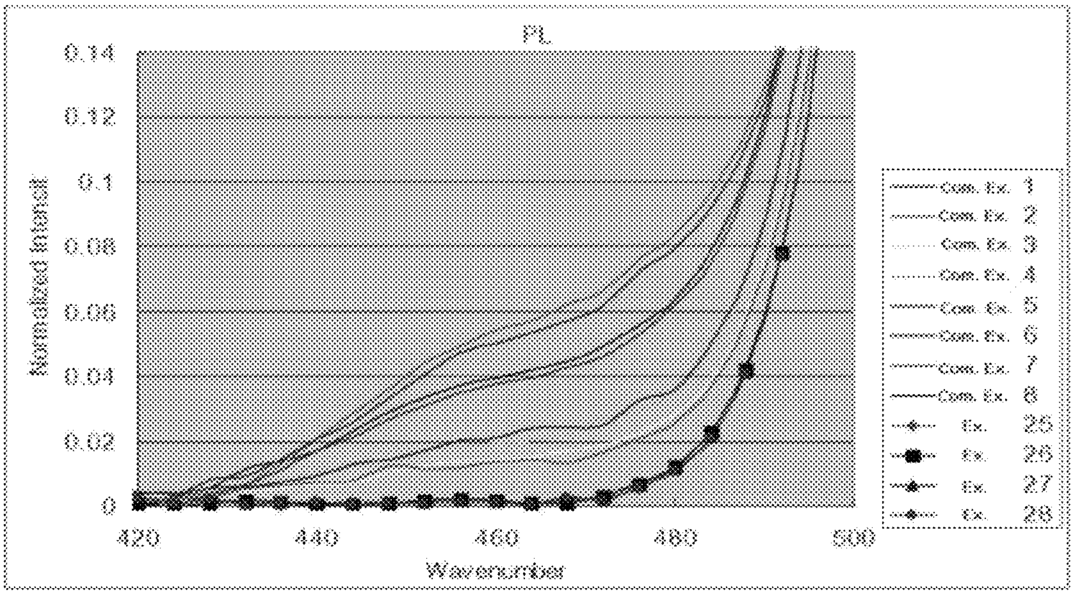
FIG. 9 is a graph comparing magnified light emission characteristics generated from 420 nm to 500 nm when diodes used in Comparative Examples 1 to 8 and Examples 25 to 28 are driven at a current density of 20 $mA/cm^2$.
Figure 10:
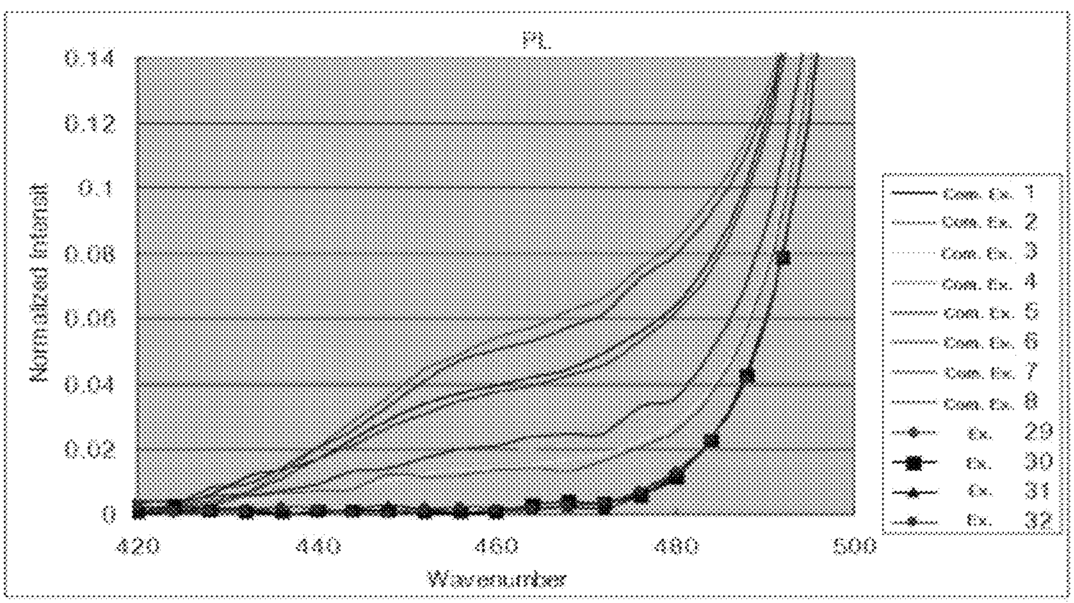
FIG. 10 is a graph comparing magnified light emission characteristics generated from 420 nm to 500 nm when diodes used in Comparative Examples 1 to 8 and Examples 29 to 32 are driven at a current density of 20 $mA/cm^2$.
Figure 11:
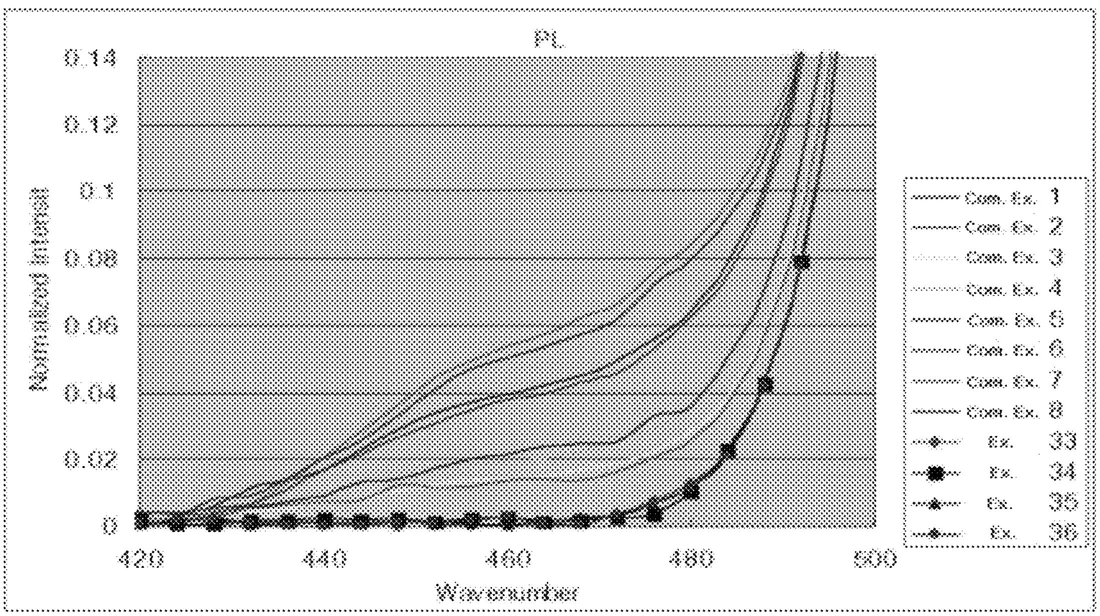
FIG. 11 is a graph comparing magnified light emission characteristics generated from 420 nm to 500 nm when diodes used in Comparative Examples 1 to 8 and Examples 33 to 36 are driven at a current density of 20 $mA/cm^2$.

In the Table, the CIE-x coordinates in Comparative Examples 1 to 8 were all in a range of 0.33 to 0.34, and it seems that the light emission spectrum was shifted toward the short wavelength side, as compared to the fact that CIE-x coordinates in Examples 1 to 24 were within a range of 0.36 to 0.37. However, when the actual light emission spectra shown in FIG. 8 are compared in FIG. 3, it is determined that small light emission peaks were observed on the short wavelength side in Comparative Examples 1 to 8 compared to Examples 1 to 24, indicating that a material having a fluorescent light emitting efficiency which was equal to or greater than that of NPB emitted light by itself when the material was disposed as a hole transporting material between the anode and the light emitting layer and in contact with the light emitting layer. For this reason, low CIE-x values are produced in the color coordinate.

In Examples 1 to 24 where substances, which are a part of Formulas 1 to 4, were mixed together or introduced alone as an electron transporting material between the light emitting layer and the cathode as compared to Comparative Examples 1 to 8, the light emission phenomenon of a hole transporting material was not observed on the short wavelength side as in Comparative Examples 1 to 8, and a result that the light emitting efficiency of the diode was also improved by about 10 times may be observed.

The invention claimed is:

1. An organic light emitting diode, comprising:

an anode;

a cathode; and an organic material layer of one or more layers disposed between the anode and the cathode, wherein the organic material layer comprises a light emitting layer, an organic material layer comprising a compound having a fluorescent light emitting efficiency equal to or greater than the fluorescent light emitting efficiency of NPB (N, N'-Bis-(1-naphthalenyl)-N, N'-bis-phenyl-(1, 1'-biphenyl)-4, 4'-diamine) positioned between the anode and the light emitting layer, and an organic material layer comprising a compound represented by the following Formula [cp8] positioned between the cathode and the light emitting layer, and wherein the compound having a fluorescent light emitting efficiency equal to or greater than the fluorescent light emitting efficiency of NPB is a compound represented by the following Formula [cp5]:

[cp8]

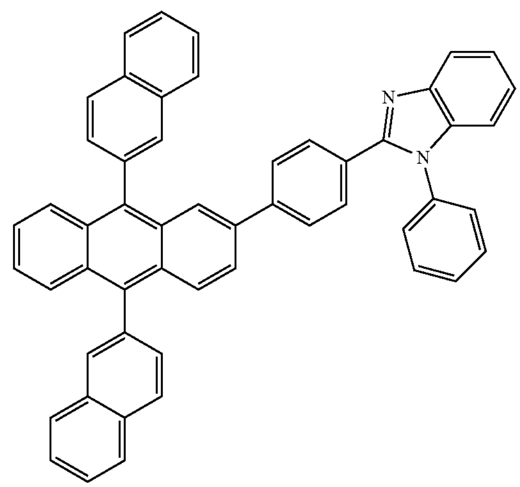

[cp5]

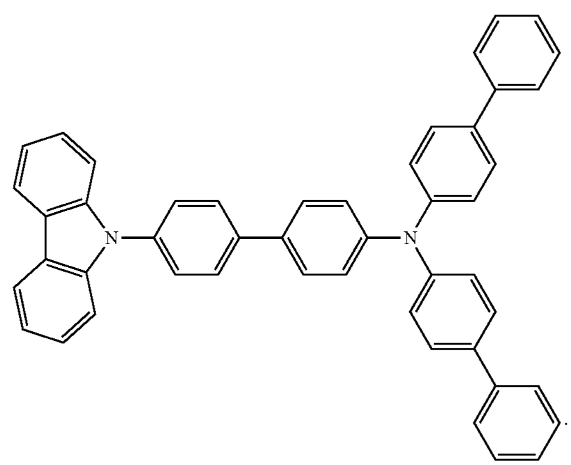

2. The organic light emitting diode according to claim 1, wherein the organic material layer comprising a compound having a fluorescent light emitting efficiency equal to or greater than the fluorescent light emitting efficiency of NPB is in contact with the light emitting layer.

3. The organic light emitting diode according to claim 1, wherein the organic material layer comprising a compound represented by Formula [cp8] is an electron transporting layer, an electron injection layer, or a layer which simultaneously transports and injects electrons.

4. The organic light emitting diode according to claim 1, wherein the organic material layer comprising a compound represented by Formula [cp8] further comprises a reducing dopant.

5. The organic light emitting diode according to claim 1, wherein the organic material layer comprising a compound having a fluorescent light emitting efficiency equal to or greater than the fluorescent light emitting efficiency of NPB further comprises a p-type dopant.

6. The organic light emitting diode according to claim 1, wherein the light emitting layer comprises a phosphorescent material.

7. The organic light emitting diode of claim 1, wherein the organic material layer comprising a compound having a fluorescent light emitting efficiency equal to or greater than the fluorescent light emitting efficiency of NPB is a hole injection layer, a hole transporting layer, or a layer which simultaneously injects and transports holes.

* * * * *